(12) United States Patent
Makeev et al.

(10) Patent No.: US 12,192,499 B2
(45) Date of Patent: Jan. 7, 2025

(54) METHODS AND APPARATUSES FOR ENCODING AND DECODING A BYTESTREAM

(71) Applicant: V-NOVA INTERNATIONAL LIMITED, London (GB)

(72) Inventors: Ivan Makeev, London (GB); Balázs Keszthelyi, London (GB); Stergios Poularakis, London (GB); Michele Sanna, London (GB); Robert Ettinger, London (GB)

(73) Assignee: V-Nova International Limited, London (GB)

( * ) Notice: Subject to any disclaimer, the term of this patent is extended or adjusted under 35 U.S.C. 154(b) by 0 days.

(21) Appl. No.: 18/295,197

(22) Filed: Apr. 3, 2023

(65) Prior Publication Data
US 2023/0388531 A1    Nov. 30, 2023

Related U.S. Application Data

(63) Continuation of application No. 16/769,803, filed as application No. PCT/GB2018/053552 on Dec. 6, 2018, now Pat. No. 11,632,560.

(51) Int. Cl.
*H04N 19/44* (2014.01)
*G06F 17/16* (2006.01)
(Continued)

(52) U.S. Cl.
CPC ............. *H04N 19/44* (2014.11); *G06F 17/16* (2013.01); *G06F 30/20* (2020.01); *H04L 65/75* (2022.05);
(Continued)

(58) Field of Classification Search
CPC ...... H04N 19/44; H04N 19/13; H04N 19/184; H04N 19/1883; H04N 19/96; G06F 17/16; G06F 30/20; H04L 65/75
See application file for complete search history.

(56) References Cited

U.S. PATENT DOCUMENTS 9,300,957 B2 *   3/2016   Cheon .................... H04N 19/30
9,420,282 B2 *   8/2016   Li ........................ H04N 19/159
(Continued)

OTHER PUBLICATIONS

Hanan, "The Quadtree and Related Hierarchical Data Structures", ACM Computing Surveys, ACM, New York, NY, US, vol. 16, No. 2, Jun. 1, 1984, pp. 187-260, XP058287271, ISSN: 0360-0300, DOI: 10.1145/356924.356930.
(Continued)

*Primary Examiner* — Mohammed S Rahaman
(74) *Attorney, Agent, or Firm* — Workman Nydegger

(57) ABSTRACT

There is provided a method of decoding a received set of encoded data, the method comprising: receiving an encoded dataset; identifying from the dataset an ordered set of node symbols and data symbols, wherein a node symbol comprises a predetermined number of elements wherein each element indicates if a subsequent node symbol or data symbol is to be expected in the dataset and a data symbol is a predetermined number of bits which represent an encoded value; constructing, based on said ordered set, an ordered tree having a predetermined number of layers from the identified node symbols and data symbols.

20 Claims, 47 Drawing Sheets

(51) Int. Cl.
*G06F 30/20* (2020.01)
*H04L 65/75* (2022.01)
*H04N 19/13* (2014.01)
*H04N 19/169* (2014.01)
*H04N 19/184* (2014.01)
*H04N 19/96* (2014.01)

(52) U.S. Cl.
CPC ........... *H04N 19/13* (2014.11); *H04N 19/184* (2014.11); *H04N 19/1883* (2014.11); *H04N 19/96* (2014.11)

(56) References Cited

U.S. PATENT DOCUMENTS

| | | | | |
|---|---|---|---|---|
| 2007/0005795 | A1* | 1/2007 | Gonzalez | H04N 19/25 375/E7.006 |
| 2009/0196513 | A1* | 8/2009 | Tian | H04N 19/60 382/232 |
| 2011/0274162 | A1* | 11/2011 | Zhou | H04N 19/15 375/240.03 |
| 2014/0092965 | A1 | 4/2014 | Joshi et al. | |
| 2014/0184430 | A1* | 7/2014 | Jiang | G06T 9/001 341/55 |
| 2014/0307770 | A1* | 10/2014 | Jiang | H04N 13/161 375/240.01 |
| 2020/0374566 | A1* | 11/2020 | Sugio | H04N 19/152 |
| 2021/0409670 | A1* | 12/2021 | Oh | H04N 21/23614 |

OTHER PUBLICATIONS

International Search Report and Written Opinion for PCT/GB2018/053552 mailed Apr. 4, 2019.

Kotra et al., "CE5: Results on Modified Inter Mode Coding and Joint Coding of Split Flags for CAVLC", 6. JCT-VC Meeting; 97, MPEG Meeting; Jul. 14, 2011 through Jul. 22, 2011; Torino; (Joint Collaborative Team on Video Coding of ISO/IEC JTC1/SC29/WG11 and ITU-T SG.16); URL: http://WFTP3.ITU.INT/AV-ARCH/JCTVC-SITE/, No. JCTVC-F524, Jul. 1, 2011, XP030009547.

* cited by examiner

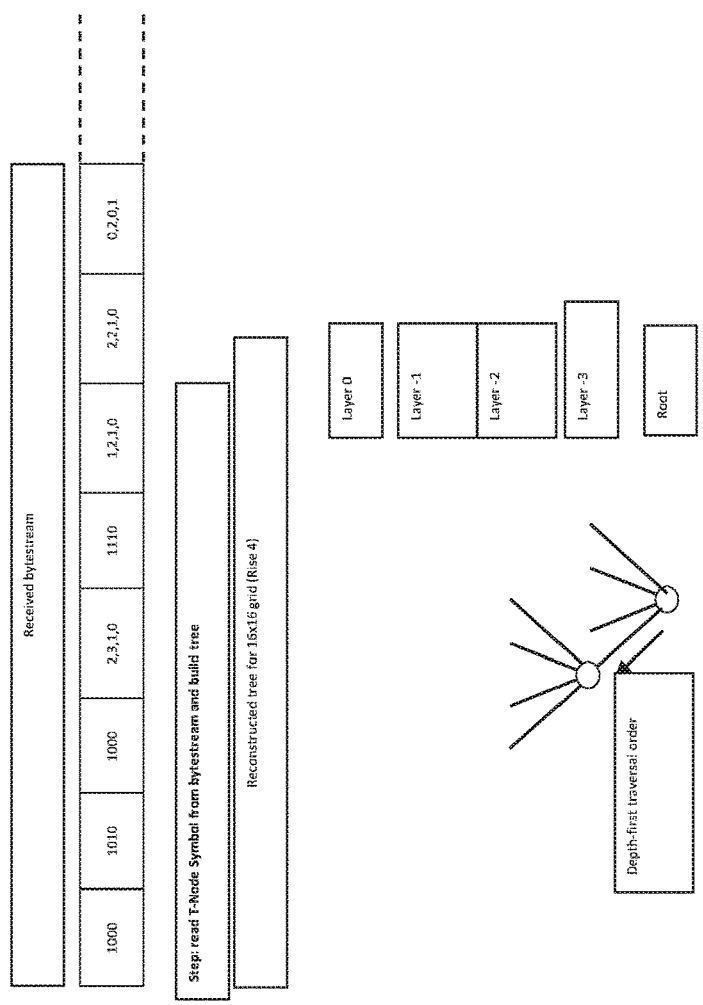
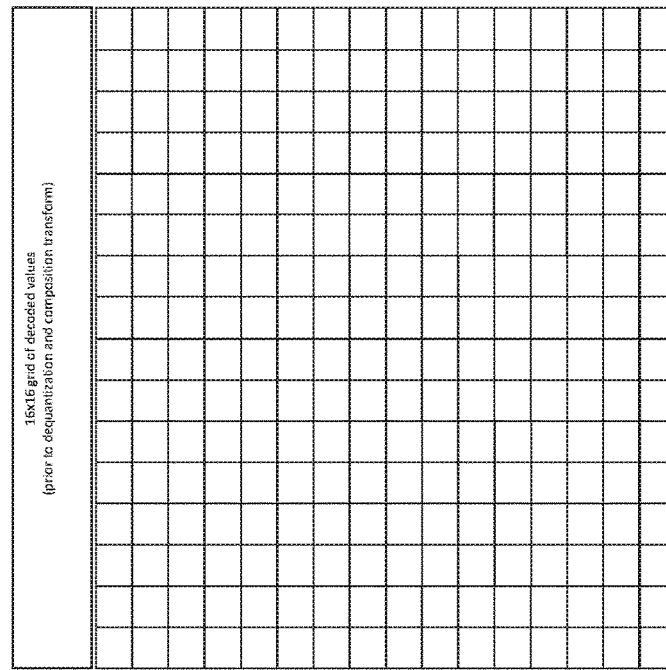
FIG. 32A
FIG. 32B

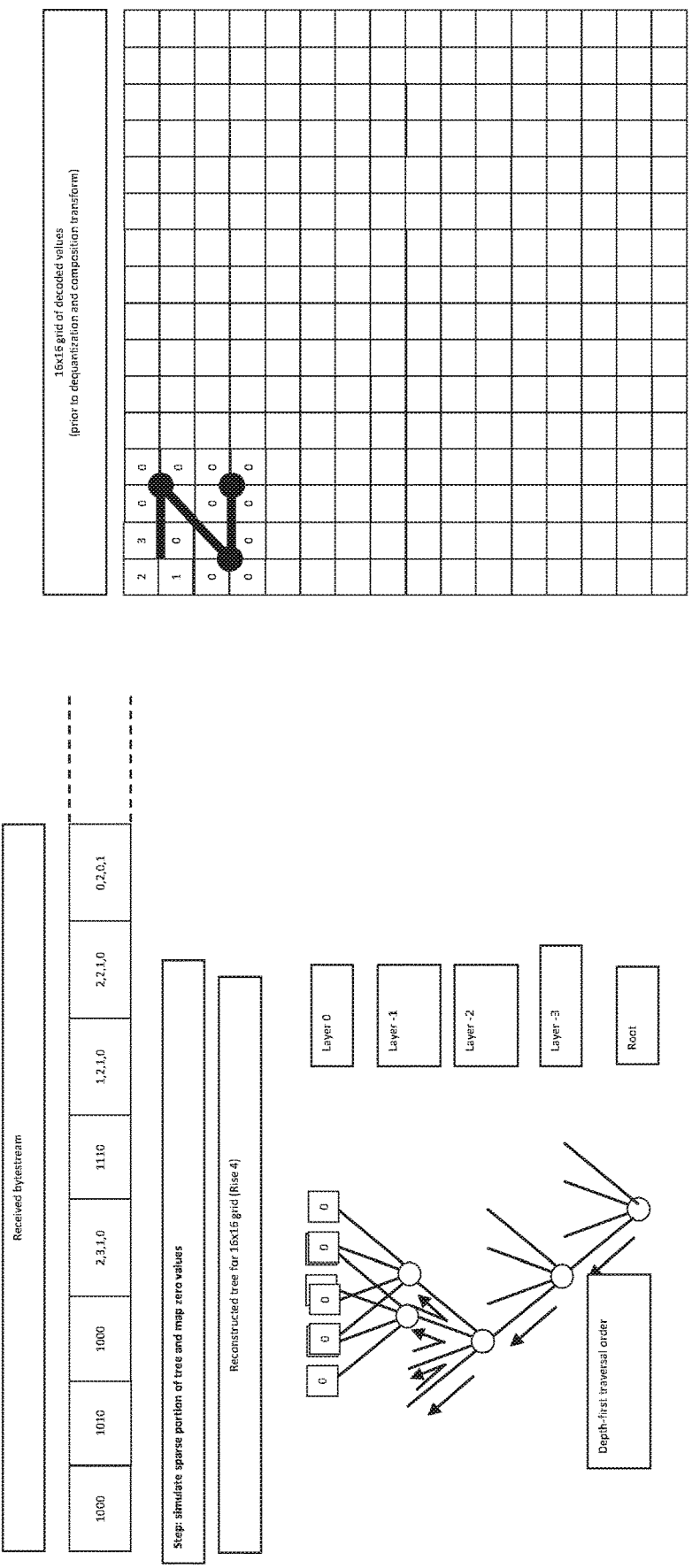

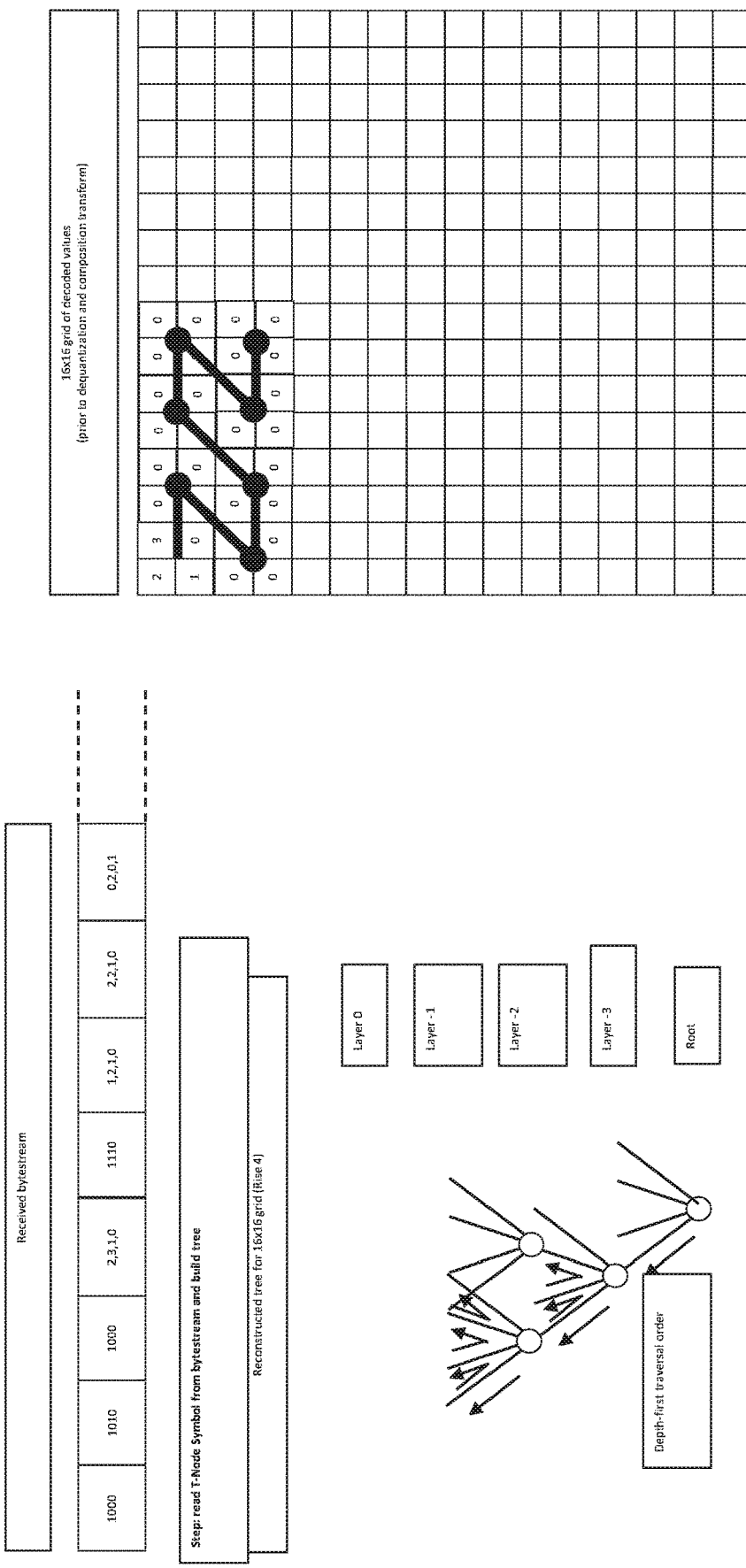

METHODS AND APPARATUSES FOR ENCODING AND DECODING A BYTESTREAM

CROSS-REFERENCE TO RELATED APPLICATIONS

This application is a continuation U.S. application Ser. No. 16/769,803, filed Jun. 4, 2020, which is a 371 US Nationalization of International Application No. PCT/GB2018/053552, filed Dec. 6, 2018, which claims priority to
EP patent application Ser. No. 17/386,046.1, filed Dec. 6, 2017,
EP patent application Ser. No. 17/386,047.9, filed Dec. 6, 2017,
GB Patent Application No. 1720365.4, filed Dec. 6, 2017
EP patent application Ser. No. 18/386,002.2, filed Feb. 8, 2018,
GB Patent Application No. 1812407.3, filed Jul. 30, 2018,
GB Patent Application No. 1815437.7, filed Sep. 21, 2018,
the disclosures of which are hereby incorporated by reference herein in their entirety.

TECHNICAL FIELD

The present invention relates to methods, apparatuses, computer programs and computer-readable media for encoding and/or decoding a sequence of data streams such as a bytestream.

BRIEF DESCRIPTION OF THE DRAWINGS

FIGS. 32A and 31B illustrate a decoder building a tree once it has read a bytestream and an associated grid;
FIGS. 37A and 37B further illustrate a decoder building a tree once it has read a bytestream and an associated grid;
FIGS. 40A and 40B further illustrate a decoder building a tree once it has read a bytestream and an associated grid.

DESCRIPTION

1 Introduction

Figure 1:
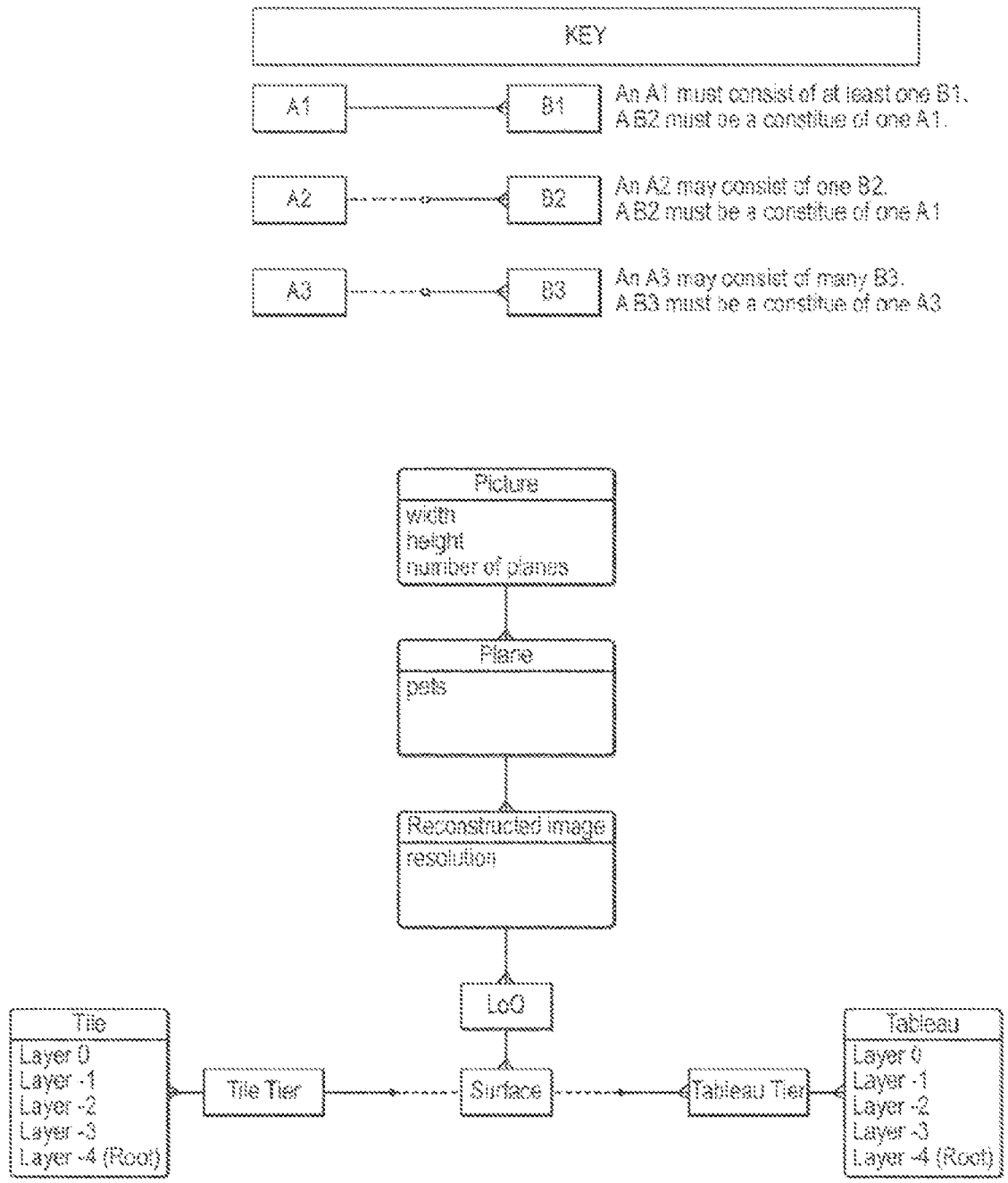
FIG. 1 illustrates an entity-relationship diagram illustrating main nomenclature pertaining to VC.

In the following there is a description of the general principles of a new method of decoding a bystestream according to the aspects of the present invention, including a description of the bytestream, the decoding process and some specific parameters. The following should be read as exemplary embodiments rather than restrictive embodiments, and the skilled reader would appreciate that the present description can be generalized without departing from the spirit of the inventive concepts described.

2 Reference to Other Documents

The following description contain provisions to other documents and/or patent applications whose contents are included in the present patent application by reference.

Also, the following standard is included in this application by reference: IEEE 758-2008 IEEE Standard for Floating-Point Arithmetic

3 Operators and Data Conventions

3.1 Notation
1. Notation $(x_0, x_1, \ldots, x_{n-1})$ denotes an n-tuple.
2. Notation A[i,j] denotes the element of a 2-D array A, at row i and column j.
3. Dimensions of 2-D arrays are written as a 2-tuple, (w,h) or in plain text w by h, where w and h are the horizontal size (width) and vertical size (height) respectively.

3.2 Operators
1. Notation x>>n denotes arithmetic right shift of a two's complement integer number x by n bits. The Most Significant Bit (MSB) of x is used to fill the bit positions that have been vacated by the shift operation (sign preserving bit shift).
2. Notation x/y denotes integer division with truncation of the result towards negative infinity. For example, ¾ results to 0 and −¾ results to −1.
3. Notation ⌊x⌋ denotes the flooring operation, mapping x to the greatest integer number that is less than or equal to x.
4. Notation ⌈x⌉ denotes the ceiling operation, mapping x to the least integer number that is greater than or equal to x.
5. Notation $\lceil \log 2(x) \rceil$ denotes the smallest non-negative integer, n, satisfying $x \le 2^n$.
6. Notation max (x1,x2 . . . xn) denotes the largest of the numbers x1, x2 . . . xn.
7. Floating point numbers and computations conform to the IEEE Standard for Floating-Point Arithmetic (IEEE 754).

4 Nomenclature

In the following section, certain terms used throughout the description are discussed. This section is meant to help the skilled reader to navigate throughout the document, and none of the description in this section 4 should be considered as definitions of a term.

Bitvector: Binary data encoded into a number of bytes.
Branch: A link between two nodes in a connected undirected graph.
Bytestream: A sequence of bytes used to store or transmit a VC encoded Image.
Convolution: Operation on a pair of arrays. Defined in section AC.3.3.
Cumulative Distribution Function: Array of cumulative probabilities of symbols.
Grid: A fully populated (dense) rectangular 2D array.
Kronecker product: Operation on two arrays, of arbitrary dimensions (p,q) and (m,n), resulting in an array of dimensions (pm,qn). See section C.2.
Quantization Parameters: A 2-tuple used in de-quantization, containing a stepwidth and an associated offset. See section 8.5.1.
Distance: Minimum number of Branches between two nodes.
Expanded Picture Structure (EPS): VC format for pictures in its complete form without Shortcuts.
Header: A group of consecutive bytes in a Bytestream, coming before the Payload. Note: The Bytestream starts with a fixed-size Header (see section 7.4.5) followed by two variable-size Headers (see sections 7.4.6-7.4.7) immediately before a Payload.
Morton-map: Function that maps a character string in the Quadrant Array to a Grid that is one quarter of an original Grid. It maps "top-left" to a copy of the top-left quarter of the original Grid etc. The original Grid's width and height must be even and equal.
Out-of-Bound Reading Rule: A method of choosing values implicitly outside the domain of an array, instead of having to read them. Associated with the use of Convolutions. See sections AC.3.2 and AC.3.3.
Payload: A group of consecutive bytes at the end of a Bytestream which contain encoded Picture Elements. See section x.
Picture Element: A numerical value defined at every location in a 2D Grid, representing a value after decoding VC. A Picture Element can be of different types. For example, for images or moving images, the type of Picture Element could be: Y, U, V, R, G, B, X', Y' Z' or some other property of the decoded image.
Pipeline Bitvector: 1-byte Bitvector where the least and most significant bits are bit 1 and bit 8 respectively. Used to enable non-default decoder processes.
Quadrant Array: An array of character strings ["top-left", "top-right", "bottom-left", "bottom-right"] linking components of a data type to areas of a Grid.
ReconstructedImage: A Grid containing Picture Elements. See section 8.7.2.
Shortcut: A permitted transformation made to the Expanded Picture Structure to enable lighter weight syntax. See section 7.5.
Shortcut Bitvector: 2-byte Bitvector where the least and most significant bits are bit 1 and bit 16 respectively. Bit values of 1 are used to communicate contractions of the VC syntax.
Altitude: An index, −j, increasing with Distance from Root, reaching 0 at maximum Distance from Root. Note: −j is always≤0.
Ancestor: A node at Altitude −j−x is an Ancestor of a node at Altitude −j, where x is the Distance between the two nodes.
Child: A node at Altitude −j+1 is a Child of a node at Altitude −j, where both nodes are linked together by only one Branch.
Dense Counterpart: New n-Tree, where every node above Layer 0 of the original n-Tree has n children and every Layer is dense.
Depth: The common term equivalent to Altitude+Rise.
Depth-First Pre-Order Traversal: A strategy for traversing an Ordered 4-Tree from least to greatest Altitude. If a Leaf is reached, the strategy backtracks through Ancestors of that Leaf, before traversing further sections of the same Tree.
Descendant: A node at Altitude −j+x is a Descendant of a node at Altitude −j, where x is the Distance between the two nodes.
Full: Qualifies an n-Tree in which every node has either zero or n Children.
Grandchild: A node at Altitude −j+2 is a Descendant of a node at Altitude −j, where the Distance between the two nodes is 2 Branches.

L: Number of Layers in an n-Tree. It corresponds to Rise plus 1.
Label: Data attached to a node in a Tree other than what is implicit in the Tree's structure and order of nodes. For use and types of Label in VC, please see section 6.2.2.
Layer: Subset of n-Tree nodes that have the same Distance from the Root.
Layer −a: Layer having a Layers greater in Distance from Root, where a is an integer and −Rise≤−a≤0.
Leaf: Node with no Children.
n-Tree: Tree where no node has more than n Children.
Ordered 4-Tree: A 4-Tree where there is a 1:1 function, that maps each Subsidiary Tree of a node to an element in the Quadrant Array and hence via the Morton-map to an area of a Grid.
Parent: A node at Altitude −j−1 is a Parent of a node at Altitude −j, where both nodes are linked together by only one Branch.
Quadtree: Full n-Tree where n is 4.
Rise: absolute value of the Altitude of the Root of an n-Tree. It corresponds to the number of Layers in the n-Tree excluding the Root.
Root: Unique node of minimum Altitude in a Tree. Note: Root has no Parent.
Root Layer: Layer of an n-tree that contains the Root.
Sibling Nodes: Nodes having same Altitude and same Parent.
Subsidiary Tree: A Tree extracted from an existing Tree, using an existing non-Root node with Descendants as the new Root node with Descendants. Branches between these nodes are also extracted.
Summit: Top Layer of the Dense Counterpart of an n-Tree, represented as a Grid.
Tree: An acyclic, connected, undirected graph, in which an arbitrary node has been designated as the Root.
Top Layer: Layer in an n-Tree having nodes at greatest Distance from the Root. It corresponds to Layer 0.
Active Volume: A set containing nodes from all Layers of the Dense Counterpart of S-Tree[L, (w,h), sometype). Layer 0 nodes with Location (x,y), in the Summit, are included where x<=w and y<=h. Other nodes are included provided one or more of their Layer 0 Descendants are included. Note Active Volume is limited by L and (w,h).
Data T-Node: A non-Leaf node in Layer −1 of a Tessera.
Dimensions Tuple: Tuple (w,h) of positive integers where w is the width and h is the height of a Surface.
Glue Node: Level-k node in an S-Tree, having k divisible by 4 and −k<0.
Inner T-Node: A non-Leaf node in Layers −3 or −2 of a Tessera.
Location: Repeated sub-division of the Summit into quarters on a path from the Root Layer to a node in Layer 0 leads to the Location of that node in the S-Tree's Summit. (see Ordered 4-Tree). Mini Tree: 4-Tree representation of a Tessera used to encode the Tessera. The Mini Tree need not be Full, is not an S-Tree and has at most 21 nodes.
Sparsified Area: Area of a Surface containing zeroes that are not encoded in the Expanded Picture Structure but are known to be zeroes by default. Zeroes outside the Sparsified Areas are decoded from Labels in the same fashion as non-zeroes. Sparsity Structure: A Depth-First Pre-Order Traversal listing of the T-Node-Symbols of a Tessera. Summit Tuple: Dimensions Tuple of width $w=2^R$ and height $h=2^R$. Supplementary Node: Any node that must be added to an n-Tree to form its Dense Counterpart.
Surface: An S-Tree representation of a Grid.
Surface Abstract Data Type (S-Tree): A special Ordered 4-Tree with a Root, Layers, Dimensions Tuple and at least one Layer 0 Leaf that has a Label.
T-Node: A node in a Tessera that is neither a Leaf nor the Root of the Tessera.
T-Node-Symbol: A 4-bit code associated with every T-Node or Root node. T-Node-Symbols describe the occurrences of Grandchildren for Inner T-Nodes or Root nodes and the occurrences of Labels on Children for Data T-Nodes.
Tessera: S-Tree with a Rise of 4. Note: The Root Layer of a Tessera has Altitude −4.
Void: Parts or all of a Tessera absent from a Bytestream due to Sparsified Areas. Voids are subsets of the Active Volume. If an entire Tessera is a Void, it has no Root.
Attribute: Metadata that specializes decoding of one or more Tesserae. Eg. Quantization Parameters, Contexts other than IndexDifferenceStatistics, and any number of further Attributes included via the EPS.
Connective Node: Glue Node with Children.
Contexts: Representations of CDFs. These are IndexDifferenceStatistics (for decoding Tableaux), NodeStatistics (for decoding Tiles and Tableaux), ResidualStatistics (for decoding Tiles) or StreamLengthDifferenceStatistics (for decoding Tableaux).
Graft: The function Graft (S, T, node) replaces a Top Layer node of an S-Tree, S, with the Root of a Tessera, T, also replicating all the Branches and Descendants of that Tessera.
Regenerate: Attach new Tier of Tesserae to Top Layer nodes, increasing S-Tree's Rise by 4.
Root Tableau: The only Tableau of a Root Tier.
Root Tier: The Tier with the lowest index of all the Tiers of an S-Tree.
Stream: Variable-length section of a Bytestream from which an entire Tessera can be obtained using Attributes. Note: Each Stream belongs to a Tier.
StreamLength: Number of bytes in a Stream.
T-Set-Index: Index of a unique tuple of Attributes needed to decode a Tessera.
Tableau: Tessera whose Data T-Nodes' possible Labels of Children are StreamLengthDifferences. Tableaux do not belong to Tier 0.
Tableau-set: Set of all Tableaux in the Bytestream having identical T-Set-Indices.
Tableau Tier: Tier −t where −t≤−1. Note: The number of Tableau Tiers depends on an S-Tree's Dimensions Tuple.
Terminal Node: Glue Node without Children.
Tier: A set of Tesserae Grafted during Regeneration of a Tier onto an S-Tree. Note: The Root Tier can be followed by further Tableau Tiers, which must then be followed by a Tile Tier.
Tier −t Tier having t subsequent Tiers to Regenerate in order to reach the Tile Tier, where t is an integer and −t≤0.
Tile: Tessera whose Data T-Nodes' possible Labels of Children are Residuals. Tiles belong to Tier 0.
Tile-set: Set of all Tiles in the Bytestream having identical T-Set-Indices.
Tile Tier: Tier where t=0.

Composition: A process of transforming elements of the four ResidualSurfaces of an LoQ into elements of a single composed array. This array has twice the dimensions of the Surfaces.

Cycle: A step in Pyramidal Reconstruction identified by an index −m, which upsamples data output from a possible previous step and takes new ResidualSurfaces decoded from new Surfaces, Tiers and Streams as further inputs in order to obtain output data to be upsampled in a possible following step.

Direction: A ResidualSurface, or a Residual contained therein, has a role in Composition denoted by a Direction, namely a letter A, H, V or D. A direction can also be seen as one of a number of components (typically 4) in a transformed space. Reference is made to.

Initial LoQ: LoQ 1-N, where N is the number of LoQs in the Plane. Note: N is given in a Bytestream header.

Level of Quality −m: A collective term, associated with a Plane, describing all new inputs and the output ReconstructedImage for the Cycle of index −m. The ReconstructedImage in LoQ 0 is the output of the final Cycle of Pyramidal Reconstruction.

Plane: A collective term associated with the Surfaces, Tiers and Tesserae used to decode any one type of Picture Element. The name of the Plane is the type of Picture Element, such as Y (or Luminance). Note: For a Bytestream transmitting a vector/tuple valued input array, the input will be decomposed into multiple scalar Planes along that vector/tuple.

Pyramidal Reconstruction: A process of reconstructing an inverted pyramid starting from the Initial LoQ and using Cycles fed by new Residuals to derive higher LoQs up to the maximum quality, Quality 0, at LoQ 0.

Quality −m: Dimensions Tuple ($w^{-m}$, $h^{-m}$) of the ResidualSurfaces in LoQ −m. The values of w and h decrease as m decreases. Note: Quality 0 is the maximum quality that a given Plane could have, where w and h are the greatest.

Residual: The value of a Label attached to a node in a Tile. A Residual is denoted A, H, V or D, depending on which of the associated directional ResidualSurfaces contains the Residual. Note: After dequantization is applied, these values become dqA, dqH, dqV or dqD.

ResidualSurface: A Grid obtained when the assembly of all Tiers of an S-Tree, including its Tile Tier, is complete. Note: The four ResidualSurfaces of an LoQ of a Plane contain Residuals suitable for another Cycle of Pyramidal Reconstruction.

StreamLengthDifference: The first element of a Label attached to a node in a Tableau.

CDF: Abbreviation for Cumulative Distribution Function.

EPS: Abbreviation for Expanded Picture Structure.

LoQ: Abbreviation for Level of Quality.

Pel: Abbreviation for Picture Element.

R: Abbreviation for Rise of an n-Tree.

S-Tree: Abbreviation for Surface Abstract Data Type.

S-Tree[L, (x,y), sometype]: Abbreviation for an S-Tree where number of Layers is L, Dimension Tuple of Surface associated with Active Volume is (x,y) and Label type is sometype.

T-Set: Abbreviation for "Tableau-set or Tile-set".

5 Introduction 5.1 Introduction to the Design Principles of the Decoding (and Encoding) Format, Process, Methods and Algorithms Described in the Present Patent Application (Collectively Called "VC")

VC is a flexible, modern compression format, primarily focusing on pictures, but also capable of compression of any 2D dense array of integers (or other symbols). In terms of the nature of data, it employs transparent techniques of data compression, hence it is equally capable of compressing low bit depth pictures as well as high bit depth formats. VC offers flexibility in terms of resolution (up to 64K×64K) as well as the number of channels to support transparency or hyper-spectral imaging.

The transform stage of VC is offering a new approach, as it is free from the blocking artefacts generated by DCT-based compressors, and it offers multi-resolution representation. It differs from other predictive coding, sub-band coding and Discrete Wavelet Transform based approaches.

Throughout the transform stage, VC uses reversible integer operations only, with quantization being the only lossy step. This means, that regardless of the configuration used, it is always possible to reach lossless reconstruction with VC, assuming a sufficient, available bitrate.

The syntax of a VC Bytestream is an array of Trees each ending in tuples of data components, defining a graph of the Expanded Picture Structure. The Expanded Picture Structure may be reduced to simplified formats, using equivalent transformation rules, known as Shortcuts, that are signaled on a per-picture basis. Every VC conformant decoder shall support all valid combinations of Shortcuts, in order to keep the choice of optimal decoded format to be entirely an encoder optimization problem.

VC is not meant to be a container format, however, injection of metadata is supported to an extent that VC may be used as a standalone file format.

5.2 Overview of Hierarchical Techniques Used by VC 5.2.1 Organization of an Encoded Image An image consists of one or more Planes.

The Bytestream will signal the number of such Planes.

In a separate conformance document, standard constraints will be described for the allowed interpretations of Planes (e.g. R, G, and B or Y, U and V). Note: The current document is agnostic regarding the interpretation of Planes.

VC records the Plane data, using data hierarchies in at least three ways, which are shown below: Levels of Quality (LoQs), Tiers and Layers.

An LoQ corresponds to a Plane at a particular image resolution. Lower LoQs are those that get decoded earlier in time and they have the lowest resolutions.

Note: A higher LoQ is present in the ByteStream merely in a very compressed form called a ResidualSurface, because the decoder can already predict an approximation to a higher LoQ before reading any of its data. The data that does get read is only that which is needed to correct such an approximation.

A Tier consists of metadata or data for Regenerating an S-Tree. Note: The final Regenerated S-Tree includes Residuals that will then contribute to the decoding of the LoQ. Tiers are marked explicitly in FIG. 5, where it will be seen that each Tier consists of Tesserae.

Figure 5:
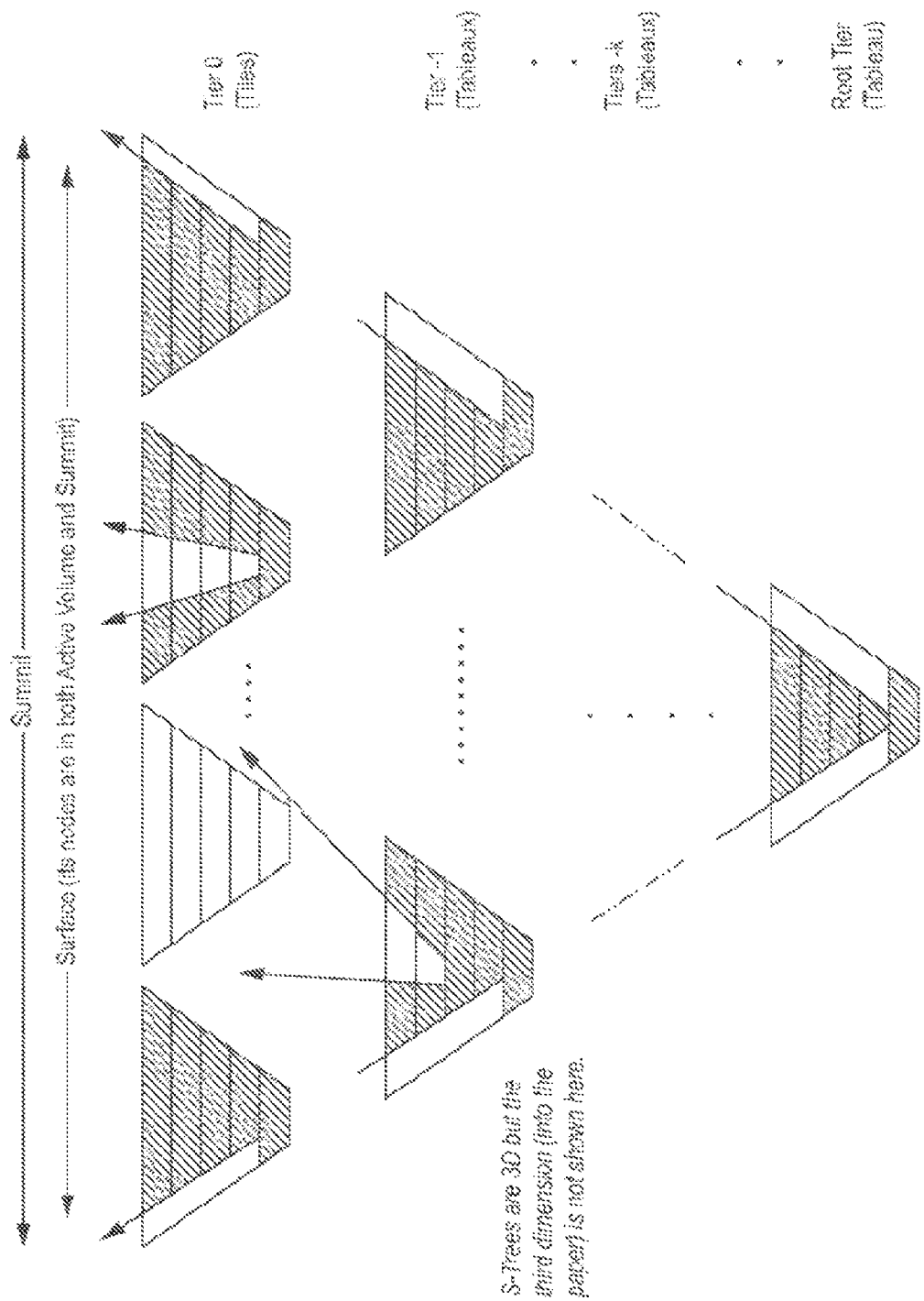
FIG. 5 illustrates a generic view of the hierarchies of Layers and Tiers pertaining to a Surface.

A Layer is part of an n-Tree, such as a Tessera or S-Tree, and consists of nodes. Layers are illustrated in FIG. 5. The abstract depictions of Tesserae, seen in FIG. 5, signify that they each have 5 Layers.

VC is a transform-based coding scheme where the Bytestream is encoded as a header followed by a hierarchical tree-of-trees structure representing transformed image data.

5.2.2 Organization of an Encoded Plane

The data for a Plane is organized in a hierarchy of LoQs, each LoQ corresponding to a different Quality (e.g., resolution) of a decoded image.

Each LoQ comprises a ReconstructedImage (see section 8.7.2), containing a dense array of Pels, and a number of Surfaces (see section 5.2.4), each Surface corresponding to different transformed image data. Using a Composition transform allows a decoder to produce a ReconstructedImage from four ResidualSurfaces containing different transformed image data.

A Surface is represented as a hierarchy of Tiers, each Tier containing elementary sparse building blocks called Tesserae. The Tesserae in the Tile Tier are called Tiles and the Tesserae in the other Tiers are called Tableaux.

FIG. 1 Entity-relationship diagram illustrating main nomenclature pertaining to VC. The decoder decodes Streams within a ByteStream to obtain Tiles and Tableaux. These two types of Tesserae allow a Surface to be constructed from its constituent Tiers. A Level of Quality consists of four Surfaces. A ReconstructedImage is produced using the data of at least one LoQ and is one of several possible ReconstructedImages for a Plane. A picture is allowed to consist of an arbitrary number of Planes.

The relationships between several of the concepts introduced above are illustrated schematically in FIG. 1.

A Tessera is organized in a hierarchy of 5 Layers. The Root Layer contains the notional Root of a Tree. The next 3 Layers comprise metadata which describe how the Tessera is sparse. The Top Layer (fifth Layer) comprises a different type of data depending on whether the Tessera is a Tableau or a Tile. In the case of a Tableau, the Top Layer comprises metadata which describe how to decode other Tesserae and how the next Tier of the Surface is sparse. In the case of a Tile, the Top Layer comprises data (e.g. encoded Pels).

5.2.3 Levels of Quality

A Level of Quality (LoQ) represents Pels (elements of a picture) encoded at a certain resolution.

Figure 2:
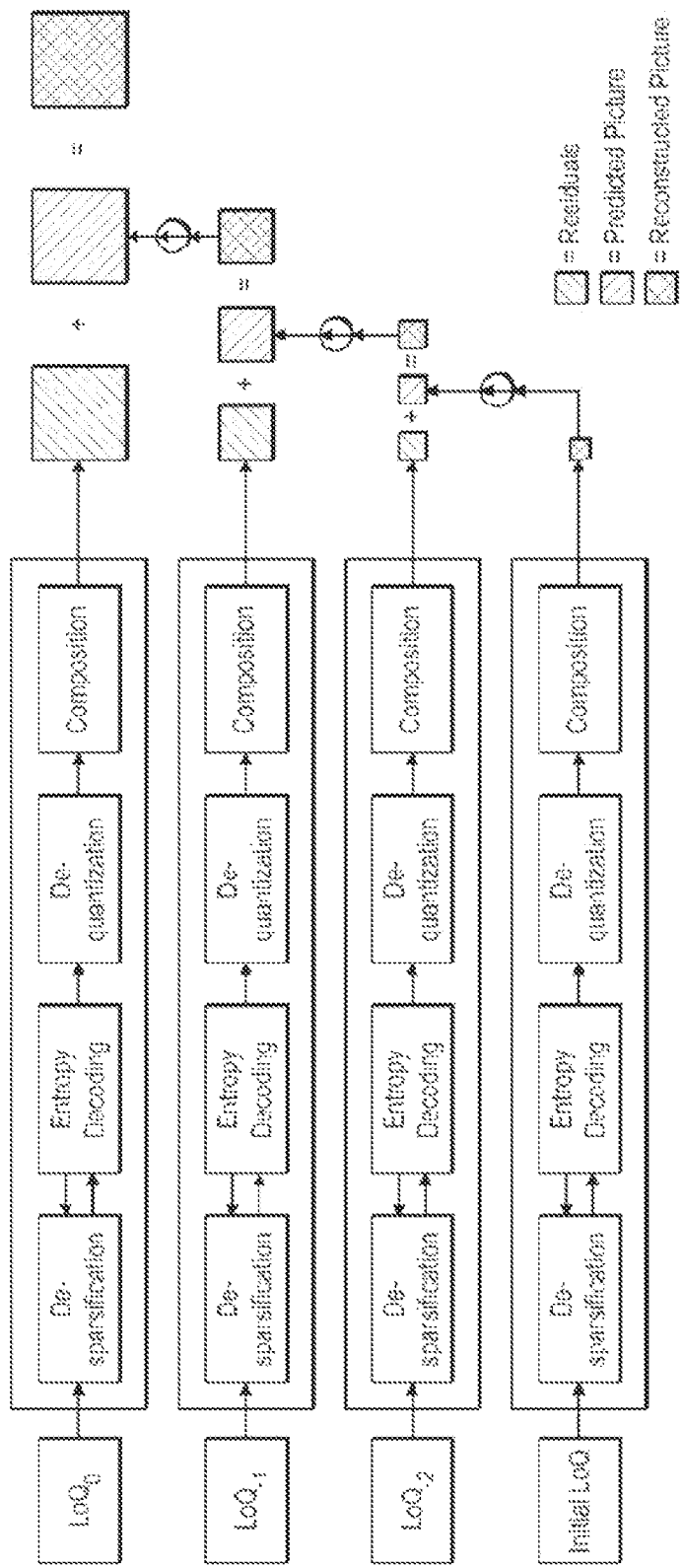
FIG. 2 illustrates four Cycles of Pyramidal Reconstruction for Initial LoQ and three higher quality successor LoQs.

FIG. 2 Four Cycles of Pyramidal Reconstruction for Initial LoQ and three higher quality successor LoQs. On all higher Cycles, Residuals are de-quantized and Composed prior to adding a predicted picture to obtain a ReconstructedImage. The predicted picture comes from upsampling the ReconstructedImage belonging to the previous LoQ. (The Initial Cycle differs since it does not add any predicted picture.)

FIG. 2 shows schematically that higher LoQs shall be predicted from lower LoQs and shall then be corrected using Residuals. The process leading from one LoQ to its successor, or leading to an Initial LoQ, is called a Cycle.

In FIG. 2 the use of Tiers of Tesserae, discussed elsewhere, to decode Residuals is not emphasized, but is represented by the rectangles entitled "De-sparsification" and "Entropy Decoding".

Every successor LoQ, LoQ −n+1, has a ReconstructedImage (defined in section 8.7.2) that is generated from an upsampled version of the ReconstructedImage from LoQ −n (the prediction data) and from decoding and applying a Composition transform to additional Residual data. Appropriate Residual data is contained in the ResidualSurfaces connected with the successor LoQ. This recursive approach is called Pyramidal Reconstruction. To initiate the process, the Initial LoQ is decoded first. (Note: The highest Level of Quality is LoQ 0, the next highest LoQ −1, etc.).

Within an LoQ, the Composition Transform allows a single ComposedResidualArray of Pels to be recovered from 4 ResidualSurfaces of transformed Pels.

5.2.4 Organization of an Encoded Surface

Figure 3:
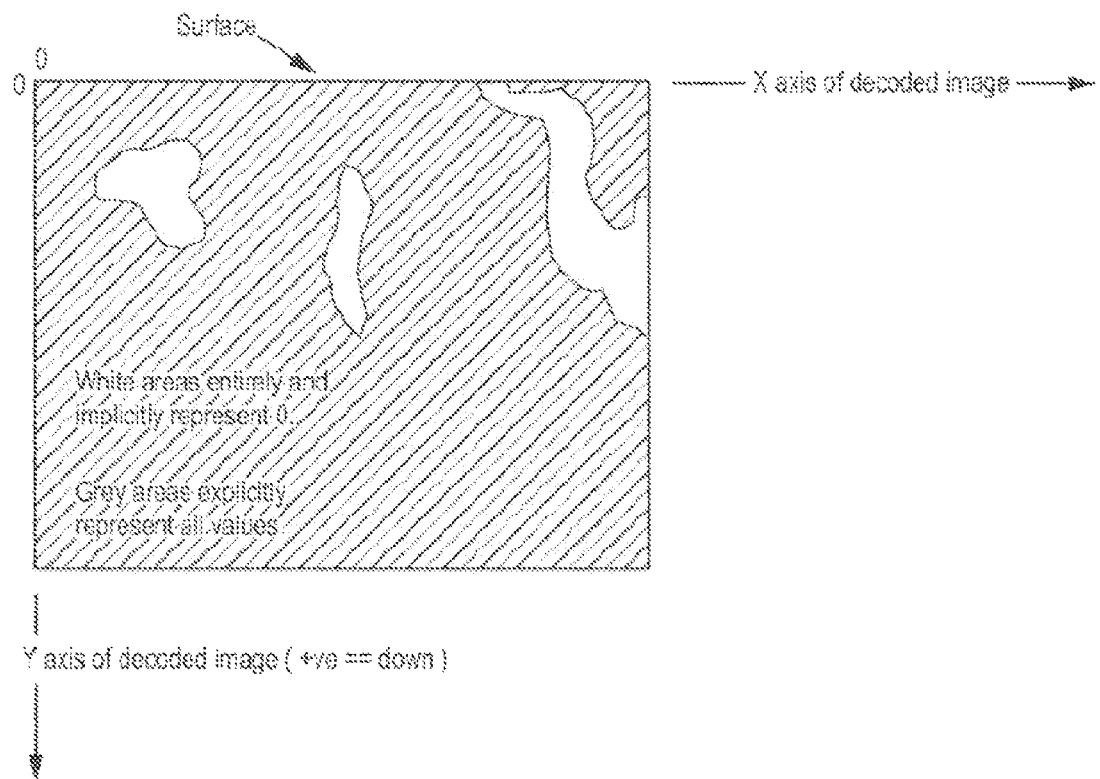
FIG. 3 illustrates Sparcified Areas of a Surface of an S-tree.

FIG. 3 In the Surface of an S-Tree, Sparsified Areas are represented implicitly without transmitting encoded data. The hierarchical data structure enabling this is a type of Tree that contains metadata (in its lower Layers) as well as encoded (non-sparsified) data in the Top Layer. The grey areas represent encoded data in the Bytestream, the three blank areas are sparse.

Layers and Tiers allow the Surface in FIG. 3 to be encoded efficiently because it contains three subsets whose data can be represented implicitly (i.e. value of that data need not appear in the Bytestream). FIG. 5, depicting an S-Tree, shows some of the volume of the S-Tree as white, which is an example of the efficient encoding enabled by means of two Sparsified Areas.

In the encoded format of a Surface, supposing implicitly represented subsets exist, the Active Volume will include sparse regions such as those shown in white in three of the Tesserae (see FIG. 5).

Tiers and LoQs are other useful sub-divisions, as explained below.

At fine scale, sparse building blocks called Tesserae consist of 4 Layers of metadata (and/or data, in the case of the Top Layer), supported by a Root Layer without data or metadata.

At coarse scale, a Surface can be described by means of an S-Tree abstraction, which allows the Surface to be decoded from Tiers of specialized Tesserae. The number of Tiers depends on the height and width of the Surface, but is at least 2.

The Tesserae in Tier 0 are called Tiles, whilst those in lower Tiers are called Tableaux. Tesserae are sparse data building blocks, implementing very small S-Trees (of Rise 4) for ease of processing.

Figure 4:
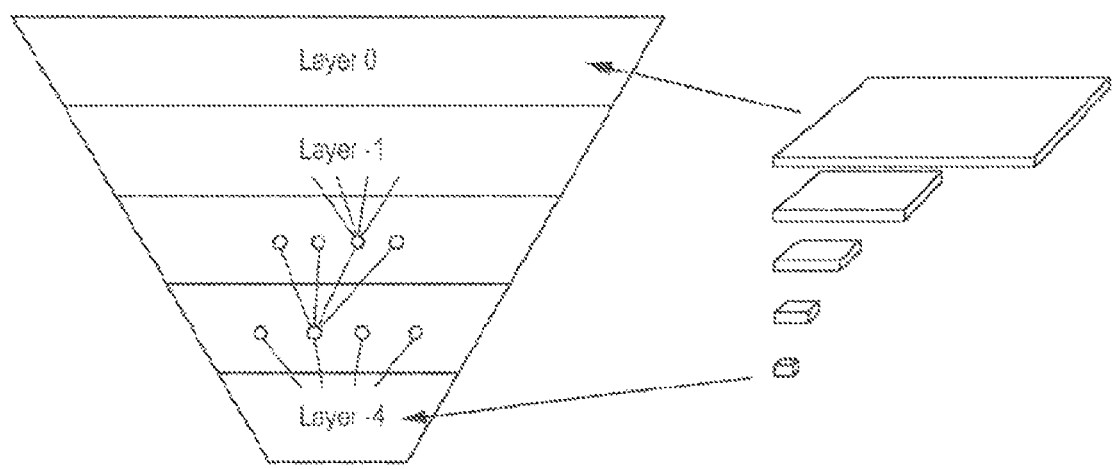
FIG. 4 illustrates Layers of an S-Tree.

FIG. 4 Schematic drawing (on the left) showing Layers of an S-Tree. Layers contain nodes, which represent certain positions in the 2D Grids shown schematically in the drawing on the right. As a concrete illustration, a possible topology of nodes and Branches (in gold colour) is indicated within two of the Layers. Later figures show the Layers of Tesserae without illustrating their nodes or Branches. The Rise is the minimum number of Branches required to reach a Layer 0 node from the Root node and it is 4 in this example, making the S-Tree a Tessera. The Root node (not shown) is in Layer-4.

FIG. 4 shows a Tessera (an example of an S-Tree). The dimensions of the Grids shown to the right of the figure are, reading from top to bottom, 16 by 16, 8 by 8, 4 by 4, 2 by 2 and 1 by 1.

Note: The Branches and nodes shown in FIG. 4 are merely an illustration. The Root Layer of an S-Tree always contains exactly 1 node and the next Layer always contains exactly 4 nodes, connected to the Root by Branches. Nodes and Branches involved with further Layers will assume many possible sparse arrangements as alternatives to a dense arrangement.

FIG. 5 shows a generic view of the hierarchies of Layers and Tiers pertaining to a Surface.

FIG. 5 Hierarchies within a Surface (a Surface is the intersection of Tile Tier's Padded Face with the Active Volume): Tiles are in Tier 0; orange lines show the boundaries of the Active Volume, and Voids in the Active Volume are shown in white. This Surface and its Tesserae all belong to the same Level of Quality, which sets the Active Volume. It is unnecessary for the Bytestream to contain all the potential Tesserae, depending on the Voids and on the Active Volume.

Note that FIG. 5 is a generic impression of the logical (not physical) organization of Tiles and Tableaux in a single Surface. Surfaces are a 2D structure where FIG. 5 is a cross section of a Surface viewed from the top of the page looking towards the bottom of the page. FIG. 5 shows each Tessera in 2D (like the left half and unlike the right half of FIG. 4) and spaces out the Tesserae of a Tier along a single axis (rather than two axes), to concentrate attention on some key features. Thus the orange lines represent planes, descending into the page, leading towards the bottom and/or right hand edge of an encoded 2D Grid such as an LoQ.

When decoding the Tiers of a Surface (see section 8.3), the decoder will start at the Root Tier and will proceed towards the Tile Tier.

When decoding a Tessera within any Tier, the decoder will start at the Root of the Tessera and will proceed towards the Top Layer of the Tessera. The decoder will then retreat to an already visited Layer of the Tessera before proceeding again towards the Top Layer of the Tessera. The decoder will repeatedly retreat and proceed in the same fashion in that Tessera until a Depth-First Pre-Order Traversal of that Tessera is completed.

The blank areas in FIG. 5 indicate, conceptually, that certain Tesserae (or portions of Tesserae) are encoded with a reduced amount of data because the decoder already knows from previously decoded Tiers (or previously decoded Layers) that the residuals in certain areas of the Surface should be 0. A Tile entirely blank in the figures must be completely absent from the EPS Bytestream.

The orange lines near the sides of the diagram show how the edges of the Surface may cause certain Tesserae to have a smaller Active Volume than their capacity (which has Summit dimensions of 16*16). A reduced Active Volume reduces the amount of data associated with such Tesserae in the Bytestream.

FIG. 5 represents an S-Tree of Rise 4n, where n is the number of Tiers, by multiple S-Trees of Rise 4. Inside the decoder, the larger S-Tree must be built from its component S-Trees. In the EPS Bytestream, only the component S-Trees of Rise 4 are transmitted.

Figure 6:
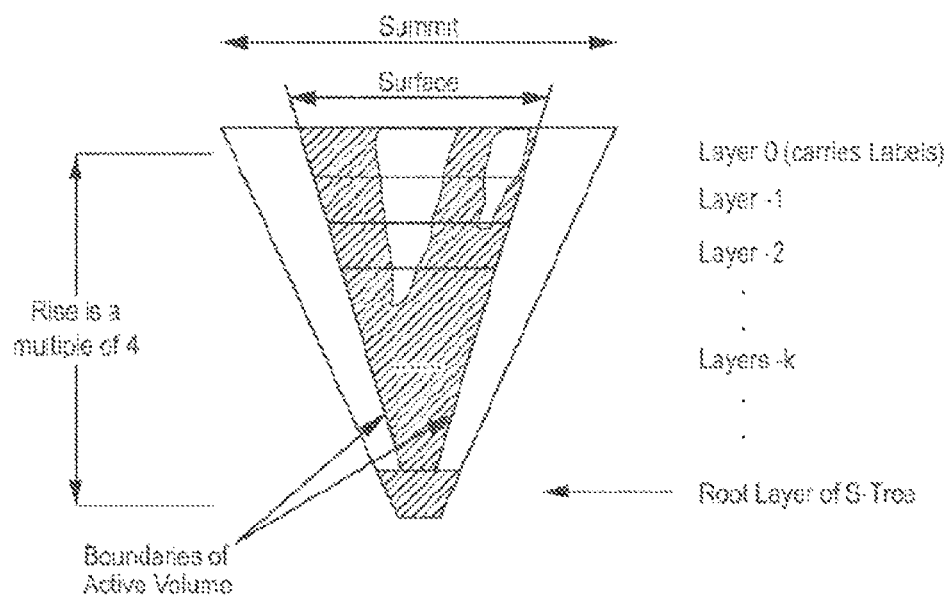
FIG. 6 illustrates the relationship between an S-Tree and a Tessera.

FIG. 6 The Layers of an S-Tree. (Number of Layers has no upper limit, must not be less than 2, and must be divisible by 4.) As an abstraction, it can represent any Surface. When Rise >4, for practical reasons the S-Tree is not directly transmitted in the Bytestream.

Figure 7:
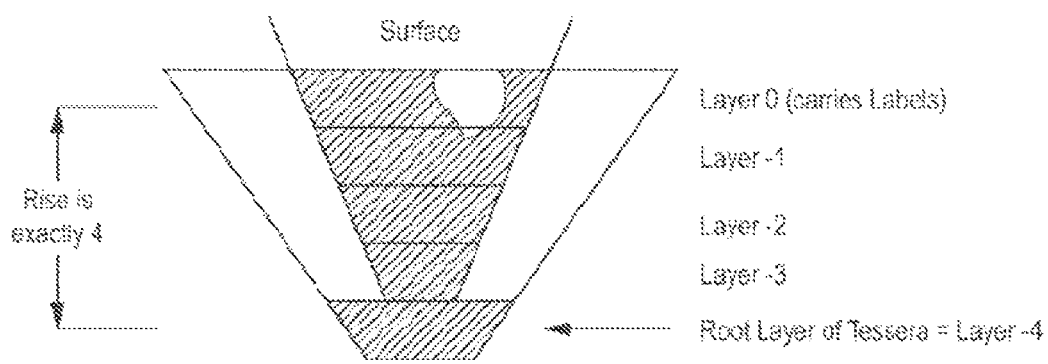
FIG. 7 illustrates the relationship between an S-Tree and a Tessera.

FIG. 7 The Layers of a Tessera. (The Rise is exactly 4). This sparse but standard component, a special S-Tree, is used extensively in VC. Tesserae called Tableaux and Tiles can be decoded efficiently and independently.

The relationship between an S-Tree and a Tessera can be understood from FIG. 6 and FIG. 7. In FIG. 6, parts of the S-Tree (inside the green dotted line) are suitable for sparsification. This means that information that portions of the Surface contain zeros is to be supplied from lower Layers, by suitable choice of Quadtree topology, and thus simplifies the higher Layers.

Decoders will also need to be able to explicitly decode zeros outside the Sparsified Areas, since not all zeros can be sparsified, and the occurrence of potential sparsification within a Bytestream is not compulsory or even always desirable.

For a technical description of the S-Tree abstraction, please see Section 6.1.

For a technical description of the Tessera format of certain S-Trees, please see Section 6.2.

For the packing of Tiers into Surfaces, please see Section 8.3.

For the procedure to decode a Surface by decoding its Tableaux and Tiles, please see Section 8.2.

6 Graph Structures Present in VC Bytestreams

6.1 Surface Abstract Data Type (S-Tree)

An S-Tree is a Quadtree, specifically a Full, Ordered 4-Tree, with a Root, together with an Active Volume, and the number of Children of each node must satisfy specific constraints given in section 6.1.2.

Any S-Tree has three important characteristics: number of Layers, Dimensions Tuple and type of Label attached to those nodes that require Labels (see section 6.1.2). Note: Labels in an S-Tree can have different values but must have the same type.

S-Tree[L, (w,h), sometype] indicates an S-Tree whose characteristics are number of Layers L, Dimensions Tuple (w,h) and Label sometype.

In FIG. 6 below, L is 9. By not showing Labels, the diagram can be used to represent an S-Tree having any Label type. By not showing the Active Volume, the diagram can represent an S-Tree having Dimensions Tuple of (256, 256) or smaller, depending on which nodes in Layer 0 lack Labels in the actual S-Tree.

By not defining the ordering of Sibling Nodes, the diagram does not distinguish between S-Trees with topologies that only differ because of ordering. For a visual representation of an S-Tree which shows exactly how it is an Ordered Tree, it is necessary to have the Sibling Nodes placed horizontally in order, with the first on the left and the last on the right, beneath their parent, as shown in FIG. 7 where the Rise is 4. (Such a representation becomes impractical for S-Trees with a Rise of 8 or more.)

Note: Highlighting all the nodes comprising the Active Volume is not possible in FIG. 7, because in certain Layers there would be nodes in the Active Volume but not in the S-Tree (and therefore excluded from this figure). Such nodes are only found in the Dense Counterpart of the pictured S-Tree. Hence the S-Tree abstraction facilitates compression, via Branches becoming "extinct".

Note: Highlighting nodes in the figure which are not in the Active Volume would be possible in FIG. 7, but only with knowledge of the Dimensions Tuple and the mapping of each Child to an element of the Quadrant Array.

Layer-8 is a single-member set containing the blue node which is the Root of the pictured S-Tree. Layer 0 (the Top Layer of the S-Tree) is the set of all nodes most distant from the Root of the S-Tree.

Altitude of nodes increases according to distance from the Root, from −8 for the Root to 0 for nodes in Layer 0.

Figure 8:
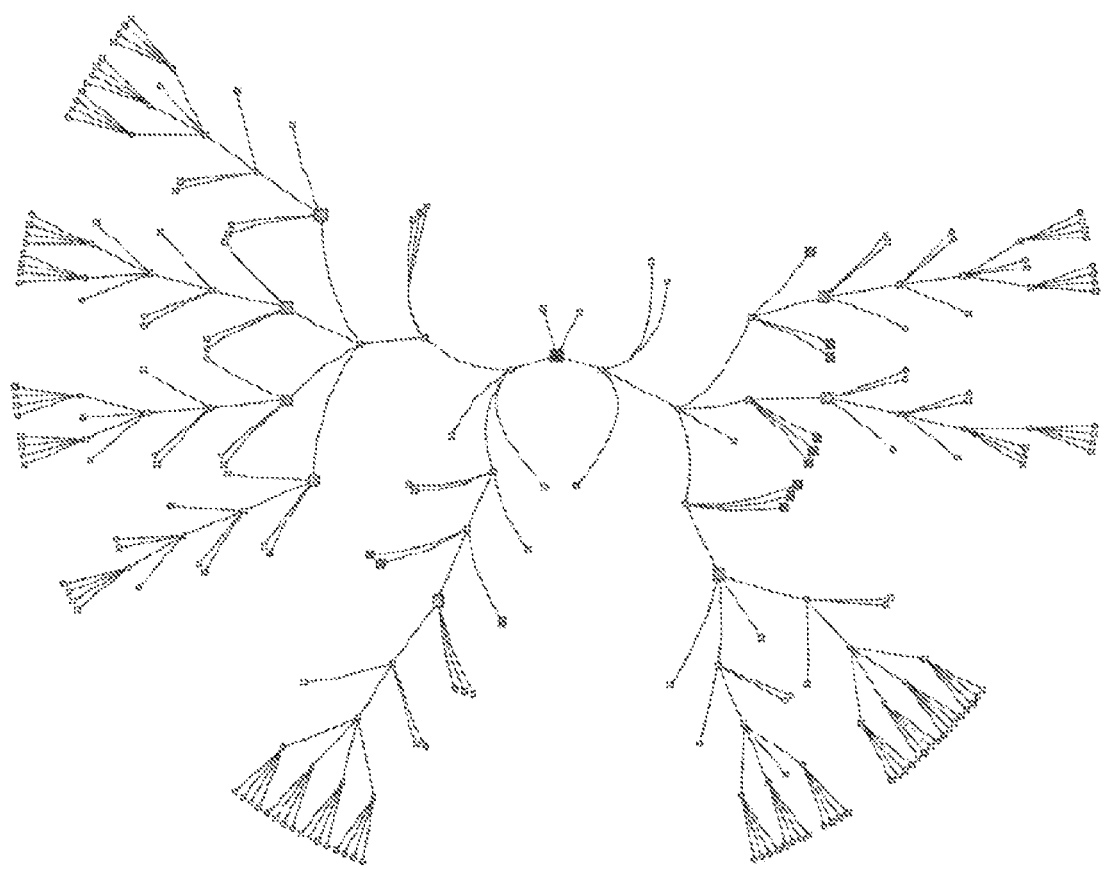
FIG. 8 illustrates an S-Tree.

FIG. 8 An S-Tree of Rise 8. Root is colored blue, Terminal Nodes are green and other Glue Nodes are Red.

We define Altitude of a node in the S-Tree with L Layers as follows: the Root shall be in the Root Layer with Altitude=1-L. Altitude 0 shall be at the Top Layer of the Quadtree where there shall be at least one Leaf.

The Rise of an S-Tree with L Layers shall be L−1, which is the absolute value of the Altitude of the Root.

Section 6.1.1 defines the Active Volume of an S-Tree with more rigor, than in FIG. 6, in terms of a Dense Counterpart of the S-Tree. In this Dense Counterpart, every node above Layer 0 of the Quadtree shall have four Children and every Layer is dense.

Note: Where a multi-Tier S-Tree is represented by a hierarchy of S-Trees, as in FIG. 5, the Active Volume of the multi-Tier S-Tree and the Active Volumes of specific Tesserae are distinct concepts, although they are related.

Note: There will usually be some nodes shown in various Layers of the S-Tree that are not in the Active Volume (even though constraint C4 in section 6.1.2 is satisfied).

6.1.1 Membership of the Active Volume

Note: Active Volume involves the concepts of Dense Counterpart and Summit.

The Summit of an S-Tree shall represent all the nodes of the Top Layer of the Dense Counterpart of the S-Tree. The Summit shall therefore always have dimensions $2^{Rise}$ by $2^{Rise}$, for a given Rise of the S-Tree.

Membership of the Active Volume shall be a test applicable to any node of an S-Tree. Note: There can be nodes in the Active Volume that are absent from the original S-Tree since the Active Volume will be defined in terms of a Dense Counterpart. There can equally be nodes in the original S-Tree that are absent from the Active Volume (although these nodes must have a sibling that is included). The definition of nodes of the Active Volume, below, reflects these two possibilities.

The Active Volume shall have members according to the following rules:
1. A Void S-Tree shall have no nodes in its Active Volume, since L shall be 0 for a Void S-Tree.
2. The Active Volume shall include all nodes in Locations, (x,y), of a Summit, where x<=w and y<=h and (w,h) is the Dimensions Tuple. All other nodes in Layer 0 shall be excluded.
3. The Active Volume shall include every node in lower Layers of the Dense Counterpart, where and that node is an Ancestor of a node satisfying 1. All other nodes in lower Layers shall be excluded.

Note: The contribution of Layer 0 nodes to the Active Volume marks out the top-left portion of the Summit.

Note: The nodes in the Active Volume in Layer-k may be mapped to fill, completely, the top-left portion of a Grid of maximum dimensions $2^{Rise-k}$ by $2^{Rise-k}$, where 0≤k≤Rise.

Note: The filled area dimensions in Layer −k−1 are $(w^{-k}+1)/2$ by $(h^{-k}+1)/2$ where $w^{-k}$ by $h^{-k}$ represents the filled area dimensions in Layer −k and 0≤k<Rise.

6.1.2 Formal Constraints on S-Trees

Constraints shall be referred to as C1 to C10 in the list below.

Six constraints referred to as C1 to C6 define the allowed S-Tree topologies. The constraints referred to as C7 to C8 define the allowed distributions of Labels. Constraint C9 constrains the Active Volume.

The following are all the constraints mentioned in section 6.1:

C1 L−1, the Rise of a non-Void S-Tree, shall be a multiple of 4. This is to facilitate any S-Tree being represented using Tesserae.

C2 L−1, the Rise of a non-Void S-Tree, shall be at least 8, except that, for an S-Tree that is a Tessera, L−1 shall be 4.

C3 Nodes shall have either zero or four Children.

C4 Nodes that are outside the Active Volume shall have no Children.

C5 Nodes at Altitude k that have |k|%4≠1 and have Children, shall have Grandchildren.

C6 Nodes that are at Altitude 0, and that are inside the Active Volume, shall have a Label.

C7 Other Nodes shall have no Label.

C8 In S-Tree[L, (w,h), sometype] the associated Label type shall be sometype.

C9 w and h shall not be greater than $2^{Rise}$.

C10 L shall be 0 for a Void S-Tree.

FIG. 8 depicts an S-Tree of 9 Layers, its Root (i.e. Layer −8) node shown in blue. It will be seen that there are 88 Layer 0 (i.e. Top Layer) nodes in this example.

Note: A single full-resolution, non-sub-sampled Plane of a 1080 by 2650 image will require a larger S-Tree, of 13 Layers, for each live 540 by 1325 Direction. In the Payload of a Bytestream, the Streams associated with such an S-Tree will carry 1 Tessera in Tier-2, up to 18 Tesserae in Tier-1 and up to 2822 Tesserae in Tier 0.

The depiction in FIG. 8 is only informative. Its purpose is to model topological constraints C2, C3, C4 and C8. (To model C7 the Active Volume would have to be given.) The Label required for a Top Layer node within the Active Volume is unmodeled.

Nodes at Layer −4 have been colored in red (Glue Nodes that are not Terminal Nodes) or green (Glue Nodes that are Terminal Nodes) in FIG. 8 depending on whether they are Leaves, to enable easy cross-referencing with FIG. 8 (where each of these colors will represent a particular type of Leaf).

Note: In FIG. 1, the number of Layers, L, is 9 and the Summit has area $2^8$ by $2^8$. The Altitude of the Root is −8. The Altitude of a more distant Node from the Root increases by 1 for each distance increment of 1 more Branch away from the Root.

Each Node of an S-Tree shall be associated with a square area located on the Summit of the S-Tree.

The Root of an S-Tree shall be associated with the square area that is the entire Summit of the S-Tree.

Four Children linked to a Parent S-Tree node shall be associated with the elements of the Quadrant Array. The Child associated with the first element shall be reached by a Depth-First Order Traversal before the second Child etc.

Note: Since the area associated with the Root is $2^{Rise}$ by $2^{Rise}$, the area associated with a Layer k node is $2^{kl}$ by $2^{kl}$.

A Node Label shall be associated with the 1 by 1 area of P-Face of its Node.

FIG. 8 does not show the Labels of the Top Layer nodes. There shall be a type sometype Label for every Top Layer node that is associated with the Active Volume. There shall not be a Label for the remaining Top Layer nodes.

For convenience, we may annotate Branches of the S-Tree with a 0 if they end on a Leaf and a 1 if not, as shown in FIG. 8 (which can be recognized as an S-Tree consisting of only the first 5 Layers of FIG. 8). This annotation of Branches is superfluous to the S-Tree as an abstract data type. In contrast, the node Labels—not depicted—in the Top Layer of the S-Tree, are normative.

6.2 Tessera Data Format 6.2.1 Use of Tesserae (Informative)

Figure 9:
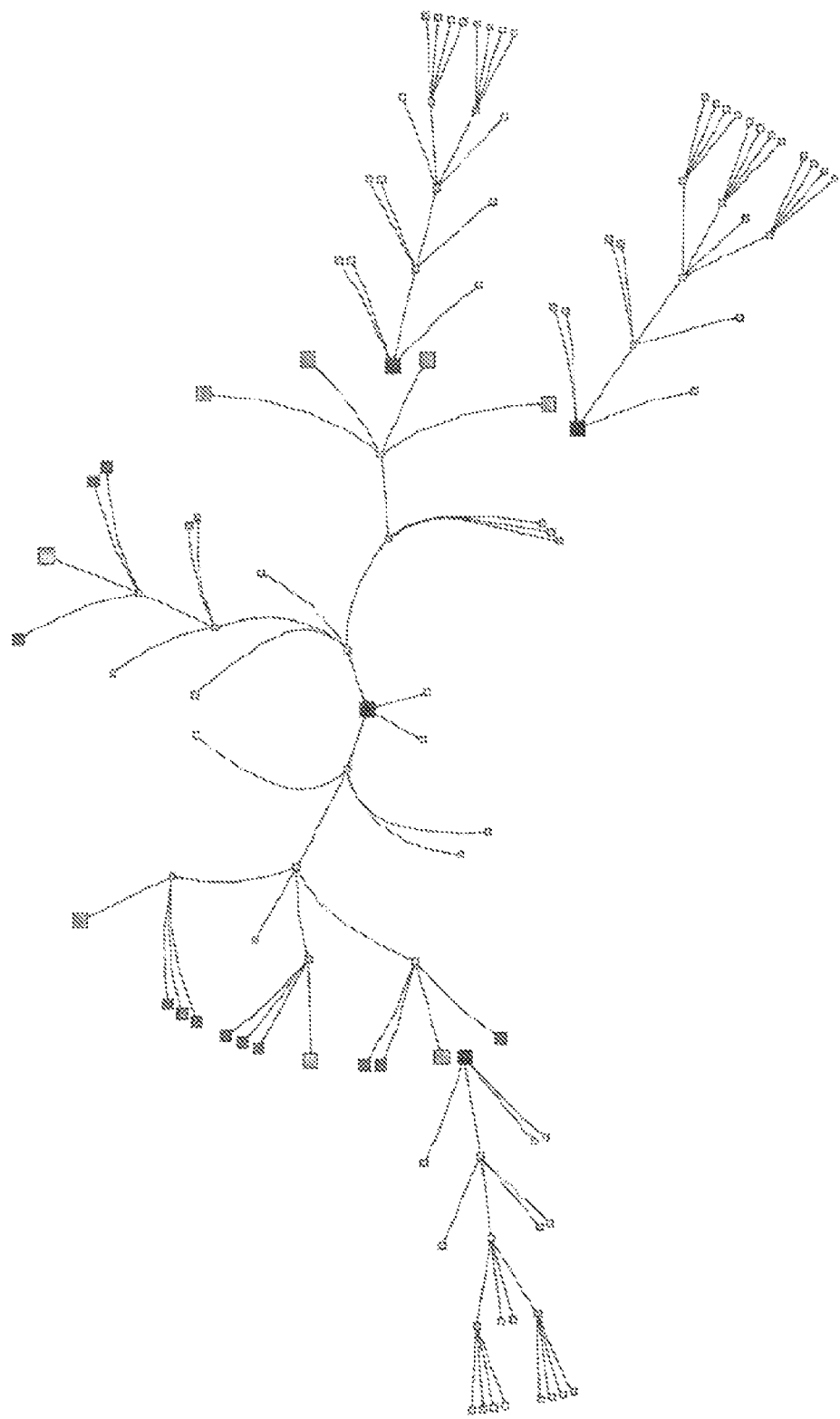
FIG. 9 illustrates an S-Tree.

FIG. 9 Four of 9 Tesserae obtained by cutting the S-Tree of Figure at its Glue Nodes. Roots colored Blue.

FIG. 9 may be cut up into 9 smaller S-Trees, 4 of which are illustrated in Figure. Having a Rise of 4, they might all be represented using Tessera Data Format.

Note that a Tessera, though a concrete format, is still parametric. It can hold Top Layer nodes with Labels of any type. This will be useful when Labels on one Tessera include the StreamLengths of other Tesserae. In FIG. 9, the central Tessera could encode the StreamLengths of the 8 outer Tesserae of FIG. 9.

This means that the StreamLengths and other properties of Tesserae in one Tier are not available until the lower Tiers have been decoded.

Figure 10:
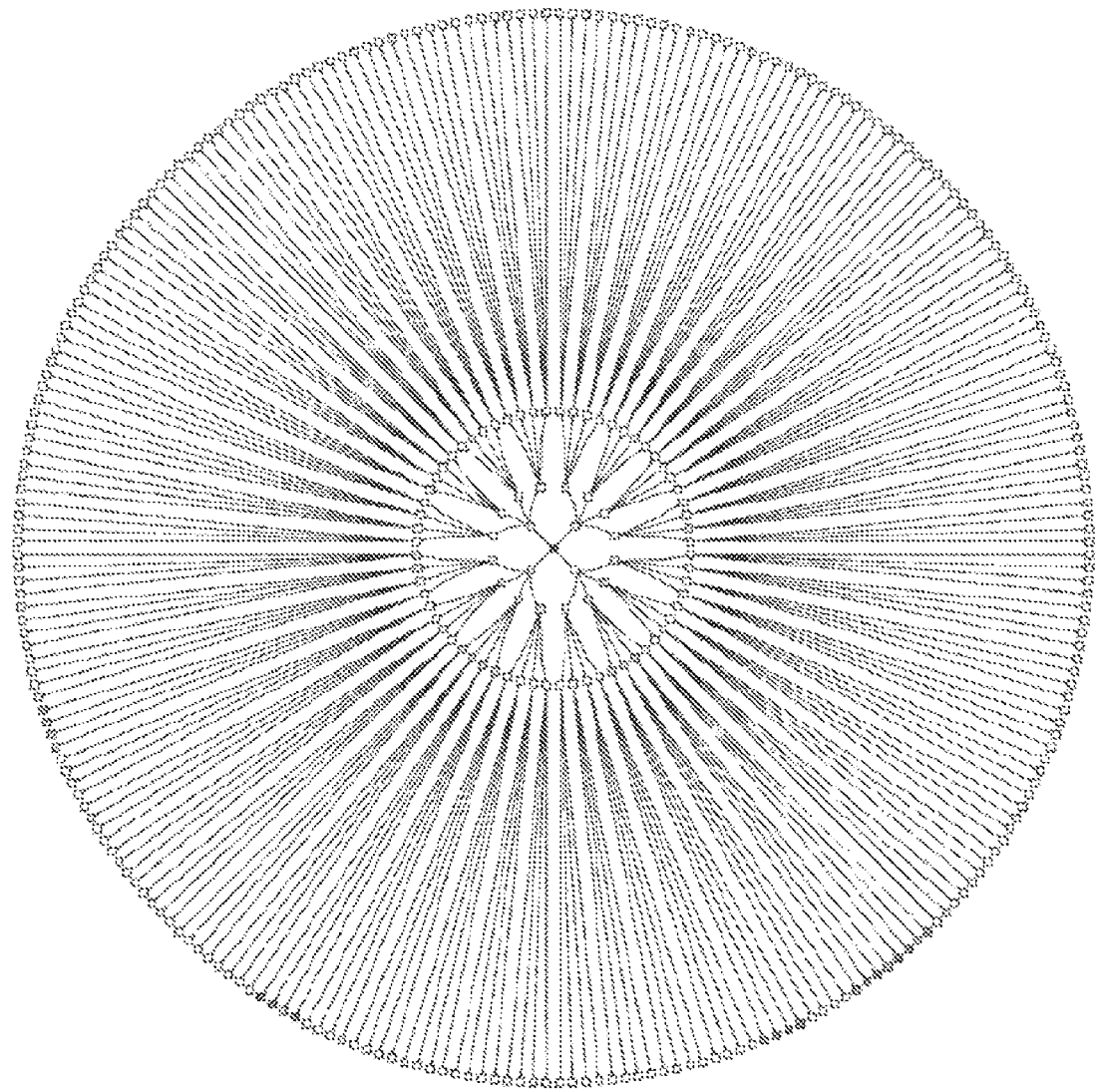
FIG. 10 illustrates a schematic of a Dense Counterpart S-Tree.

FIG. 10 Schematic of a Dense Counterpart S-Tree. The color-filled nodes correspond to the nodes of the central Tessera from FIG. 10. The Branches joining these nodes correspond to the Branches of the Tessera. (The Dense Counterpart of the Tessera includes all 341 depicted nodes and all 340 depicted Branches. To completely picture the Dense Counterpart the unfilled nodes would also be filled in yellow, except for Layer 0 where they would be filled in green.)

Every S-Tree also has an S-Tree as its Dense Counterpart. For example, the Dense Counterpart of the central Tessera of FIG. 10 is shown in FIG. 9. In this schematic depiction it becomes obvious that S-Trees have Layers.

6.2.2 Labels in a Tessera

It is generally not appropriate to define the type or representation of Labels when specifying how abstract data structures shall incorporate Labels. For example, an S-Tree or Tessera has already been introduced as an abstract data type where a node in Layer 0 may have a Label.

The two types of Tesserae having prescribed types of Label shall be Tableaux and Tiles. A combination of Tableaux and Tiles can be used to transmit any S-Tree whose Labels are Residuals. The Labels of the Tableaux signal the occurrence and positioning of Streams in the Bytestream which carry further Tableaux or Tiles. The mechanism is specified in section 8.3.

A Mini-Tree may be derived from any Tessera. This compact 4-Tree has fewer nodes and Branches, because it is not a Quadtree, but has Labels on every node.

6.2.2.1 Mini-Tree Labels

Figure 12:
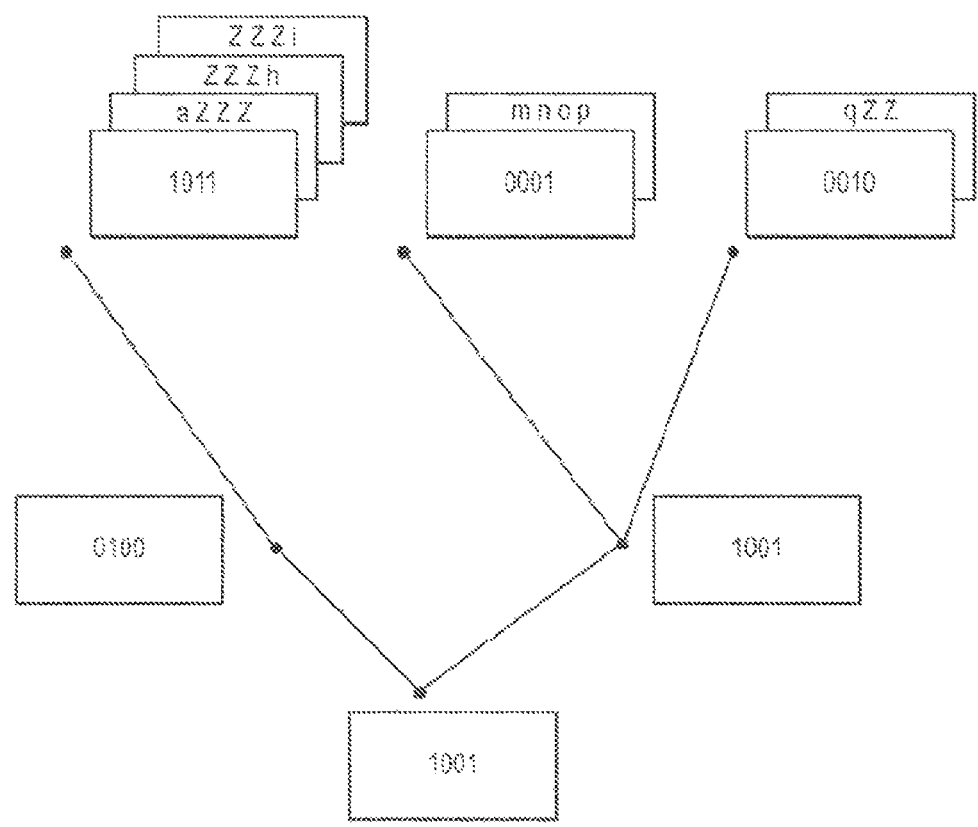
FIG. 12 illustrates a Mini Tree.

The Labels of a possible Mini-Tree are illustrated in FIG. 12. These Labels begin with a T-Node-Symbol associated with a node of the Tessera, followed, in some cases, by values of one or more Labels from Layer 0 of the Tessera.

T-Node-Symbols shall not automatically be Labels, although they may appear in Labels of a Mini-Tree. There are 16 4-bit T-Node-Symbols but one of them, 0000, shall never be present in a Stream. Their interpretation does not depend on Altitude, except that no T-Node-Symbol shall be associated with any Leaf nodes of an S-Tree.

The Labels of a Mini-Tree all include a T-Node-Symbol, but some Leaves of the Mini-Tree also include up to 4 groups of up to 4 Residuals.

6.2.2.2 Tableau Labels

Tableaux are the specific category of S-Tree that has as S-Tree Label a tuple of StreamLengthDifference and T-Set-Index. This tuple type is specified in section 7.4.11.

6.2.2.3 Tile Labels

Tiles are the specific category of S-Tree that has a Residual as S-Tree Label, as specified in section 7.4.13.

6.2.3 Representation of a Tessera

A Tessera shall be a concrete data format for the abstract S-Tree[5, (wt, ht), sometype] where, according to the previous section, wt by ht, the Tessera's internally active Dimensions Tuple, shall not be greater than $2^4$ by $2^4$, which is the area of the Tessera's corresponding Summit.

We do not specify the choice or format of sometype here, simply the way it could be decomposed from the composite Tessera data format.

Figure 11:
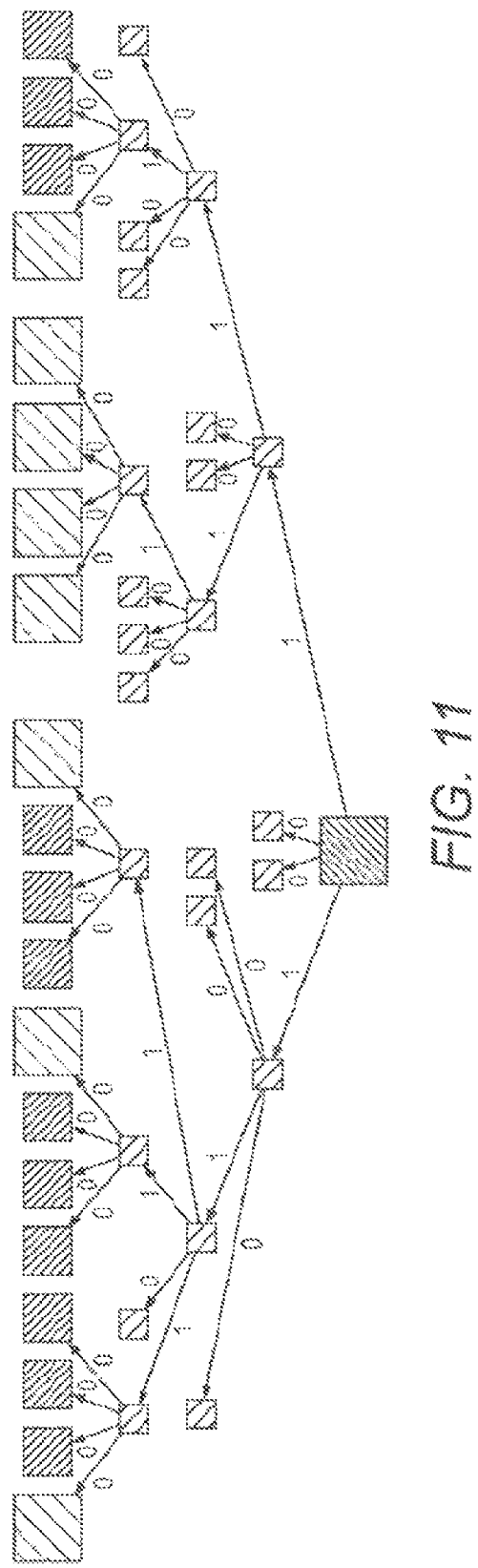
FIG. 11 illustrates a central Tessera.

FIG. 11 The central Tessera from FIG. 11, laid out to show the Altitude and the ordering of children (from left to right) as well as the Sparsity Structure. Branches leading to a Leaf are annotated with a 0, whilst those with children are annotated 1. Altitude of the Root of a Tessera is defined as −4. Labels always required on the red nodes and generally required on the green nodes (depending on the Active Volume) are not included.

An example of a Tessera with 20 Top Layer Leaves is shown in FIG. 11. Of these 20 nodes, 8 (shown in red) shall have a Label. The remaining 12 (shown in green) also shall have a Label if they are within the Tessera's Active Volume. The Root node and the Top Layer Leaves shall not be T-Nodes. According to the definition of T-Node, of the other 24 nodes (shown in yellow), 11 shall be T-Nodes.

For this Tessera the Sparsity Structure of the central S-Tree in FIG. 11 has been copied precisely. The structured layout mirrors the fact that a Tessera, unlike an S-Tree, shall have a concrete representation as a Tessera data structure.

The entire Sparsity Structure of a Tessera shall be coded using T-Nodes and their associated T-Node-Symbols (see section 6.2.4). The Sparsity Structure, as we see later in this section, shall be defined in its own, simpler, Mini Tree with T-Nodes used as nodes and T-Node-Symbols used as Labels.

Every node of the Mini-Tree shall have a Label.

Layer −4 (i.e. the Root) of a Tessera shall take no space in the format as it shall be implicitly known that the Root of the Tessera exists.

The Mini-Tree shall have the Root node of the Tessera as its Root and shall have Inner T-Nodes of the Tessera as the Descendents of the Root.

In the Mini-Tree, the Root shall have the associated T-Node-Symbol as Label.

In the Mini-Tree, the Root shall have at least one Child and the number of Children shall be the number of 1-valued bits in the T-Node-Symbol of the Root.

The Label of the Root shall be the T-Node-Symbol of the Root.

In the Mini-Tree, a Grandchild of the Root shall have at least 1 Child and the number of Children shall be the number of 1-valued bits in the T-Node-Symbol of the Grandchild of the Root. The Label of a Grandchild shall be a concatenation of two parts.

The first part of this concatenation shall be the T-Node-Symbol of the Grandchild.

In the Mini-Tree, the second part of the Label of a Layer −2 Inner T-Node shall be a list of up to 16 values. This list shall consist of copies of the values of all Labels attached, in the original Tessera, to Grandchildren of that Inner T-Node.

The accumulated topology from Root to Layer −3 shall take exactly 1 node; extension to Layer −3 shall take from 1 to 4 T-Nodes, and further extension to Layer −2 shall take from 1 to 16 T-Nodes. We refer to the T-Nodes in such cases as Layer −3 and Layer −2 Inner T-Nodes.

In FIG. 11, in accordance with the definition of T-Node-Symbol in section 6.2.4, the Layer −3 T-Node-Symbol shall be 1001, the Layer −2 T-Node-Symbols shall be 0100 and 1001 and the Layer −1 T-Node-Symbols shall all be 0000.

Note: It is apparent from edge annotations of FIG. 11 that there is no reason to include Layer −1 T-Nodes (i.e. Data T-Nodes) in the Mini-Tree, because knowledge of the lower Layers is sufficient to deduce the Top Layer (but not, of course, its node Labels). Recall that red and green node colors (Top Layer only) and the 1-bit edge annotations in FIG. 11 are not Labels and are for explanatory purposes only.

In the context of a Tessera, Layer −3 and Layer −2 T-Nodes shall be known as Inner T-Nodes, whereas Layer −1 T-Nodes shall be known as Data T-nodes.

A Mini Tree shall be a simpler 4 Layer inverted 4-Tree that need not be a Quadtree. A Mini Tree shall be used to encode a Tessera. Note: S-Trees are not intended to be directly encoded.

The nodes of the Mini Tree for a Tessera shall correspond to the Root node and Inner T-Nodes of the Tessera.

The Layer −3 T-Node of the Tessera shall be the Root of the Mini Tree, followed by the Inner T-Nodes above its Root. The Tessera's Data T-Nodes shall not be in the Mini-Tree but the values of their Labels shall be included in the Labels of the Top Layer of the Mini-Tree.

All nodes in the Mini Tree shall have Labels.

Each Inner T-Node shall have the associated T-Node-Symbol as Label.

Each Data T-Node shall have two parts to its Label. The first part is a 4-bit code indicating what is included in the second part of the Label. The second part is the list of only those sometype Labels that were (in the original S-Tree of the Tessera) on the Layer 0 Leaves associated with that T-Node.

FIG. 12 An example of a Mini-Tree. The Root's Label is shown on a blue background. Its value is the T-Node-Symbol for the Root of the original Tessera shown in FIG. 12. The other Labels are on the Inner T-Nodes taken from Layer −3 and Layer −2 of the original Tessera-their T-Node_Symbols are shown on a yellow background. Note that the Layer −2 Inner T-Nodes have additional values appended to their Label following a T-Node-Symbol. Letters in red or a capital Z refer to 19 of the 20 Top Layer nodes in FIG. 12. A capital Z signifies an appended value of 0, representing a Terminal Node. A letter in red is only shown where its corresponding Top Layer node is a Connective Node.

FIG. 12 shows a Mini Tree corresponding to FIG. 11. Letters a to s shall correspond to the values of Labels of the first 19 Top Layer nodes from left to right in FIG. 11, where the $20^{th}$ of the Top Layer nodes is assumed for illustration to be a Terminal Node outside the Active Volume. A capital Z has been written in place of a red letter if the corresponding Glue Node in FIG. 12 is a Terminal Node. No letter is needed for a Terminal Node without Label (e.g. the $20^{th}$ node, which is outside the Active Volume).

Note: The data format known as the Expanded Picture Specification (EPS) is given in Section 7.4. Within it there is a Depth-First Pre-Order Traversal of the Labels of each Tessera's Mini-Tree. The pictured Mini-Tree illustrates how efficiently one typical Tile or Tableau could fit into the EPS.

6.2.4 T-Nodes

Root node and Inner T-Nodes shall be labelled with their T-Node-Symbol, which is a 4-bit code.

Data T-Nodes shall each be labelled with a 4-bit code which shall not be a T-Node-Symbol and with up to 16 values of sometype, depending on the node's specific 4-bit code and upon the Active Volume of the Tessera.

The position of every T-Node shall be a position in the Active Volume of the Tessera.

7 VC Syntax Definition

The Expanded Picture Structure (see section 7.4 below), refers to the fact that it is defined in its fully expanded form. Via the definition of so called Shortcuts (see section 7.5), equivalent transformations can be applied on the graph, allowing certain simplifications.

7.1 Overview (Informative)

Attributes specify how a Tessera must be treated by a decoder.

The actual choice of attributes of a Tessera is described by the Tessera's T-Set-Index (see section 7.2). The T-Set-Index identifies a Tableau-set or Tile-set, as appropriate (see sections 7.4.2 and 7.4.3).

The Root Tableau is exceptional in that its T-Set-Index does not come from some Leaf of a lower Tier.

The T-Set-Index can differ between different sets of Tesserae. A Tile-set can contain Tiles from Tier 0 of some or all Surfaces in some or all LoQs. A Tableau-set can contain Tableaux from some or all of the higher Tiers of some or all Surfaces in some or all LoQs.

7.2 Headers, TableauSets and TileSets

The fixed-size header and the two variable-sized headers are defined in sections 7.4.5 to 7.4.7. Note that Variable-Size Header 1 may end with an auxiliary header, which the decoder ignores.

Variable-Size Header 2 contains arrays of Attributes, containing possible ResidualStatistics, NodeStatistics, QuantizationParameters, StreamLengthDifferenceStatistics and auxiliary Attributes of a Tessera.

Tile-sets and Tableau-sets shall include the indices for each of the Attributes listed in the corresponding sections of the EPS (see sections 7.4.2 and 7.4.3). When decoding a part 1 conformant Bytestream, the indices shall be smaller than the corresponding elements of nums_attribute.

A part 1 conformant Bytestream may have num_aux_tile__attributes Auxiliary attributes in Variable-Size Header 2 and then shall have Tile-sets and Tableau-sets that include the indices for each of these Attributes. The indices shall not affect the decoding of Tesserae in a part 1 conformant decoder and need not be smaller than num_aux_tile_attributes.

The T-Set-Index needed to decode the Root Tableau shall come from root_tableauset_indices in Variable-Size Header 2.

The T-Set-Index needed to decode a Tessera in a higher Tier, Tier −t, where −t<0, shall come from a Leaf of the lower Tier, Tier −t−1.

A set of Tiles where each Tile has the same T-Set-Index shall be called a Tile-set and a set of Tableaux where each Tableau has the same T-Set-Index shall be called a Tableau-set.

Apart from the T-Set-Index used in the Root Tier of a Surface, T-Set-Indices shall be obtained by decoding Tableaux. The Labels at the Top Layer of the Root Tableau shall be decoded to give tuples of (Streamlength, T-Set-Index) as shown in section. Each resulting T-Set-Index shall be the T-Set-Index for decoding a Tessera in the next (higher) Tier. The same method of determining and using T-Set-Indices shall be used with all Top Layers until the Top Layer of Tier −1.

To decode the T-Set-Index from a Label the decoder shall not use an Attribute of the Tessera.

The decoder shall instead use a Statistics that is not an Attribute, namely an IndexDifferenceStatistics.

IndexDifferenceStatistics can be cdf_tilesets or cdf_tableausets. Note: These Statistics do not specialize the decoding of T-Set-Indices of individual Tesserae, because they are fixed for the decoding of an entire Picture.

In Section 8.2, IndexDifferenceStatistics shall refer to the appropriate one of these two attributes, depending on which Tableau Tier is being decoded. For Tier −1, cdf_tableausets should be used, and for lower Tiers cdf_tilesets should be used.

For each Tessera being decoded where the T-Set-Index has some non-negative integer value, ts, the decoder shall select the actual attributes of a Tessera from the arrays of Tile-Sets or TableauSets in Variable-Size Header 2. For example, from section 7.4.7 in the Expanded Picture Specification, it can be recognized that quantization_parameters [tilesets[2][indx]] would give a particular choice of quantization and stream_length_stats[tableausets[0][indx]] would give a particular choice of StreamLengthDifferenceStatistics.

Note: These attributes, when applied to the payload, permit decoding of each Tableau or Tile in the next Tier due to be Grafted.

The effects of Shortcuts are indicated below as superscript index numbers, where each index number refers to a particular Shortcut. For example "Statistics[4]" indicates shortcut #4 in section 7.5.2.4.

7.3 VC Types
7.3.1 Elementary Types

[u]intn: shall be an n bit [unsigned] integer. For example, uint8 is an 8-bit unsigned integer.

mantissan: shall be n fractional bits of a number between 0 and $1-(0.5)^n$. For example, the mantissa4 value 0101 represents 0.3125.

Where a byte of the Bytestream contains data associated with more than one elementary item, data associated with a second item shall be contained in bits of less significance than data associated with a first item.

Where an item has a length of more than one byte, the less significant bytes of the item shall be contained in more significant bits of the Bytestream. Bits of decreasing significance in a single byte of an item shall be contained in bits of decreasing significance in the Bytestream.

For example, where an int11 value followed by an int9 value followed by an int4 value are read from a Bytestream represented by the symbols in table q, the resulting items in binary shall be represented by $a_x\ b_x\ c_x\ d_x\ e_x\ f_x\ g_x\ h_x\ i_x\ j_x\ k_x$, by $a_y\ b_y\ c_y\ d_y\ e_y\ f_y\ g_y\ h_y\ i_y$, and by $a_z\ b_z\ c_z\ d_z$, respectively.

TABLE 7-1

Layout of bits in a Bytestream, illustrating the case of an 11-bit type followed by a 9-bit type followed by a 4-bit type. Each name stands for a digit 0 or 1. For example the subscript y refers to the second type (int9) and $d_y$ stands for the 4th most significant bit in its binary value.

| Position in bytestream | Most Significant Bit | | | | | | | Least Significant Bit |
|---|---|---|---|---|---|---|---|---|
| First byte | $d_x$ | $e_x$ | $f_x$ | $g_x$ | $h_x$ | $i_x$ | $j_x$ | $k_x$ |
| Second byte | $a_x$ | $b_x$ | $c_x$ | $b_y$ | $c_y$ | $d_y$ | $e_y$ | $f_y$ |
| Third byte | $g_y$ | $h_y$ | $i_y$ | $a_y$ | $a_z$ | $b_z$ | $c_z$ | $f_z$ |

7.3.2 Complex Types type[n]: a vector of n elements of a given type, the rightmost index nm of type[n0] . . . [nm] shall be the major index. For example, uint8[3] represents a vector of 3 elements of type 8 bit unsigned integer.

The element of a vector corresponding to the index 0 shall come first in the Bytestream.

tuple (type0, . . . typen): shall be a record of elements of the corresponding type. For example, tuple (mantissa4, uint8) represents a tuple with first element of type mantissa4 and second element of type uint8.

The first element of a tuple shall come first in the Bytestream.

7.3.3 Template Types template<type_parameter>: template instantiation defines a new type where the type parameter is substituted with its corresponding type argument

7.4 VC Expanded Picture Structure (EPS)
7.4.1 Implicit Types
7.4.1.1 Element Type type element_t:uint1[element_descriptor[0]+element_descriptor[1]]

The size of the elements shall be known from the element_descriptor in the header.

7.4.1.2 Residual Type type residual_t:uint1[1+element_descriptor[0]+element_descriptor[1]+2]

The Residuals shall be signed and the Residual type shall be at least 1 bit bigger than the Residuals as they need to be able to hold differences of elements.

7.4.1.3 Stepwidth Type type stepwidth_t:uint1[element_descriptor[0]+element_descriptor[1]+2]

This shall be the unsigned variant of the Residual type.

7.4.1.4 Attribute Index Type type attribute_index_t:uint1[⌈log 2(max(nums_attributes[0], . . . , num_attributes[4+num_aux_tile_attributes+num_aux_tableau_attributes−1))⌉]

This shall be the unsigned type capable of holding even the most numerous attribute's indices.

7.4.1.5 TableauSet Index Type type tableauset_index_t:uint1[1+⌈log 2(num_tableauset)⌉]

This shall be the unsigned type capable of holding the indices of Tableau-sets, as well as differences of Tableau-set indices.

7.4.1.6 TileSet Index Type type tileset_index_t:uint1[1+⌈log 2(num_tileset)⌉]

This shall be the unsigned type capable of holding the indices of Tile-sets, as well as differences of Tile-set indices.

7.4.1.7 StreamLength Type

The constant of maximum_stream_length shall be defined as: 1+⌈log 2(84+256*(1+element_descriptor[1]+element_descriptor[2]+2)/8.0)⌉.

type stream_length_t:int1 [maximum_stream_length]

This shall be the signed type capable of storing both the lengths of Streams and the difference of two Stream lengths. The maximum Stream length is based on the uncompressed maximum size of a Tessera. Every Stream in a conformant Bytestream shall be no longer than maximum_stream_length.

7.4.1.8 Root StreamOffset Type type root_stream_offset_t:uint1[⌈log 2(picture_size)⌉]

This shall be the unsigned type capable of storing the offsets of each root tessera.

7.4.2 List of TileSet Attributes

The 3 non-auxiliary attributes of a Tileset shall be:
Residual Statistics
T-Node Statistics[4]
Quantization Parameters[3]

7.4.2.1 Line-Segments CDF[15]

type line_segments_cdf15_t<x_axis_type>:tuple(mantissa16[14], x_axis_type[16])

This shall be a tuple containing a vector of CDF and joint point of line segments respectively. 15 line segments shall exist, the first (0.0) and the last (1.0) CDF values shall be implicit.

If there are fewer than 15 line segments in use, the vector shall be padded to the left.

7.4.2.2 Residual Statistics type residual_stat_t:line_segments_cdf15_t<residual_t> or uint16[1,5,6,8]

See the definition of the layout under Line-Segment CDF[15] in section 7.4.2.1.

If Pre-Computed Residual statistics are enabled along with Tile-set Bypassing, this type shall be redefined to hold indices pointing to the pre-computed array of tuples.

7.4.2.3 T-Node Statistics type tnode_stat_t:mantissa8[6]

This shall be a vector containing fractional bits representing the CDF over a compressed histogram where the 7 bins represent the number of "active" bits, and breaking down more populated bins. Within each bin, the probability of each symbol shall be assumed to be equal.

7.4.2.4 Quantization Parameters type quantization_parameters_t:tuple (stepwidth_t, residual_t)

This shall be a tuple containing the stepwidth and the dequantization offset. This latter shall be used for precise dequantization.

7.4.3 List of Tableau-set Attributes

The 2 non-auxiliary Attributes of a Tableau-set shall be:

StreamLength Statistics

T-Node Statistics[4]

7.4.3.1 StreamLength Statistics type stream_length_stat_t: line_segments_cdf15_t<stream_length_t>

See the definition of the layout under Line-Segment CDF[15] in section 7.4.2.1.

Note: this also enables the same functional block to be re-used for decoding both Tableaux and Tiles with some parametrization.

7.4.3.2 T-Node Statistics

The same type as for Tile-set's T-Nodes, see section 7.4.2.3, above. The attribute array is shared accordingly.

7.4.4 Order of Header Fields and Streams in the Bytestream

The data in the Bytestream shall be as follows:

All Fields in the Fixed-Size-Header, followed by

All Fields in the Variable-Sized Header 1, followed by

All Fields in the Variable-Sized Header 2, followed by

All Streams in the Payload.

In sections 7.4.5 to 7.4.7, the fields in the three Headers shall be defined. The order of the fields of a Header in the Bytestream shall be the order in which they shall be defined in sections 7.4.5 to 7.4.7.

7.4.5 Fixed-Size Header

Format Version shall be format_version:uint8

Picture Size in Bytes shall be picture_size:uint32

Recommended Fetch Size in Bytes

This shall be at least as big as the sum of header sizes, and at most as big as the entire picture.

recommended_fetch_size:uint32

Element Interpretation

Shall inform the user about the interpretation of the elements. As of VC Part 1, it can only be zero, which means that the interpretation is not specified.

element_interpretation:uint8

The element_interpretation values shall be interpreted according to Table 7-3:

TABLE 7-2

Values of the element_interpretation field.

| element_interpretation value (in decimal) | Element interpretation |
|---|---|
| 0 | User defined |
| 1-127 | Reserved |
| 128-255 | Forbidden |

Pipeline Bitvector

Changes shall be made as follows, compared to the default transformation and processing pipeline:

Integer Composition Transform (Bit 1)

If this bit is set, the integer version of the Composition transform shall be used, otherwise the standard version shall be used.

Reserved Bits: 2 to 8 pipeline:uint8

Upsampler

The first 128 values of this field shall be either defined upsamplers of this standard or shall be reserved for future use.

The last 128 values of this field shall be forbidden to be used.

upsampler:uint8

The upsampler values shall be interpreted according to Table 7-3:

TABLE 7-3

Meanings of upsampler values

| upsampler value (in decimal) | Upsampler Description |
|---|---|
| 0 | Nearest Neighbour |
| 1 | Sharp |
| 2 | Bicubic |
| 3-31 | Reserved |
| 32 | Standard 16-8-3 CNN |
| 33-127 | Reserved |
| 128-255 | Forbidden |

Shortcut Bitvector shall be shortcuts:shortcuts_t

Element Descriptor (integer+ fractional bits) shall be element_descriptor:tuple (uint5, uint3)

Number of Planes shall be num_plane:uint8

Auxiliary Header Size in Bytes shall be aux_header_size:uint16

Number of Auxiliary Attributes shall be num_aux_tile_attribute:uint4 num_aux_tableau_attribute:uint4

7.4.6 Variable-Sized Header 1

Size of Auxiliary Attributes (per each per Attribute in bits) shall be aux_attribute_sizes:uint16 [num_aux_tile_attribute+num_aux_tableau_attribute]

Numbers of Attributes (per each)[1] shall be nums_attribute:uint16[4[1,3,5,6,8]+num_aux_tile_attribute+num_aux_tableau_attribute]

Number of Tile-sets[2] shall be num_tileset:uint16

Number of Tableau-sets shall be
  num_tableauset:uint16
Width of Planes shall be
  widths:uint16 [num_plane]
Height of Planes shall be
  heights:uint16 [num_plane]
Number of LoQs per Plane (6 at 1080p, scales accordingly) shall be
  num_loqs:uint8 [num_plane]
Auxiliary Header shall be
  aux_header:uint8 [aux_header_size]

7.4.7 Variable-Sized Header 2

Arrays of Attributes (per each) shall be
  residual_stats:residual_stat_t[nums_attribute[0]]$^{1,5}$
  tnode_stats:tnode_stat_t[nums_attribute[1]]
  quantization_parameters:quantization_parameters_t
    [nums_attribute[2]]$^3$
  stream_length_stats:stream_length_stat_t[nums_attribute[3]]$^{6,8}$
  aux_attributes:uint1[aux_attributes_size[i]][num_aux_tile_attribute+num_aux_tableau_attribute]
Array of Tile-sets shall be
Tile-set Attribute Indices (per each)$^{1,3,5}$
  tilesets:attribute_index_t[3$^{1,3,5}$+num_aux_tile_attributes]
    [num_tile_set]
Array of Cumulative Distribution of Tile-sets$^2$ shall be
  cdf_tilesets:line_segments_cdf15_t<tileset_index_t>
Array of Tableau-sets shall be
Tableau-set Attribute Indices (per each)$^{6,8}$
  tableausets:
  attribute_index_t[2$^{6,8}$+num_aux_tableau_attribute]
    [num_tableau_set]
Array of Root TableauSet Indices$^7$ shall be
(Bit 15 of any Tableau-set Index, or indeed Tile-set Index, is unused)
  root_tableauset_indices$^7$: tableauset_index_t[loq_idx]
    [num_planes][4]
Array of Cumulative Distribution of Tableau-sets$^7$ shall be
  cdf_tableausets:
    line_segments_cdf15_t<tableauset_index_t>
Array of Root StreamOffsets shall be
  root_stream_offsets:root_stream_offset_t[loq_idx][num_planes][4]
Array of Root Streamlengths shall be
  root_stream_lengths:stream_length_t[loq_idx][num_planes][4]
Padding at end of variable-sized header 2
  Where the combined size of the all the arrays in section 7.4.7 is not a multiple of 8 bits, arbitrary bits of padding shall be read after the last array in Variable-sized header 2 in the Bytestream until the combined size of arrays plus padding shall first reach a multiple of 8 bits.

7.4.8 Directions

A, H, V or D shall be the Directions allowed in the EPS. The Payload (see section7.4.10) shall contain quantized ResidualSurfaces for each Direction. When the prefixed names dqA, dqH, dqV and dqD appear elsewhere in this standard, these will refer to de-quantized versions of these Surfaces.

7.4.9 Streams

The logical structure of a Payload is an array of multi-tiered Tableaux, which precedes the Tile Tier with Tiles containing Residuals at their Top Layer.

The data in the Payload that represents a Tessera shall be a Stream. Streams are ordered by LoQ, then by Plane, then by direction and then by Tier. Such ordering is a first step towards a low-latency design.

The initial Surface shall be the Initial LoQ, initial Plane, A Direction and lowest Tier.

The ordering of a Tessera's children in the Bytestream shall be defined by the Tessera's Stream, whether it is a Tableau or a Tile.

This ordering shall be used to derive offsets from StreamLengths throughout the decoding process.

A Stream shall contain, after its compressed Tessera data, some arbitrary bits before the end of the Stream. Hence the total compressed picture size shall be an integer number of bytes.

7.4.10 Payload

A Surface shall be live if it has a non-zero root_tableau_length (see section 7.4.7). Only live Surfaces shall appear in the Payload. Every Residual shall be zero in any Surface that is not live.

At the start of the Payload shall be the Stream for the Root Tableau of the first live Surface.

A Tile followed by a Tableau shall mean that the Tile is the last one in a live Surface and that the Tableau shall be the Root Tableau of the following live Surface At the end of the Payload shall be the Stream for the last Tile of the final live Surface.

7.4.11 Tessera

Streams represent Tesserae and shall be decoded to sequences of entries, where each entry may be a T-Node symbol or a tuple for Layer 0 Leaves, whose type is a parameter of the Tessera. Note: such tuple may have a size of 1, depending on the shortcuts activated.

The entries of the Streams shall be ordered accordingly to a Depth-First Pre-Order Traversal of the Tessera.

A Tessera's Rise shall be 4, hence a Tessera's Summit shall always be 16×16. Note: there can be no entries outside the Active Volume.

The notation of seqT(entrytype1; ... ; entrytypen) shall be designated to mean a Tessera's representation as described in this section.

The notation {range encoded} occurring after a type of an entry shall denote that the entry must first be range decoded.

7.4.12 Tableau

Where the corresponding shortcuts of 1 and 6 are not activated, Tableaux shall hold indices of either Tile-set indices or Tableau-set indices depending on the type of the subsequent Tier. Hence, the Tier −1 Tableaux and only those Tableaux shall store Tile-set Indices.

Tableau (subsequently followed by a Tier of Tiles) shall be:
  seqT(tnode_t{range encoded}$^4$; (streamlength_t{range encoded}, tileset_idx: tileset_index_t{range encoded}$^1$))

Tableau (subsequently followed by a Tier of Tableaux) shall be:
  seqT(tnode_t{range encoded}$^4$; (streamlength_t{range encoded}, tableauset_idx: tableuset_index_t{range encoded}$^6$))

The StreamLengths and Tile-set Indices shall be stored as differences from the closest preceding StreamLength and Tile-set or Tableau-set Index of the Tile.

Empty Tiles (of size 0) shall have no TileSet index associated with them.

Empty Tableaux (of size 0) shall have no TableauSet index associated with them either.

The StreamLength shall always correspond to the size of the Children, regardless of whether a Tile or a Tableau.

7.4.13 Tile

Tile shall be:

seqT(tnode_t{range encoded}[4];
(residual_t{range_encoded}))

7.5 VC Shortcut Bitvector Definitions

7.5.1 Enabling of Shortcuts

The Shortcut Bitvector shall be:

type shortcuts_t:uint1[16]

This Bitvector shall enable or disable transformation rules (called shortcuts) which shall be applied on the Expanded Picture Structure to change it. In previous sub-sections, the entries of every structures affected by each bit are highlighted with superscript numbers of the particular bit, as discussed in section 7.2.

The Shortcut Bitvector shall be indexed starting from 1, stored in little-endian order.

Every VC decoder shall support every possible configuration of this vector, leaving this setting as primarily a rate-control decision.

7.5.2 Effects of Shortcuts on the EPS

7.5.2.1 TileSet Bypassing (Bit 1)

If this bit is set, the length of every array of Attributes shall be equal to the number of TileSets, creating a one-to-one relationship between Tile-sets and Attributes.

Counters shall be omitted so that only the number of Tile-sets remains, just as indices from Tile-sets shall be omitted as those would be equal to the index of the Tile-set itself.

7.5.2.2 Static Tile-set Allocation (Bit 2)

This bit shall not be set unless Tile-set bypassing is enabled.

If this bit is set, it means that there shall be exactly one Tile-set associated with each direction of each LoQ of each Plane.

Note: Tile-set indices are omitted, as they could be calculated from the Plane index, the LoQ index and the direction index. Cumulative distribution of these non-existent indices is also omitted.

7.5.2.3 Quantization Disabled (Bit 3)

If this bit is set, it means that the Residuals shall not be quantized, and integer Composition shall be used instead of standard Composition.

As a result, the number of quantization parameters as well as their array and any related indices shall be omitted.

7.5.2.4 Dense Quadtree (Bit 4)

If this bit is set, it means that sparse Tree optimizations shall not be enabled.

As a result, the number of T-Node statistics as well as their array and any related indices shall be omitted from Tiles. Additionally, Tableaux and Tiles shall no longer contain T-Nodes.

The z-order of the Residuals and StreamLengths shall still be kept so that the other systems shall not change.

7.5.2.5 Pre-Computed Residual Statistics (Bit 5) [Reserved]

If this bit is set, it means that there shall be no transmitted Residual Statistics.

As a result, the residual_stats vector and its size should be omitted.

If Tile-set Bypassing is also enabled at the same time, then the residual_stats vector shall be kept, but it shall contain Residual Statistic indices instead of Residual Statistics.

7.5.2.6 TableauSet Bypassing (Bit 6)

If this bit is set, the length of every array of Attributes shall be equal to the number of Tableau-Sets, creating a one-to-one relationship between Tableau-sets and Attributes.

Counters shall be omitted so that only the number of Tableau-sets remains, just as indices from Tableau-sets shall be omitted as those would be equal to the index of the Tableau-set itself.

7.5.2.7 Static Tableau-Set Allocation (Bit 7)

This bit shall not be set unless Tableau-set bypassing is enabled.

If this bit is set, it means that there shall be exactly one Tableau-set associated with each direction of each Tier (except Tile Tier) of each LoQ of each Plane.

Tableau-set indices shall be omitted, as they could be calculated from the Plane index, the LoQ index, the Tier and the Direction index.

Root Tableau-set indices shall be omitted.

Cumulative distribution of these non-existent indices shall be omitted.

7.5.2.8 Pre-Computed StreamLength Statistics (Bit 8) [Reserved]

If this bit is set, it means that there shall be no transmitted StreamLength statistics.

As a result, the stream_length_stats vector and its size should be omitted.

If Tableau-set Bypassing is also enabled at the same time, then the stream_length_stats vector shall be kept, but it shall contain StreamLength statistic indices instead of StreamLength statistics.

7.5.3 Additional Transformation Rules to Apply for Combinations

7.5.3.1 Shared Attributes

For Attributes shared between Tableaux and Tiles (T-Node statistics is the only Attribute in this document), when applying the bypassing and/or static allocation rules, the shared Attributes' arrays shall be considered as a concatenation of two separate arrays, either or both of which may be empty.

In such concatenation, the entries related to Tiles shall preceed the entries related to Tableaux.

Example: assuming static Tableau-set allocation is enabled, but for Tile-sets only Tile-set bypassing, the tnode_stats will contain as many elements as we have Surfaces, so that the one-to-one relationship is obeyed.

8 VC Decoding Process

8.1 Levels of Conformance According to Decoder Stratification

Three successive strata of decoding will be developed in the following sections.

This document specifies an exact milestone that shall be achieved upon completion of each stage.

A partially conformant decoder could be created that follows the standard for the first stratum only, or for the first two strata only. The remaining strata would not achieve the exact milestones demanded for a fully-conformant decoder.

The terms VC (Level 0), VC (Level 1) and VC (Level 2) distinguish between decoder implementations that diverge from the standard after the first milestone, the second, or never.

A decoder shall be conformant up to Strata 0 and 1 if the output produced is a bit-exact match of the one produced by the Reference Decoder of VC.

A decoder shall be conformant at Stratum 2 if
a) the integer output produced is a bit-exact match of the one produced by the Reference Decoder of VC
b) and the upsampler in use has been defined via integer or fixed point coefficients and operations.

A decoder shall be conformant at Stratum 2 if
a) the integer output produced is differs by at most a value of 1 for each pel to the integer output of the Reference Decoder of VC
b) and the upsampler in use has been defined via floating point coefficients
c) and the upsampling has been executed using IEEE-754 conformant operations.

The following table shows which strata are required to conform for each type of implementation.

| Stratum | Milestone | VC (LEVEL 0) | VC (LEVEL 1) | VC (LEVEL 2) | Refer to: |
|---|---|---|---|---|---|
| 0 | EPS fully assembled | Conform | Conform | Conform | Section 8.4 |
| 1 | Surfaces of residuals assembled | n/a | Conform | Conform | Section 8.6 |
| 2 | Surfaces of pyramid assembled | n/a | n/a | Conform | Section 8.8 |

8.2 Decoding Tableaux and Tiles Using Statistics (CDFs)
8.2.1 Overview (Informative)

Decoding shall use multiple statistical Contexts (see Appendix A). A Context is a Cumulative Distribution Function that will be used for decoding particular symbols in a Tessera.

In a Tile, the particular types of symbol requiring Contexts are T-Node-Symbols and Residuals. These are used in Labels received in the Bytestream.

FIG. 12 shows an example during decoding of a Tile where a Label containing a T-Node-Symbol and 12 Residuals is in the process of being decoded.

FIG. 13A stage in the decoding of a Tile. In the pictured Grid, the top-right quarter of the bottom-left quarter of the top-left quarter of the Tile receives the four Residual values 2, 2, 1 and 0. The values were decoded from a Label starting with T-Node-Symbol 1110 and continuing with Residuals values 1,2,1,0,2,2,1,0,0,2,0,1 as pictured in the Bytestream.

Figure 13:
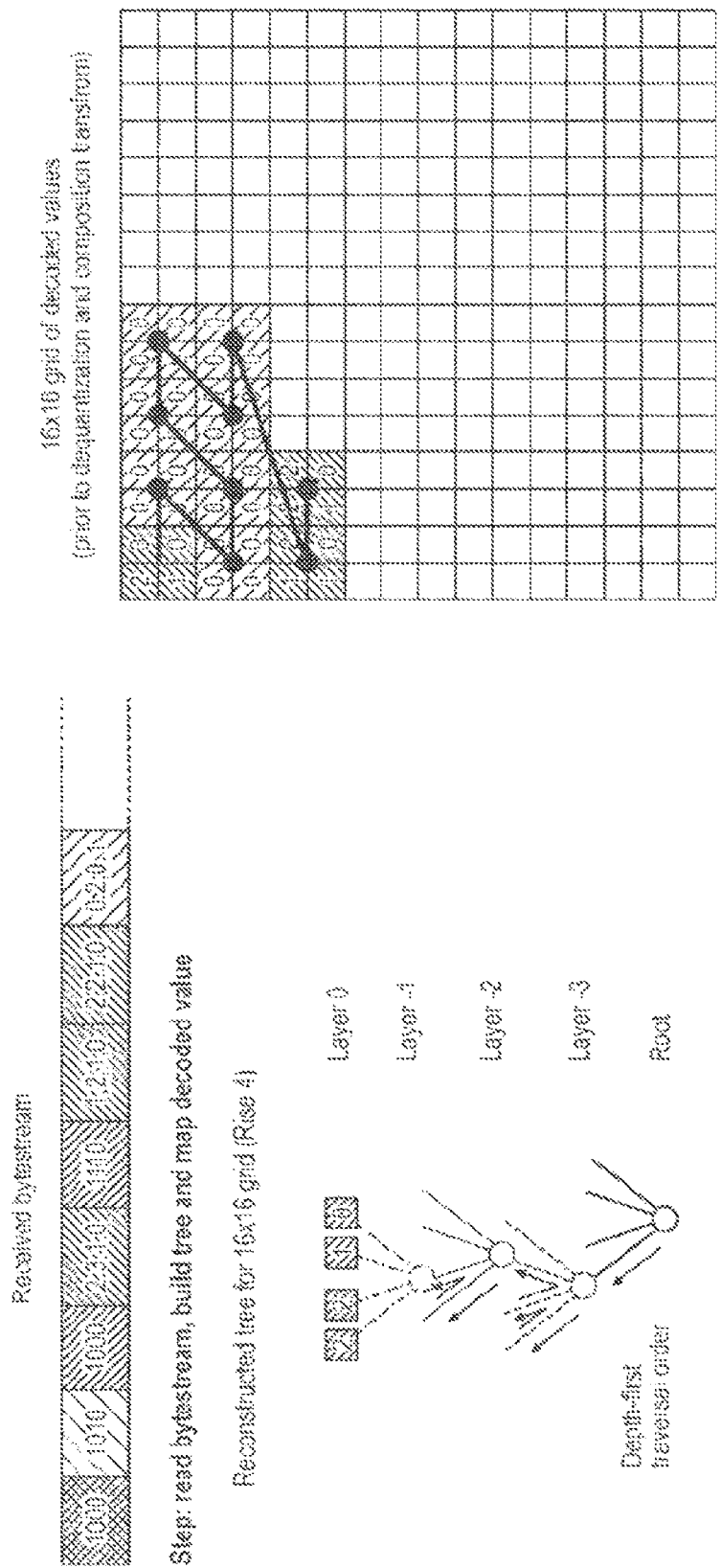
FIG. 13 illustrates a stage in the decoding of a Tile.

FIG. 13 shows an example during decoding of the same Tile where 64 Residuals would not be decoded at any stage in the decoding. The figure shows a simulated dense portion of the sparse QuadTree, receiving Residuals of value 0. In practice, none of these values are received from the Bytestream because the value of these Residuals is known implicitly.

FIG. 14A later stage in the decoding of the same Tile. In the pictured Grid, The bottom-left quarter of the Tile receives Residuals all of value 0. The values were not decoded from a Label. The very first T-Node-Symbol 1000 is pictured in the Bytestream. The symbol signalled the implicit zeroes by means of its third digit and was the only value decoded (earlier) from the very first Label.

Ensuring that the correct Contexts are used to decode a given Tableau or Tile involves some preparation by the decoder, which is described below in sections 8.2.3 and 8.2.4.

8.2.2 Rules for Tableaux and Tiles Ordering

Figure 14:
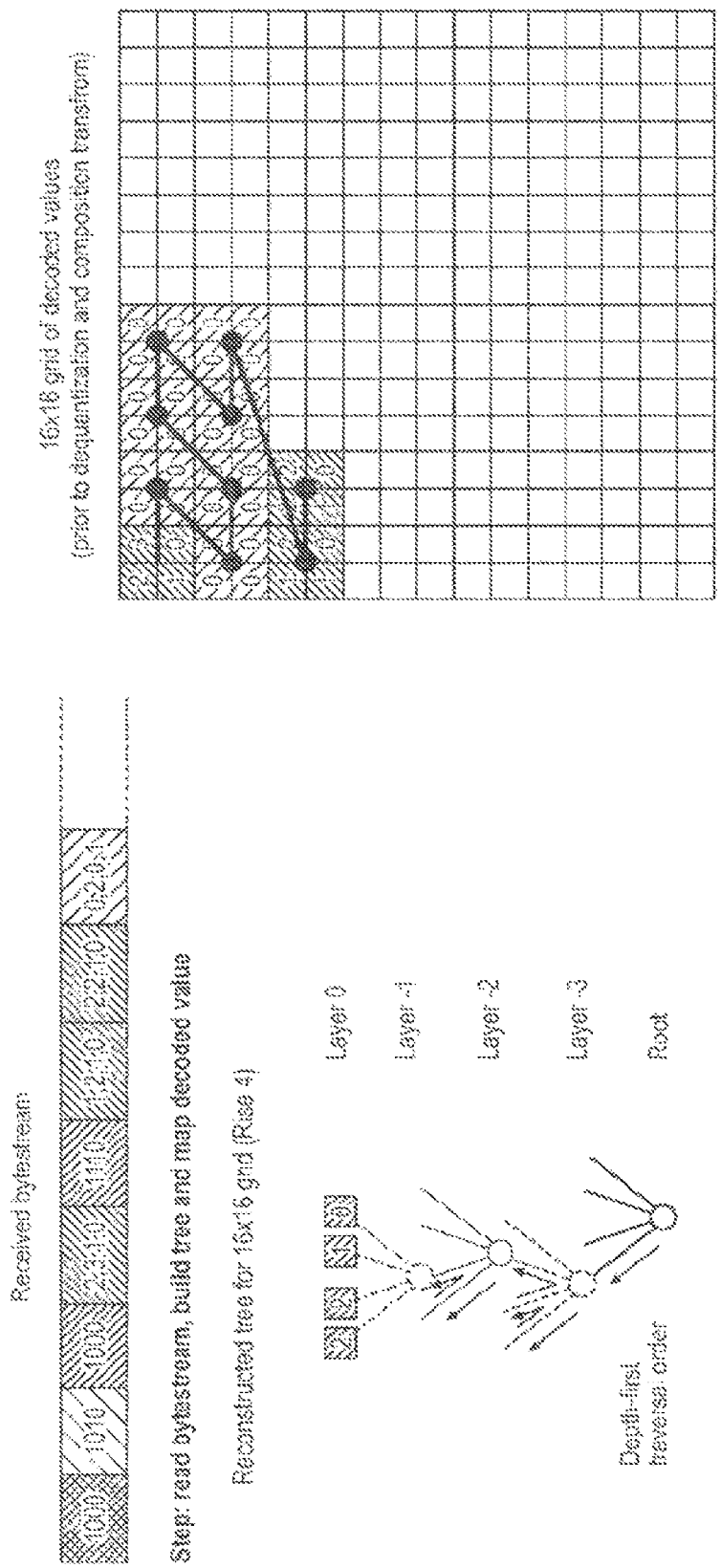
FIG. 14 illustrates a later stage in the decoding of a Tile.

The S-Tree depicted in FIG. 14 would be transmitted by a Bytestream containing one Tableau followed by 8 Tiles.

Decoding [Tableau][Tile], shall begin by decoding the Root Tableau. This shall be the one and only Tableau in the Root Tier. The decoder shall check the properties of the Surface to tell that there are n+1 Tiers, with Tier 0 the highest and Tier-n the lowest.

From Tier −n to Tier 1, each Tier shall contain one or more Tableaux. Tier 0 shall contain one or more Tiles.

Hence [Tableau]=Root Tableau, [Tier −n Tableau], . . . [Tier 1 Tableau]

After decoding the Root Tableau, the decoder shall know the total number of Tier −n+1 Tableaux from the total number of non-zero StreamLengths calculated by the Additional Decoding Process (see section 8.2.6.2.1) during the Traversal Stage (see section 8.2.6). After decoding all the Tier k−1 Tableaux, the decoder shall able to select the head and total number, of the Tableaux (for k>0) and Tiles (for k=0), in Tier k.

The offsets to the starts of all Tableaux (or Tiles) in tier k>−n and to the end of the tail Tableau (or Tile) in tier k>−n, shall be discovered by the decoder not later than completion of decoding Tier k−1. In the case of Tier −n, the two offsets of the Tableau shall come from the header.

8.2.3 Decoder Readiness

VC shall support the use of different CDFs for decoding the same type of symbol, depending on the individual Tableau or Tile.

There shall be four types of CDF, namely IndexDifferenceStatistics, NodeStatistics, ResidualStatistics and StreamLengthDifferenceStatistics, respectively designed for decoding T-Set-Index, T-Node, Residual and StreamLengthDifference symbols. There shall be up to 65536 CDFs of the first type (32768 CDFs each for Tableaux and Tiles) and up to 65536 CDFs of each other type. The decoder should be readied to read from these CDFs, before attempting to decode any Tessera.

Instances of the second type of CDF shall not have 16 individual CDF values for the 16 possible Tree-Node-Symbol values. Each Tree-Node-Symbol value shall be allocated to one of seven groups:

$1^{st}$ group [7, 11, 13, 14]
$2^{nd}$ group, [1, 2, 4, 8],
$3^{rd}$ group [5, 10]
$4^{th}$ group [3, 12]
$5^{th}$ group [6, 9]
$6^{th}$ group [0]
$7^{th}$ group The CDF shall have six explicit cumulative frequencies (from $1^{st}$ to $6^{th}$ group) with the $7^{th}$ CDF value being 1.0 (which is implicit). The type of value shall be as given in section 7.4.2.3. Instances of the other types of CDF (IndexDifferenceStatistics, ResidualStatistics or StreamLengthDifferenceStatistics) shall have minimum and maximum symbol values, which shall be integers, and cumulative frequencies up to and including certain join points. There shall be no more than 14 symbol values in between the minimum and the maximum. Explicit CDF values shall be non-decreasing cumulative probabilities and shall all be less than 1.0.

The decoder should know whether the next Stream it processes is a Tableau or a Tile (but it might not be necessary to have two entirely distinct functional units for the two cases). It should also know the location of the start of the Stream in the bytestream by summing the StreamLengths of previous Tesserae.

The decoder should calculate at which byte the stream ends, since flushing the decoder at the same stage as happened in the encoder will be necessary to correctly interpret the last few bytes of the Tessera. It should also know the relevant T-Set-Index.

8.2.4 Statistics Selection Stage

This section shall be skipped if the Tessera's StreamLength is 0.

The decoder shall use the value of T-Set-Index to obtain the NodeStatistics CDF Attribute from Variable-Sized Header 2 (see section 7.4.7) as follows:

The decoder shall use tnode_stats[tilesets[T-Set-Index][1]] as the NodeStatistics for this Tessera if this Tessera is a Tile.

The decoder shall use tnode_stats[tableausets[T-Set-Index][0]] as the NodeStatistics for this Tessera if this Tessera is a Tableau.

Note: These NodeStatistics are used in section 8.2.6.1 to decode the 4 bit T-Node-Symbols of T-Node labels.

Note: Further CDFs, discussed in the current section, allow the extra labels on data T-nodes to be decoded.

The decoder shall use the value of T-Set-Index to obtain another CDF Attribute from Variable-Sized Header 2 (see section 7.4.7) as follows:

The decoder shall use residual_stats[tilesets[T-Set-Index][0]] as the ResidualStatistics for this Tessera if this Tessera is a Tile.

The decoder shall use stream_length_stats[tableausets[T-Set-Index][1]] as the StreamLengthDifferenceStatistics for this Tessera if this Tessera is a Tableau.

The decoder shall obtain the IndexDifferenceStatistics CDF Attribute from Variable-Sized Header 2 (see section 7.4.7) as follows:

The decoder shall use cdf_tilesets as the IndexDifferenceStatistics for this Tessera if this Tessera is a Tile.

The decoder shall use cdf_tableausets as the IndexDifferenceStatistics for this Tessera if this Tessera is a Tableau.

8.2.5 Initialization Stage

CDF shall be set to the NodeStatistics.

OldIndex and OldStreamLength shall be set to 0 in the case of a Tableau. Otherwise they shall not used.

If the end of a Tile is after the end of the Bytestream, then decoding of symbols shall continue until truncation is activated, see below, when simulation shall take over. After simulation takes over, all symbol decodings that would otherwise happen in the next stages shall be simulated as follows:

Where decoding part of a Stream to find a StreamLengthDifference is described (see section 8.2.6.2.1), but truncation is active, there shall be no such decoding. The Traversal Stage shall then set StreamLengthDifference to minus OldStreamLength.

Where decoding part of a Stream to find a ResidualValue is described (see section 8.2.6.2.1), but truncation is active, there shall be no such decoding. The Traversal Stage shall then set ResidualValue to 0.

Where decoding part of a Stream to find a 4-bit code is described (see section 8.2.6.1), but truncation is active, there shall be no such decoding. The Traversal Stage shall then set the 4-bit code to 15 in decimal.

All other processes for decoding the Tessera (see sections 8.2.6.1 and 8.2.6.2) shall proceed as normal.

If the end of a Tableau is after the end of the Bytestream, simulation shall take over immediately, without any reading of the Tableau from the Bytestream. Note: This ensures, when a Tableau is decoded, that all the Streamlengths that need to be decoded are decoded, thus allowing the start and end of all Streams present in the Tier above the Tier of the Tableau to be calculated. (This is also vital for calculation of the start of the next Tier but one, where such a Tier exists.)

Simulation of this Tessera shall take over immediately if the Tessera's StreamLength is 0, and shall cease when the Tessera's Traversal Stage (see section 8.2.6) is complete.

Note: If the start of the Tessera is after the last byte of the bytestream, the effect is that every symbol in the Tessera is simulated. The same effect could have been effected by replacing the Tessera's StreamLength with 0.

8.2.6 Traversal Stage

8.2.6.1 T-Nodes, and Label (of Root or of Layer −3 Inner T-Nodes) or Head of Label (of Layer −2 T-Nodes).

The decoder shall now decode the new Tessera's 4 bit codes in Depth-First Pre-Order Traversal order until it has found the 4-bit code at the head of the Label of a Layer −2 Inner T-Node.

Note: In FIG. 12, all the T-Node-Symbols of the Bytestream of a Tessera are shown in a Mini-Tree. The first node to be traversed (Root) has T-Node-Symbol 1001 as Mini-Tree Label. The second node to be traversed (a Layer −3 Inner T-Node) has 0100 as Label. The third node to be traversed (a Layer −2 Inner T-Node) has 1011 as the head of its Label and values symbolized by a, h and l following the head.

8.2.6.2 Traversing the Tail of a Data T-Node Label.

Up to 4 additional Label decoding operations should be performed, each one as in subsection 8.2.6.2.1 below. These shall be followed by a Context reset as in subsection 8.2.6.2.2.

Note: In FIG. 12, after decoding the symbol 1011 as the head of the third Label, 3 additional Label decoding operations will take place. The first decodes the value denoted in red by letter a, the second h and the third l. Later, after decoding 0001 at the head of the fifth Label, 1 additional Label decoding operation will take place, which will decode m, n, o and p.

8.2.6.2.1 Additional Decoding Process:

At this point what happens depends whether the Tessera is a Tableau or a Tile.

In a Tableau, the decoder shall repeat the following steps 4 times:

Switch CDF to the StreamLengthDifferenceStatistics and decode a StreamLengthDifference. This shall be added to OldStreamLength to give a StreamLength belonging to the Tier above. If StreamLength is greater than 0 it shall switch CDF again to IndexDifferenceStatistics and decode an IndexDifference. This shall be added to OldIndex to give a Leaf T-Set-Index. OldIndex and OldStreamLength shall now be updated by the calculated Leaf index and StreamLength respectively. The index (if length >0) and length shall be used to update their associated location in this Tessera's A-Surface.

Note: If the current Tableau has Tier greater than 1, then this Leaf T-Set-Index will eventually enable decoding of Tableaux in the Tier beneath (the T-Set will turn out to be a TableauSet).

If the current tier is 1, it will turn out that the T-Set is a TileSet. To restate, there are no Leaf T-Sets of any kind in tier 0 as there is no lower Tier to make use them.

In a Tile, the decoder shall set the CDF to ResidualStatistics and shall decode 4

ResidualValues, which shall be used to update their associated locations in this Tessera's A-Surface.

Following completion of the (up to 4) additional Label decoding operations (yielding either up to 16 StreamLengths and up to 16 Leaf T-Set-Indices, or up to 16 Residual values) the decoder shall reset CDF to the NodeStatistics, whatever the type of Tessera. It shall then resume the traversal stage.

8.2.6.3 Active Area Test

A Tessera shall never contain data outside its Active Volume, whether Stream-lengths or Residuals.

8.2.6.2.2 Context Reset

Note: This is why the S-Tree was defined in section 6.1 to have a physical Active Volume (as well as the hypothetical Summit).

Any step described anywhere in this section that references outside the Active Volume shall be short circuited. Note: A consequence of this is that on occasion some (but not all) bits of a particular 4-bit code encountered by the decoder may not affect the end result of decoding in any way.

8.2.6.4 Refresh of Decoding Buffer

During decoding symbols, the decoder shall refresh by reading a new range decoder input word (see sections B.1 and B.3) from the Bytestream. Note: Refresh is only triggered intermittently by the symbol decoder.

If, while a Tessera symbol is being decoded, the decoder needs to refresh but there are no words or a fraction of a word remaining before the end of that Tessera in the Bytestream, then the available bytes shall be supplemented by pad bytes (of hex value FF) up to the end of the last range decoder refresh word needed in decoding that symbol.

Note: A convenient way to do this is by calling a special decode function for the final symbol of a Tessera, assuming that the Bytestream does not end before the end of the Tessera.

Note: There may be the following optional feature for handling broken input streams:

If the end of a Tile is after the end of the Bytestream, then just before decoding each symbol of the Tessera there must be a check that there remain a certain number of bytes before the end of the Bytestream.

This is called truncation_number and is a multiple of the word length (see section xxx). Not all decoder implementations or settings will deem this check affordable.

Truncation shall be activated the first time that the optional check fails (with the optional feature of repeatedly checking in a Tile), or before beginning to decode an incomplete Tile (if feature not in use in a Tile), or before decoding an incomplete Tableau. Section 8.2.6.5 states the required response to Truncation.

8.2.6.5 Response to Truncation

If and when truncation is activated, the next symbol (which is necessarily not the final one of the Tessera) shall be decoded differently to the special decode function mentioned in section 8.2.6.4 above. The decoder shall employ the previously described FF-valued pad bytes when the end of the Bytestream (now not the end of the Tessera) is encountered during decoder refreshing. For all successors of this symbol, decoding shall be simulated as mentioned in section 8.2.6.4.

8.3 Assembly of Surfaces from Tableaux and Tiles (Stratum 0)

The assembly of an S-Tree shall be carried out in order of Tier, from lowest to highest. Attaching all the Tesserae of the next Tier, to a partly Regenerated S-Tree, shall be called Grafting a Tier.

Once an S-Tree has been partly Regenerated by Grafting Tiers from Root Tableau up to and including Tier $-n$ Tableaux, the Tesserae of Tier $-n+1$ shall be decoded. When all the relevant Tesserae have been decoded, they should together be Grafted to the S-Tree to give it an extra 4 Layers.

The Active Volume of the intended final S-Tree (Root Tableau to Tier 0) shall be known from the start, since it is a property of the Surface. Similarly, the Rise of the final S-Tree, which we shall call R, shall be known.

Prior to decoding the Tier $-n+1$ Tesserae of an S-Tree of Rise R, a complete S-Tree of Rise $R-4*t$ shall already be known. (For example, prior to decoding Tier 0, a complete S-Tree of Rise $R-4$ shall already be known.)

We call the Active Volume of the S-Tree of Rise R, the final Active Volume.

We call the Summit of the S-Tree of Rise R, the final Summit. This Summit is a Grid of dimensions $2^R$ by $2^R$ where the elements of this Grid shall be Residuals. The same Summit may be represented in a coarser Grid of dimensions $2^{R-4*t}$ by $2R^{R-4*t}$ where the elements of the coarser Grid shall themselves be Grids of dimensions $2^{4*t}$ by $2^{4*t}$ where the elements shall be Residuals.

Figure 15:
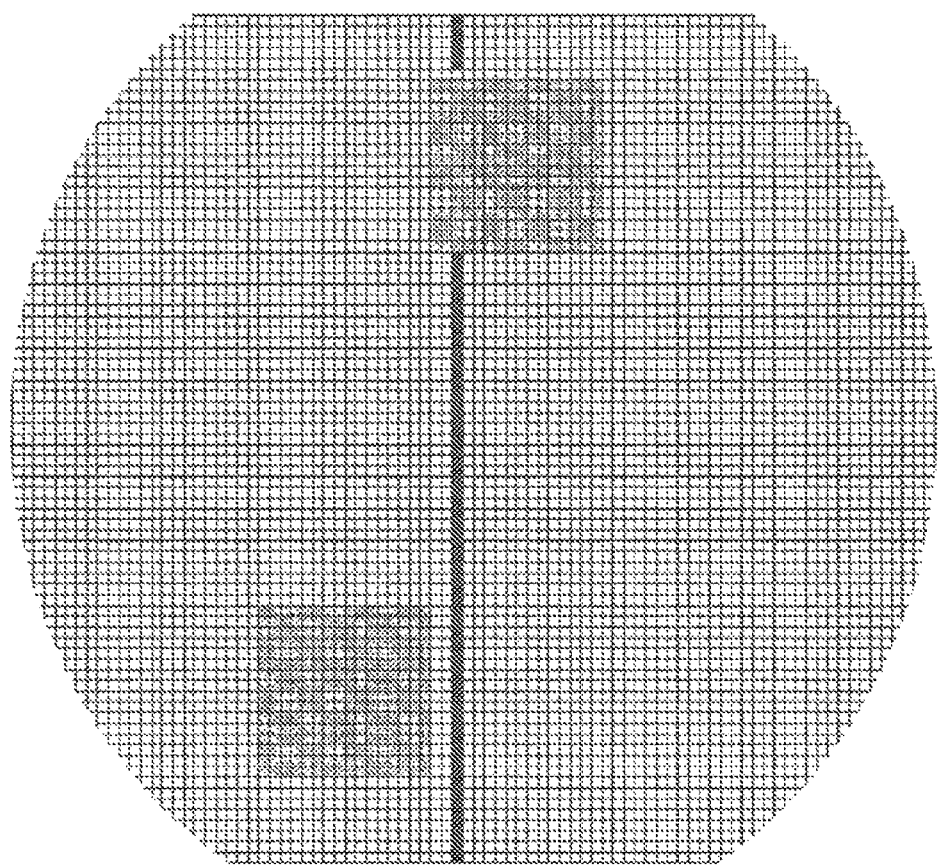
FIG. 15 illustrates two elements of a coarser Grid.

FIG. 15 Two elements of a coarser Grid superimposed in yellow on an original Grid. Only the relevant area of the original Grid is shown. The elements of the coarser Grid are themselves Grids. The highlighted black line marks the rightmost column that is still within the width w of the final Surface represented by S-Tree[L, (w,h) . . . ].

FIG. 15 shows part of an original Grid in black and shows two elements of a coarser Grid in yellow. Each of the two elements of the coarser Grid contains 256 elements representing a square region of the original Grid. The coarser Grid need not be represented explicitly in a decoder but is a useful aid in describing the decoding process.

The Dimensions Tuple of a Tessera associated with the leftmost yellow square shall be (16,16) because the whole of the square is to the left of the highlighted vertical black line. The Dimensions Tuple of a Tessera associated with the rightmost of the two yellow squares shall be (2,16).

The Top Layer of the final Active Volume may be mapped into a two-dimensional Grid of nominally square elements, each of (nominal) dimension $2^{R+4*t}$ by $2^{R+4*t}$. Each row or column of the Grid is kept as short as is possible, by ignoring square elements that are entirely outside the final Active Volume. Cells in the bottommost and rightmost columns should have actual dimensions reduced so that they end at the corresponding edges of the Top Layer of the final Active Volume.

Each Tessera in Tier $-t+1$ shall correspond to one of the above Grid elements. The correspondence is made by:—

- associating the Root of the existing S-Tree with the Summit of the final S-Tree, still of unknown Sparsity Structure.
- recursively identifying quarters of the final Surface (by means of a Depth-First Pre-Order Traversal of the existing S-Tree).
- Each quarter shall be derived from the Morton-map.
- Note: If a Top Layer node becomes associated with an area that overlaps with one of the elements of the Grid, the next Tessera in the Bytestream shall be associated with that element.

For example, prior to decoding Tier 0, the nominal element dimension will be $2^{R-4}$ by $2^{R-4}$.

The Active Volume of such a Tessera shall be found from the dimensions of the corresponding Grid elements. For example, if an element has actual dimensions p by q, the Tessera Active Volume at its Top Layer will be $\lceil p*2^{-t+1} \rceil$ by $\lceil q*2^{-t+1} \rceil$ where the modified square brackets denote ceiling.

For example, taking $-t=-1$, the Top Layer Active Volume of a Tile will simply be p by q.

The Regeneration process can now be described:
Begin with input S-Tree of Rise $R-4*t$.
Identify the two-dimensional Grid.

Get T-Set-Indices of Tesserae in the new Tier: i.e. the non-Terminal labels of the input
S-Tree.
Decode new Tier into a queue of Tesserae. Ensure that the decoder always uses the appropriate T-Set-Indices.
For each Top Layer node of the S-Tree:
If it is not marked as a Terminal Node:
Get next Tessera.
Replace Node with a sub-tree, namely the Tree represented by that Tessera.
(The Root of the Tessera becomes a Glue Node in the S-Tree built by the Regeneration process.)
End with S-Tree of Rise R+4*(−t+1).

Marking a Top Layer node of a Tessera as a Terminal Node shall occur during decoding of a Tableaux, for one of two specific reasons; either the Node was outside the Active Volume of the Tessera, or the Node Label was decoded to show a StreamLength of 0.

The same Regeneration process shall be repeated until there is an S-Tree with Rise R. This S-Tree's parametric type shall be Residual, whereas previous S-Trees shall have other parametric types (which could differ between S-Trees of Rise R−4 and S-Trees of Rise less than R−4).

From the final S-Tree of Rise R, the ResidualSurface shall be extracted by initializing every Residual to 0 and then, for those Top Layer nodes that are within the final Active Volume, the decoder shall copy the Residual value (that was decoded from its Label when Tiles were decoded) to the correct 1 by 1 cell of the Surface.

For all Residual values copied to the ResidualSurface, the T-Set-Index used in decoding the Residual value (see the Regeneration process earlier in this section) shall be copied to the corresponding element of the TilesetIndexArray.

The values in the TilesetIndexArray need not be initialized.

8.4 Endpoint of Stratum 0 and Input for Stratum 1.

A decoder shall reach the endpoint of Stratum 0 by meeting the following conditions:
At the endpoint of Stratum 0, fully populated non-sparse ResidualSurfaces (A, H, V and D) shall exist for each of the quantized directional components of each Level of Quality (see section 8.7) of each Plane.
At the endpoint of Stratum 0, fully populated non-sparse TilesetIndexArrays (idxA, idxH, idxV and idxD) shall exist for each of the quantized directional components of each Level of Quality (see section 8.7) of each Plane.
At the endpoint of Stratum 0, those ResidualSurfaces without any Streams in the Bytestream shall also be available, though filled with zeros.

8.5 Surface Transformations (Stratum 1).
8.5.1 Dequantization.
8.5.1.1 Quantization Parameters.

Quantization parameters shall be represented as a 2-tuple, containing the stepwidth and the dequantization offset (see section 7.4.2.4).

The decoder shall obtain a value of T-Set-Index for each Residual in a ResidualSurface by reading it from the corresponding position in an associated TilesetIndexArray.

The decoder shall use this T-Set-Index to obtain the QuantizationParameters Attribute from Variable-Sized Header 2 (see section 7.4.7) as follows:
The decoder shall use quantization_parameters[tilesets[T-Set-Index][2]] as the QuantizationParameters for a Residual belonging to a Tile of a given Tile-set.
Note: The TilesetIndexArray maintains the T-Set_Indices from Stratum 0 to Stratum 1.

8.5.1.2 Precise Dequantization Process.

This process shall receive as input the quantized Residual, q, the stepwidth, sw, and the dequantization offset, ofs (see section 8.5.1.1). It shall output the dequantized Residual, dq, computed as follows:

$$dq=q*sw-\text{sgn}(q)*ofs$$

where sgn (q) denotes the sign of q, defined as $$\text{sgn}(q)=\begin{cases} 1, \text{ if } q>0 \\ 0, \text{ if } q=0 \\ -1, \text{ if } q<0 \end{cases}$$

8.5.2 Composition Transform

The Composition Transform shall receive as input four directions, Average (A), Horizontal (H), Vertical (V) and Diagonal (D) and the transform shall output the recovered Residuals (denoted as x00, x01, x10, x11).

We consider two Composition Transform variations, as described in sections 8.5.2.1 and 8.5.2.2 below.

8.5.2.1 Standard Composition Transform

Standard Composition Transform shall be defined as:

$$x00=(A+H+V+D+2)>>2$$

$$x01=(A-H+V-D+2)>>2$$

$$x10=(A+H-V-D+2)>>2$$

$$x11=(A-H-V+D+2)>>2$$

8.5.2.2 Integer Composition Transform

Integer Composition Transform shall consist of two steps, as described below.

Step 1

This step shall receive as input the four directions A, H, V, D (see Sec. 7.5.2). This step shall distinguish between Initial LoQ and higher LoQs, as follows.

For the Initial LoQ
The transform shall modify the four directions as follows:

$$D'=D$$

$$V'=2*V+(D \bmod 2)$$

$$H'=2*H+(D \bmod 2)$$

$$A'=4*A+(H'+V-D') \bmod 4$$

For all Other LoQs Other than the Initial LoQ
The transform shall modify the four directions as follows:

$$D'=D$$

$$V'=2*V+(D \bmod 2)$$

$$H'=2*H+(D \bmod 2)$$

$$A'=4*A+\text{rem}-t$$

where rem is defined as $$\text{rem}=(H'+V-D') \bmod 4$$

and $$t=\begin{cases} 4 \text{ if } A<=0 \text{ AND rem}>0 \\ 0 \text{ elsewhere} \end{cases}$$

Step 2

In this step the transform shall recover the residuals using the modified directions A', H', V' and D'.

$$x00=(A'+H'+V'+D')\gg 2$$

$$x01=(A'-H'+V'-D')\gg 2$$

$$x10=(A'+H'-V'-D')\gg 2$$

$$x11=(A'-H'-V'+D')\gg 2$$

8.5.3 Surface Composition Process

Surfaces belong to LoQs. The qA, qH, qV, and qD decoded ResidualSurfaces of an LoQ shall be inputs to the Surface composition process and the output of the process shall be a ComposedResidualArray.

Except when composing the Initial LoQ, the Composition process shall take a ModifiedPredictedAverageArray of the same LoQ as the input.

Computation of ModifiedPredictedAverageArray shall not be the responsibility of Stratum 1. It shall be chosen by the system that invokes Stratum 1 and the resulting data shall be available to use in Stratum 1 when required (see section 8.5.3.1).

Note: The system invoking Stratum 1 is Stratum 2 if the decoder is conformant at Stratum 2. Stratum 2 invokes the (Stratum 1) Surface Composition process (of this section 8.5.3) for one LoQ at a time. Each invocation happens after choosing a ModifiedPredictedAverageArray according to section 8.7.4.

The Composition process shall discriminate between Bottom LoQ and other LoQs, as described below.

8.5.3.1 Composition Process for any LoQ Other than the Initial LoQ

1. The four quantized directions A, H, V, D, shall be dequantized (see section 7.5.1) and the corresponding dequantized directions dqA, dqH, dqV, dqD shall be produced. Each of A, H, V, D, uqA, uqH, uqV, uqD shall be a 2-D array of dimensions ($W^{Loq}$, $H^{LoQ}$).

2. Correction of dimensions ($W^{Loq}$, $H^{LoQ}$) shall be applied to direction uqA, as follows:

$uqA[i,j]=uqA[i,j]+\text{ModifiedPredictedAverageArray}[i,j]$

3. The Composition Transform shall be called (see section 7.5.2), operating on all 4-tuples, Tij, where $T_{ij}=(uqA[i,j],uqH[i,j],uqV[i,j],uqD[i,j])$, $i=0,1,\ldots,H^{LoQ}-1$, $j=0,1,\ldots,W^{LoQ}-1$ and shall output all 4-tuples Cj, where $C_{ij}=(C00[i,j],C01[i,j],C10[i,j],C11[i,j])$ This way, four 2-D arrays of dimensions ($H^{LoQ}$, $W^{LoQ}$), namely C00, C01, C10 and C11, shall be computed.

4. The composed array—termed as ComposedResidualArray$^{LoQ}$—shall be a 2-D array of dimensions ($2W^{Loq}$, $2H^{LoQ}$), which shall be created by assembling C00, C01, C10, C11 to a single array as follows:

ComposedResidualArray$^{LoQ}$[$2*i,2*j$]=C00[$i,j$]

ComposedResidualArray$^{LoQ}$[$2*i,2*j+1$]=C01[$i,j$]

ComposedResidualArray$^{LoQ}$[$2*i+1,2*j$]=C10[$i,j$]

ComposedResidualArray$^{LoQ}$[$2*i+1,2*j+1$]=C11[$i,j$]

where $i=0,1,\ldots,H^{LoQ}-1$ $j=0,1,\ldots,W^{LoQ}-1$

8.5.3.2 Decoding process for the Initial LoQ

Decoding process of the Initial LoQ shall include only the steps 1, 3 and 4 of the process followed for higher LoQs (see section 7.5.3.1). FLAG_SHIFT_TOWARDS_ZERO shall be set to FALSE.

8.6 ENDPOINT OF STRATUM 1 AND INPUT FOR STRATUM 2.

At this stage in the decoding process there are now fewer ComposedResidualArrays than ResidualSurfaces, each of which has been reconstituted from component qA, qH, qV and qD directional surfaces (possibly present) in the original bytestream.

Note: At this stage in the decoding process, the effects of quantization have also been undone, to the greatest possible extent. Longer bytestreams may convey a picture representation that is mathematically lossless. (The required length depends on the image.) Values have 2 additional fractional bits relative to the element descriptor, assuming standard decoding mode (see X1) is in use.

8.7 Pyramidal Reconstruction (Stratum 2)

LoQs shall be reconstructed in reverse pyramidal order, i.e. from Initial LoQ to LoQ 0. This Stratum shall be responsible for the Composition processes of Stratum 1 for each LoQ in turn, once the necessary input data is known.

The ComposedResidualArray shall be subtracted from the PredictedImage (see section 8.7.1) to create the ReconstructedImage at that LoQ. Note: the two Surfaces and the ReconstructedImage all belong to the same LoQ.

Before a ReconstructedImage is exported by the decoder, but not when it is used as input to other calculations within Stratum 2, the fractional bits shall be set to zero. Furthermore, the integer part shall be rounded towards minus infinity and shall be clamped to be representable by the integer part of the element descriptor.

8.7.1 Image Prediction Via Upsampling

A predicted image, PredictedImage$^{LoQ}$, of dimensions ($2*W^{LoQ}$, $2*H^{LoQ}$), shall be computed by 2×-upsampling (see Appendix C Standard Upsamplers.) the reconstructed image of the lower LoQ, ReconstructedImage$^{LoQ-1}$ (see Stratum 2, section 7.7).

ReconstructedImage$^{LoQ-1}$ shall be of dimensions ($2*W^{Loq-1}$, $2*H^{LoQ-1}$), with $H^{Loq}=2*H^{LoQ-1}$ and $W^{Loq}=2*W^{Loq-1}$.

The type of upsampling shall be determined from the fix-sized header (see section 7.4.5). In the case of the Initial LoQ, Predictedimage shall be defined as a 2-D array of zeros, i.e.

Predictedimage[$i,j$]=0, $i=0,1,\ldots,2H^{LoQ}-1$, $j=0,1,\ldots,2W^{LoQ}-1$

8.7.2 Reconstruction of an Image at an LoQ

The reconstructed image of each LoQ—termed as ReconstructedImage$^{LoQ}$—shall be a 2-D array of dimensions ($2H^{LoQ}$, $2W_{LoQ}$), computed as:

ReconstructedImage$^{LoQ}$[$i,j$]=PredictedImage$^{LoQ}$[$i,j$]+ComposedResidualArray$^{LoQ}$[$i,j$]

(see section 7.5.3.1 for the definition of ComposedResidualArray$^{LoQ}$ and section 8.7.1 for PredictedImage$^{LoQ}$.)

The ReconstructedImage shall also have its integer part clamped to be representable by the integer part of the element descriptor.

8.7.3 PredictedAverage

The predicted image PredictedImage$^{LoQ}$ shall be decomposed to four 2-D arrays of dimensions ($W^{LoQ}$, $H^{LoQ}$), namely Pr00, Pr01, Pr10 and Pr11, as follows:

$$Pr00[i,j] = \text{PredictedImage}^{LoQ}[2*i, 2*j]$$

$$Pr01[i,j] = \text{PredictedImage}^{LoQ}[2*i, 2*j+1]$$

$$Pr10[i,j] = \text{PredictedImage}^{LoQ}[2*i+1, 2*j]$$

$$Pr11[i,j] = \text{PredictedImage}^{LoQ}[2*i+1, 2*j+1]$$

where $i = 0, 1, \ldots, H^{LoQ}-1$ $j = 0, 1, \ldots, W^{LoQ}-1$

8.7.4 ModifiedPredictedAverageArray

A correction 2-D array of dimensions ($W^{LoQ}$, $H^{LoQ}$), termed ModifiedPredictedAverageArray, shall be formed as follows:

$$\text{ModifiedPredictedAverageArray}[i,j] = CA[i,j] - CB[i,j]$$

where $$CA[i,j] = Pr00[i,j] + Pr01[i,j] + Pr10[i,j] + Pr11[i,j]$$

$$CB[i,j] = 4 * \text{ReconstructedImage}^{LoQ-}[i,j]$$

8.8 Dimensions of Surfaces and Arrays

8.8.1 Dimensions of LoQ images

An LoQ image (of a specific image plane) shall be a 2-D array of dimensions ($w^{Loq}$, $h^{LoQ}$). Dimensions shall be defined recursively as:

$$w^{LoQ-1} = (w^{LoQ}+1)/2$$

$$h^{Loq-1} = (h^{Loq}+1)/2$$

with $w^0$, $h^0$ being available at Variable-Sized Header 1 (see section?6.2.5?).

The LoQ image reconstruction process (see section 8.7.2) shall ignore any columns/rows exceeding the LoQ image dimensions defined in section 8.8.1. Note: Exceeding is possible due to ceiling operations included in the calculations of Composition Transform direction dimensions (see section 8.8.2).

8.8.2 Dimensions of Composition Transform Directions

A Composition Transform direction at a given LoQ shall be a 2-D array of dimensions ($W^{Loq}$, $H^{LoQ}$), with $$W^{Loq} = (w^{Loq}+1)/2$$

$$H^{Loq} = (h^{Loq}+1)/2$$

8.9 Endpoint of Stratum 2.

At this stage in the decoding process, a ReconstructedImage has been exported by the decoder.

A raw file containing all planes in order, to the depth of the integer portion of the element descriptor. For example, with 3 planes, this permits YUV planar formats of 8 bit, 10 bits etc. Each value shall be padded to the next byte boundary by adding 0 in the unused most significant bits.

APPENDIX A HISTOGRAM FORMATS

A.1 StreamLengths Histograms.

Note: These Histograms are not used in the Tile Tier

There shall be two StreamLengths histograms to be used in the decoding of Tableaux using StreamLengthDifferenceStatistics in section 8.2.

This histogram format contains data necessary for the range decoder to decode a StreamLengthDifference in two stages.

The first stage shall use StreamLengthDifferenceStatistics to derive the CDFs of 15 ordered symbols. The first 14 CDF values shall come from the mantissa16 [14] array (see section 7.4.2.1) and the final shall be 1.0. The range decoder, using a table of these 15 CDFs shall return the position, $0 \leq pos < 15$ of one of the ordered symbols.

Note: Representation of these 15 individual symbols is not required. They are not T-Node-Symbols, but are bins of the first decoding stage where each bin represents several ordered symbols of the second, StreamLengthDifferences decoding, stage.

The x_axis_type[16] array in StreamLengthDifferenceStatistics shall be referred to in the next paragraph as x.

In the second decoding stage, a new uniform CDF shall be derived from x[pos] and x[pos+1], whose symbols shall be the actual StreamLengthDifferences ranging from x[pos] to x[pos+1]−1. The number of CDF values needed for range decoding to select one of these symbols shall be m=x[pos+1]−x[pos]. The CDF values shall be 1.0/m, 2.0/m, ... (m−1)/m, and 1.0. The range decoder shall generate the position, pos2, of the selected symbol in the histogram. The final decoded StreamLengthDifference value to return shall therefore be x[pos]+pos2.

A.2 Index Histograms.

Note: These Histograms are not used in the Tile Tier

The format shall be common to section A.1 except that the words StreamLengthDifferenceStatistics and StreamLengthDifference shall be replaced by IndexDifferenceStatistics and T-Set-Index respectively.

Depending on the tier, the decoded T-Set-Index may index a TileSet or a TableauSet.

A.3 Node Histogram.

Note: These Histograms are used in all Tiers

This histogram format shall be used for NodeStatistics. It enables the range decoder to decode T-Nodes in either 1 or 2 stages. The result of the first stage shall determine whether the second stage is applicable.

The first stage shall use the NodeStatistics to derive the CDFs of 7 unnamed symbols. The first 6 CDF values shall come from the mantissa8[6] array (see section 7.4.2.3) and the final value shall be 1.0. The range decoder, using a table of these 7 CDFs shall return the position pos where $0 \leq pos < 7$, of one of the unnamed symbols.

The 7 unnamed symbols narrow the T-Node-Symbol, in decimal, down to a member of one of the following 7 sets of integers, according to the unnamed symbol's position, pos: [7, 11, 13, 14], [1, 2, 4, 8], [5, 10], [3, 12], [6, 9], [0] and [15]. The integers shall represent 4-bit unsigned binary numbers. For example, if the value of pos is returned as 4, the integer shall be 6 or 9 in decimal, representing that the T-Node-Symbol in binary shall be 0110 or 1001. If either member of the final pair of the above sets is selected there shall be no need for a second stage, and 0 or 15 shall be the final integer. The integer 0 shall be reserved for future use. The integer 15 shall mean that the T-Node-Symbol in binary shall be 1111.

If either member of the first pair of the above sets is selected there shall be a second stage, using CDF values representing 0.25, 0.5 and 0.75 in a mantissa8[3] array. The range decoder shall return the further position pos2 where 0≤pos2<4, in this histogram. The final decoded T-Node shall return s [pos2] where s is the selected set of integers.

If either member of the second pair of the above sets is selected there shall be a second stage, using CDF value representing 0.5 in a mantissa8[1] array. The range decoder shall return the further position, pos3 where 0≤pos3<2, in this histogram. The final decoded T-Node shall be returned as s[pos3] where s is the selected set of integers.

A.4 Residuals Histograms.

Used Only in Tile Tier

The format shall be the same as section A.1 except that the words StreamLengthDifferenceStatistics and StreamLength-Difference shall be replaced by ResidualStatistics and Residual respectively.

APPENDIX B SYMBOL DECODER

B.1 Initialization

Code shall be read in as the first 32 bits of the Bytestream.
The state variable low shall be set to 0.
Range is set to $2^{32}-1$.

B.2 Search 16 bit Table entries shall be multiplied by range >>16

First location n in the scaled table of symbols shall be selected such that (code−low)>=table[n].

The decoded symbol shall be symbol n.

B.3 Range Decoding Core

The actions of this section shall take place after every search except for the first search. The model's cumulative probability up to but not including the next symbol shall be cdf=table[n] and the probability of the next symbol is prob=cdf[n+1]−cdf[n].

A reduced range shall be calculated as follows (STEP A):
Integer divide range by $2^{16}$ (since probabilities cdf and prob are pre-multiplied by that).

low=low+range*cdf if prob>0:range=range*prob else range=range*$2^{16}$.

N, The number of matching leading bits in low and low+range is calculated.

Expansion of the range (STEP B):

N trailing bits of Code shall be fetched from the Bytestream.

N leading bits from low are thrown away (left shift)

The range shall be expanded by being shifted N bits to the left.

Rarely, expanded range <$2^{16}$−1 (the expansion was insufficient: get 0 in next STEP A divide).

If so,
increase/set the range to $2^{32}-1$—original low (so STEP A divide OK).
an extra 16 trailing bits of Code are now fetched from the Bytestream.
16 leading bits from low are thrown away; the new low+range will not overflow after the OK divide even in worst case.

Continue by repeating the Search with the new low and range.

B.4 Replacement of Search for Uniform CDFs.

In the case of a second decoding stage, referred to in sections A.1 and A.3, the CDF shall be uniformly increasing and N shall represent the number of symbols.

In such a second decoding stage, the search (see section B.2) may be replaced by the following steps:

Integer divide range by N n=(code−low)/range

If the search is replaced by the above formula, STEP A in section x shall be replaced by the following:

low=low+range*n

B.5 Non-Conforming Bytestreams

If standard decoding of a Tessera of StreamLength s causes the decoder to try and read the byte s bytes after the beginning of the Tessera, the consequences are undefined. This byte belongs to a different Tessera, or does not belong to any Tessera.

The symptom described in the previous paragraph shall not occur when the decoder is processing a VC-conformant ByteStream. (This rule sets restrictions on what is a conformant Bytestream.)

APPENDIX C STANDARD UPSAMPLERS

C.1 Standard Linear Upsamplers

A standard linear upsampler shall be characterized by an even sized, s×s kernel coefficient array K[y,x], and its origin o.

Kernel coefficients shall be fixed point, and as in kernel-based image filtering the value of pixel $p_l[y,x]$ in the upsampled picture shall be computed as:

$$p_l[y, x] = \sum_{j=0}^{s-1}\sum_{i=0}^{s-1} p_{l+1}\left[\frac{y}{2} + d(y) - o + j, \frac{x}{2} + d(x) - o + i\right] *$$

$$K[f(d(y), j, s), f(d(x), i, s)]$$

Where:

s is the size of the kernel.

$o_x = o_y = o = \frac{s}{2}$ is the origin.

$d(x) = \begin{cases} 0, & x \text{ is even} \\ 1, & \text{otherwise} \end{cases}$ $f(dx, i, s) = \begin{cases} i, & dx = 0 \\ s - 1 - i, & dx = 1 \end{cases}$ l is the LoQ index, therefore p, is the upper and target picture, and $p_{l+1}$ is the lower picture.

k is the kernel array.

The results are rounded towards the nearest representable number, numbers that are half of the representable precision are rounded towards minus infinite.

When reading outside of the valid frame of the lower picture, the values of the outermost valid column or row shall be used.

The Standard Linear Upsamplers used in VC shall be: Bicubic Upsampler (see section C.1.1) and Sharp Upsampler (see section C.1.2), each with kernel size s×s=4×4 and origin $[o_x,o_y]=[2,2]$.

C.1.1 Bicubic Upsampler

Bicubic coefficients (normalized to 256), where x is the horizontal dimension, and y the vertical one shall be:

| 0 | −2 | −6 | 1 |
|---|----|----|---|
| −2 | 15 | 54 | −5 |
| −6 | 54 | 193 | −19 |
| 1 | −5 | −19 | 2 |

C.1.2 Sharp Upsampler

Sharp coefficients (normalized to 256), where x is the horizontal dimension, and y the vertical one shall be:

| 2 | −4 | −11 | 3 |
|---|----|-----|---|
| −4 | 18 | 46 | −6 |
| −11 | 46 | 250 | −39 |
| 3 | −6 | −39 | −8 |

C.2 Standard Nearest Neighbor Upsampler

A standard nearest-neighbor (NN) upsampler shall produce the output as a Kronecker Product of the lower surface by a 2×2 unit array.

To produce the Kronecker Product of an array, X, with a 2×2 unit array, each element of X shall be replaced by a 2×2 block of copies of the element.

In other words the value of one pixel in the upsampled surfaces shall be the value of the reference pixel in the lower surface, replicated twice on each direction.

Example

| 23 | 100 | −68 |
|----|-----|-----|
| −2 | 255 | 0 |

Becomes:

| 23 | 23 | 100 | 100 | −68 | −68 |
|----|----|-----|-----|-----|-----|
| 23 | 23 | 100 | 100 | −68 | −68 |
| −2 | −2 | 255 | 255 | 0 | 0 |
| −2 | −2 | 255 | 255 | 0 | 0 |

C.3 Standard Non-Linear 6 Layers 16-8-3 Set of Upsamplers

C.3.1 Layered Upsampler

A standard non-linear 6 layers 16-8-3 upsampler definition shall be a set of 6 different upsamplers, which shall be enumerated from 0 to 5. An upsampler with index/shall depend on the upsampler state of index l+1, and on the input picture, described as follows. Where the term feature format is used, the standard 32 bit floating point type shall be understood. Where the term picture format, is used, this shall be a fixed-point format.

The input to each upsampler shall be one of the following:

Upsamplers 5 shall take as input a 2D array, in picture format, whose x and y sizes should be the size of the picture at LoQ l+1, called the input picture.

Upsamplers from 4 to 0 shall take as input the same 2D array as above, also called the input picture, and an additional set of 7, 2D arrays, whose x and y sizes are all the same as the input picture, and elements are in feature format, called the LoQ l+1 upsampler state.

The output of each upsampler shall be one of the following:

Upsampler 0 shall return A 2D array, in picture format, whose x and y sizes should be the size of the picture at LoQ l, called the output picture.

Upsamplers 5 to 1, shall return A 2D array as above, also called the output picture, and an additional set of 7, 2D arrays, whose x and y sizes are all the same as the output picture, and elements are in feature format, called the LoQ l upsampler state.

C.3.2 Standard 16-8-3 Convolution Sets

The 6 upsamplers, ordered from the highest index, shall in turn implement the following operations:

Convolution operators shall be fully characterized by the number of input channels, the kernel size, the set of bias, coefficients, and the alpha factor from convolution coefficients set i of upsampler i, a step which shall be either 1 or 2, and an Out-of-Bound Reading Rule.

Every upsampler shall have 6 sets of convolution operators, each shall be called Convolution Set i, with i from 0 to 5. A convolution set shall be made of N convolution operators.

Convolutions Sets 0, 2, and 4 of any upsampler shall have N=16 convolution operators, and shall have kernel size 3.

Convolution Sets 1, 3, and 5 of any upsampler shall have N=8 convolution operators, and shall have kernel size 1.

All convolution sets shall compute a number of channels equal to the number of convolution operators in that set.

Convolution set 0 of Upsampler 5 shall take as input the upsampler input picture, and shall therefore have 1 input channel.

Convolution set 0 of Upsamplers 1 to 5, shall take as input 8 channels which shall be the input to the upsampler itself. The first channel shall be the input picture (output of upsampler for LoQ l+1) and the remaining 7 channels shall be the LoQ l+1 upsampler state channels.

Convolution set 0 of any of the 6 Upsamplers shall divide the input picture by 1000 and shall pass it to the convolution operators as feature format.

Convolutions Sets 1 to 5 shall take as input the output of the previous Convolution Set.

Every upsampler shall have a convolution called Reference Deconvolution. This shall be a single operator with 8 input channels, kernel size 4, and set of bias, coefficients, and alpha factor from deconvolution coefficients of upsampler i, and step=2. The input to the reference deconvolution shall be the output of convolution set 5.

Every upsampler shall have a Reference Upsampler, this shall be a standard linear upsampler, with coefficients from the sharp upsampler table. This shall take as input the input picture at LoQ l+1, in feature format, and shall return a surface, also in feature format, that shall be double the size of the input.

Every upsampler shall have an operator that produces the final output as the sum of the output of deconvolution set 1 and reference upsampler, multiplied by 1000, and rounded to integer that shall be returned in picture format.

Upsamplers 1 to 5, shall have 2 set of convolution operators, each shall be called Feature Deconvolution Sets 0 or 1. Set 0 shall have 16 convolution operators, each shall have kernel size 4, 8 input channels, the set of bias, coefficients, and alpha factor from deconvolution coefficients set 0 of upsampler i, and step=2. Set 1 shall have 7 convolution operators, each with kernel size 1, 16 input channels, and bias, coefficients, and alpha factor from deconvolution coefficients set 1 of upsampler i, and step=1.

All convolution sets shall have an out-of-bound reading rule, which shall apply when the convolution operator needs a value that would fall outside of the area of the input picture or state channel. Convolution operators of all Convolution Sets shall use a rule of type mirror:

$$\text{mirror}(x, W) = \begin{cases} x, & 0 \leq x < W \\ -x, & x < 0 \\ 2*W - x - 2, & x \geq W \end{cases}$$

whereas convolution operators of Deconvolution Sets (Reference or Feature) shall use a rule of type zero:

$$\text{zero}(x, W) = \begin{cases} x, & 0 \leq x < W \\ 0, & \text{otherwise} \end{cases}$$

If the number of LoQs is 7 or more, Upsampler i shall be used to upsample LoQ i+1 to LoQ i, where i is at most 5. Upsampler 5 shall be used when i is greater.

If the number of LoQs is less then 7, a number of upsamplers starting from 0 shall not be used, Upsampler 5 shall be used for the LoQ above the Initial Loq, and the remaining Upsamplers shall be used for the further LoQs above.

C.3.3 Convolution Operator

A convolution operator shall be defined by
Scalar bias factor b
3D coefficients array k
Scalar multiplication factor a
A rule for out-of-bound reading (oob rule)
of that specific convolution operator, in a convolution set (if applicable) and of the specific upsampler. Input and output shall be parameters of this operator. Indexing is base zero. Step shall be either 1 or 2.

The following definitions shall be used:
I[c, n, m] shall be the 3D input array (in feature format). First index c shall be the channel index, second index m shall be the vertical dimension, and the third index m shall be the horizontal dimension.
C shall be the number of input channels.
O[y,x] shall be the 2D output array, in feature format. First index y shall be the vertical dimension, second index x shall be the horizontal dimension.
S shall be the kernel size, and i shall be horizontal index
j shall be the vertical index.
o=s/2.

Step shall be be either 1 or 2. The out-of-bound rule shall be applied on I[c, n, m] arrays:
If step is 1: S[c,y,x]=I[c,oob(y),oob(x)].

If step is 2: $S[c, y, x] =$ $$\begin{cases} I[c, oob((y-1)/2, H_i), oob((x-1)/2, W_i), & \text{both } x \text{ and } y \text{ are odd} \\ 0, & \text{otherwise} \end{cases}$$

$W_i$ shall be the horizontal size of the input channels.
$H_i$ shall be the vertical size of the input channels.
O[y,x] shall be the output.
The convolution operator shall be:

$$R[x, y] = b + \sum_{c=0}^{C-1}\sum_{j=0}^{S-1}\sum_{i=0}^{S-1} S[c, y-0+j, x-0+i] * k[c, j, i] O[y, x] =$$

$$\max(R[y, x], a*R[y, x])$$

C.4 Organization of Coefficients Sets for Standard Non-Linear Upsamplers

C.4.1 Organization Methodology

Section C.5 introduces an annex that tabulates all factors and coefficients mentioned in section C.3 and shall be used by upsamplers 0 to 5. Every figure in the tables is given as a mantissa (in hexadecimal format +hhhh or −hhhh) and an exponent (in hexadecimal format +h or −h). Upsamplers 0 to 5 are listed in sub-sections of the annex. Section C.4.2, below, describes the meaning of each table, and the order of the sub-sections reflects the order of the tables (as required) for a particular upsampler.

C.4.2 Upsamplers 0 to 5

This is an example of the "Upsamplers" sections from the annexed documents

C.4.2.1 Upsamplers 0 to 5, Convolution Sets 0, 2, and 4

These sections give bias and alpha factors, and 3×3 coefficients organized in tables like the following one:

| ch | k[0, 0] | k[0, 1] | k[0, 2] | k[1, 0] | k[1, 1] | k[1, 2] | k[2, 0] | k[2, 1] | k[2, 2] |
|---|---|---|---|---|---|---|---|---|---|
| | m, e | m, e | m, e | m, e | m, e | m, e | m, e | m, e | m, e |

C.4.2.2 Upsampler 0, Convolution Sets 1, 3, and 5

These sections give alpha factors, and bias factors and 1×1 coefficients organized in tables like the following one, where the first row is the biases and the remaining ones correspond each to a channel:

| operators | 0 | 1 | 2 | 3 | 4 | 5 | 6 | 7 |
|---|---|---|---|---|---|---|---|---|
| biases | m, e | m, e | m, e | m, e | m, e | m, e | m, e | m, e |
| ch idx | m, e | m, e | m, e | m, e | m, e | m, e | m, e | m, e |

C.4.2.3 Upsamplers 0 to 5, Reference Deconvolution

These sections give alpha factors, biases and coefficients of the 4×4 kernels. Rows of the 4×4 kernels are given in pairs for all input channels, like the following tables:

| ch | k[y, 0] | k[y, 1] | k[y, 2] | k[y, 3] | k[y + 1, 0] | k[y + 1, 1] | k[y + 1, 2] | k[y + 1, 3] |
|---|---|---|---|---|---|---|---|---|
| | m, e | m, e | m, e | m, e | m, e | m, e | m, e | m, e |

C.4.2.4 Upsamplers 1 to 5, Feature Deconvolution Set 0

These sections give bias and alpha factors, and 4×4 coefficientsRows of the 4×4 kernels are given in pairs for all input channels, like the following tables:

| ch | k[y, 0] | k[y, 1] | k[y, 2] | k[y, 3] | k[y + 1, 0] | k[y + 1, 1] | k[y + 1, 2] | k[y + 1, 3] |
|---|---|---|---|---|---|---|---|---|
| | m, e | m, e | m, e | m, e | m, e | m, e | m, e | m, e |

C.4.2.5 Upsamplers 1 to 5, Feature Deconvolution Set 1

These sections give alpha factors, and bias factors and 1×1 coefficients organized in tables like the following one, where the first row is the biases and the remaining ones correspond each to a channel:

| operators | 0 | 1 | 2 | 3 | 4 | 5 | 6 |
|---|---|---|---|---|---|---|---|
| biases | m, e | m, e | m, e | m, e | m, e | m, e | m, e |
| ch idx | m, e | m, e | m, e | m, e | m, e | m, e | m, e |

C.5 Standard Coefficient Sets for Upsamplers 0 to 6

An additional element of this standard entitled "Coefficient Sets" contains coefficient sets reflecting the layouts described in section C.4.

Every figure is given as a mantissa (in hexadecimal format)—where the unit and decimal separator have been removed as they are constant, and an exponent for base 10, also in hex format.

Bytestream and Decoding—Further Description

In a further embodiment, it is described a generic way of decoding a bytestream according to the present invention.

A decoding module would receive a portion of data to be decoded (e.g., Stream as described in the present application). This portion of data would be part of a data stream, such as a Bytestream as described in the present application. This portion of data may be of variable length (for example, 3 bytes or equivalently 24 bits) and is typically associated with an elementary data structure that describes the data to be decoded, for example the data structure called Tile as further described in the present application and other applications by the same applicant such as European patent application No. 17386045.3 and/or 17386046.1 both filed on 6 Dec. 2017 and incorporated herein by reference.

To enable decoding of the portion of data, use of some additional data such as metadata may be required. This metadata may be present in the portion of data itself (for example, the portion of data may include a header field containing said metadata and a payload field containing data to be decoded), or could be received as part of a separate data field, such as a data field including metadata for multiple portions of data (e.g., for all the Streams in a Surface, wherein Surface is described in the present application) with the portions of data included in a payload field. This separate data field may be received prior to the portion of data. The header field of the portion of data may be decoded ahead of the payload field in order to enable decoding of the data to be decoded. This separate data field may be decoded ahead of a portion of data. The metadata themselves may be associated with the elementary data structure that describes the metadata, for example the data structure called Tableau as further described in the present application and other applications such as the above-mentioned European patent application No. 17386045.3 and/or 17386046.1.

Note that Tile and Tableau are two embodiments of the same data structure called Tessera, as further described in the present application and other applications by the same applicant such as the above-mentioned European patent application No. 17386045.3 and/or 17386046.1.

As discussed above, the data stream (e.g., Bytestream) may include multiple portions of data. Typically, there are no gaps between different portions of data—in other words, the last byte (or bit) of a first portion of data is followed in the data stream by the first byte (or bit) of a second portion of data. The metadata may be used to indicate a length associated with a portion of data (e.g., a StreamLength as described in the present application). These lengths can range from zero to an arbitrary maximum number of bytes associated with a portion of stream.

Figure 16:
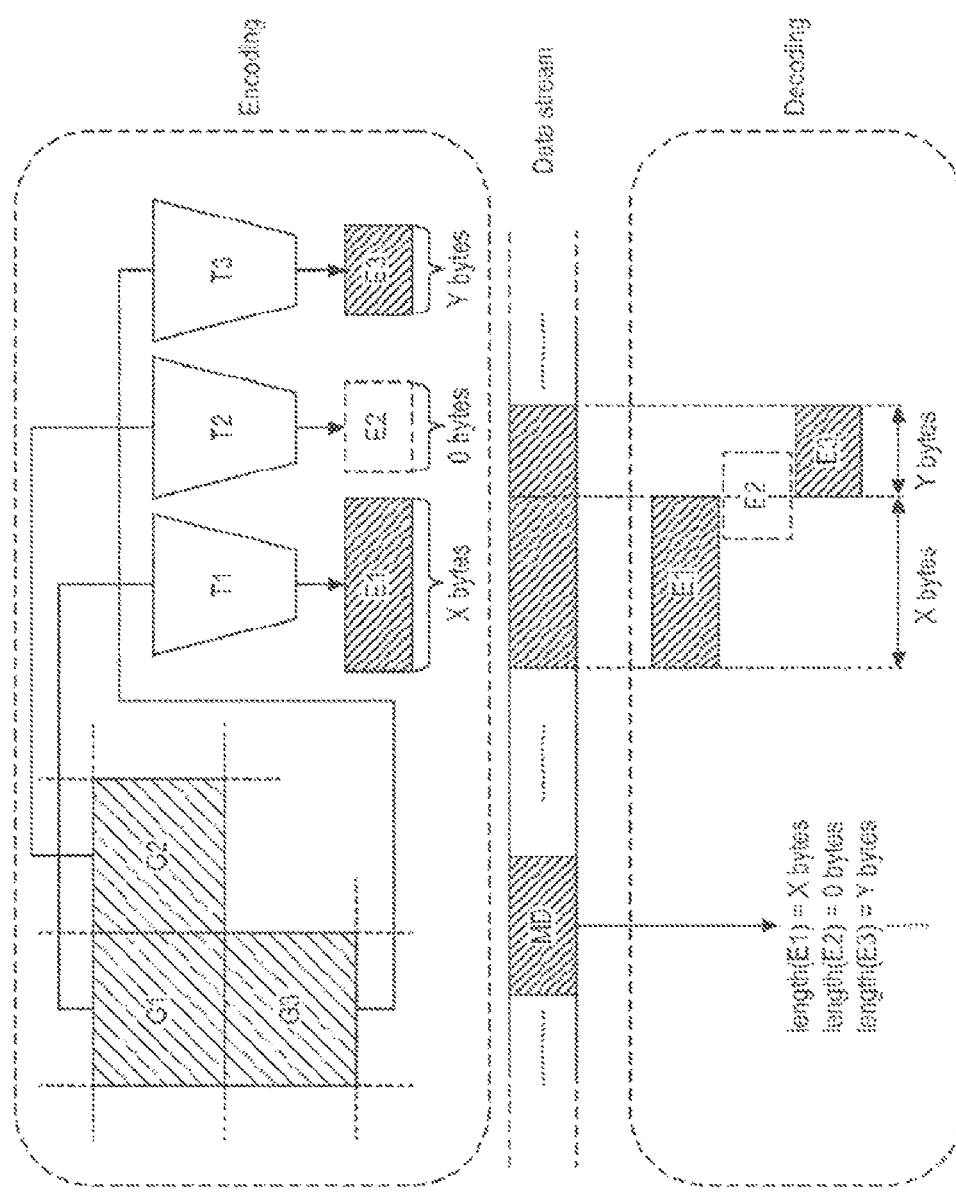
FIG. 16 illustrates encoding and decoding a data stream.

During encoding, the data to be encoded (for example, transformed residual data) are processed so that they are divided into groupings of data, with each grouping of data associated with an elementary data structure (e.g., Tessera) as discussed above. For example, with reference to FIG. 16, a first grouping of data G1 may be associated with a first elementary data structure T1 and gets encoded as first encoded data set E1, a second grouping of data may be associated with a second elementary data structure T2 and gets encoded as second encoded data set E2, a third grouping of data G3 may be associated with a third elementary data structure T3 and gets encoded as first encoded data set E1, and so forth. When transmitting to the decoder, a data stream would need to be created, said data stream being formed by a sequence of bytes corresponding to the sequence of encoded data sets, first E1, then E2, then E3 and so forth.

Since the data to be encoded may be sparse in nature (e.g., many of those data to be encoded are either zero or below a certain threshold), some of these groupings of data to be encoded may be completely empty, for example G2 may be completely empty. That means that whilst G1 and G3 contains some data to be decoded and therefore the corresponding encoded data sets E1 and E3, respectively, contains data to be decoded, G2 does not contains any data and therefore the corresponding encoded data set E2 contains no data.

Accordingly, the data stream will contain a first portion of data corresponding to E1 and a second portion of data corresponding to E3, with no portion of data corresponding to E2.

Since the decoding module would not know a priori that there is no portion of data corresponding to E2, and since the data stream as discussed above has no gaps, the decoder needs to receive information about the length of each of the portion of data to reconstruct and decode the various groupings of data. Accordingly, the metadata MD will contain information about the length of the various portions of data in the data stream. In the exemplary FIG. 16, E1 has length of X bytes, E2 has a length of 0 bytes, E3 has a length of Y bytes.

The decoding module will extract the length information from the metadata MD, and based on it extract from the data stream the corresponding portions of data. With reference to the exemplary FIG. 16, the decoding module extracts the length of E1 as X bytes, Accordingly, the first X bytes of the payload data will be associated with E1. Further, since the decoding module would extract the length of E2 as 0 bytes whilst the length of E3 as Y bytes, the decoding module will associate the next X bytes in the payload data with E3, therefore knowing that E2 has no data associated with it. Accordingly, the decoding module will decode E1 and E3 to arrive at the reconstructed versions of, respectively, groupings of data G1 and grouping of data G3, but it will not reconstruct any grouping of data G2.

As described in the present application and other applications such as the above-mentioned European patent application No. 17386045.3 and/or 17386046.1, the data to be decoded are organised in tiers of Tesserae, with the top Tier (Tier 0) being the Tesserae associated with transformed residual data (also known as Tiles), Tier −1 being the Tesseare associated with metadata of the Tiles on Tier 0 (these Tesserae also known as Tableaux), Tier −2 being the Tesserae associated with metadata of the Tableaux of Tier −1, and so on and so forth. These metadata could be, for example, the length of the portions of data associated with the Tiles (if we are referring to Tier −1) or the length of the portions of data associated with the Tableaux (if we are referring to Tier −2).

Accordingly, when a decoding module receives the data stream it shall extract information about the length of the portions of data associated with the various Tesserae.

Tesserae are decoded in phases, each phase corresponding to decoding a Tier. This is further described in the present patent application. A Tableau tier decoding phase involves using Streamlengths to "find" the Tableaux for that Tier, then decoding the "found" Tesserae to obtain more Streamlengths. The Tile tier decoding phase involves using Streamlengths to find the Tiles, and decoding the "found" Tiles to get residuals (all other residuals being zero).

Bytestream Structure

Figure 17:
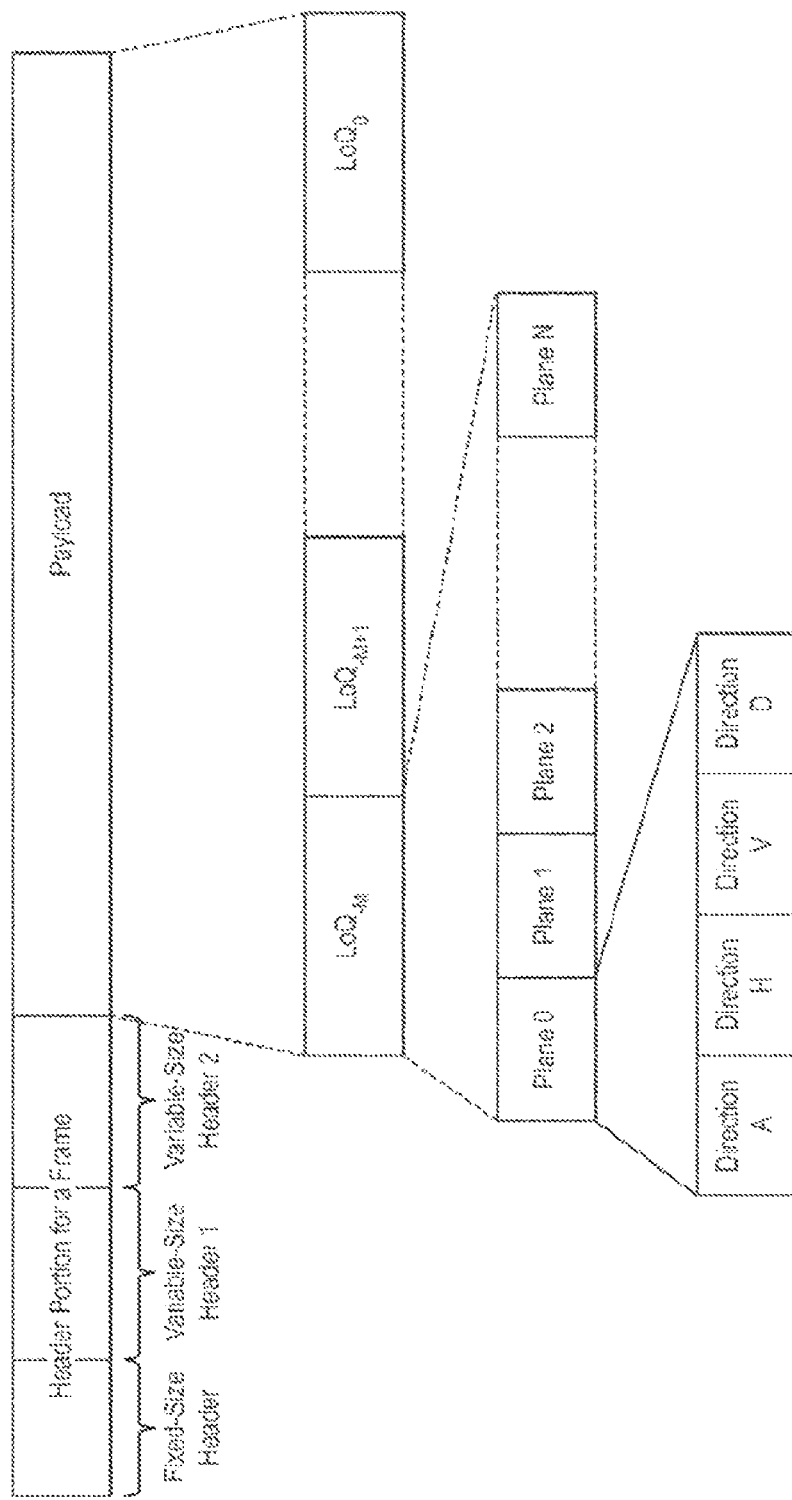
FIG. 17 illustrates a bytestream.

As shown in FIG. 17, the bytestream may include multiple fields, namely one or more headers and a payload. The headers are further described below as well as in Section 7.4. The payload is further described in Section 7.4. In general, a payload includes the actual data to be decoded, whilst the headers provide information needed when decoding the payload. The payload may include information about a plurality of planes. In other words, the payload is subdivided in portions, each portion corresponding to a plane. Each plane further comprises multiple sub-portions, each sub-portion associated with a level of quality as described in the present application. The logical structure of a Payload is an array of multi-tiered Tableaux, which precedes the Tile Tier with Tiles containing Residuals at their Top Layer. The data in the Payload that represents a Tessera shall be a Stream. In the present example, Streams are ordered by LoQ, then by Plane, then by direction and then by Tier. However, the Streams can be ordered in any other way, for example first direction, then LoQ, the Plane, then Tier. The order between directions, LoQ and Planes can be done in any way, and the actual order can be inferred by using the information in the header, for example the stream_offsets info further described below and in the present application.

The payload contains a series of streams, each stream corresponding to an encoded tessera. For the purpose of this example, we assume that the size of a tessera is 16×16. First, the decoding module would derive a root tableau (for example, associated with a first direction of a first LoQ within a first plane). From the root tableau, the decoding module would derive up to 256 attributes associated with the corresponding up to 256 tesserae associated with it and which lie in the tier above the root tier (first tier). In particular, one of the attributes is the length of the stream associated with the tessera. By using said streamlengths, the decoding module can identify the individual streams and, if implemented, decode each stream independently. Then, the decoding module would derive, from each of said tessera, attributes associated with the 256 tesserae in the tier above (second tier). One of these attributes is the length of the stream associated with the tessera. By using said streamlengths, the decoding module can identify the individual streams and, if implemented, decode each stream independently. The process will continue until the top tier is reached. Once the top tier has been reached, the next stream in the bytestream would correspond to a second root tableau (for example, associated with a second direction of a first LoQ within a first plane), and the process would continue in the same way.

Figure 22:
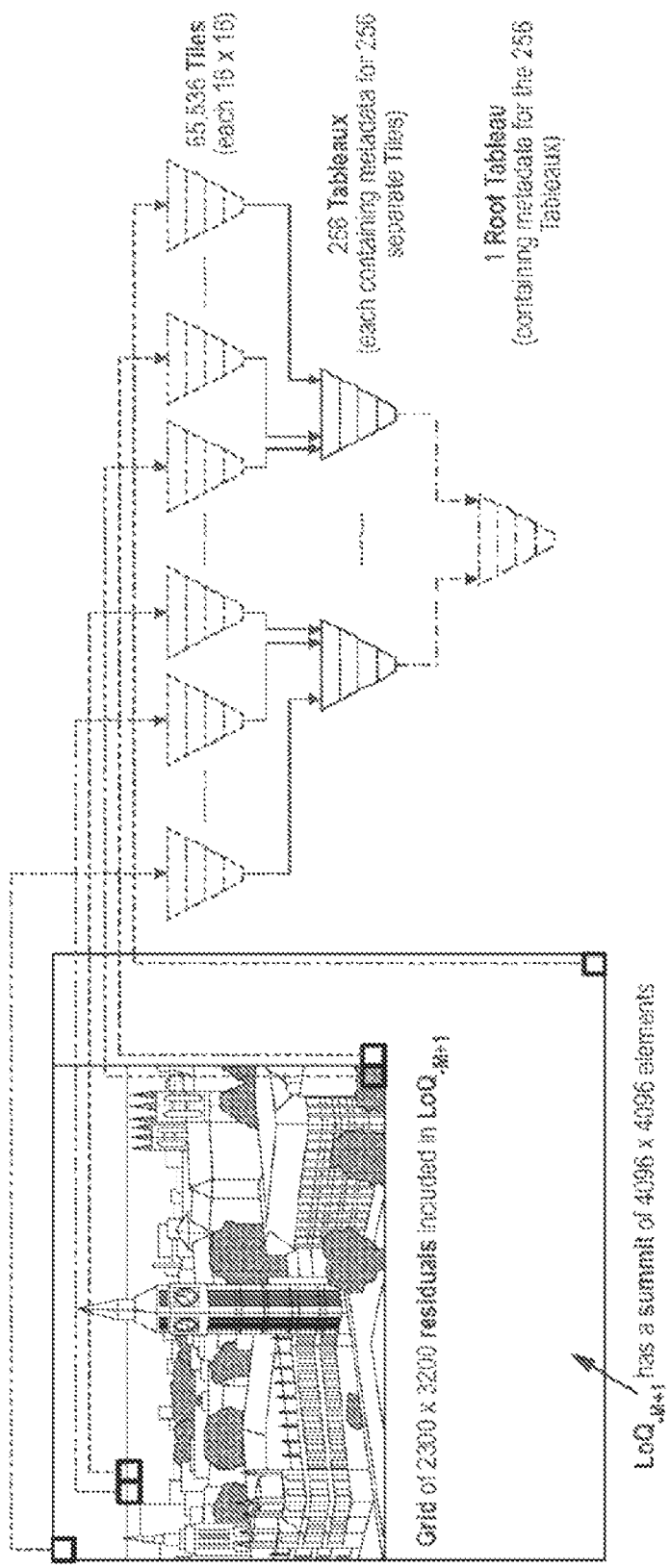
FIG. 22 illustrates an example of how a Summit is mapped.

FIG. 22 shows an example of the hierarchy of tesserae associated with a picture, in the present example including two tiers plus the root tier.

Fixed-Sized Header

Figure 18:
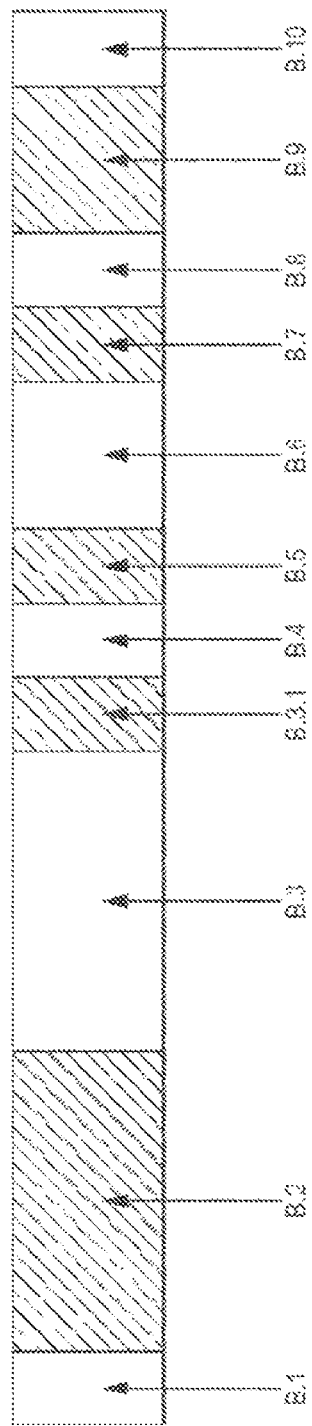
FIG. 18 illustrates a header of a bytestream.

The bytestream may include a fixed-sized header, i.e. a header whose byte/bit length is fixed. The header may include a plurality of fields. FIG. 18 shows an example of said fixed-sized header. The fixed-sized header is described in further detail in the present patent application in Section 7.4.

The fixed-sized header may include a first field indicating a version of the bytestream format (B.1—also described as format_version:unit8 in the present application). In an embodiment, this first field may include 8 bits (or equivalently 1 byte). This field may allow flexibility in the encoding/decoding process to use, adapt and/or modify the version of the bytestream format and inform a decoding module of said version. In this way, it is possible to use multiple different version of the encoding/decoding format and allow the decoding module to determine the correct version to be used.

A decoding module would obtain said first field from the bytestream and determine, based on the value included in said first field, a version of the encoding format to be used in the decoding process of said bytestream. The decoding module may use and/or implement a decoding process to adapt to said version.

The fixed-sized header may include a second field indicating a size of the picture frame encoded with a specific bytestream (B.2—also described as picture_size:unit32 in the present application). The size of the picture frame may actually correspond to the size of the bytestream associated with that picture frame. In an embodiment, this first field may include 32 bits (or equivalently 4 bytes). The size of the picture frame may be indicated in units of bytes, but other units may be used. This allows the encoding/decoding process flexibility in encoding picture frames of different size (e.g., 1024×720 pixels, 2048×1540 pixels, etc.) and allow the decoding module to determine the correct picture frame size to be used for a specific bytestream.

A decoding module would obtain said second field from the bytestream and determine, based on the value included in said second field, a size of a picture frame corresponding to said bytestream. The decoding module may use and/or implement a decoding process to adapt to said size, and in particular to reconstruct the picture frame from the encoded bytestream to fit into said size.

The fixed-sized header may include a third field indicating a recommended number of bits/bytes to fetch/retrieve at the decoding module when obtaining the bytestream (B.3—also described as recommended_fetch_size:unit32 in the present application). In an embodiment, this first field may include 32 bits (or equivalently 4 bytes). This field may be particularly useful in certain applications and/or for certain decoding modules when retrieving the bytestream from a server, for example to enable the bytestream to be fetched/retrieved at the decoding module in "portions". For example, this may enable partial decoding of the bytestream (as further described, for example, in European patent application No 17386047.9 filed on 6 Dec. 2017 by the same applicant whose contents are included in their entirety by reference) and/or optimise the retrieval of the bytestream by the decoding module (as for example further described in European patent application No 12759221.0 filed on 20 Jul. 2012 by the same applicant whose contents are included in their entirety by reference).

A decoding module would obtain said third field from the bytestream and determine, based on the value included in said third field, a number of bits and/or bytes of the bytestream to be retrieved from a separate module (for example, a server and/or a content delivery network). The decoding module may use and/or implement a decoding process to request to the separate module said number of bits and/or bytes from the bytestream, and retrieve them from the separate module.

The fixed-sized header may include another field indicating a generic value in the bytestream (B.3.1—also described as element_interpretation:uint8 in the present application). In an embodiment, this first field may include 8 bits (or equivalently 1 byte).

A decoding module would obtain said another field from the bytestream and determine, based on the value included in said another field, a value indicated by the field.

The fixed-sized header may include a fourth field indicating various system information, including the type of transform operation to be used in the decoding process (B.4—also described as pipeline:unit8 in the present application). In an embodiment, this first field may include 8 bits (or equivalently 1 byte). A transform operation is typically an operation that transform a value from an initial domain to a transformed domain. One example of such a transform is an integer composition transform further described in the present application. Another example of such a transform is a standard composition transform further described in the present application. The composition transform (integer and/or standard) are further described in European patent application No. 13722424.2 filed on 13 May 2013 by the same applicant and incorporated herein by reference.

A decoding module would obtain said fourth field from the bytestream and determine, based on at least one value included in said fourth field, a type of transform operation to be used in the decoding process. The decoding module may configure the decoding process to use the indicated transform operation and/or implement a decoding process which uses the indicated transform operation when converting one or more decoded transformed coefficient and/or value (e.g., a residual) into an original non-transform domain.

The fixed-sized header may include a fifth field indicating a type of up-sampling filtering operation to be used in the decoding process (B.5—also described as upsampler:unit8 in the present application). In an embodiment, this first field may include 8 bits (or equivalently 1 byte). An up-sampling filtering operation comprises a filter which applies certain mathematical operations to a first number of samples/values to produce a second number of samples/values, wherein the second number is higher than the first number. The mathematical operations can either be pre-defined, adapted either based on an algorithm (e.g., using a neural network or some other adaptive filtering technique) or adapted based on additional information received at the decoding module. Examples of such up-sampling filtering operations comprise a Nearest Neighbour filtering operation, a Sharp filtering operation, a Bi-cubic filtering operation, and a Convolutional Neural Network (CNN) filtering operations. These filtering operations are described in further detail in the present application, as well as in UK patent application No. 1720365.4 filed on 6 Dec. 2017 by the same applicant and incorporated herein by reference.

A decoding module would obtain said fifth field from the bytestream and determine, based on at least one value included in said fifth field, a type of up-sampling operation to be used in the decoding process. The decoding module may configure the decoding process to use the indicated up-sampling operation and/or implement a decoding process which uses the indicated up-sampling operation. The indication of the upsampling operation to be used allows flexibility in the encoding/decoding process, for example to better suit the type of picture to be encoded/decoded based on its characteristics.

The fixed-sized header may include a sixth field indicating one or more modifying operations used in the encoding process when building the fixed-sized header and/or other headers and/or to be used in the decoding process in order to decode the bytestream (see below) (B.6—also described as shortcuts: shortcuts_t in the present application). These modifying operations are also called shortcuts in the present application and further described in the present application in Section 7.5. The general advantage provided by these shortcuts is to reduce the amount of data to be encoded/decoded and/or to optimise the execution time at the decoder, for example by optimising the processing of the bytestream.

A decoding module would obtain said sixth field from the bytestream and determine, based on at least one value included in said sixth field, a type of shortcut used in the encoding process and/or to be used in the decoding process. The decoding module may configure the decoding process to adapt its operations based on the indicated shortcut and/or implement a decoding process which uses the indicated shortcut. The specific type of shortcuts, what each type means and what advantage it provides in further described in the present application in Section 7.5.

The fixed-sized header may include a seventh field indicating a first number of bits to be used to represent an integer number and a second number of bits to be used to represent a fractional part of a number (B.7—also described as element_descriptor:tuple (uint5, utin3) in the present application). In an embodiment, this first field may include 8 bits (or equivalently 1 byte) subdivided in 5 bits for the first number of bits and 3 bits for the second number of bits.

A decoding module would obtain said seventh field from the bytestream and determine, based on at least one value included in said seventh field, how many bits to dedicate to represent the integer part of a number that has both integer and fractional parts and how many bits to dedicate to a fractional number.

The fixed-sized header may include an eighth field indicating a number of planes forming a frame and to be used when decoding the bytestream (B.8—also described as num_plane:unit8 in the present application). In an embodiment, this first field may include 8 bits (or equivalently 1 byte). A plane is defined in the present application and is, for example, one of the dimensions in a color space, for examples the luminance component Y in a YUV space, or the red component R in an RGB space.

A decoding module would obtain said eighth field from the bytestream and determine, based on at least one value included in said fifth field, the number of planes included in a picture.

The fixed-sized header may include a ninth field indicating a size of an auxiliary header portion included in a separate header—for example the First Variable-Size Header or the Second Variable-Size Header (B.9—also described as aux_header_size:uunt16 in the present application). In an embodiment, this first field may include 16 bits (or equivalently 2 byte). This field allows the encoding/decoding process to be flexible and define potential additional header fields.

A decoding module would obtain said ninth field from the bytestream and determine, based on at least one value included in said ninth field, a size of an auxiliary header portion included in a separate header. The decoding module may configure the decoding process to read the auxiliary header in the bytestream.

The fixed-sized header may include a tenth field indicating a number of auxiliary attributes (B.10—also described as num_aux_tile_attribute:uint4 and num_aux_tableau_attribute: uint4 in the present application). In an embodiment, this first field may include 8 bits (or equivalently 1 byte) split into two 4-bits sections. This field allows the encoding/ decoding process to be flexible and define potential additional attributes for both Tiles and Tableaux. These additional attributes may be defined in the encoding/decoding process.

A decoding module would obtain said tenth field from the bytestream and determine, based on at least one value included in said tenth field, a number of auxiliary attributes associated with a tile and/or a number of auxiliary attributes associated with a tableau. The decoding module may configure the decoding process to read said auxiliary attributes in the bytestream.

First Variable-Sized Header

Figure 19:
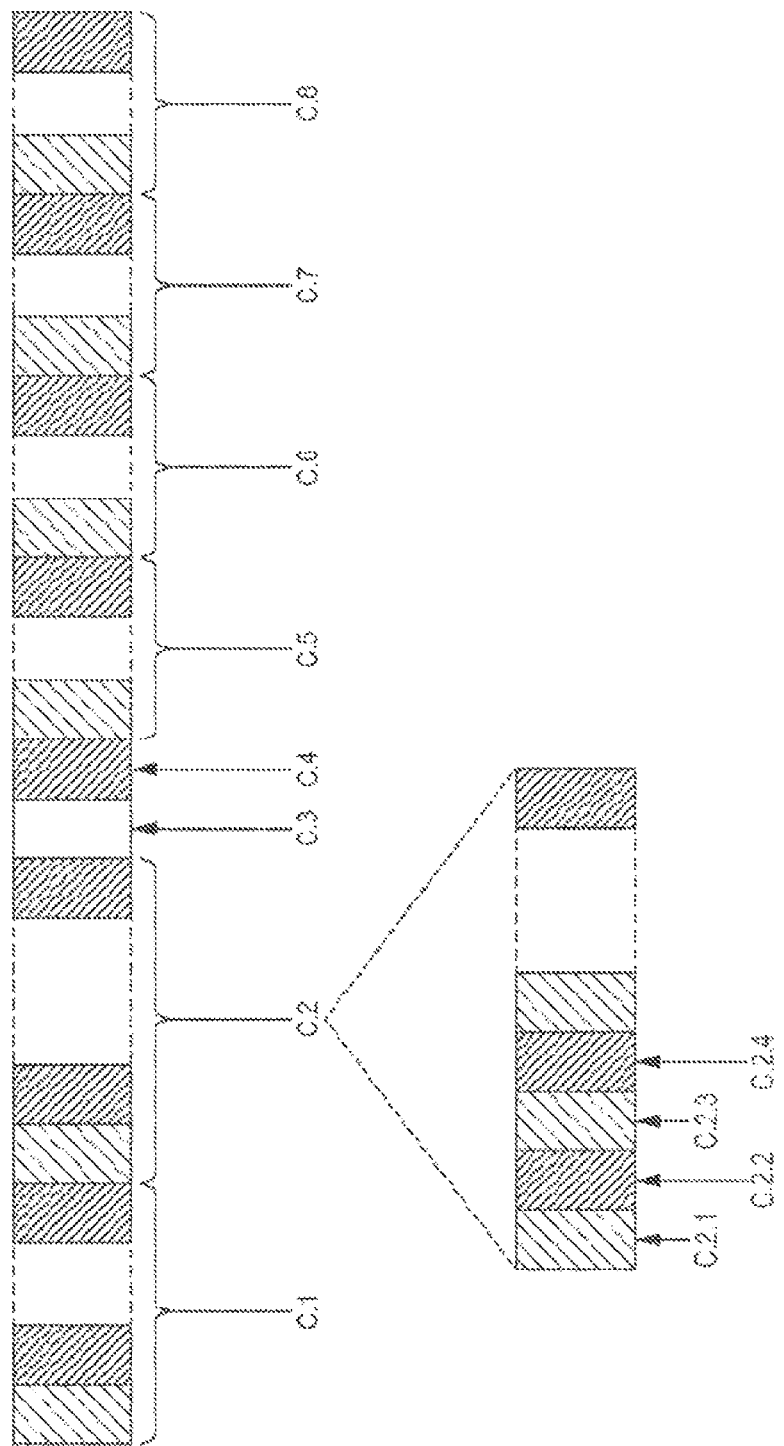
FIG. 19 illustrates a variable sized header.

The bytestream may include a first variable-sized header, i.e. a header whose byte/bit length is changeable depending on the data being transmitted within it. The header may include a plurality of fields. FIG. 19 shows an example of said first variable-sized header. The first variable-sized header is described in further detail in the present patent application in Section 7.4.

The first variable-sized header may include a first field indicating a size of a field associated with an auxiliary attribute of a tile and/or a tableau (C.1—also described as aux_attribute_sizes: unti16 [num_aux_tile_attribute+num_aux_tableau_attribute] in the present application). In an embodiment, the second field may include a number of sub-fields, each indicating a size for a corresponding auxiliary attribute of a tile and/or a tableau. The number of these sub-fields, and correspondingly the number of auxiliary attributes for a tile and/or a tableau, may be indicated in a field of a different header, for example the fixed header described above, in particular in field B.10. In an embodiment, this first field may include 16 bits (or equivalently 2 bytes) for each of the auxiliary attributes. Since the auxiliary attributes may not be included in the bytestream, this field would allow the encoding/decoding process to define the size of the auxiliary attributes were they to be included in the bytestream. This contrasts, for example, with the attributes (see for example C.2 below) which typically are pre-defined in size and therefore their size does not need to be specified and/or communicated.

A decoding module would obtain said first field from the bytestream and determine, based on a value included in said first field, a size of an auxiliary attribute associated with a tessera, (i.e., either a tile or a tableau). In particular, the decoding module may obtain from said first field in the bytestream, a size of an auxiliary attribute for each of the auxiliary attributes which the decoding module is expecting to decode, for example based on information received separately about the number of auxiliary attributes to be specified. The decoding module may configure the decoding process to read the auxiliary attributes in the bytestream.

The first variable-sized header may include a second field indicating, for each attribute of a tile and/or a tableau, a number of different versions of the respective attribute (C.2—also described as nums_attribute:unti16[4+num_aux_tile_attribute+num_aux_tableau_attribute] in the present application). The second field may include a number of sub-fields, each indicating for a corresponding attribute a number of different version of said respective attribute. The number of these sub-fields, and correspondingly the number of standard attributes and auxiliary attributes for a tile and/or a tableau, may be indicated at least in part in a field of a different header, for example the fixed header described above, in particular in field B.10. The attributes may comprise both standard attributes associated with a tile and/or a tableau and the auxiliary attributes as described above. In an embodiment, there are three standard attributes associated with a tile (e.g., Residual Statistics, T-Node Statistics and Quantization Parameters as further described in the present application) and two standard attributes associated with a tableau (e.g., Streamlengths Statistics and T-Node Statistics). In an embodiment, since the T-Node Statistics for the tiles and the tableaux may be the same, they may only require to be specified once. In such embodiment, only four different standard attributes will need to be included (and therefore only four sub-fields, C.2.1 to C.2.4, each associated with one of the four standard attributes Residual Statistics, T-Node Statistics, Quantization Parameters and Streamlengths Statistics, are included in the second field, each indicating a number of different versions of the respective attribute). Accordingly, there may be four different sub-fields in said second field, each indicating the number of standard attributes for a tile and/or a tableau which need to be specified for the decoding process. By way of example, if the sub-field associated with the T-Node Statistics indicate a number 20, it means that there will be 20 different available versions of T-Node Statistics to use for tiles and/or attributes.

A decoding module would obtain said second field from the bytestream and determine, based on a value included in said second field, a number of different versions of a respective attribute, said attribute associated with a tile and/or a tableau. The decoding module may configure the decoding process to use the available versions of the corresponding attributes.

The first variable-sized header may include a third field indicating a number of different groupings of tiles, wherein each grouping of tiles is associated with a common attribute (C.3—also described as num_tileset:uint16 in the present application). In an embodiment, this first field may include 16 bits (or equivalently 2 bytes). In an embodiment, the common attribute may be the T-Node Statistics for a tile. For example, if a grouping of tiles (also known as "tileset" in the present application) is associated with the same T-node Statistics, it means that all the tiles in that grouping shall be associated with the same T-Node Statistics. The use of grouping of tiles sharing one or more common attributes allows the coding and decoding process to be flexible in terms of specifying multiple versions of a same attribute and associate them with the correct tiles. For example, if a group of tiles belongs to "Group A", and "Group A" is associated with "Attribute A" (for example, a specific T-Node Statistics), then all the tiles in Group A shall use that Attribute A. Similarly, if a group of tiles belongs to "Group B", and "Group B" is associated with "Attribute B" (for example, a specific T-Node Statistics different from that of Group A), then all the tiles in Group B shall use that Attribute B. This is particularly useful in allowing the tiles to be associated with a statistical distribution as close as possible to that of the tile but without having to specify different statistics for every tile. In this way, a balance is reached between optimising the entropy encoding and decoding (optimal encoding and decoding would occur if the distribution associated with the tile is the exact distribution of that tile) whilst minimising the amount of data to be transmitted. Tiles are grouped, and a "common" statistics is used for that group of tiles which is as close as possible to the statistics of the tiles included in that grouping. For example, if we have 256 tiles, in an ideal situation we would need to send 256 different statistics, one for each of the tiles, in order to optimise the entropy encoding and decoding process (an entropy encoder/decoder is more efficient the more the statistical distribution of the encoded/decoded symbols is close to the actual distribution of said symbols). However, sending statistics is impractical and expensive in terms of compression efficiency. So, typical systems would send only one single statistics for all the 256 tiles. However, if the tiles are grouped into a limited number of groupings, for example 10, with each tile in each grouping having similar statistics, then only 10 statistics would need to be sent. In this way, a better encoding/decoding would be achieved than if only one common statistics was to be sent for all the 256 tiles, whilst at the same time sending only 10 statistics and therefore not compromising too much the compression efficiency.

A decoding module would obtain said third field from the bytestream and determine, based on a value included in said third field, a number of different groupings of tiles. The decoding module may configure the decoding process to use, when decoding a tile corresponding to a specific grouping, one or more attributes associated with said grouping.

The first variable-sized header may include a fourth field indicating a number of different groupings of tableaux, wherein each grouping of tableaus is associated with a common attribute (C.4—also described as num_tableauset:uint16 in the present application). In an embodiment, this fourth field may include 16 bits (or equivalently 2 bytes). This field works and is based on the same principles as the third field, except that in this case it refers to tableaux rather than tiles.

A decoding module would obtain said fourth field from the bytestream and determine, based on a value included in said fourth field, a number of different groupings of tableaux. The decoding module may configure the decoding process to use, when decoding a tableau corresponding to a specific grouping, one or more attributes associated with said grouping.

The first variable-sized header may include a fifth field indicating a width for each of a plurality of planes (C.5—also described as widths:uint16 [num_plane] in the present application). In an embodiment, this fifth field may include 16 bits (or equivalently 2 bytes) for each of the plurality of planes. A plane is further defined in the present specification, but in general is a grid (usually a two-dimensional one) of elements associated with a specific characteristic, for example in the case of video the characteristics could be luminance, or a specific color (e.g. red, blue or green). The width may correspond to one of the dimensions of a plane. Typically, there are a plurality of planes.

A decoding module would obtain said fifth field from the bytestream and determine, based on a value included in said fifth field, a first dimension associated with a plane of elements (e.g., picture elements, residuals, etc.). This first dimension may be the width of said plane. The decoding module may configure the decoding process to use, when decoding the bytestream, said first dimension in relation to its respective plane.

The first variable-sized header may include a sixth field indicating a width for each of a plurality of planes (C.6—also described as heights:uint16 [num_plane] in the present application). In an embodiment, this sixth field may include 16 bits (or equivalently 2 bytes) for each of the plurality of planes. The height may correspond to one of the dimensions of a plane.

A decoding module would obtain said sixth field from the bytestream and determine, based on a value included in said sixth field, a second dimension associated with a plane of elements (e.g., picture elements, residuals, etc.). This second dimension may be the height of said plane. The decoding module may configure the decoding process to use, when decoding the bytestream, said second dimension in relation to its respective plane.

The first variable-sized header may include a seventh field indicating a number of encoding/decoding levels for each of a plurality of planes (C.7—also described as num_loqs: uint8 [num_plane] in the present application). In an embodiment, this seventh field may include 16 bits (or equivalently 2 bytes) for each of the plurality of planes. The encoding/decoding levels corresponds to different levels (e.g., different resolutions) within a hierarchical encoding process. The encoding/decoding levels are also referred in the application as Level of Quality A decoding module would obtain said seventh field from the bytestream and determine, based on a value included in said seventh field, a number of encoding levels for each of a plurality of planes (e.g., picture elements, residuals, etc.). The decoding module may configure the decoding process to use, when decoding the bytestream, said number of encoding levels in relation to its respective plane.

The first variable-sized header may include an eighth field containing information about the auxiliary attributes (C.8—also described as aux_header:uint8 [aux_header_size] in the present application). In an embodiment, this eight field may include a plurality of 8 bits (or equivalently 1 byte) depending on a size specified, for example, in a field of the fixed header (e.g., B.9)

A decoding module would obtain said eighth field from the bytestream and determine information about the auxiliary attributes. The decoding module may configure the decoding process to use, when decoding the bytestream, said information to decode the auxiliary attributes.

Second Variable-Sized Header

Figure 20:
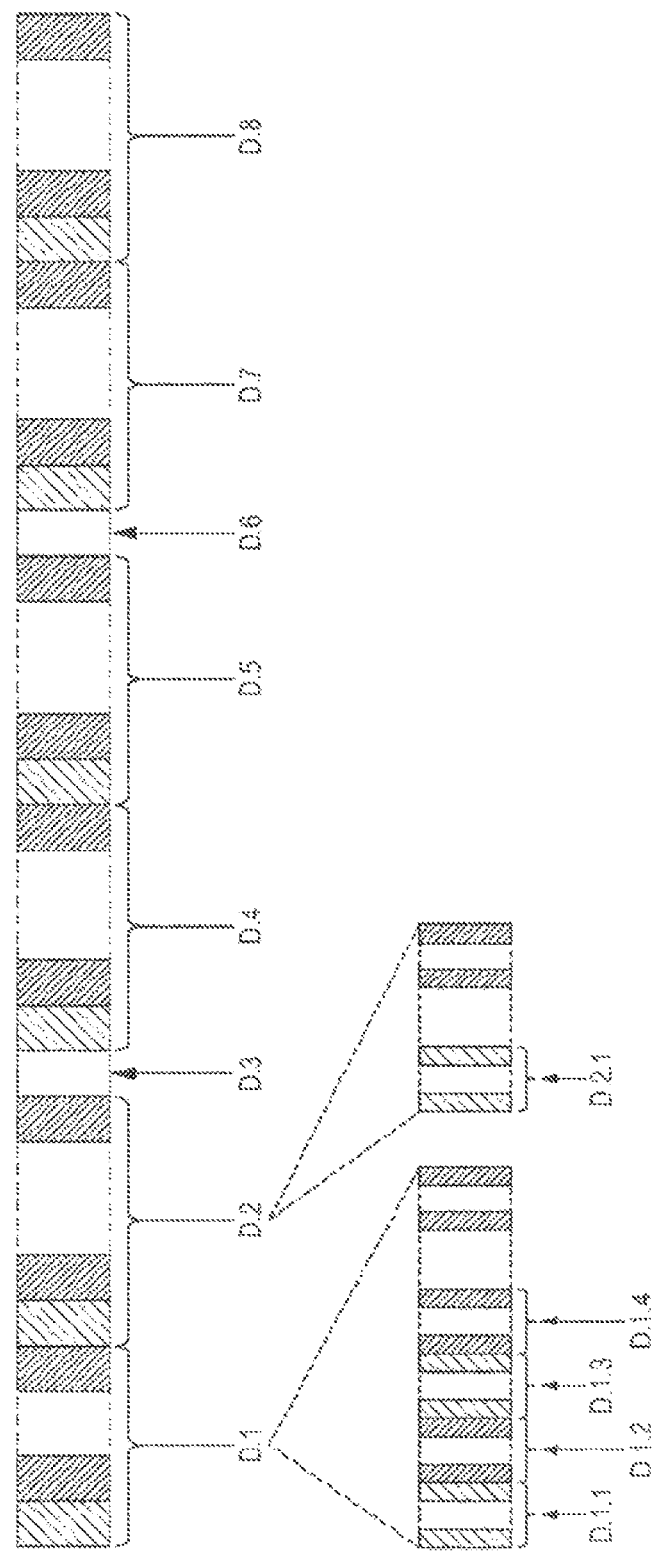
FIG. 20 illustrates a second variable sized header.

The bytestream may include a second variable-sized header, i.e. a header whose byte/bit length is changeable depending on the data being transmitted within it. The header may include a plurality of fields. FIG. 20 shows an example of said second variable-sized header. The second variable-sized header is described in further detail in the present patent application in Section 7.4

The second variable-sized header may include a first field containing, for each attribute, information about one or more statistics associated with the respective attribute (see D.1). The number of statistics associated with a respective attribute may be derived separately, for example via field C.2 as described above. The statistics may be provided in any form. In an embodiment of the present application, the statistics is provided using a particular set of data information which includes information about a cumulative distribution function (see also type residual_stat_t as described in the present application).

In particular, a first group of sub-fields in said first field may contain information about one or more statistics associated with residuals values (also D.1.1—also described as residual_stats: residual_stat_t[nums_attribute[0]] in the present application). In other words, the statistics may identify how a set of residual data are distributed. The number of statistics included in this first group of sub-fields may be indicated in a separate field, for example in the first sub-field C.2.1 of field C.2 as described above (also indicated as nums_attribute[0]). For example, if nums_attribute[0] is equal to 10, then there would be 10 different residuals statistics contained in said first field. For example, the first 10 sub-fields in the first field correspond to said different 10 residuals statistics.

A second group of sub-fields in said first field may contain information about one or more statistics associated with nodes within a Tessera (also D.1.2—also described as tnode_stats: tnode_stat_t[nums_attribute[1]] in the present application). In other words, the statistics may identify how a set of nodes are distributed. The number of statistics included in this second group of sub-fields may be indicated in a separate field, for example in the second sub-field C.2.2 of field C.2 as described above (also indicated as nums_attribute[1]). For example, if nums_attribute[1] is equal to 5, then there would be 5 different t-node statistics contained in said first field. For example, considering the example above, after the first 10 sub-fields in the first field, the next 5 sub-fields correspond to said 5 different t-node statistics.

A third group of sub-fields in said first field may contain information about one or more quantization parameters (also D.1.3—also described as quantization_parameters: quantization_parameters_t[nums_attribute[2]] in the present application). The number of quantization parameters included in this third group of sub-fields may be indicated in a separate field, for example in the third sub-field C.2.3 of field C.2 as described above (also indicated as nums_attribute[2]). For example, if nums_attribute[2] is equal to 10, then there would be 10 different quantization parameters contained in said first field. For example, considering the example above, after the first 15 sub-fields in the first field, the next 10 sub-fields correspond to said 10 different quantization parameters.

A fourth group of sub-fields in said first field may contain information about one or more statistics associated with streamlengths (also D.1.4—also described as stream_length_stats: stream_length_stat_t[nums_attribute[3]] in the present application). In other words, the statistics may identify how a set of streamlengths are distributed. The number of statistics included in this fourth group of sub-fields may be indicated in a separate field, for example in the fourth sub-field C.2.4 of field C.2 as described above (also indicated as nums_attribute[3]). For example, if nums_attribute[4] is equal to 12, then there would be 12 different streamlengths statistics contained in said first field. For example, considering the example above, after the first 25 sub-fields in the first field, the next 12 sub-fields correspond to said 12 different streamlengths statistics.

Further groups of sub-fields in said first field may contain information about auxiliary attributes (also described as aux_atttributes:uint1[aux_attributes_size[i]][num_aux_tile_attribute+num_aux_tableau_attribute] in the present application). The number of auxiliary attributes may be indicated in another field, for example in field C.2 as described above.

As discussed above and elsewhere in the specification, specifying one or more versions of the attributes (e.g., statistics) enables flexibility and accuracy in the encoding and decoding process, because for instance more accurate statistics can be specified for a specific grouping of tesserae (tiles and/or tableaux), thus making it possible to encode and/or decode said groupings in a more efficient manner.

A decoding module would obtain said first field from the bytestream and determine, based on the information contained in said first field, one or more attributes to be used during the decoding process. The decoding module may store the decoded one or more attributes for use during the decoding process. The decoding module may, when decoding a set of data (for example, a tile and/or a tableau) and based on an indication of attributes to use in relation to that set of data, retrieve the indicated attributes from the stored decoded one or more attributes and use it in decoding said set of data.

The second variable-sized header may include a second field containing, for each of a plurality of grouping of tiles, an indication of a corresponding set of attributes to use when decoding said grouping (D.2—also described as tilesets: uint16 [3+num_aux_tile_attributes][num_tiles] in the present application). The number of groupings of tiles may be indicated in a separate field, for example in field C.3 described above. This second field enables the encoding/decoding process to specify which of the sets of attributes indicated in field D.1 described above is to be used when decoding a tile.

A decoding module would obtain said second field from the bytestream and determine, based on the information contained in said second field, which of a set of attributes is to be used when decoding a respective grouping of tiles. The decoding module would retrieve from a repository storing all the attributes the ones indicated in said second field, and use them when decoding the respective grouping of tiles. The decoding process would repeat said operations when decoding each of the plurality of grouping of tiles.

By way of example, and using the example described above in relation to field D.1, let's assume that for a first grouping of tiles the set of attributes indicated in said second field corresponds to residuals statistics No. 2, t_node statistics No. 1 and to quantization parameter No. 4 (we assume for simplicity that there are no auxiliary attributes). When the receiving module receives said indication, it would retrieve from the stored attributes (as described above) the second residuals statistics from the 10 stored residuals statistics, the first t_node statistics from the 5 stored t_node statistics and the fourth quantization parameter from the 10 stored quantization parameters.

The second variable-sized header may include a fourth field containing, for each of a plurality of grouping of tableaux, an indication of a corresponding set of attributes to use when decoding said grouping (D.4—also described as tableausets:uint16 [2+num_aux_tableaux_attributes] [num_tableaux] in the present application). The number of groupings of tableaux may be indicated in a separate field, for example in field C.4 described above. This fourth field enables the encoding/decoding process to specify which of the sets of attributes indicated in field D.1 described above is to be used when decoding a tableau.

The principles and operations behind this fourth field corresponds to that described for the second field, with the difference that in this case it applies to tableaux rather than tiles. In particular, a decoding module would obtain said fourth field from the bytestream and determine, based on the information contained in said fourth field, which of a set of attributes is to be used when decoding a respective grouping of tableaux. The decoding module would retrieve from a repository storing all the attributes the ones indicated in said fourth field, and use them when decoding the respective grouping of tableaux. The decoding process would repeat said operations when decoding each of the plurality of grouping of tableaux.

The second variable-sized header may include a fifth field containing, for each plane, each encoding/decoding level and each direction, an indication of a corresponding set of attributes to use when decoding a root tableau (D.5—also described as root_tableauset_indices: uint16 [loq_idx] [num_planes][4] in the present application). This fifth field enables the encoding/decoding process to specify which of the sets of attributes indicated in field D.1 described above is to be used when decoding a root tableau. A "direction" is described further in the present application.

A decoding module would obtain said fifth field from the bytestream and determine, based on the information contained in said fifth field, which of a set of attributes is to be used when decoding a respective root tableau. The decoding module would retrieve from a repository storing all the attributes the ones indicated in said fifth field, and use them when decoding the respective grouping of tiles.

In this way, the decoding module would effectively store all the possible attributes to be used when decoding tiles and/or tableaux associated with that bytestream, and then retrieve for each of a grouping of tiles and/or tableaux only the sub-set of attributes indicated in said second field to decode the respective grouping of tiles and/or tableaux.

The second variable-sized header may include a third field containing information about the statistics of the groupings of tiles (D.3—also described as cdf_tilesets: line_segments_cdf15_t<tilese_index_t> in the present application). The statistics may provide information about how many times a certain grouping of tiles occurs. The statistics may be provided in the form of a cumulative distribution function. In the present application, the way the cumulative distribution function is provided is identified as a function type, specifically type line_segments_cdf15_t<x_axis_type>, and is described further in the present application. By using said statistics, the encoding/decoding process is enabled to compress the information about the grouping of tiles (e.g., the indices of tiles) and therefore optimise the process. For example, if there are N different groupings of tiles, and correspondingly N different indexes, rather than transmitting these indexes in an uncompressed manner, which would require $2^{\lceil log_2 N \rceil}$ bits (where $\lceil \cdot \rceil$ is a ceiling function), the grouping can be compressed using an entropy encoder thus reducing significantly the number of bits required to communicate the groupings of tiles. This may represent a significant savings. For example, assume that there are 10,000 tiles encoded in the bytestream, and that these tiles are divided in 100 groupings. Without compressing the indexes, an index needs to be sent together with each tile, meaning that at least $2^{\lceil log_2 100 \rceil}=7$ bits per tile, which means a total of 70,000 bits. If instead the indexes are compressed using an entropy encoder to an average of 1.5 bits per index, the total number of bits to be used would be 15,000, reducing the number of bits to be used by almost 80%.

A decoding module would obtain said third field from the bytestream and determine, based on the information contained in said third field, statistical information about the groupings of tiles. The decoding module would use said statistical information when deriving which grouping a tile belongs to. For example, the information about the tile grouping (e.g., tileset index) can be compressed using said statistics and then reconstructed at the decoder using the same statistics, for example using an entropy decoder.

The second variable-sized header may include a sixth field containing information about the statistics of the groupings of tableaux (D.6—also described as cdf_tableausets: line_segments_cdf15_t<tableauset_index_t> in the present application). The statistics may provide information about how many times a certain grouping of tableaux occurs. The statistics may be provided in the form of a cumulative distribution function.

This field works in exactly the same manner as the third field but for grouping of tableaux rather than grouping of tiles. In particular, a decoding module would obtain said sixth field from the bytestream and determine, based on the information contained in said sixth field, statistical information about the groupings of tableaux. The decoding module would use said statistical information when deriving which grouping a tableau belongs to. For example, the information about the tableau grouping (e.g., tableauset index) can be compressed using said statistics and then reconstructed at the decoder using the same statistics, for example using an entropy decoder.

The second variable-sized header may include a seventh field containing, for each plane, each encoding/decoding level and each direction, an indication of a location, within a payload of the bytestream, of one or more sub-streams (e.g., a Surface) of bytes associated for that respective plane, encoding/decoding level and direction (D.7—also described as root_stream_offsets: root_stream_offset_t[loq_idx][num_planes][4] in the present application). The location may be indicated as an offset with respect to the start of the payload. By way of example, assuming 3 planes, 3 encoding/decoding levels and 4 directions, there will be 3*3*4=36 different sub-streams, and correspondingly there will be 36 different indication of locations (e.g., offsets).

A decoding module would obtain said seventh field from the bytestream and determine, based on the information contained in said seventh field, where to find in the payload a specific sub-stream. The sub-stream may be associated with a specific direction contained in a specific plane which is within a specific encoding/decoding level. The decoding module would use said information to locate the sub-stream and decode said sub-stream accordingly. The decoding module may implement, based on this information, decoding of the various sub-stream simultaneously and/or in parallel.

This can be advantageous for at least two reasons. First, it would allow flexibility in ordering of the sub-streams. The decoder could reconstruct, based on the location of the sub-streams, to which direction, plane and encoding/decoding level the sub-stream belongs to, without the need for that order to be fixed. Second, it would enable the decoder to decode the sub-streams independently from one another as effectively each sub-stream is separate from the others.

The second variable-sized header may include an eighth field containing, for each plane, each encoding/decoding level and each direction, a size of the Stream of bytes associated with the root tableau (D.8—also described as root_stream_lengths: root_stream_length_t[loq_idx][num_planes][4] in the present application).

A decoding module would obtain said eighth field from the bytestream and determine, based on the information contained in said eighth field, the length of a stream associated with a root tableau.

Types of Dataset

The encoding and decoding process may identify a number of types of dataset which are then used in the various headers and/or payload.

A first type of dataset is called residual type and is indicated in the patent application as type residual_t:uint1 [1+element_descriptor[1]+element_descriptor[2]+2]. This type describes how a residual can be indicated, namely using a total number of bits corresponding to the number between square brackets, wherein element_descriptor is indicated in a header field as described above.

A second type of dataset is called stepwidth type and is indicated in the patent application as type stepwidth_t:uint1 [element_descriptor[1]+element_descriptor[2]+2]. This type describes how a stepwidth can be indicated, namely using a total number of bits corresponding to the number between square brackets, wherein element_descriptor is indicated in a header field as described above.

A third type of dataset is called streamlength type and is indicated in the patent application as type stream_length_t: int1 [maximum_stream_length]. This type describes how a streamlength can be indicated, namely a number of bits equal to maximum_stream_length so that up to $2^{maximum\_stream\_length}$ different streamlength (plus their sign) can be indicated.

A fourth type of dataset is called line segment CDF and is indicated in the patent application as type line_segments_cdf15_t<x_axis_type>:tuple (mantissa16 [14], x_axis_type[16]). This type is used to indicate a cumulative distribution function (CDF) by indicating a number of values corresponding to a specific range.

Figure 21:
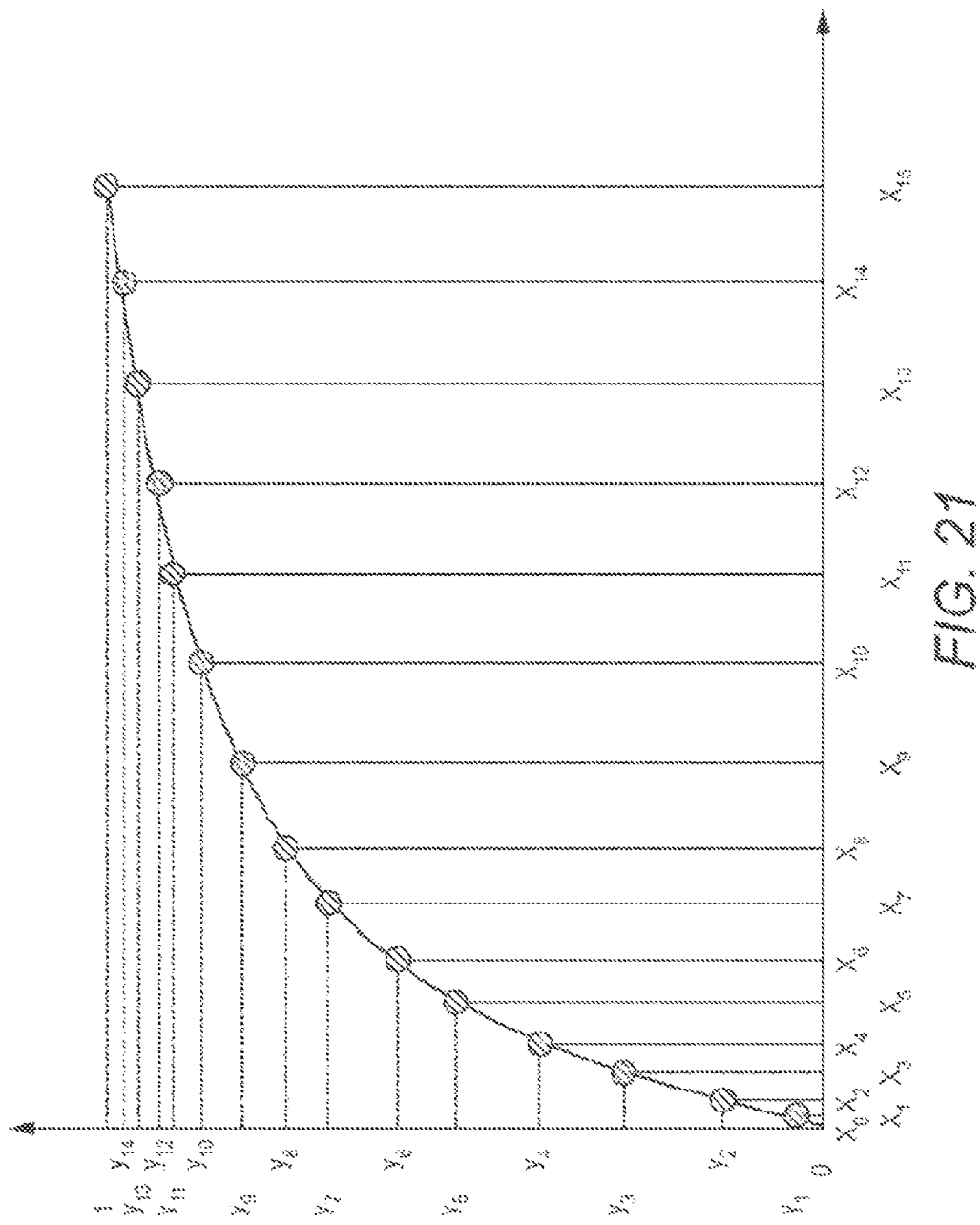
FIG. 21 illustrates a cumulative distribution function.

With reference to FIG. 21, a cumulative distribution function is determined at the encoder for a set of data (for example, the residuals data included in a tile, the streamlengths included in a tableau, the tileset and/or tableaset indices, etc.). The CDF could be derived, for example, from an histogram associated with the set of data. A histogram is typically an estimate of a probability distribution function (pdf) based on real samples. The histogram and the corresponding CDF may be generated using any suitable methods. Alternatively, a theoretical probability density function could be used. For simplicity, the CDF shown in FIG. 21 is shown as a continuous function, but it is to be understood that it could also be constructed by summing the histogram bins and therefore it would look like a stepped curve.

The CDF is "sampled" at specific points (e.g., $x_0$ to $x_{15}$) generating corresponding values (e.g., $y_0$ to $y_{15}$). In the present embodiment, 16 samples are used. However, it is to be understood that a different number of samples can be used without departing from the spirit of the invention. Once that is done, a vector is constructed including the values other than the first and the last (since they always correspond to 0 and 1, respectively) and the specific sampling points. In the present example, this means 14 values ($y_1$ to $y_{14}$) and 16 sampling points ($x_0$ to $x_{15}$). These values corresponds, in the type described, to the 14 values encoded using 2 bytes (16 bits) including their mantissa (i.e., mantissa16 [14]) and to the 16 sampling points (i.e., x_axis_type[16]) encoded using the number of bits specified by the type (i.e., x_axis_type).

When the decoder receives this vector, the decoder would read its content, in particular the sampling points and the values, and reconstruct the CDF by, for example, interpolating the values. In other words, a decoding module receives information about a statistical distribution (e.g., a CDF) in the form of a set of sampled values (y) and a corresponding a set of sampling points (x). It uses the sampling values to reconstruct the statistical distribution, for example by interpolating the values and reconstructing the statistical distribution. For example, in the case of a CDF, it means reconstructing the CDF curve from the values by interpolating them. The decoding module uses said statistical distribution when decoding a corresponding set of data associated with it. In this way, the information about statistical distribution of sets of data, which typically would be expensive in terms of bits required to be used when sending from the encoding module to the decoding module, can be effectively compressed without compromising the accuracy. In particular, using a CDF rather than a histogram is particularly efficient due to the nature of the CDF (monotone curve) compared to that of the histogram which would instead require to encode every bin separately.

A fifth type of dataset is called residual statistics and is indicated in the patent application as type residual_stat_t: line_segments_cdf15_t<residual_t> or uint16. This type identifies a statistic associated with residual elements (i.e., residual_t) and it uses the fourth type using the residual elements as a parameter to it. In other word, the residual statistics are coded (and decoded) in the same way as the fourth type described above.

A sixth type of dataset is called t-node statistics and is indicated in the patent application as type t-node_stat_t: mantissa8[6]. This type identifies a statistic associated with the t-nodes in a tessera. As discussed above, the t-nodes may take up to 16 values (being 4-bit codes) and their statistics is communicated using seven bins in which the probability of the t-nodes in encoded. As for the other statistics, this is an efficient way of encoding these values which would otherwise be sent un-compressed. This statistics is used by the decoding module to decode the t-node.

A seventh type of dataset is called quantization parameter and is indicated in the patent application as type quantization_parameters_t:tuple (stepwidth_t, residual_t). This type indicates the quantization parameters to be used in decoding the residuals.

An eighth type of dataset is called streamlengths statistics and is indicated in the patent application as type stream_length_stat_t:line_segments_cdf15_t<stream_length_t>. This type identifies a statistic associated with streamlengths and it uses the third type as a parameter to it. In other word, the streamlghts statistics are coded (and decoded) in the same way as the fourth type described above.

FIG. 22 shows an example of how a Summit (described in the present application) is mapped onto the codign structre described above. In the example, there is a Summit of 4,096×4,096 elements in $LoQ_{M-1}$, and a Grid (described in the present application) of 2,300λ3,2000 residuals in the same LoQ. The residuals in the present example are shows as a picture for easiness of understanding, but effectively they may be differences between two different picture frames and therefore may not correspond to an actual picture. In order to code the Summit and Grid of the present example, there needs to be 65,536 Tiles (each having 16×16, i.e. 256, elements). This is because in order to cover the whole Summit we would need 65,536×256 elements. As can be seen from the example, each Tiles correspond to a small 16×16 area of the Summit. Note that some of the Tiles cover an area of the Grid, whereas other Tiles cover are of the Summit where no Grid is present. Since there are 65,536 Tiles, we would need 256 Tableaux, each containing 256 (16×16) metadata. These metadata may correspond, for example, to the length of the Stream corresponding to a Tile, also known as streamlength in the present application. The metadata may include also other element such as tilesets indexes. Each metadata element corresponds to one Tile. Finally, there will be one Root Tableau containing 256 (16×16) metadata (e.g., the streamlength of the Tableaux, the tableauset indexes, etc.). Each metadata corresponds to each of the 256 Tabelaux.

Figure 23:
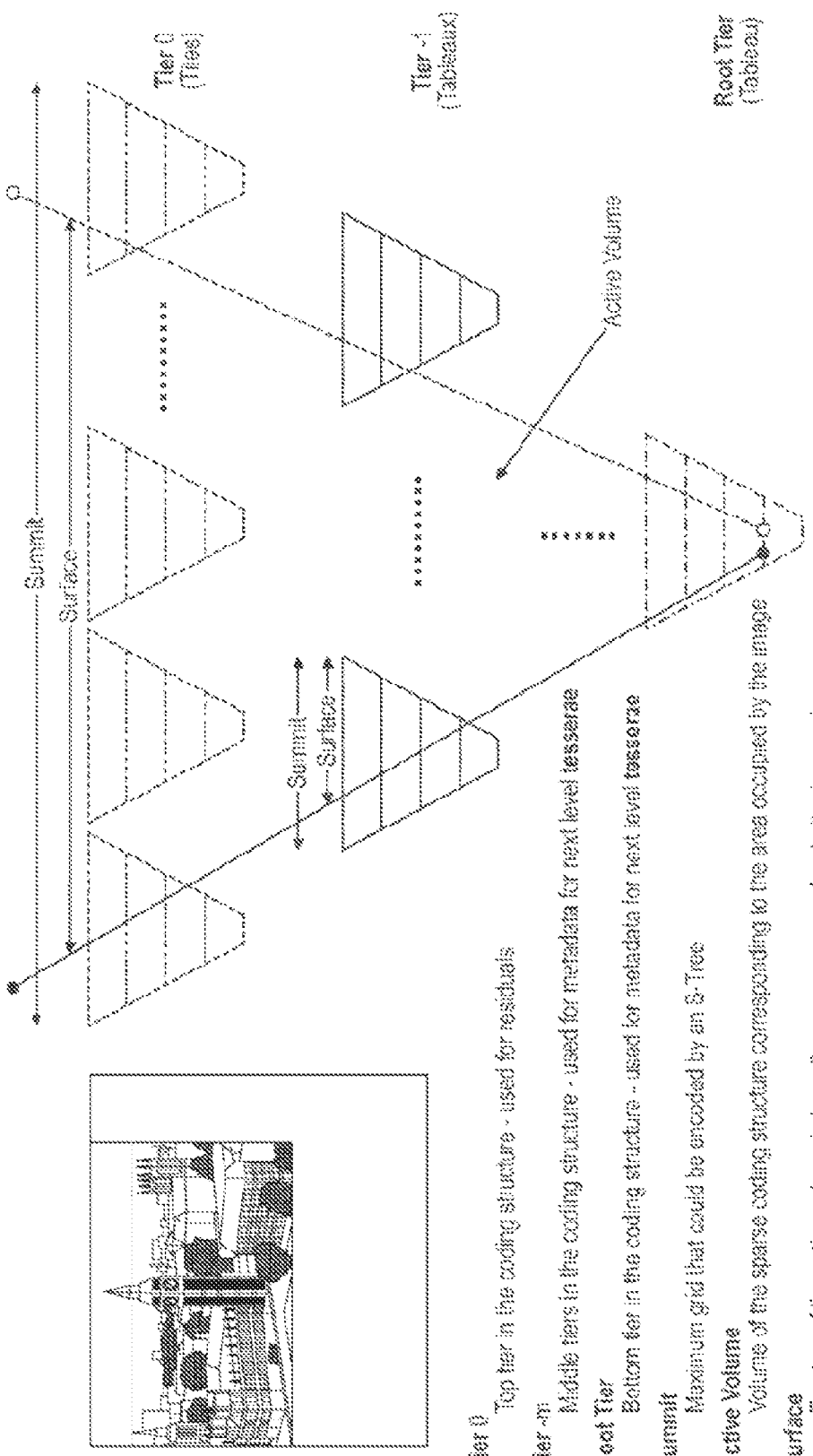
FIG. 23 illustrates a general view of the coding structure.

FIG. 23 shows a more general view of the coding structure. In particular, and as already described in the present application and/or in other patent applications by the same applicant (such as European Patent No. 17386046.1 filed on 6 Dec. 2017 and incorporated herein by reference), there are various Tiers in the coding structure, with Tier 0 being formed by Tiles, Tier −m formed of Tableaux and Root Tier formed of the single Root Tier. FIG. 23 also shows some of the concept described above. For example, one can see that a Summit, corresponding to maximum Grid size that could be encoded, is present both at a specific Tier (i.e., the union of all the values in Layer 0 of each Tier) or could also be seen for each tessera (i.e., the 256 values in Layer 0 of each tessera). Another important concept is that of Active Volume (described also elsewhere in the present application) which effectively corresponds to that portion of the coding structure associated with the area occupied by the Surface. In other words, all those tesserae which are associated with at least one element of the Surface belongs to the Active Volume. The Surface, on the other hand, corresponds to the area of the Summit where there are actual data (e.g., residuals or metadata) to be used.

A ninth type of dataset is called root_stream_offset_t: uint1[[log 2[picture size]]]. This type indicates the offset of each root in a tessera.

A tenth type of dataset is called type tileset_index_t:uint1 [1+[log 2[num_tileset]]], and it indicates the indices of the tileset, as well as differences between indices of tileset.

An eleventh type of dataset is called tableauset_index_t: uint1[1+[log 2[num_tableauset]]], and it indicates the indices of the tableauset, as well as differences between indices of tableausets.

A twelfth type of dataset is called type element_t:uint1 [element_descriptor[0]+element_descriptor[1]] and it indicates the size of an element.

A thirteen type of dataset is called type attribute_index_t: uint1[−] and it indicates the attributes' indices.

Parallel Processing

An important aspect of the present invention is that it allows for the encoding and/or decoding process to be parallelised.

In particular, as discussed in this application and other applications by the same applicant such as the above-mentioned European patent application No. 17386045.3 and/or 17386046.1, one of the basic building blocks of the encoding/decoding scheme is the structure called tessera. A tessera is an individual structure that can be processed independently from others. Since tesserae are independent structures, they can be encoded and decoded separately and in parallel. The portion of the bytestream that is associated with the tessera is called a "stream" in the present application. When the decoding module receives the bytestream, in order to being able to parallelise the decoding of the streams, it would need to know where the streams are located within the bytestream. This information is delivered to the decoding module via the streamlengths, i.e. that information that explains how long a stream is. Accordingly, when the decoding module receives the bytestream, it derives information about the length of the streams (e.g., the streamlength) and, using said information, separates the bytestream into streams. The decoding module then may decode the streams independently and in parallel, for example by implementing a different decoding instance and/or process for each of the streams. In particular, the decoding module may derive (for each Surface) streamlength for the Root Tableau Tier from stream_offsets, decode the Root Tableau Tier and derive, from the info indicated by said Root Tableau Tier, the streamlengths for the Tier immediately above it. The process continues until the decoding module decodes the Tiles. As it can be understood, the Tiles can be decoded only once the streamlength of their streams has been provided from decoding a required Tableau in the previous Tier. For this reason, every Tessera in the previous Tiers must be decoded before a Tile of the associated Surface can be decoded. Note that, although there is a dependency between Tiers in a specific Surface, each tessera in a given Tier can in principle be decoded independently of all other tesserae in the same Tier, and therefore parallel processing can be implemented within a Tier.

In a specific embodiment, streamlengths are carried on leaves of TableAux as relative differences rather than absolute values (i.e., for a first tessera a first streamlength corresponding to it is indicated in full, then for the second tessera it is indicated a difference between the streamlength of the second tessera and the streamlength of the first tessera, and so on). This allows compression to be optimized on the basis that The Shannon Entropy of relative differences will be smaller than that of raw streamlengths. The same idea can be used when encoding tileset indices or treeset indices, with the added flexibility that the encoder can also optimise the numerical ordering of tilesets and treesets to minimise the entropy of their corresponding indices.

Note that the location (or offset) within the bytestream where the individual "streams" start from is obtained as the cumulative sum of consecutive streamlengths. There are known massively parallel algorithms of calculating such a cumulative sum, most under the names of exclusive prefix sum or scan.

In addition, as the encoding process is a Tier-by-Tier process encoding individual streams, the encoding process also creates supplemental data of streamlengths that it can take as the input of encoding for the next Tier of encoding, and such recursive process continues until only one stream remain. From this point of view, the encoding process is a parallel reduction.

For example, assume the decoding module has derived the streamlength of four consecutive streams as 3, 4, 6, and 3 bits. The decoding module could then identify that the portion of the bytestream from the first bit to the third bit corresponds to the first stream (and therefore the first tessera), the portion of the bytestream from the fourth bit to the seventh bit corresponds to the second stream (and therefore the second tessera), the portion of the bytestream from the eighth bit to the thirteenth bit corresponds to the third stream (and therefore the third tessera) and the portion of the bytestream from the fourteenth bit to the sixteenth bit corresponds to the fourth stream (and therefore the fourth tessera).

Decoding Process—Further Description

In accordance with the invention, there is provided a method of reconstructing a received set of encoded data, wherein the set of encoded data comprises first and second component sets, the first component set corresponding to a lower image resolution than the second component set, the method comprising: for each of the first and second component sets: decoding the component set so as to obtain a decoded set, the method further comprising: upscaling the decoded first component set so as to increase the corresponding image resolution of the decoded first component set to be equal to the corresponding image resolution of the decoded second component set, and combining the decoded first and second component sets together so as to produce a reconstructed set.

Advantageously, the method provides an efficient technique for reconstructing an image encoded in a received set of data, which may be received by way of a data stream, for example, by way of individually decoding different component sets corresponding to different image size or resolution levels, and combining the image detail from one decoded component set with the upscaled decoded image data from a lower-resolution component set. Thus by performing this process for two or more component sets, digital images at the structure or detail therein may be reconstructed for progressively higher resolutions or greater numbers of pixels, without requiring the full or complete image detail of the highest-resolution component set to be received. Rather, the method facilitates the progressive addition of increasingly higher-resolution details while reconstructing an image from a lower-resolution component set, in a staged manner.

Moreover, the decoding of each component set separately facilitates the parallel processing of received component sets, thus improving reconstruction speed and efficiency in implementations wherein a plurality of processes are available.

Each resolution level corresponds to a level of quality (LoQ). This is a collective term, associated with a plane as defined elsewhere, that describes all new inputs or received component sets, and the output reconstructed image for a cycle of index −m. The reconstructed image in LoQ zero, for instance, is the output of the final cycle of pyramidal reconstruction.

As defined in another part of this document, pyramidal reconstruction may be a process of reconstructing an inverted pyramid starting from the initial LoQ and using cycles by new residuals to derive higher LoQs up to the maximum quality, quality zero, at LoQ zero. A cycle may be thought of as a step in such pyramidal reconstruction, the step being identified by an index −m. The step typically comprises upsampling data output from a possible previous step, for instance, upscaling the decoded first component set, and takes new residual surfaces decoded from new surfaces, sets, as also defined in this disclosure, as further inputs in order to obtain output data to be upsampled in a possible following step. Where only first and second component set are received, the number of LoQs will be two, and no possible following step is present. However, in embodiments wherein the number of component sets, or LoQs, is three or greater, then the output data may be progressively upsampled in the following steps.

The first component set typically corresponds to the initial LoQ, which may be denoted by LoQ 1-N, where N is the number of LoQs in the plane. The value of N is typically given in a byteset header.

Typically, the upscaling of the decoded first component set comprises applying an upsampler to the output of the decoding procedure for the initial LoQ. In preferred embodiments, this involves bringing the resolution of a reconstructed picture output from the decoding of the initial LoQ component set into conformity with the resolution of the second component set, corresponding to 2-N. Typically, the upscaled output from the lower LoQ component set corresponds to a predicted image at the higher LoQ resolution. Owing to the lower-resolution initial LoQ image and the upsampling process, the predicted image typically corresponds to a smoothed or blurred picture.

Adding to this predicted picture higher-resolution details from the LoQ above provides a combined, reconstructed image set. Advantageously, in embodiments where the received component sets for one or more higher-LoQ component sets comprise residual image data, or data indicating the pixel value differences between upscaled predicted pictures and original, uncompressed, or pre-encoding images, the amount of received data required in order to reconstruct an image or data set of a given resolution or quality may be considerably less than the amount or rate of data that would be required in order to receive the same quality image using prior art techniques. Thus, by combining low-detail image data received at lower resolutions with progressively greater-detail image data received at increasingly higher resolutions in accordance with the method, data rate requirements are reduced.

Typically, the set of encoded data comprises one or more further component sets, wherein each of the one or more further component sets corresponds to a higher image resolution than the second component set, and wherein each of the one or more further component sets corresponds to a progressively higher image resolution, the method comprising, for each of the one or more further component sets, decoding the component set so as to obtain a decoded set, the method further comprising, for each of the one or more further component sets, in ascending order of corresponding image resolution: upscaling the reconstructed set having the highest corresponding image resolution so as to increase the corresponding image resolution of the reconstructed set to be equal to the corresponding image resolution of the further component set, and combining the reconstructed set and the further component set together so as to produce a further reconstructed set.

In this way, the method may involve taking the reconstructed image output of a given component set level or LoQ, upscaling that reconstructed set, and combining it with the decoded output of the component set or LoQ above, to produce a new, higher resolution reconstructed picture. It will be understood that this may be performed repeatedly, for progressively higher LoQs, depending on the total number of component sets in the received set.

In typical embodiments, each of the component sets corresponds to a progressively higher image resolution, wherein each progressively higher image resolution corresponds to a factor-of-four increase in the number of pixels in a corresponding image. Typically, therefore, the image size corresponding to a given component set is four times the size or number of pixels, or double the height and double the width, of the image corresponding to the component set below, that is the component set with the LoQ one less than the LoQ in question. A received set of component sets in which the linear size of each corresponding image is double with respect to the image size below may facilitate more simple upscaling operations, for example.

In some embodiments, the number of further component sets is two. Thus, in such embodiments, the total number of component sets in the received set is four. This corresponds to the initial LoQ being $LoQ_{-3}$.

In preferred embodiments, the first component set corresponds to image data, and the second and any further component sets correspond to residual image data. As noted above, the method provides particularly advantageous data rate requirement reductions for a given image size in cases where the lowest LoQ, that is the first component set, contains a low resolution, or down sampled, version of the image being transmitted. In this way, with each cycle of reconstruction, starting with a low resolution image, that image is upscaled so as to produce a high resolution albeit smoothed version, and that image is then improved by way of adding the differences between that upscaled predicted picture and the actual image to be transmitted at that resolution, and this additive improvement may be repeated for each cycle. Therefore, each component set above that of the initial LoQ needs only contain residual data in order to reintroduce the information that may have been lost in down sampling the original image to the lowest LoQ.

In accordance with the invention there is also provided a method of decoding a data set, the method comprising: de-sparsifying the set, comprising recreating sparse data in one or more parts of the set at which no sparse data was received, and maintaining the locations of received data within the set; and applying an entropy decoding operation to the de-sparsified set; wherein the step of de-sparsifying the set is performed in accordance with the entropy decoding operation.

In accordance with the invention there is also provided a method of decoding a received data set so as to obtain a decoded set, the method comprising:

de-sparsifying the set, comprising recreating sparse data in one or more parts of the set at which no sparse data was received, and maintaining the locations of received data within the set; and applying an entropy decoding operation to the de-sparsified set; wherein the step of de-sparsifying the set is performed in accordance with the entropy decoding operation; de-quantizing the entropy-decoded set; and applying a directional composition transform to the de-quantized set so as to obtain a decoded set.

The method provides a way of obtaining image data, which may be residual data, upon receipt of a set containing data that has been compressed, for example, by way of decomposition, quantization, entropy-encoding, and sparsification, for instance.

The sparsification step is particularly advantageous when used in connection with sets for which the original or pre-transmission data was sparse, which may typically correspond to residual image data. A residual may be a difference between elements of a first image and elements of a second image, typically co-located. Such residual image data may typically have a high degree of sparseness. This may be thought of as corresponding to an image wherein areas of detail are sparsely distributed amongst areas in which details are minimal, negligible, or absent. Such sparse data may be described as an array of data wherein the data are organised in at least a two-dimensional structure (e.g. a grid), and wherein a large portion of the data so organised are zero (logically or numerically) or are considered to be below a certain threshold. Residual data are just one example. Additionally, metadata may be sparse and so be reduced in size to a significant degree by this process. Sending data that has been sparsified allows a significant reduction in required data rate to be achieved by way of omitting to send such sparse areas, and instead reintroducing them at appropriate locations within a received byteset at a decoder.

Typically, the entropy-decoding, de quantizing, and directional composition transform steps are performed in accordance with parameters defined by an encoder or a node from which the received set of encoded data is sent. For each LoQ, or component set, the steps serve to decode image data so as to arrive at a set which may be combined with different LoQs as per the technique disclosed above, while allowing the set for each level to be transmitted in a data-efficient manner.

In accordance with the invention there is also provided a method of reconstructing a set of encoded data according to the method disclosed above, wherein the decoding of each of the first and second component sets is performed according to the method disclosed above. Thus the advantageous decoding method of the present disclosure may be utilised for each component set or LoQ in a received set of image data and reconstructed accordingly.

Figure 30:
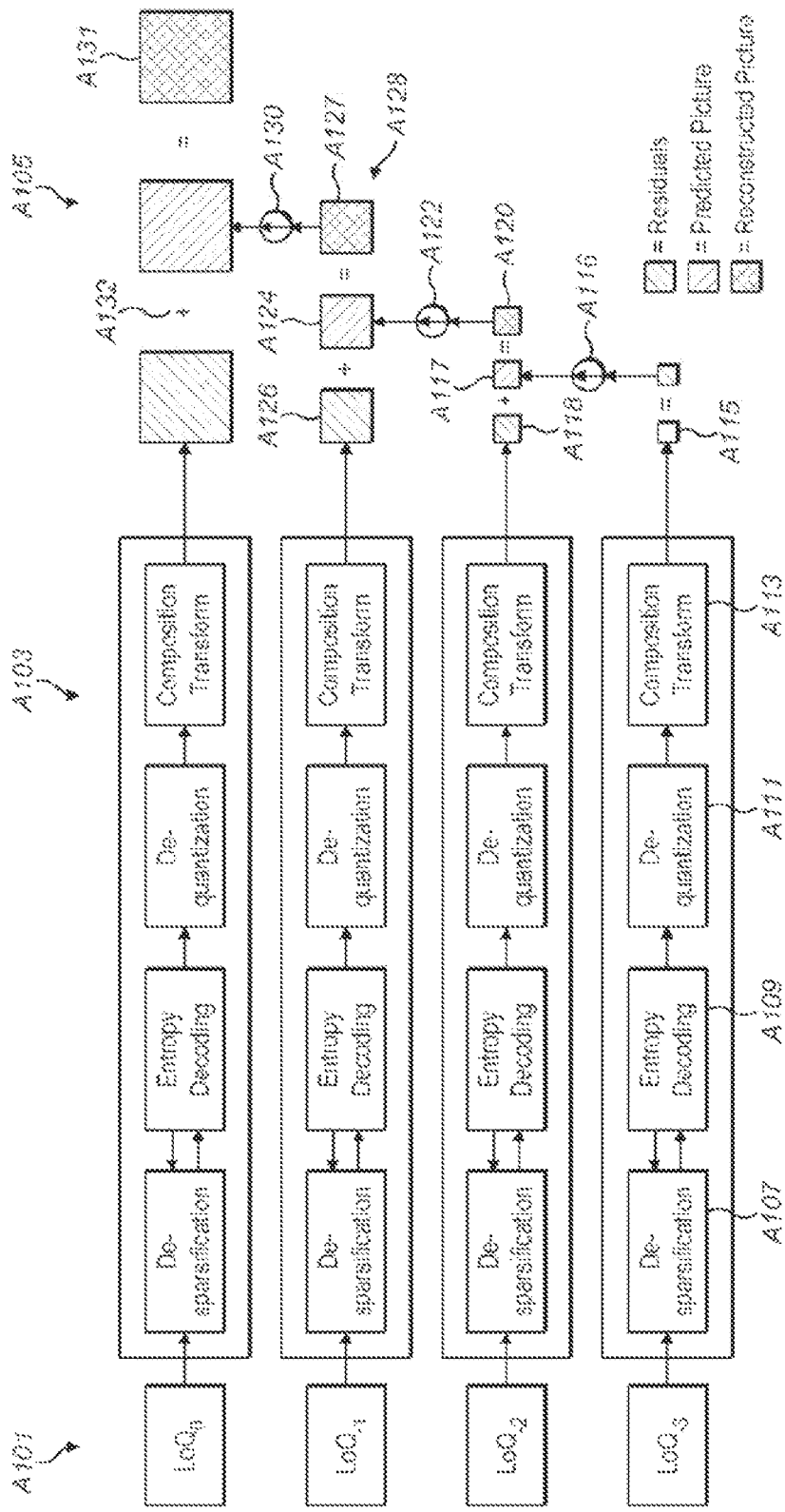
FIG. 30 illustrates an example method according to the embodiments disclosed herein.

With reference to FIG. 30, an example method according to the invention is now described. A set of encoded data A101 is received, wherein the set comprises four LoQs: from $LoQ_0$, the highest resolution or level of quality, to $LoQ_{-3}$, the initial LoQ. The image data carried in the $LoQ_{-3}$ component set corresponds to image data, and the other component sets contain residual data for that transmitted image. While each of the levels may output data that can be considered as residuals, the residuals in the initial LoQ level, that is $LoQ_{-3}$, effectively correspond to the actual reconstructed image. At stage A103 each of the component sets is processed in parallel so as to decode that encoded set.

With reference to the initial LoQ, the following decoding steps are carried out for each component set $LoQ_{-3}$ to $LoQ_0$.

At step A107 the component set is de-sparsified. In this way, the de-sparsification causes a sparse two-dimensional array to be recreated from the encoded byteset received at each LoQ. Zero values grouped at locations within the two-dimensional array which were not received (owing to there being omitted from the transmitted byteset in order to reduce the quantity of data transmitted) are repopulated by this process. Non-zero values in the array retain their correct values and positions within the recreated two-dimensional array, with the de-sparsification step repopulating the transmitted zero values at the appropriate locations or groups of locations there between.

At step A109 a range decoder, the configured parameters of which correspond to those using which the transmitted data was encoded prior to transmission, is applied to the de-sparsified set at each LoQ in order to substitute the encoded symbols within the array with pixel values. The encoded symbols in the received set are substituted for pixel values in accordance with an approximation of the pixel value distribution for the image. The use of an approximation of the distribution, that is relative frequency of each value across all pixel values in the image, rather than the true distribution, permits a reduction in the amount of data required to decode the set, since the distribution information is required by the range decoder in order to carry out this step. As described in the present disclosure, the steps of de-sparsification and range decoding are interdependent, rather than sequential. This is indicated by the loop formed by the arrows between blocks 107 and 109 in the flow diagram.

At step A111, the array of values is de-quantized. This process is again carried out in accordance with the parameters with which the decomposed image was quantized prior to transmission.

Following de-quantization, the set is transformed at step A113 by a composition transform which comprises applying an inverse directional decomposition operation to the de-quantized array. This causes the directional filtering, according to a 2×2 operator comprising average, horizontal, vertical, and diagonal operators, to be reversed, such that the resultant array is image data for $LoQ_{-3}$ and residual data for $LoQ_{-2} LoQ_0$.

Stage A105 illustrates the several cycles involved in the reconstruction utilising the output of the composition transform for each of the LoQ component sets A101.

A115 indicates the reconstructed image data output from the decoder A103 for the initial LoQ. In the present example, the reconstructed picture A115 has a resolution of 64×64. At A116 this reconstructed picture is upsampled so as to increase its constituent number of pixels by a factor of four, thereby a predicted picture A117 having a resolution of 128×128 is produced. At stage A120 the predicted picture A117 is added to the decoded residuals A118 from the output of the decoder at $LoQ_{-2}$. The addition of these two 128×128-size images produces a 128×128-size reconstructed image, containing the smoothed image detail from the initial LoQ enhanced by the higher-resolution detail of the residuals from $LoQ_{-2}$. This resultant reconstructed picture A119 may be output or displayed if the required output resolution is that corresponding to $LoQ_{-2}$. In the present example, the reconstructed picture A119 is used for a further cycle.

At step A112 the reconstructed image A119 is upsampled in the same manner as at step A116, so as to produce a 256×256-size predicted picture A124. This is then combined at step A128 with the decoded $LoQ_{-1}$ output A126, thereby producing a 256×256-size reconstructed picture A127 which is an upscaled version of prediction A119 enhanced with the higher-resolution details of residuals A126. At A130 this process is repeated a final time, and the reconstructed picture A127 is upscaled to a resolution of 512×512, for combination with the $LoQ_0$ residual at stage A132. Thereby a 512×512 reconstructed picture A131 is obtained.

Figure 29:
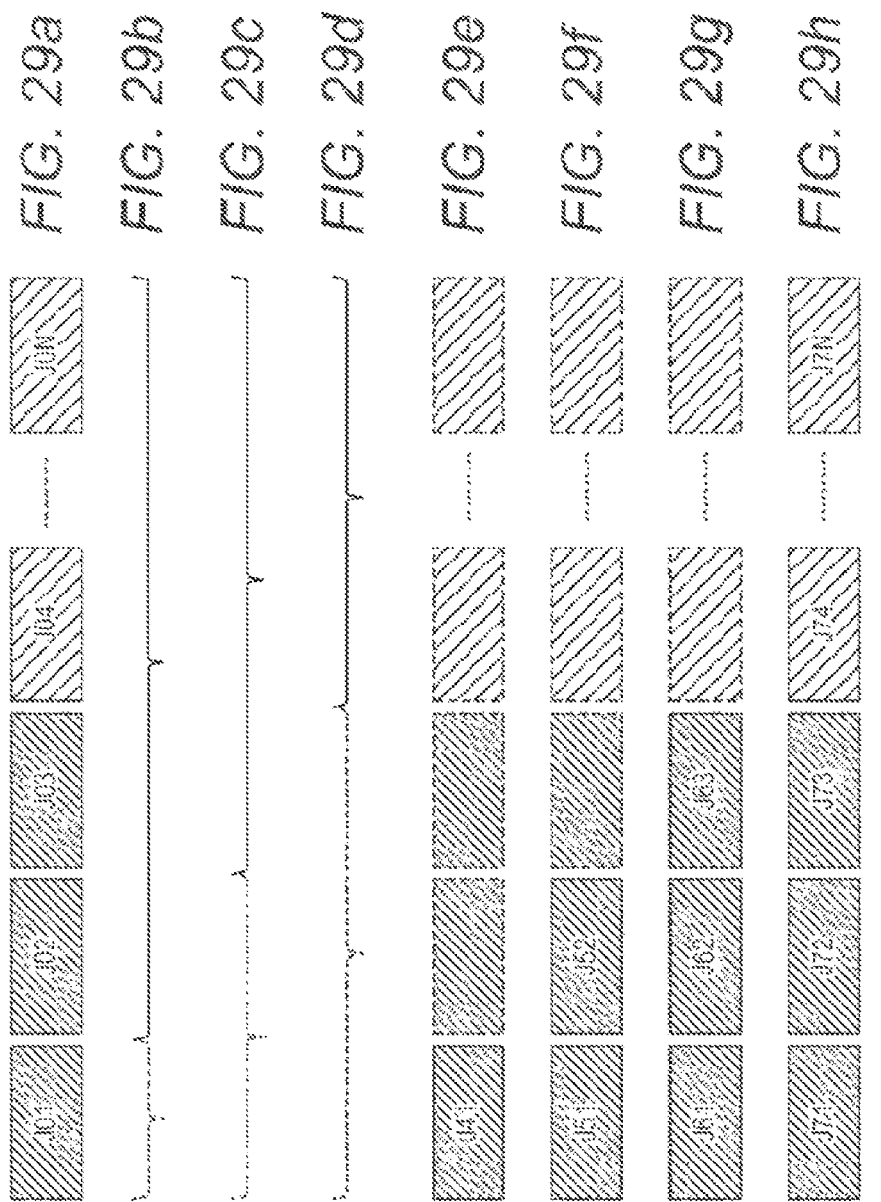
FIG. 29 illustrates a schematic representation of the de-sparsification and decoding process.

FIG. 29 shows a schematic representation of the de-sparsification and decoding process. In FIG. 29a it is schematically shown a typical set of symbols received via the bytestream when a first type of data symbols is received. The first type may be a non-zero value and the second type may be a zero value. Alternatively, the first type may be a value above a threshold and the second type may be a value below the threshold, and wherein a value equal to the threshold can belong either to the first type or to the second type depending on a chosen implementation. In particular, there are three groups of symbols (also described as metadata symbols) followed by a number of first type of data symbols (typically up to four).

In general, there is provided a method of decoding a set of sparse data, the method comprising: obtaining a set of encoded data, said encoded data containing information which, when decoded, would enable reconstruction of the set of sparse data; decoding a first portion of said set of encoded data to obtain a first set of decoded data; and based on the first set of decoded data, determining how to reconstruct a first portion of the set of sparse data. The first set of decoded data may correspond to one or more metadata symbols indicating whether to reconstruct a first portion of the set of sparse data based on a second set of decoded data or based on simulating the first portion of the set of sparse data. If the one or more metadata symbols may indicate that reconstruction of the first portion of the set of sparse data should be based on a second set of decoded data, the method further comprises: decoding a second portion of said set of encoded data to obtain the second set of decoded data; and reconstructing the first portion of the set of sparse data by extracting from the second set of decoded data a first type of data symbols. The steps of decoding and reconstructing comprise: decoding a first sub-portion of said second portion to obtain a first sub-set of decoded data; based on the information associated with the first set of decoded data, determining whether the first sub-set of decoded data contains one or more metadata symbols or a first type of data symbols. In FIGS. 29b to 29d, the bracket in dotted lines represents the first set of decoded data, the continuous line represents the second set of decoded data.

With reference to FIG. 29b, if it is determined that the first sub-set of decoded data (J02) contains one or more metadata symbols, the method further comprises: decoding a second sub-portion of said second portion to obtain a second sub-set of decoded data (J03); and based at least on information associated with the first sub-set of decoded data, determining whether the second sub-set of decoded data contains one or more metadata symbols or a first type of data symbols. If it is determined that the second sub-set of decoded data contains one or more metadata symbols, the method further comprises: decoding a third sub-portion of said second portion to obtain a third sub-set of decoded data (J04-J0N); and reconstructing the first portion of the set of sparse data by extracting from the third sub-set of decoded data a first type of data symbols.

With reference to FIG. 29c, if it is determined that the first sub-set of decoded data (J03) contains one or more metadata symbols, the method further comprises: decoding a second sub-portion of said second portion to obtain a second sub-set of decoded data (J04-J0N); and based at least on information associated with the first sub-set of decoded data, determining whether the second sub-set of decoded data contains one or more metadata symbols or a first type of data symbols. If it is determined that the second sub-set of decoded data contains a first type of data symbols, the method further comprises: decoding a second sub-portion of said second portion to obtain a second sub-set of decoded data; and reconstructing the first portion of the set of sparse data by extracting from the second sub-set of decoded data a first type of data symbols.

With reference to FIG. 29d, if it is determined that the first sub-set of decoded data (J04-J0N) contains a first type of data symbols, the method further comprises: reconstructing the first portion of the set of sparse data by extracting from the first sub-set of decoded data a first type of data symbols.

FIGS. 29e to 29h show an example of a bytestream when a second type of data symbols need to be reconstructed by the decoder- or said in another way, it is implicitly sent to the decoder. The Figures shows a series of blocks with dashed border. The dashed border boxes are trying to visualise the block of data that should have been sent to the decoder if the data set was not sparsified as described in the present application, but rather the whole data set, including the sparse part of it, was sent. Nevertheless, from a point of view of the decoder, the dashed boxes are somehow reconstructed via a process called "simulation", in other words their presence is "simulated" for the purpose of decoding and obtaining the second type of data symbols so as to reconstruct the full sparse data set.

In particular, with reference to FIG. 29e there is provided a method of decoding a set of sparse data, the method comprising: obtaining a set of encoded data, said encoded data containing information which, when decoded, would enable reconstruction of the set of sparse data; decoding a first portion of said set of encoded data to obtain a first set of decoded data (J41, J51, J61, J71); and based on the first set of decoded data, determining how to reconstruct a first portion of the set of sparse data. The first set of decoded data corresponds to one or more metadata symbols indicating whether to reconstruct a first portion of the set of sparse data based on a second set of decoded data or based on simulating the first portion of the set of sparse data. If the one or more metadata symbols indicates that reconstruction of the first portion of the set of sparse data should be based on simulating the first portion of the set of sparse data, the method further comprises: simulating first portion of the set of sparse data by generating a second type of data symbols.

With reference to FIG. 29e, if the one or more metadata symbols indicates that reconstruction of the first portion of the set of sparse data should be based on a second set of decoded data, the method further comprises: decoding a second portion of said set of encoded data to obtain the second set of decoded data (J52), wherein the second set of decoded data corresponds to one or more metadata symbols indicating whether to reconstruct a first portion of the set of sparse data based on a third set of decoded data or based on simulating the first portion of the set of sparse data. If the one or more metadata symbols in the second set of decoded data indicates that reconstruction of the first portion of the set of sparse data should be based on simulating the first portion of the set of sparse data, the method further comprises: simulating first portion of the set of sparse data by generating a second type of data symbols.

With reference to FIG. 29f, if the one or more metadata symbols indicates that reconstruction of the first portion of the set of sparse data should be based on a second set of decoded data, the method further comprises: decoding a second portion of said set of encoded data to obtain the second set of decoded data (J62), wherein the second set of decoded data corresponds to one or more metadata symbols indicating whether to reconstruct a first portion of the set of sparse data based on a third set of decoded data or based on simulating the first portion of the set of sparse data. If the one or more metadata symbols indicates that reconstruction of the first portion of the set of sparse data should be based on a third set of decoded data, the method further comprises: decoding a third portion of said set of encoded data to obtain the third set of decoded data (J63), wherein the third set of decoded data corresponds to one or more metadata symbols indicating whether to reconstruct a first portion of the set of sparse data based on a fourth set of decoded data or based on simulating the first portion of the set of sparse data. If the one or more metadata symbols in the third set of decoded data indicates that reconstruction of the first portion of the set of sparse data should be based on simulating the first portion of the set of sparse data, the method further comprises: simulating first portion of the set of sparse data by generating a second type of data symbols.

With reference to FIG. 29g, wherein if the one or more metadata symbols indicates that reconstruction of the first portion of the set of sparse data should be based on a second set of decoded data, the method further comprises:
decoding a second portion of said set of encoded data to obtain the second set of decoded data (J72), wherein the second set of decoded data corresponds to one or more metadata symbols indicating whether to reconstruct a first portion of the set of sparse data based on a third set of decoded data or based on simulating the first portion of the set of sparse data. If the one or more metadata symbols indicates that reconstruction of the first portion of the set of sparse data should be based on a third set of decoded data, the method further comprises: decoding a third portion of said set of encoded data to obtain the third set of decoded data (J73), wherein the third set of decoded data corresponds to one or more metadata symbols indicating whether to reconstruct a first portion of the set of sparse data based on a fourth set of decoded data or based on simulating the first portion of the set of sparse data. If the one or more metadata symbols in the third set of decoded data indicates that reconstruction of the first portion of the set of sparse data should be based on a fourth set of decoded data (J74-J7N), the method further comprises: decoding a fourth portion of said set of encoded data to obtain the fourth set of decoded data; reconstructing the first portion of the set of sparse data by extracting from the fourth set of decoded data a first type of data symbols.

De-Sparsification and Decoding Process—Further Description

The present technique takes advantage of the sparseness of a 2D array of data to be decoded and/or encoded. that is, the relative amount of zeros in the expected array and the way those zeros are grouped within the array. The following sets out how a sparse 2D array can be recreated from the encoded bytestream. The data can be of any nature as long as they can be mapped into a 2D array. For example, in the case of a picture or video, the data could be values associated with a color space (e.g., the value of a red component in an RGB color space, or the value of a Y component in a YUV color space, etc.), or alternatively they could be residual data (whether transformed or not) or metadata used to decode the bytestream. Residuals are further defined in the present application, but in general they refer to a difference between a value of a reference array and an actual array of data.

The following short description does not touch upon the meaning or use of the decoded array; that is covered elsewhere. Rather, the concept of decoding a sparse array from an encoded bytestream is discussed. The array once recreated may represent any sparse data set. Of course, as described, the sparse data set may be used to reconstruct a larger array which in turn is converted to a set of symbols representing a 2D array of data, such as an image or sonogram. The following description relates to an illustrative example of de-sparsifying and decoding a specific sparse array which is also called "tessera" in other parts of the present application. In particular, the description shows how the processes of de-sparsification and decoding interact with each other. Although the description refers to a specific example, the skilled person would readily understand the general principles behind it and how the process can be applied more in general to de-sparsifying and decoding sparse arrays.

Figures 50A, 50B:
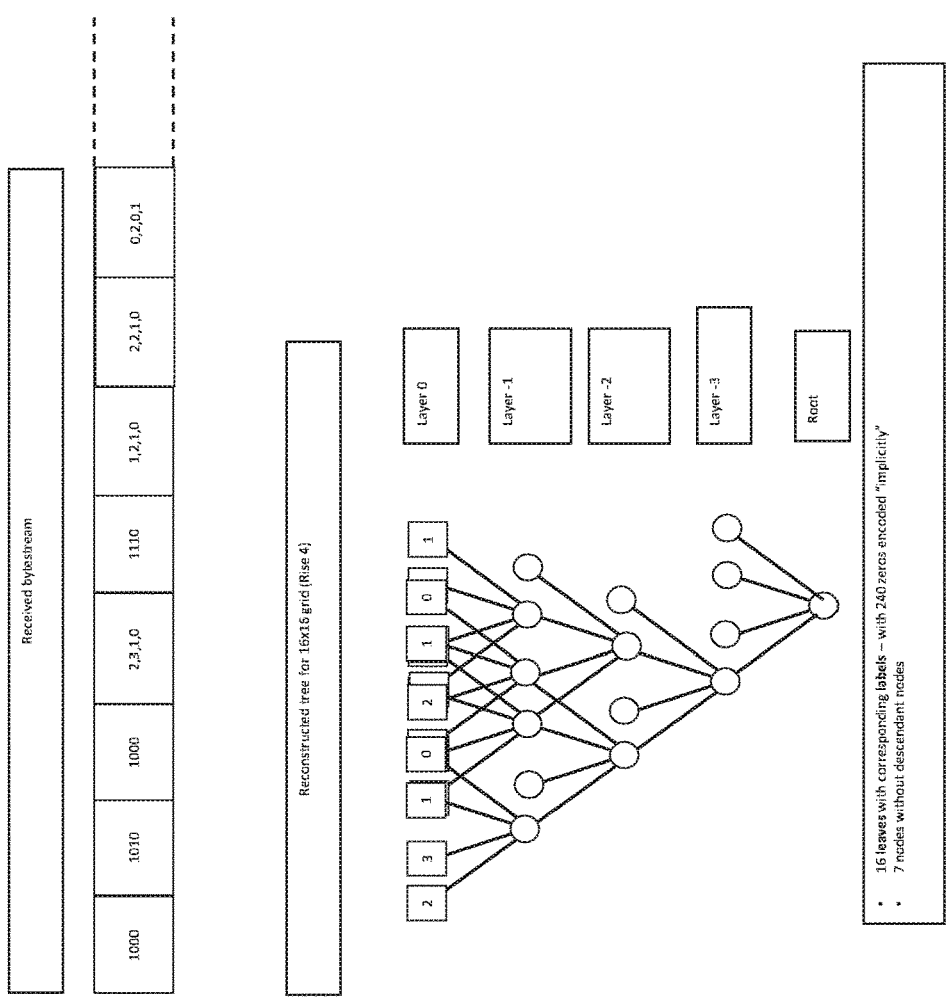
FIGS. 50A and 50B further illustrate a decoder building a tree once it has read a bytestream and an associated grid.

FIG. 50b illustrates an example of a recreated sparse 2D array. This array is the recreated array which is encoded in the example bytestream. As can be seen, the array contains a large amount of zeros and small clusters of non-zero values, as symbols.

Contemporary techniques for compressing a sparse set of data such as this would include, for example, grouping or concatenating the zero values and indicating the number of zeros to be decoded in the stream. However, this is inefficient as the technique requires in any case for some data to be sent and processed at the decoder and extra symbols defined accordingly. The present technique takes advantage of the sparseness of the data by not sending quadrants where the array is sparse and thus achieves compression gains. Moreover, since the decoder does not need to store significant data in memory or monitor for defined symbols, decoder efficiency can be improved.

However, if no data is sent, there is introduced of course significant challenges at the decoder. The following sets out a technique by which a decoder may recreate a 2D array of sparse data where much of the sparse data has not been received, while any non-zero values are accurately located within the array. In particular, the specific structure used to encode and/or decode the data (e.g., the tessera or a combination of tesserae) together with the order used to decode said structure enables to minimise the amount of information needed to be received by the decoder in relation to the zero values, thus optimising decoding and reducing the amount of data to be transmitted.

For the purposes of this short description, we assume the decoder knows or otherwise has identified the stream length and the position of the data in the stream, as it has been signalled and received separately. This short description considers an encoded dataset.

Figure 31B:
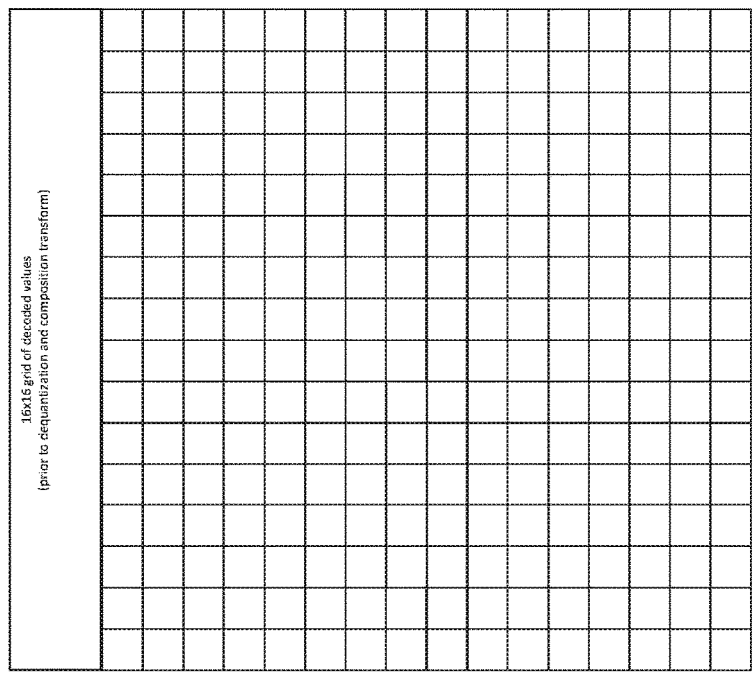
FIGS. 31A and 31B illustrate a decoder beginning to build a tree once it has read a bytestream and an associated grid.
Figure 31A:
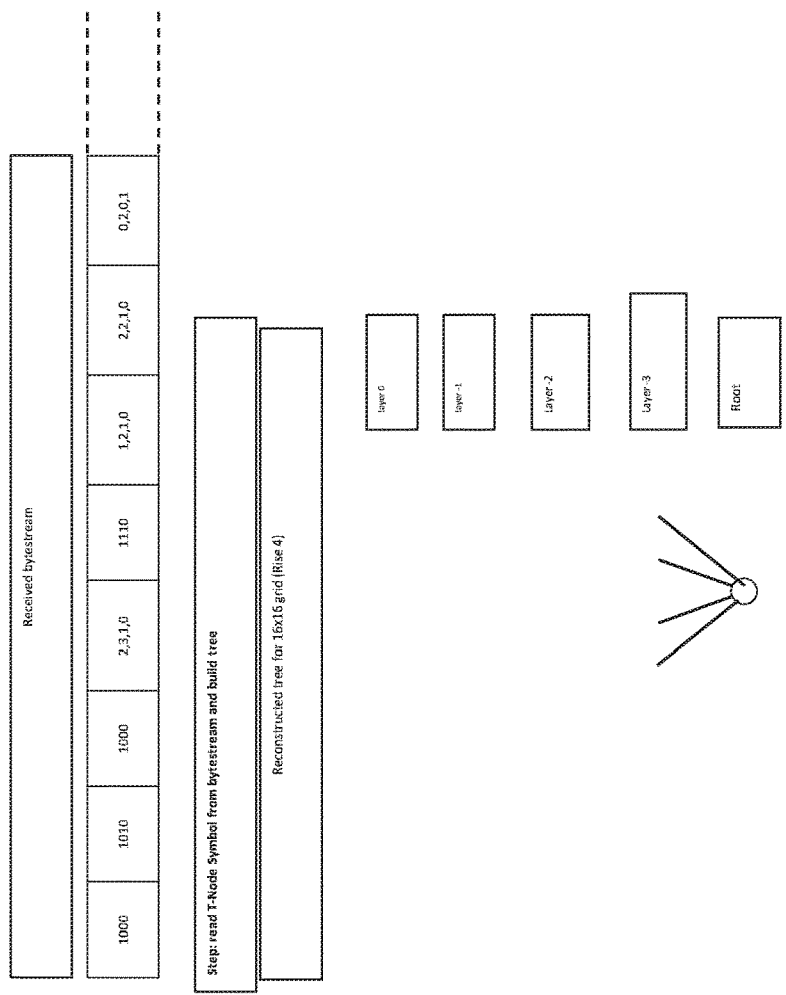

With reference to FIG. 31a, the technique first reads the stream to identify the data. The Figures, and FIG. 31a for example, show a representation of the received bytestream. As will be clear, the representation is not truly a bytestream but rather a logical representation. The logical representation is separated into bytes or nibbles. The logical representation is a series of four-bit values or nibbles, each representing a T-Node Symbol, and a series of four symbols each representing a leaf in the Top Layer, or Layer 0. This will become clear from the below as the process of decoding the data is explained.

The decoder builds a tree. The tree is a quadtree composed of nodes and edges that connect the nodes. A parent node is connected to a child node by an edge. In a quadtree, each parent node has exactly four child nodes. A quadtree can contain a number of leaf nodes. A leaf node is defined as a node containing no children. A root node is defined as a node without a parent. Nodes containing both parents and children are referred to as inner-nodes.

The present technique utilises a sparse quadtree. In the sparse quadtree, each parent node has either exactly four child nodes, or no children. An inner node is considered empty if all of its children are likewise empty. A leaf node is considered empty if its corresponding residual value is zero, or the corresponding residual value is below a certain threshold value.

As an example, an inner node is empty because its leaf nodes all map to residual values of zero. During traversal of a sparse quadtree, children of a node are only visited if said node is not empty. Accordingly, if an empty node is visited during traversal, then the traversal does not continue to said empty node's children as they will all, by definition, be likewise empty.

During decoding, the tree is traversed in a bottom to top definition; that is, the tree is traversed from the lowest level to the highest level. In an embodiment, the tree is traversed in a depth-first manner. Doing so is equivalent to visiting the elements of the corresponding N×N tessera in a z-order traversal. This allows for spatial information to be utilised as part of the encoding and decoding process. It further ensures that the elements are decoded in the same order that they are encoded. In further embodiments, other traversal methods could be employed to utilise further aspects of the structure of the tile. Thus, the sparse quadtree data structure defines the instances and location of data.

As mentioned above, the data in the bytestream may either be a T-node symbol or a data symbol. The T-node symbol is a series of binary values that indicate to the decoder if a particular branch in the tree has an expected child. That is, that the byte stream contains information on a child node or not. If not, it can be assumed that all descendant leaves from that node are the same, predetermined value (in the example the value is zero). When the decoder traverses the tree to reach a leaf, the bytestream contains a series of four data symbols, each representing the value of the leaf of the tree. The tree is mapped to a grid with each leaf on the tree corresponding to a location in the grid.

As illustrated in FIG. 31a, the reconstructed tree structure has a set of layers. A layer is considered to be the subset of nodes that have the same Distance from the root. The Distance is the minimum number of Branches (or edges) between two nodes. The number of layers is set by the size of the array which is to be reconstructed. This size may be either predetermined or signalled in the bytestream.

The example considers a quadtree but the nodes may have any number of children. The tree may accordingly be referred to as an n-Tree, a tree where no node has more than n Children. That is, a Quadtree is an n-Tree where n is 4. A quadtree is well known in the art and is a tree data structure in which each internal node has exactly four children except leaf nodes and all leaves are on the same level, the level corresponding to the locations in the grid. The data can be stored compactly in an array as an implicit data structure.

In the example described, the tree has four layers and a root which reconstructs a tree for a 16×16 grid. That is, the Rise is 4. The Rise is the absolute value of the Altitude of the Root of an n-Tree. It corresponds to the number of Layers in the n-Tree excluding the Root. The Altitude is an index, $-j$, increasing with Distance from Root, reaching 0 at maximum Distance from Root. Note: $-j$ is always $\leq 0$. In other words, the Number of Layers in an n-Tree corresponds to Rise plus 1.

For completeness, a node at Altitude $-j-1$ is a Parent of a node at Altitude $-j$, where both nodes are linked together by only one Branch and a node at Altitude $-j+1$ is a Child of a node at Altitude $-j$, where both nodes are linked together by only one Branch (or edge). A node at Altitude $-j+x$ is a Descendant of a node at Altitude $-j$, where x is the Distance between the two nodes and a node at Altitude $-j-x$ is an Ancestor of a node at Altitude $-j$, where x is the Distance between the two nodes.

Returning again to FIG. 31a, the decoder begins to build the tree once it has read the bytestream. At this stage, the grid is empty as shown in FIG. 31b. The decoder knows that the tree must have a root and simulates four branches from that root as the decoder knows that the tree is a quadtree (or 4-tree). Thus the root and the first four branches are known or assumed.

The tree can be traversed in any known manner. The example here utilises a depth-first approach, specifically a Depth-First Pre-Order Traversal. A Depth-First Pre-Order Traversal can be considered to be a strategy for traversing an Ordered Tree from least to greatest Altitude. If a Leaf is reached, the strategy backtracks through Ancestors of that Leaf, before traversing further sections of the same Tree.

As outlined by Wikipedia, in a depth-first approach, the tree is deepened as much as possible on each child before going to the next sibling. For a binary tree, they are defined as display operations recursively at each node, starting with the root. In a pre-order depth first search, the following algorithm is performed:

Check if the current node is empty/null.
Display the data part of the root (or current node).
Traverse the left subtree by recursively calling the pre-order function.
Traverse the right subtree by recursively calling the pre-order function.

Returning to the example of FIG. 31a, the first 4-bit value of the stream is taken. In this example, the value is 1000. This value may be referred to as a T-node symbol. A Label is data attached to a node in a Tree other than what is implicit in the Tree's structure and order of nodes. The T-node symbol informs the decoder of the data in the stream and tells the decoder how to reconstruct the tree.

In the 4-bit value of the stream, the T-Node Symbol, a "1" indicates that the Child of the node is an expected child, that is, there will be data sent in the stream representing the Children of that node—or, alternatively, a "1" indicates that the Child node will have itself children, and therefore it will be present. On the other hand, a "0" indicates that the Child of the node is not expected, that is, no data will be sent in the stream for those nodes and no child is expected to be received for that branch—or, alternatively, a "0" indicates that the Child node will not have itself children, and therefore it will not be present. The decoder can assume that all the leaves from those latter branches are zero values. This will optionally be simulated and is described below.

At the end of the branches of the root node, the decoder now knows that there is a node having further children for which data will be received in the stream and three nodes for which no further data was or will be sent.

In the depth-first traversal order, the process moves to the left-most node. There was a 1 received in the stream for this branch in the T-Node Symbol. It will be recalled that the T-node symbol indicates that further data will be received. Referring to FIG. 32a, the next 4-bit value of the stream is taken. In this example, the value is 1010. The decoder simulates the 4 branches of that node, as shown.

Figures 33A, 33B:
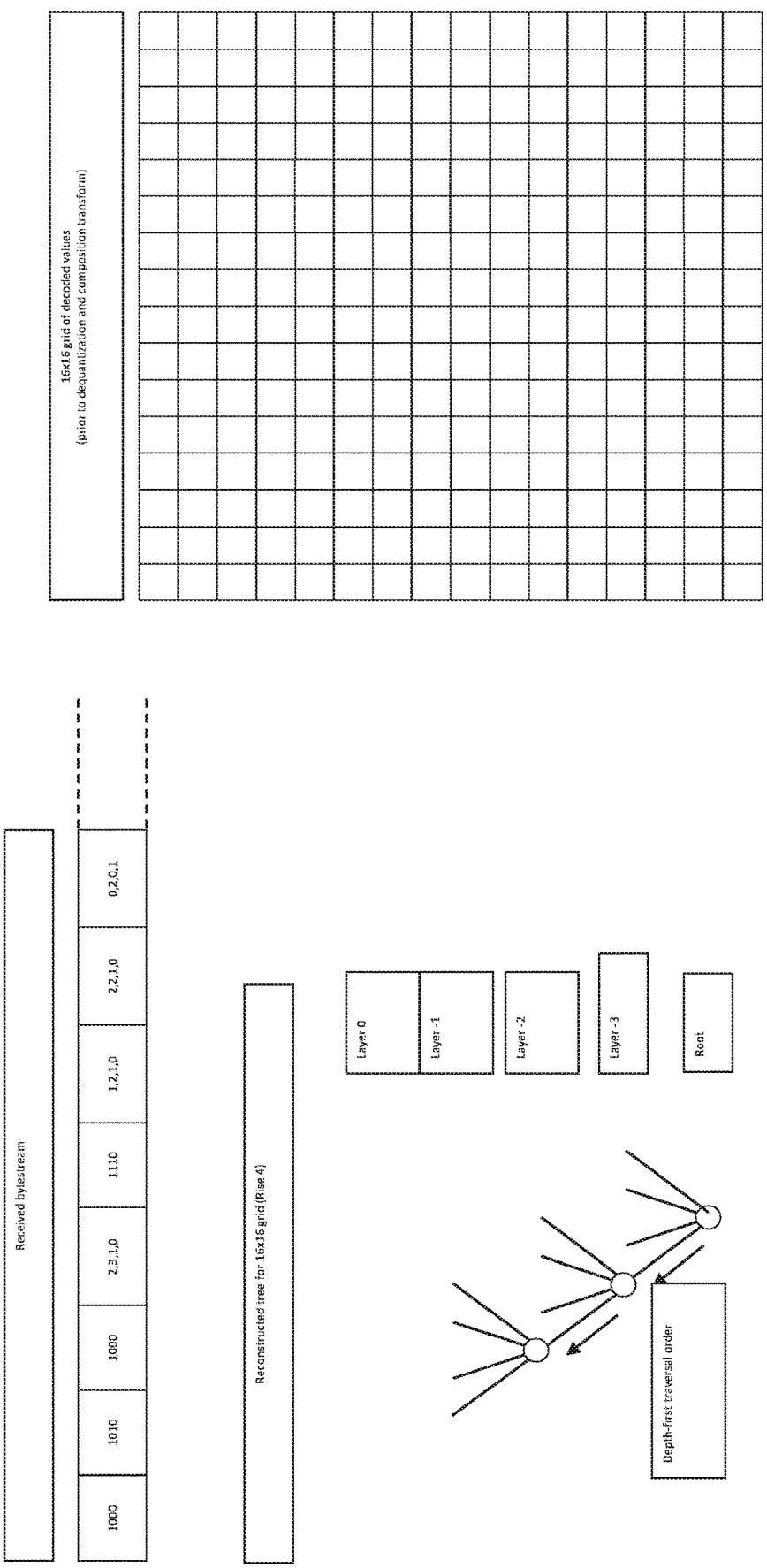
FIGS. 33A and 33B further illustrate a decoder building a tree once it has read a byt bytestream and an associated grid.

The left-most branch is traversed and since the first value is 1 the decoder looks to the next 4-bit value. The decoder is now in Layer −1 as shown in FIG. 33a. As shown, the data received next is 1000 signifying that further data will be received for the leftmost branch but no further data will be sent for the three remaining branches.

Figure 34B:
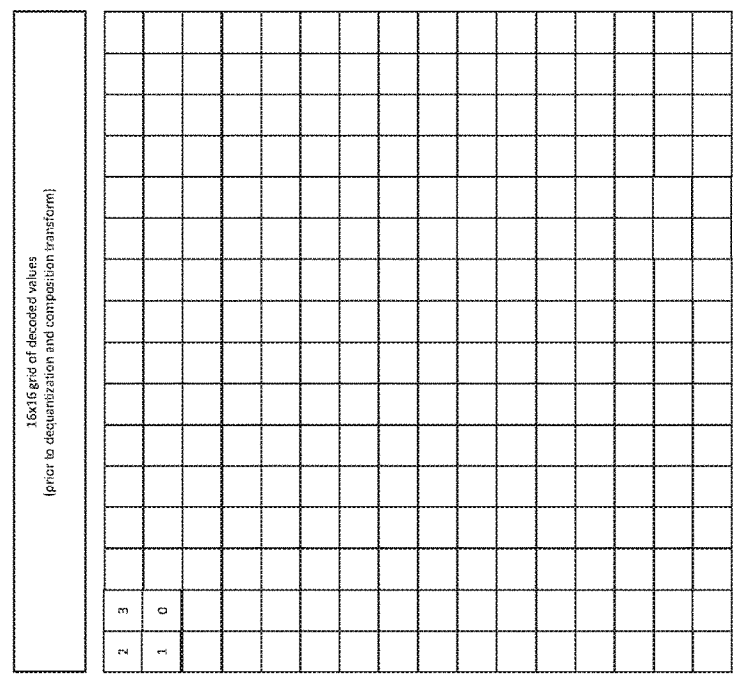
FIGS. 34A and 34B further illustrate a decoder building a tree once it has read a bytestream and an associated grid.
Figure 34A:
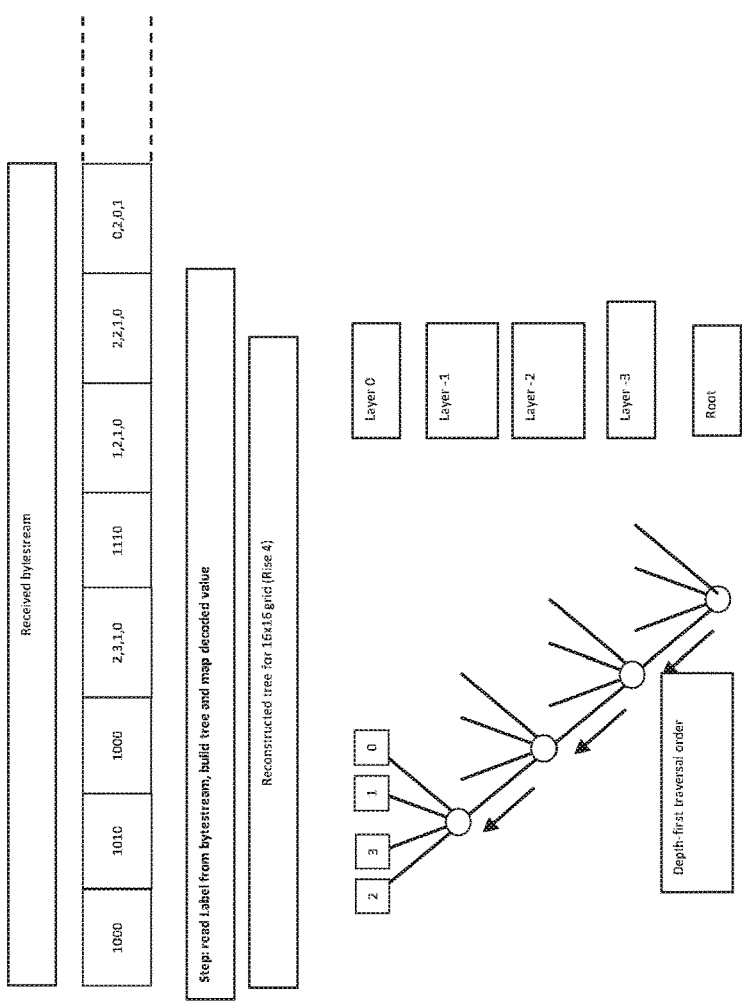

The decoder has now populated the root and the left-most part of the Layers −3 and −2 from the left-most node of Layer −2, as shown in FIG. 34a. Since the decoder has reached Layer −1, it now expects 4 symbols. It is noted that all values in Layer 0 are sent if the decoder reaches that level even if the value is zero. The decoder now reads the symbols from the stream to populate the tree. In the example the symbols or values are '2', '3', '1' and '0' and the decoder populates the tree as shown in the Figure. In the example traversal order, the tree is populated with the symbols from left to right and each Leaf in Layer 0 (the Top Layer) is known.

The following is a summary of the present example:
1) the first T-Node Symbol of the bytestream (1000) corresponds to the T-Node Symbol of the Root Layer;
2) the second T-Node Symbol of the bytestream (1010) corresponds to the T-Node Symbol of Layer −3;
3) the third T-Node Symbol of the bytestream (1000) corresponds to the T-Node Symbol of Layer −2;
4) there is no T-Node sent for Layer −1 because the T-Node of Layer −1 would always be (1111), and therefore it is implicitly present once the T-Node Symbol of Layer −2 has indicated there is a child node;
5) The values in the Label (i.e., the residuals in the case of a tessera being a tile, metadata such as streamlegnths in the case of a tessera being a tableau) correspond to Layer 0 and are "attached" to the branches of Layer −1.

For further clarification, within a tessera there are five layers (wherein a layer is a set of nodes), from the Root Layer to Layer 0. Each Layer is associated with a set of data. In the case of the Root Layer, Layer −3, Layer −2 and Layer −1, this set of data is called "T-Node Symbol" and effectively indicates whether the four children node from a specific layer will have children (in which case it is a logical value of "1") or no children (in which case it is a logical value of "0"). Layer −1 T-Node-Symbol must have at least one "1" bit—for Tableaux, such a "1" indicates a non-zero streamlength (or another metadata such as tileset), for Tiles, all the bits are set at "1". Layer 0 is a "special" layer in that it contains leaves, i.e. nodes with no children, and in particular includes the data symbols in those leaves.

In the bytestream, there will be T-Node Symbols for the Root Layer, Layer −3 and Layer −2. Due to the way that T-Node Symbols work and their meaning (as described in this application), and the fact that Layer 0 is the "final" layer, the T-Node Symbol for Layer −1 is implicitly sent, since the T-Node Symbol in Layer −2 would have already implicitly indicated whether or not the child node of Layer −2(i.e., Layer −1) has children. Given that the children could only be the data symbols in Layer 0 (residuals or metadata in the video case), then the bytestream would only simply directly indicate Layer 0 data symbols. Note we have a maximum of 21 T-Nodes Symbols for each Tessera (one for the root, up to four for Layer −3, and up to 16 for Layer −2).

From a nomenclature point of view, the term "Label" may refer to: (a) a T-Node Symbol for Root Layer or Layer −3 (e.g., in the present figures these would be data blocks {1000} and {1010}); (b) the "group" of Layer −2 and the data symbols of Layer 0 (e.g., in the present figures, these would be either the third and fourth data block in the bytestream, i.e. {1000} and {2,3,1,0} or the last four data blocks in the bytestream, i.e., {1110}, {1,2,1,0}, {2,2,1,0} and {0,2,0,1}); and (c) each individual data symbol in Layer 0 (e.g., in the present figures, each one of data blocks {2,3,1,0}, {1,2,1,0}, {2,2,1,0} and {0,2,0,1}).

We now have values which can be mapped to the grid. Whether the grid is populated as the tree is populated is unimportant but we populate the grid here when the data is placed into the tree for illustrative purposes. In practice, the process may wait until the entire tree is populated.

As shown in FIG. 34b, the 16×16 grid of decoded values can be populated by the symbols received. A grid is a fully populated, dense, rectangular 2D array. The four symbols represent a 2×2 block in the upper left of the grid.

In the example, the 2×2 block is ordered: top-left, top-right, bottom-left, bottom-right. As will be understood, in practice this order may be any order provided the encoder and decoder are in agreement.

The values in the stream shall be interleaved in the example in depth-first order, which corresponds to z-order in image space. The z-order is defined recursively in the examples but of course this may be any order, as will be understood. Z-order is an ordering of overlapping two-dimensional objects. In the example, the data of the tree is mapped to the grid in a Morton ordering. A Morton ordering maps multidimensional data to one dimension while preserving locality of the data points. It was introduced in 1966 by G. M. Morton. The Morton order for the example is sub-partitioned into 2×2 blocks. The terms Z-order, Lebesgue curve, Morton order or Morton code are used in the art.

Morton ordering is well known in the art and will be understood. It will also be understood that any suitable mapping of the data from the tree into the grid may be utilised.

In practice Morton ordering using 2×2 blocks means that the symbols of the tree are mapped to the grid in the following example order for an 8×8 grid:

| 0  | 1  | 4  | 5  | 16 | 17 | 20 | 21 |
| 2  | 3  | 6  | 7  | 18 | 19 | 22 | 23 |
| 8  | 9  | 12 | 13 | 24 | 25 | 28 | 29 |
| 10 | 11 | 14 | 15 | 26 | 27 | 30 | 31 |
| 32 | 33 | 36 | 37 | 48 | 49 | 52 | 53 |
| 34 | 35 | 38 | 39 | 50 | 51 | 54 | 55 |
| 40 | 41 | 44 | 45 | 56 | 57 | 60 | 61 |
| 42 | 43 | 46 | 47 | 58 | 59 | 62 | 63 |

When considering the mapping of the tree to the grid, it can be considered that the z-order mapping results in each branch of the tree being a quadrant of the grid. The Layer −1 branches each being a 2×2 block, the Layer −2 branches each being a 4×4 block and the Layer −3 branches each being an 8×8 block (the Root representing the 16×16 grid).

Figures 35A, 35B:
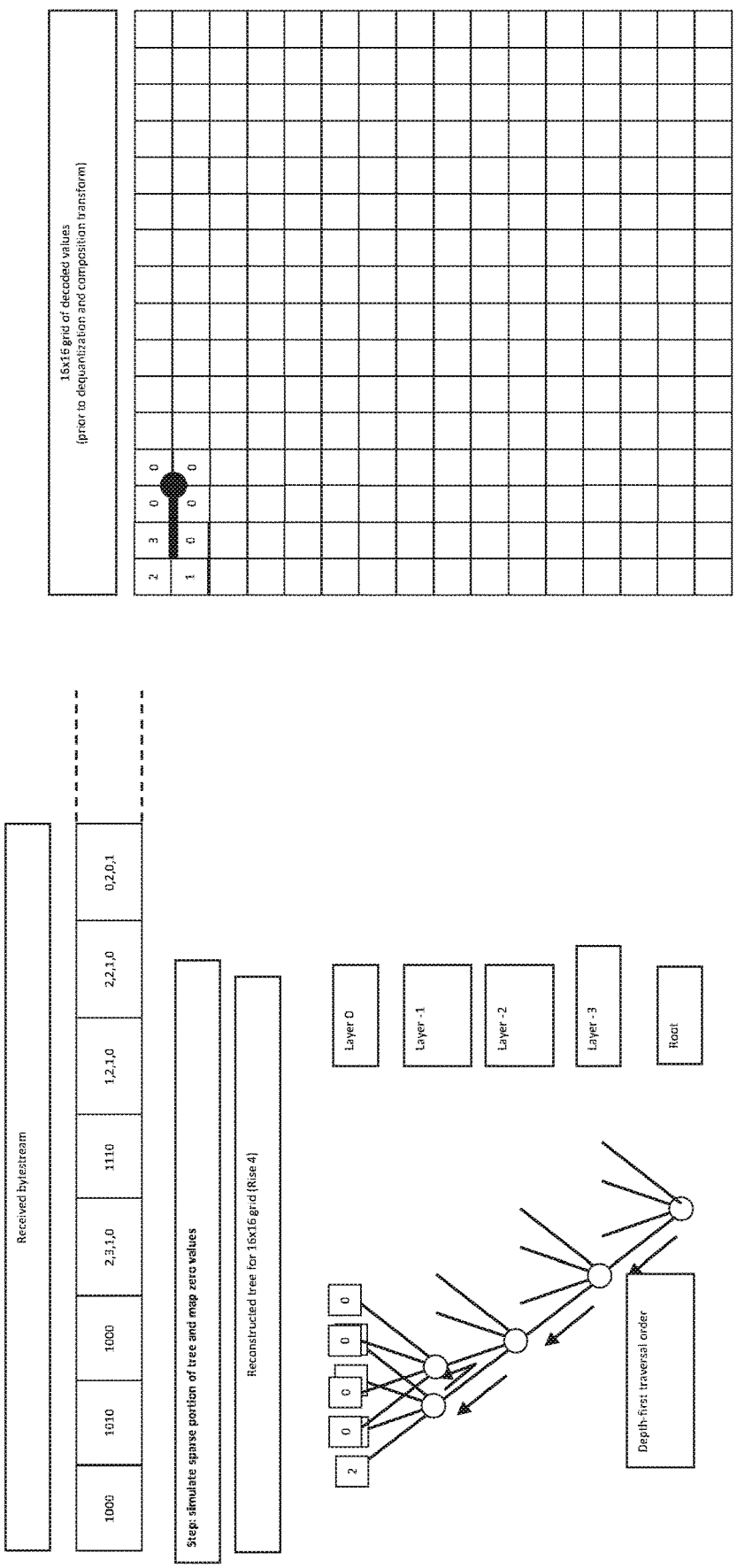
FIGS. 35A and 35B further illustrate a decoder building a tree once it has read a bytestream and an associated grid.

With reference to FIGS. 34*a* and 34*b*, it can be seen that the first four symbols have been decoded and mapped. Following the traversal order, the decoder decodes the tree, as shown in FIG. 35*a*. Since the data previously received for Layer −2 indicated a 0 value for this node, the decoder is able to simulate the sparse portion of the tree and map zero values to the grid. Where a 0 is received in the T-node symbol, the 0 indicates that no data will be sent for that node. If no data is to be sent, the decoder assumes the value is zero.

The present context assumes that the grid is sparse and so assumes a zero value where no data is sent. Of course it will be readily understood that any value could be used as the value that is not sent. For example, the value not sent could be any symbol or a 1.

As shown in FIG. 35*a*, the process assumes that the values in the Top Layer are zero and simulates the tree. The zero values can then also be mapped onto the grid following the z-order mapping as shown in FIG. 35*b*. The four zero values are mapped to the 2×2 block to the right of the 2×2 block previously mapped.

Figure 36B:
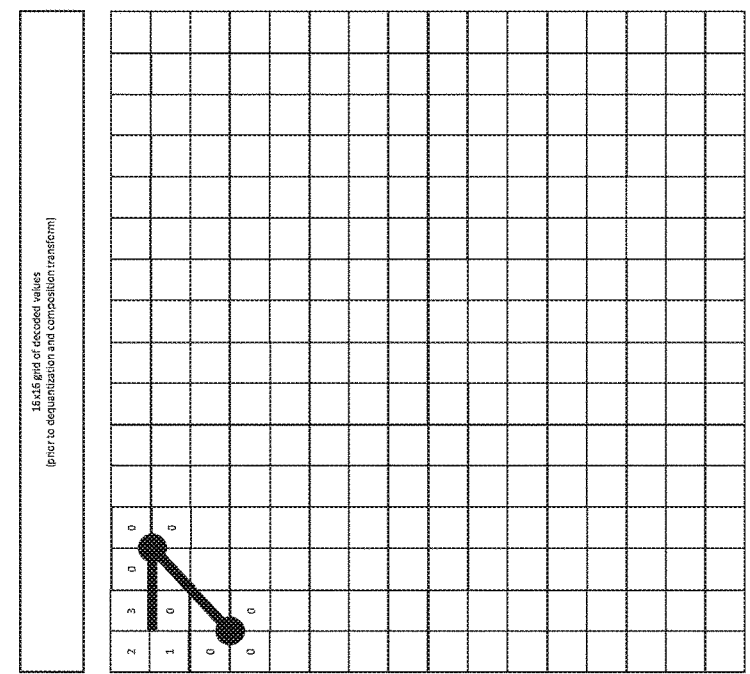
FIGS. 36A and 36B further illustrate a decoder building a tree once it has read a bytestream and an associated grid.
Figure 36A:
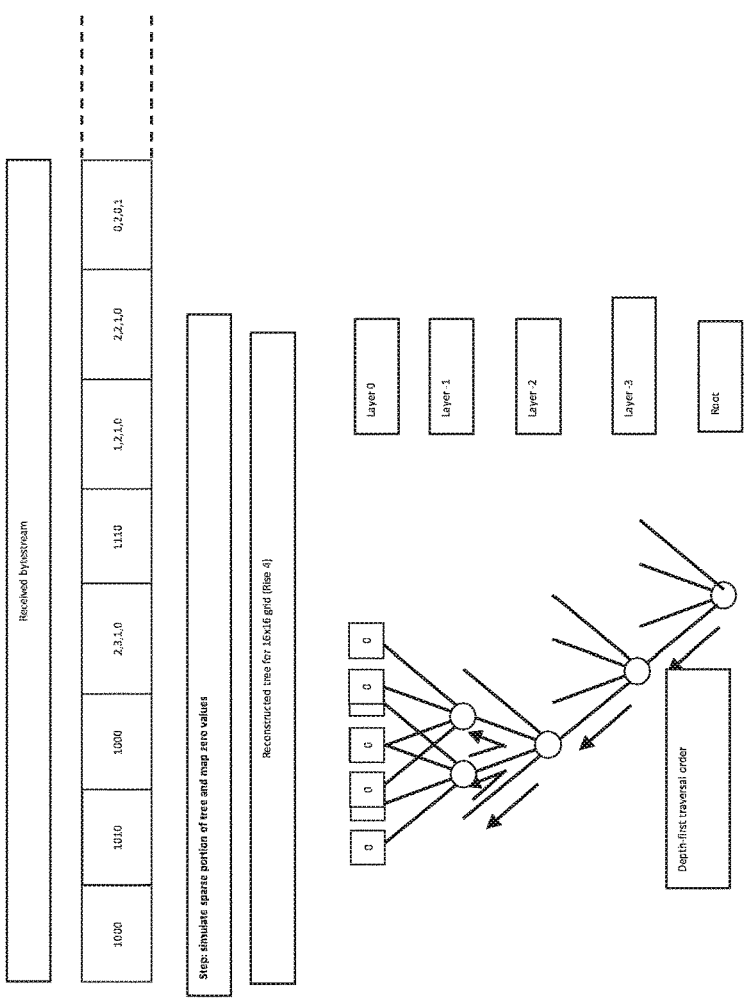

The simulation process continues as shown in FIG. 36*a*. The previously parsed T-node symbol indicated that the next node in the traversal terminates. Therefore, the decoder can simulate that the leaves of this node are sparse in Layer 0. The zero symbols can be mapped to the grid according to the z-order mapping. As shown in FIG. 36*b*, a block of 2×2 zero values are entered beneath the first block placed, that is, at the bottom-left of the 4×4 quadrant.

The quadrant in the grid is completed by simulating the final leaves of that node. As the T-node symbol for that node indicated 1000, the sparse values can be simulated as shown in FIG. 37*a*. The zero values are mapped to the final 2×2 block of the 4×4 quadrant according to the z-order, as illustrated in FIG. 37*b*. The 2×2 block of zero values is entered as the bottom-right block of the quadrant. The process now has a complete quadrant. In practice, the simulation may be done in one single step for each of the Layers (e.g., all the nodes associated with the zero T-Node symbols in that Layer are simulated simultaneously and the corresponding zeros are mapped in the grid). The simulation can be a notional process, i.e. done implicitly rather than explicitly.

Figures 38A, 38B:
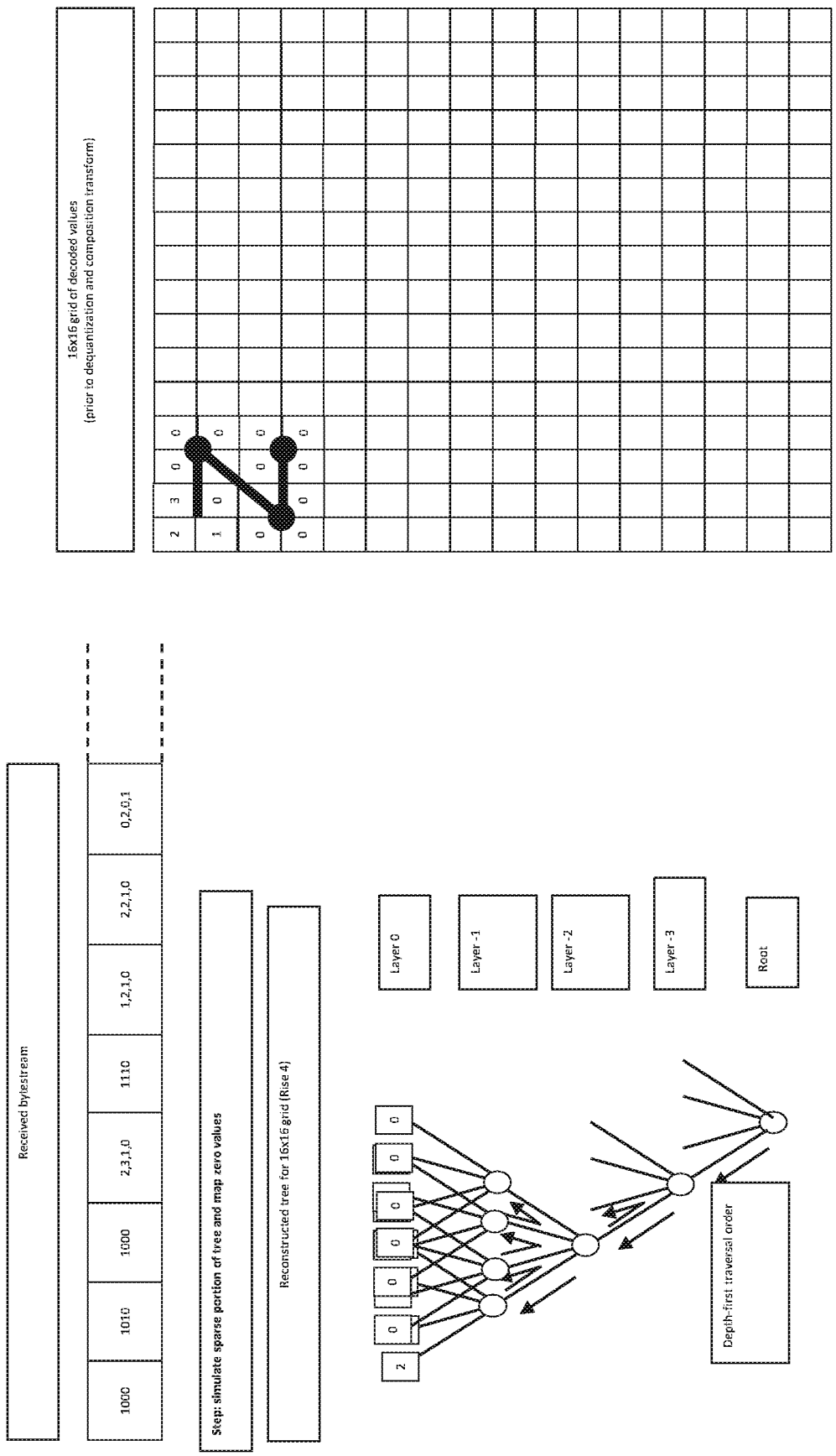
FIGS. 38A and 38B further illustrate a decoder building a tree once it has read a bytestream and an associated grid.

FIG. 38*a* illustrates the depth-first pre-order traversal. The arrows indicate how the process traverses the tree to consider the next node. The process descends the tree now it has populated all branches from the previous node. The process then continues to the sibling. Sibling Nodes are nodes having same Altitude and same Parent. As all the leaves have been populated, the next node to consider is the sibling in Layer −1.

Figure 39B:
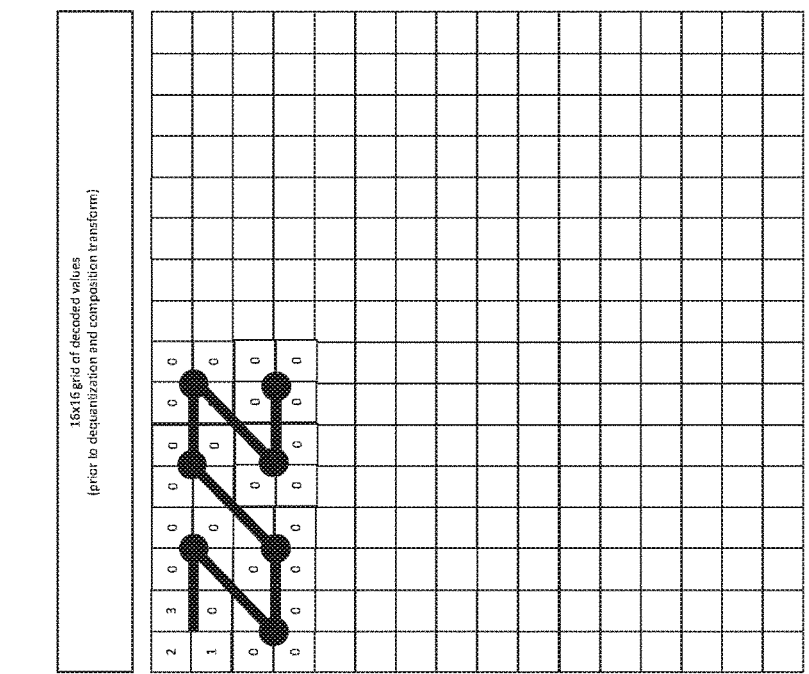
FIGS. 39A and 39B further illustrate a decoder building a tree once it has read a bytestream and an associated grid.
Figure 39A:
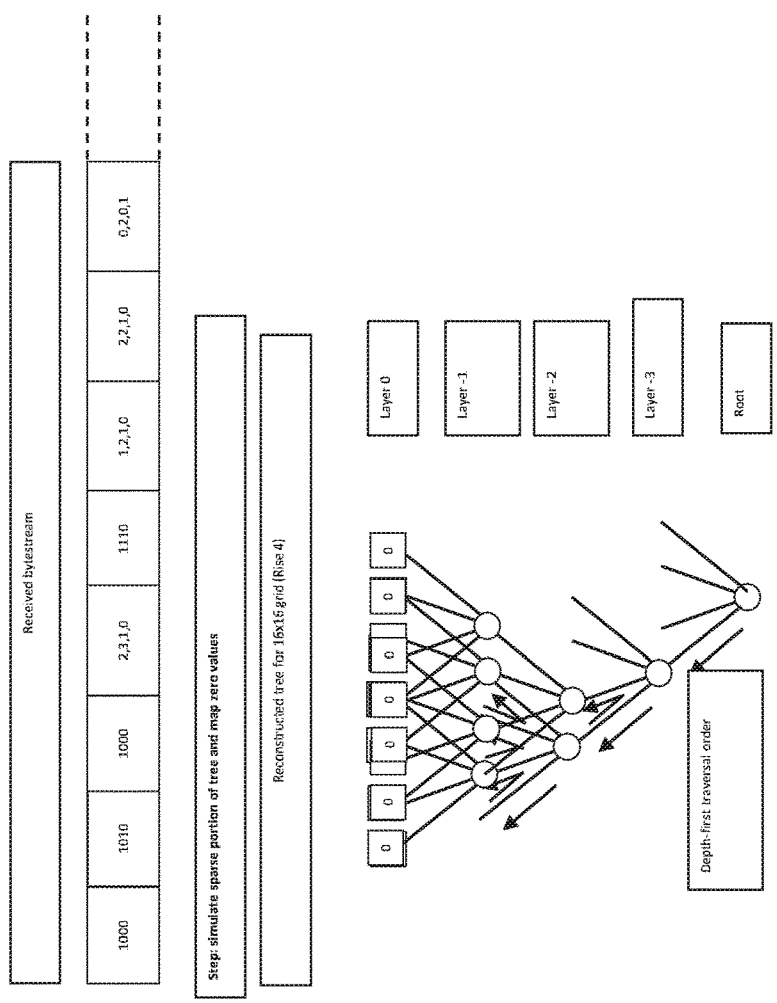
Figures 41A, 41B:
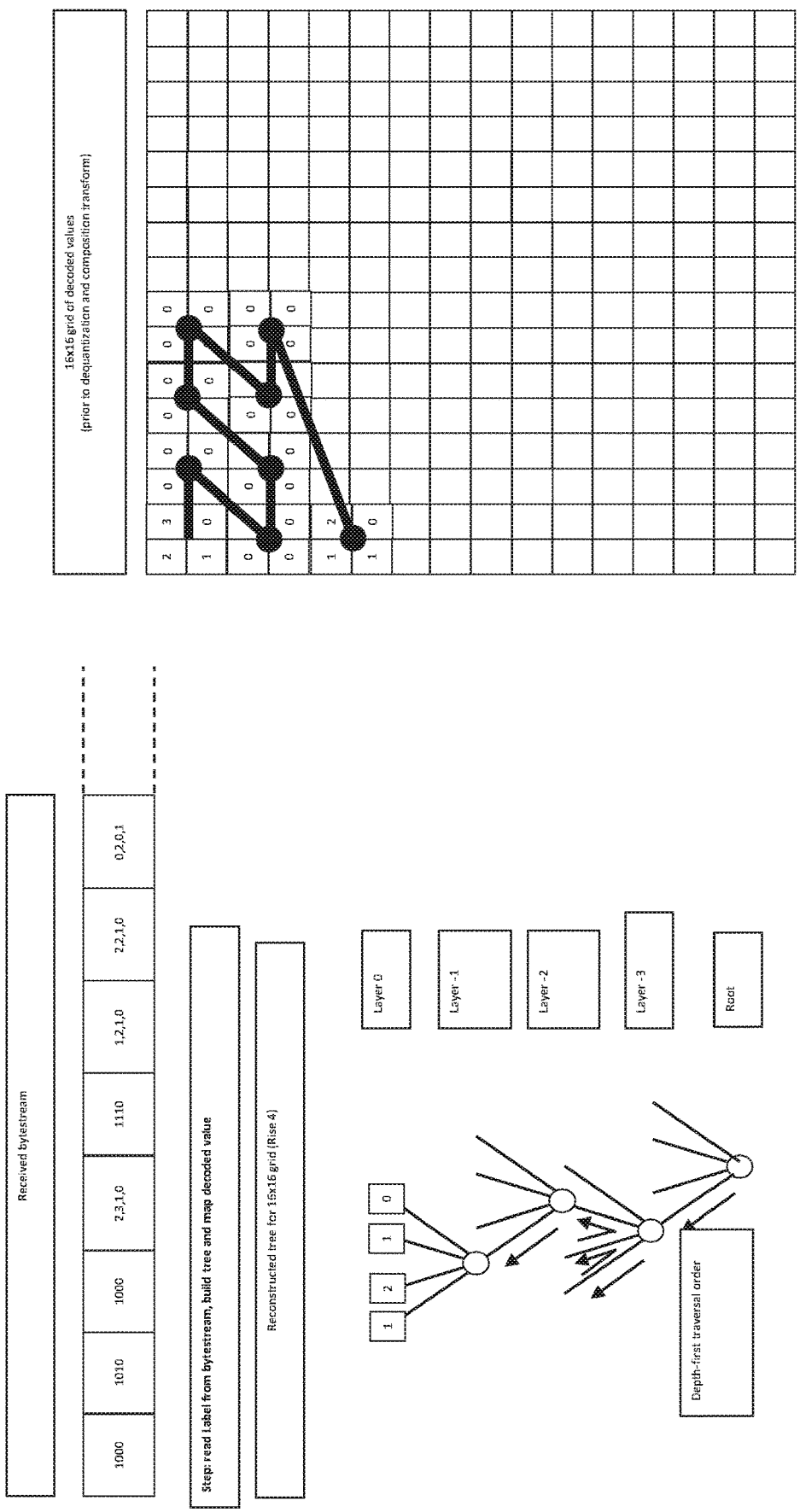
FIGS. 41A and 41B further illustrate a decoder building a tree once it has read a bytestream and an associated grid.
Figures 42A, 42B:
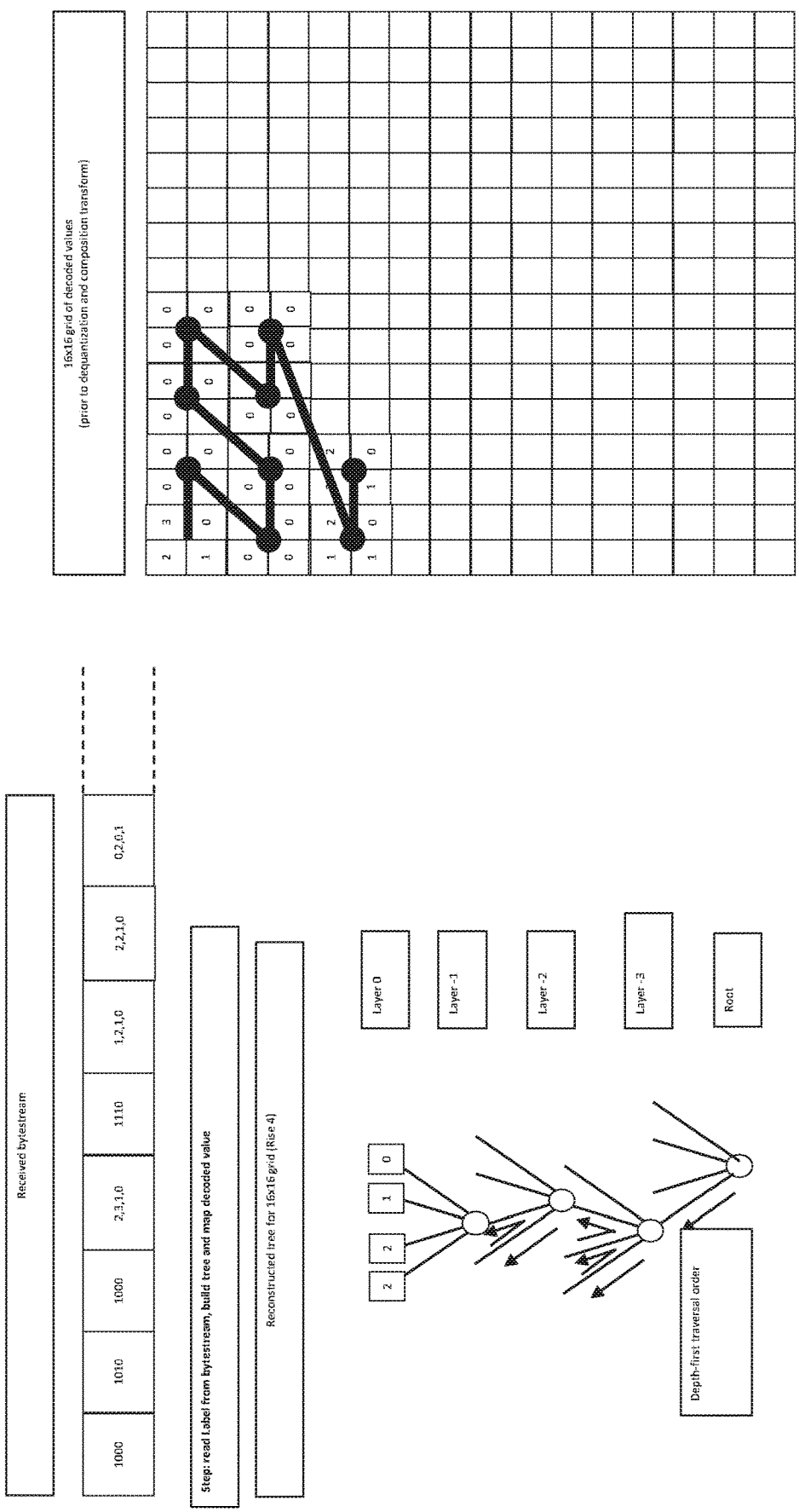
FIGS. 42A and 42B further illustrate a decoder building a tree once it has read a bytestream and an associated grid.
Figures 43A, 43B:
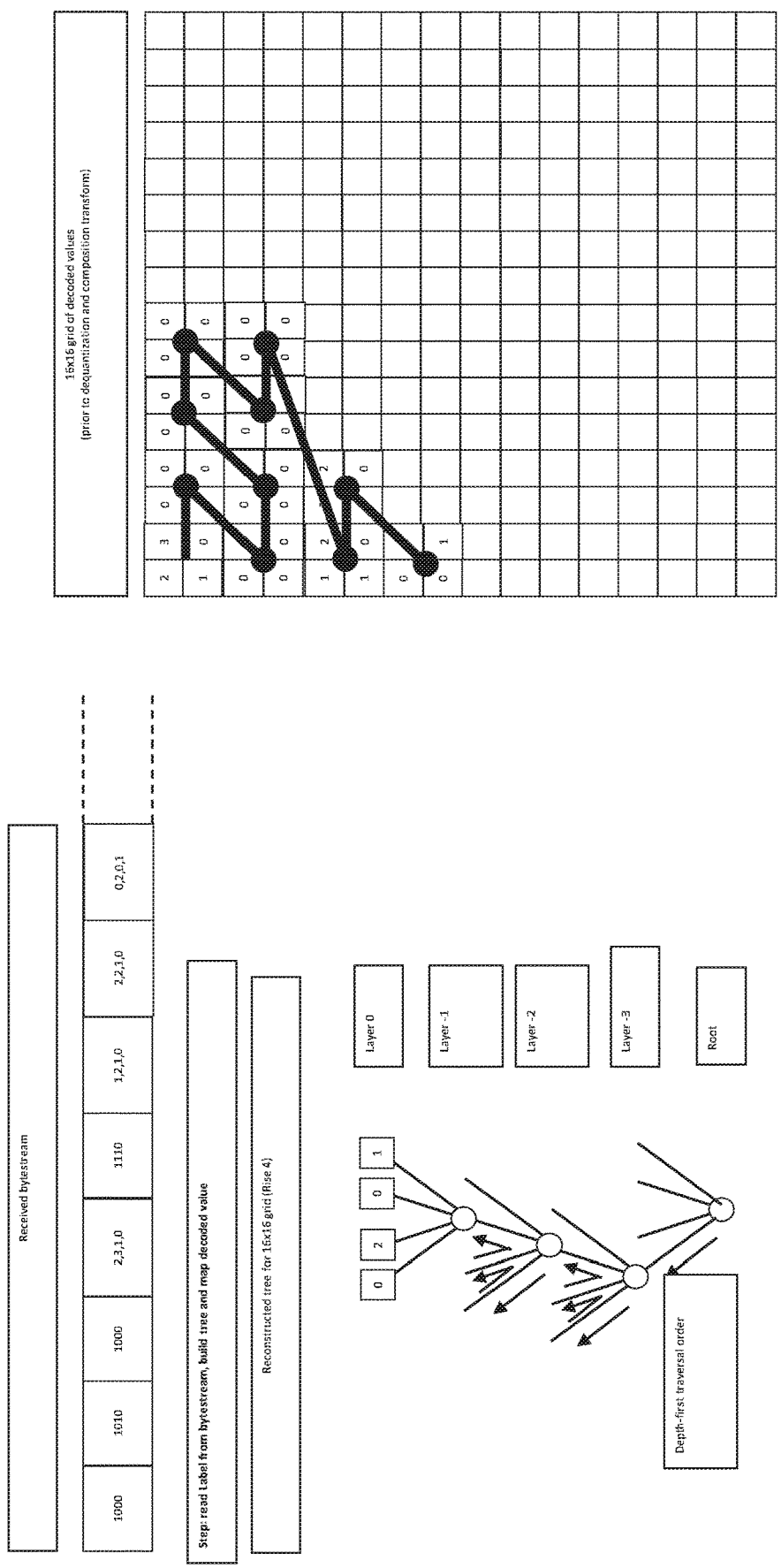
FIGS. 43A and 43B further illustrate a decoder building a tree once it has read a bytestream and an associated grid.

Referring to FIG. 39*a*, it will be recalled that the T-node symbol for the parent was 1010. Accordingly, since the T-Node symbol associated with the second branch is zero, the process does not expect to receive any data in the stream for this branch, that is, the sibling. Accordingly, all leaves from this node can be simulated as zero values, that is all values in Layer 0 from this node are zero values. In other words, all values in this quadrant are zero. Once the tree is simulated, the values can be mapped on the grid. As shown in FIG. 39*b*, following the z-order, the 4×4 block in the top-right of the quadrant can all be mapped as zero values.

Figure 44B:
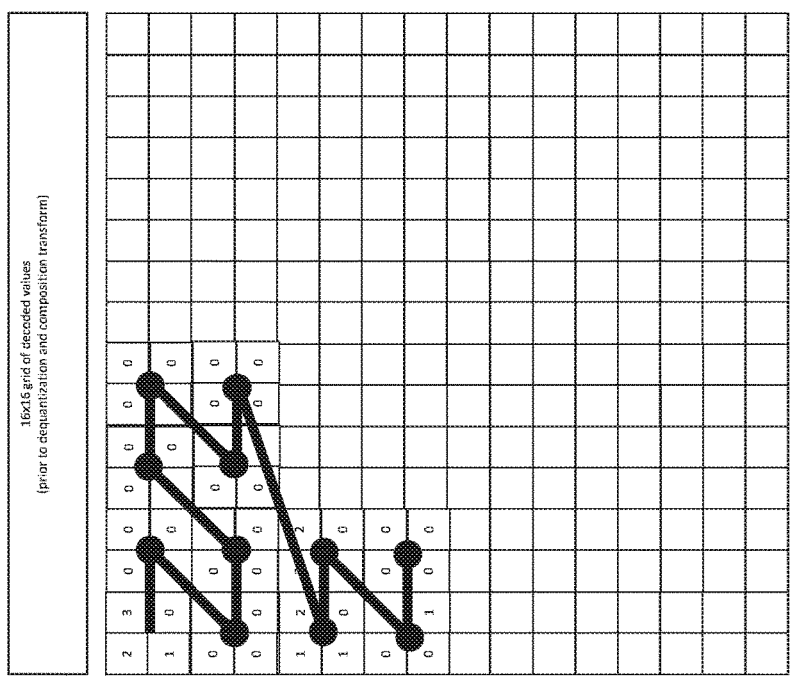
FIGS. 44A and 44B further illustrate a decoder building a tree once it has read a bytestream and an associated grid.
Figure 44A:
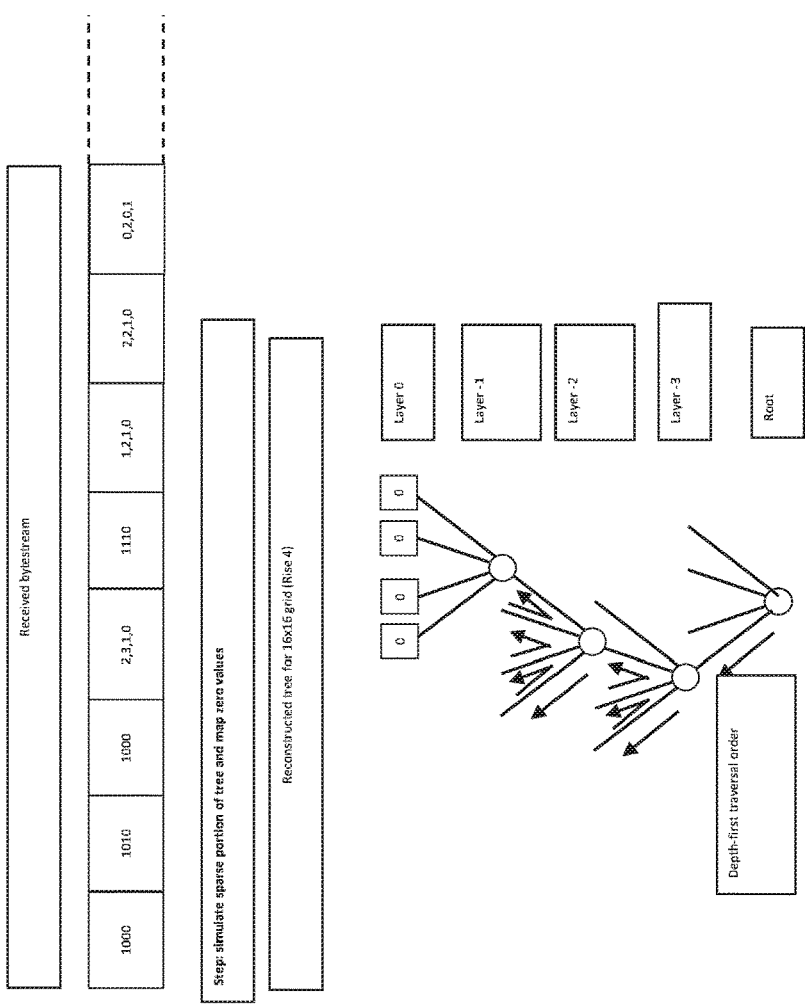
Figures 45A, 45B:
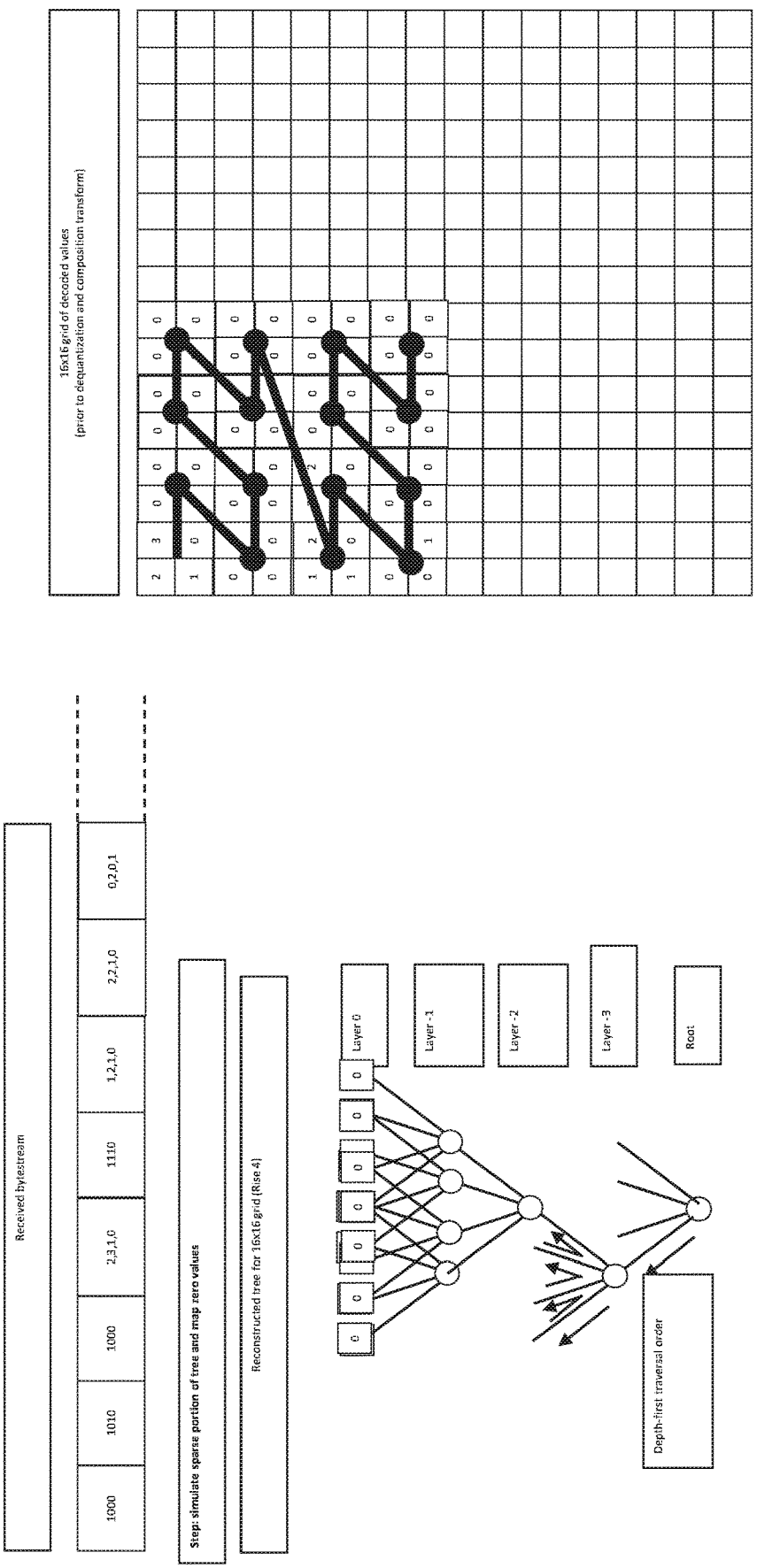
FIGS. 45A and 45B further illustrate a decoder building a tree once it has read a bytestream and an associated grid.
Figure 46B:
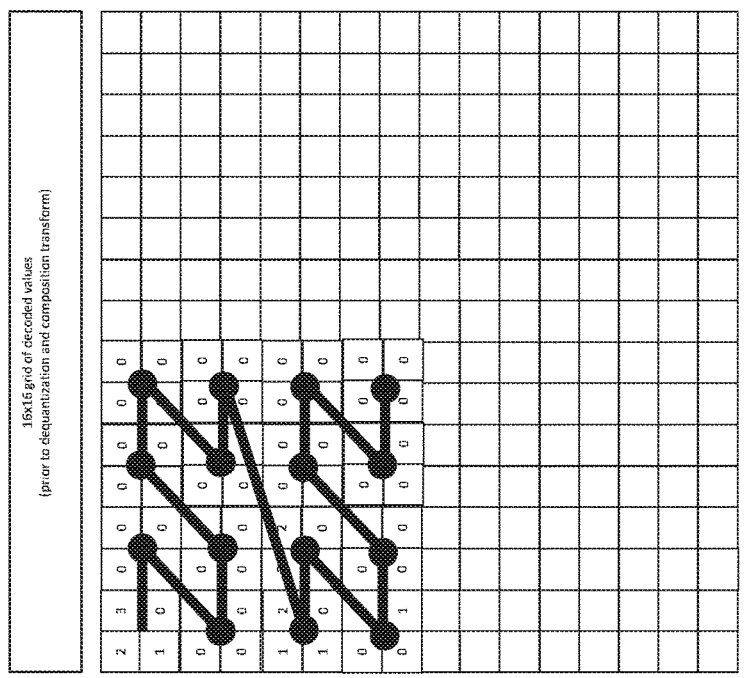
FIGS. 46A and 46B further illustrate a decoder building a tree once it has read a bytestream and an associated grid.
Figure 46A:
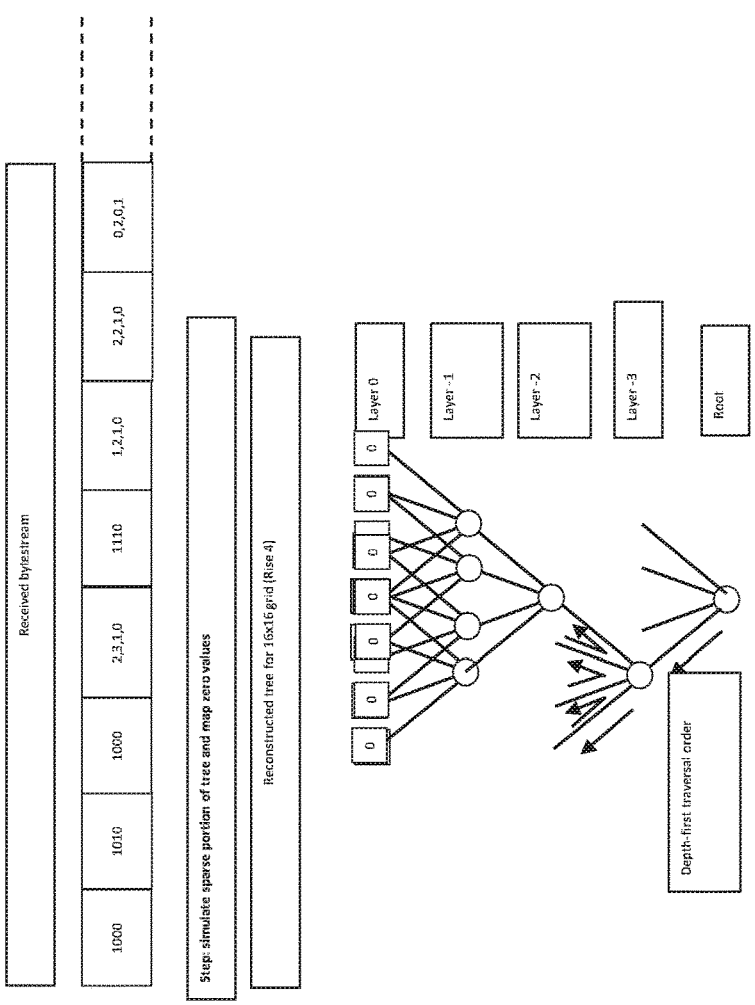

Traversing the tree, the next sibling was indicated by the T-node symbol as having data in the stream (the corresponding T-Node Symbol was 1). Accordingly, the process retrieves the next T-node symbol from the stream. As shown in FIG. 40*a*, in this example the next T-node symbol is 1110. This T-node symbol indicates that three of the nodes in Layer −1, that is three of the Children from the node in Layer −2, have nodes which contain non-zero values. The final node contains only zero values. As shown in FIGS. 41*a*, 41*b*, 42*a*, 42*b*, 43*a* and 43*b*, the symbols are retrieved from the bytestream, the tree is built using the symbols as the leaves in Layer 0 and the symbols are mapped to the grid according to the z-order mapping. For the final sibling, no data is retrieved from the stream as a 0 was indicated in the T-node symbol. The process simulates the tree with zero values as the leaves in Layer 0 from this node, as shown in FIG. 44*a*. The zeros are mapped to the grid to complete the quadrant as shown in FIG. 44*b*. As shown in FIGS. 45*a* and 45*b*, the final sibling from the node in Layer −2 was indicated using the T-node symbol as being sparse and the process populates the tree with zero values for all leaves descended from that node. The zeros are mapped to the grid with zero values for that 4×4 block in the quadrant.

Figures 47A, 47B:
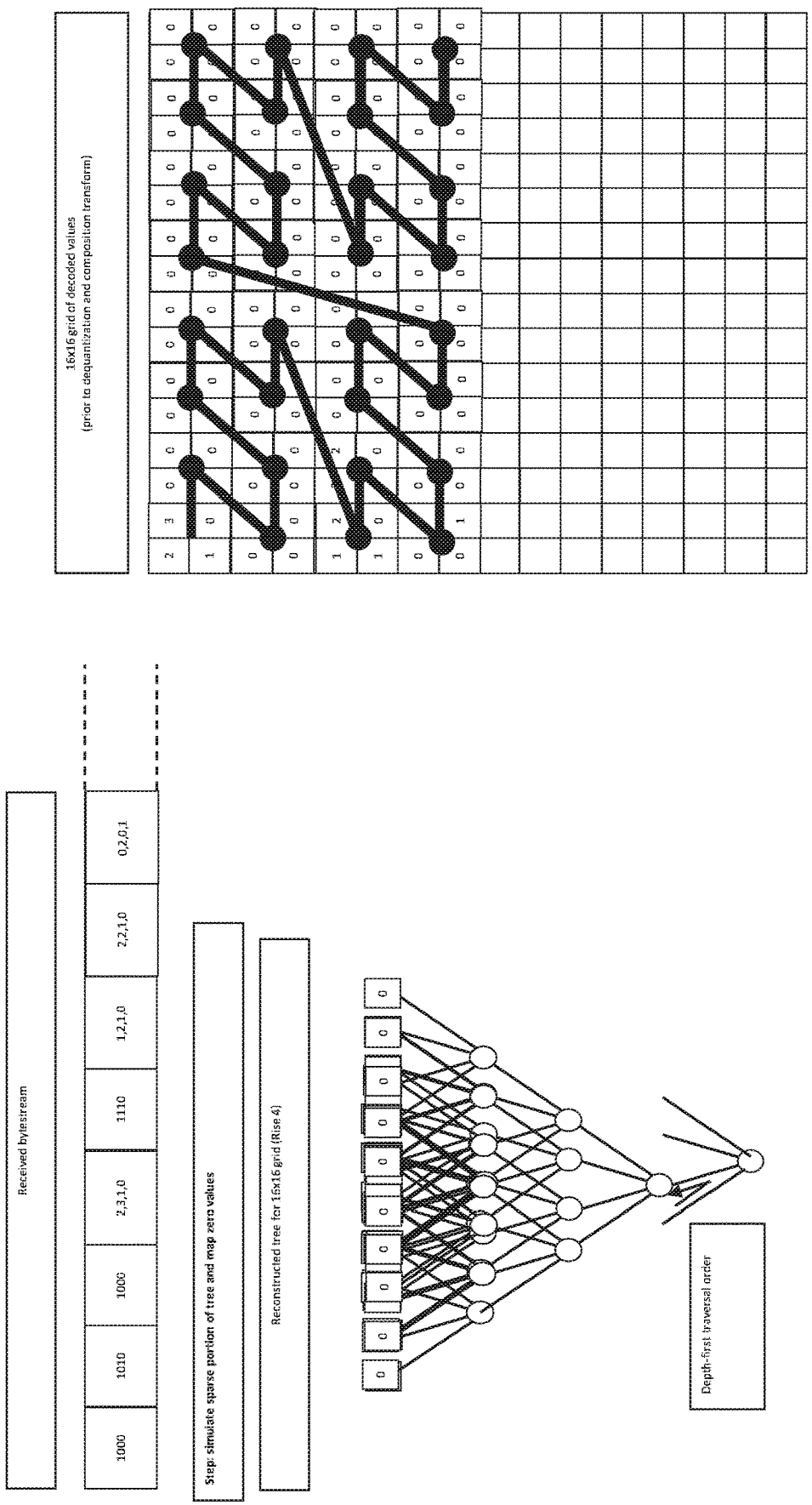
FIGS. 47A and 47B further illustrate a decoder building a tree once it has read a bytestream and an associated grid.
Figures 48A, 48B:
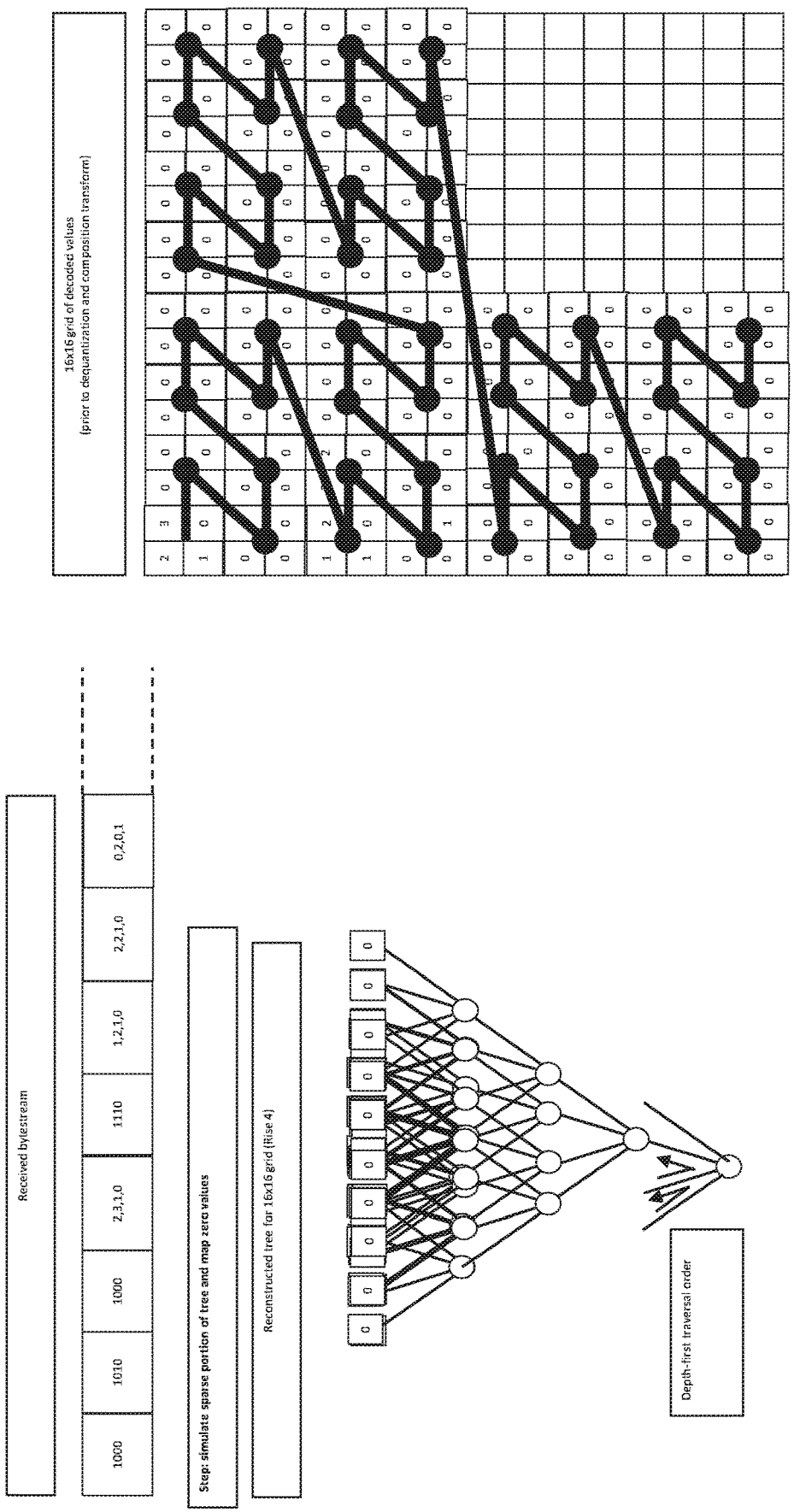
FIGS. 48A and 48B further illustrate a decoder building a tree once it has read a bytestream and an associated grid.
Figures 49A, 49B:
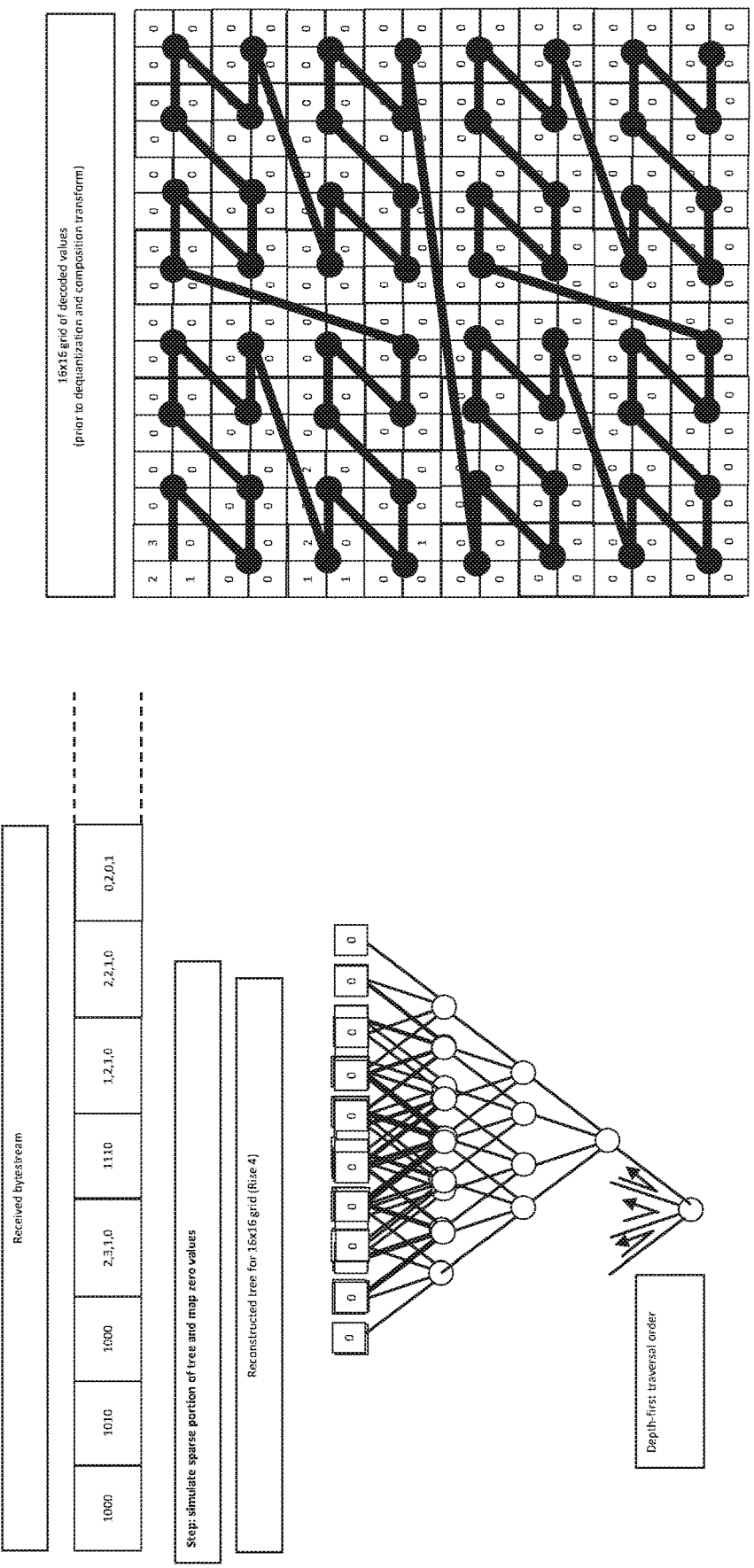
FIGS. 49A and 49B further illustrate a decoder building a tree once it has read a bytestream and an associated grid.

The traversal now ascends to the next parent node in Layer −3 following the traversal order, as shown in FIG. 47*a*. Since the first T-node symbol retrieved from the stream for the root node indicated that this branch does not have a T-node symbol in the stream, it can be inferred that all leaves in Layer 0 which are descended from this branch, the second branch from the root, are zero values. The process accordingly reconstructs a dense tree while simulating zero values for all leaves in this sub-tree. The zeros are mapped to the grid as shown in FIG. 47*b*. The 8×8 quadrant is all represented by zeros. This 8×8 quadrant may be referred to as a sparsified area. A sparsified area is an area of a grid containing zeroes that are not encoded in the stream but are known to be zeroes by default. Zeroes outside the sparsified areas are decoded from T-node symbols in the same fashion as non-zeroes.

In the illustration, the full iterative process is shown. That is, each branch of the tree is simulated and each leaf is populated with a zero in turn. However, the linear steps are not essential and the process may intelligently identify that all leaves are zero and map the zeros to the grid accordingly, in bulk.

The same process is followed for all siblings for the root as indicated by the original root T-node symbol. This process is shown in FIGS. 48a, 48b, 49a and 49b. The grid is now completed with the final two 8×8 quadrants being mapped with the zero values from the tree.

Once the process is terminated and all the simulations are made, the decoding process has effectively reconstructed a dense counterpart of the sparse tree received. That is, a tree where every node above Root Layer of the original n-Tree has n children and every Layer is dense.

FIGS. 50a and 50b illustrate a summary. 16 leaves are shown with corresponding T-node symbols. 16 symbols (or Labels) have been received in the bytestream. 240 zeros have been encoded "implicitly" as the T-node symbols for the nodes and the decoding and de-sparsification process resulted in an indication that the areas were sparsified. In the received tree derived from the bytestream, there are 7 nodes without descendant nodes. Children of these nodes are optionally simulated in the process to derive a dense tree. The tree is mapped to the grid where the 16 non-zero values are located accurately in the 2D array, while the sparse areas of zeros are placed within the grid without the data being sent in the bytestream.

By using the tree structure, the T-node symbols (which tell the process which branch will have children and which will have no children) and the depth traversal order, the process can reconstruct a fully sparsified grid by sending only a small set of information. As indicated above, the performance of the decoder is improved as it can be made more efficient. The process maps a constructed tree onto a grid. The grid may contain a sparsified area, that is, an area of a grid containing zeroes that are not encoded in the stream but are known to be zeroes by default. Zeroes outside the Sparsified Areas are decoded from T-node symbols in the same fashion as non-zeroes.

Tileset and Tableauset—Further Description

Below is a further description of methods and embodiments relative to tilesets, tableausets and related concepts. In particular, there is provided a method of processing metadata associated with a stream of video data, the method comprising the steps of, for a first frame of video data: subdividing the first frame of video data into a plurality of tiles; calculating a first statistical attribute for each of a plurality of tiles; identifying tiles having a first instance of identical, or similar, statistical attributes; grouping said identified tiles together as a tile set; for each tile set defining metadata for the tile set, said metadata indicative of the statistical attribute of the tiles defining the tile set; and encoding data indicative of the metadata for the tiles of the first frame of video data based on the metadata defined for each of the tile set to which said tile belongs.

Thus, the method provides the means for identifying and grouping tiles which are not necessarily linked spatially, but are linked by their statistical properties. Being able to group tiles in such a manner provides an improved understanding of the properties of the data, and furthermore allows for groupings to be made which would not otherwise be made. Optionally, the encoding occurs using an entropy encoding based technique. As the groupings are based on their statistical similarity, the probability of the occurrence of the data can be calculated allowing for entropy based encoding. Optionally, the metadata for a tile set further defines a location of each of the tiles forming the tile set, and preferably wherein the size of the tiles is fixed. This allows for an improved understanding of the data which can be repeated across multiple frames or datasets. Optionally, wherein the step of identifying the tiles that form a tile set comprises further comprising ordering the tiles, based on their statistical attributes, preferably wherein the ordering of the tiles defines a probability distribution function of the statistical attributes. Such ordering enables the easy identification of tiles which have identical or similar attributes. Optionally, wherein tiles are encoded in a set order, preferably wherein the method further comprises determining the difference between the metadata of a tile and its preceding tile, and encoding the metadata as the difference, preferably wherein in the set order is a z-order traverse. This allows for further reductions in data to be made. Optionally, wherein the method further comprise the step of encoding the tiles, preferably wherein the step of encoding the tiles comprises determining a level of quantisation and encoding tiles at said level of quantisation, more preferably wherein tiles belonging to a first a first tile set are quantised at a first level of quantisation and tiles belonging to a second tile set are quantised at a second, different, level of quantisation. The improved understanding of the video data provided by the clustering based on the statistics allows for areas of the image to be selectively quantised at higher rates of quantisation. Thus specific areas within the image which are deemed to be important can be encoded at a higher level of quality thus producing an improved image.

Some embodiments of the present inventions will be now described with reference to some of the attached Figures. It is to be noted that the following description is merely used for enabling the skilled person to understand the present invention, without any intention to limit the applicability of the present invention to other embodiments which could be readily understood and/or envisaged by the reader.

The present invention provides a methodology and apparatus for encoding video data in a manner that enables a full flexibility in terms of being able to collect and determine statistics associated with video data. Such data provides advantages in terms of encoding, and decoding, as well as a greater understanding of the data to be encoded. In particular, the present invention allows for the identification of tiles with the same or similar statistics to be grouped together, even though they may be spatially separate. Thus the overhead in metadata is lowered, whilst allowing for the recordal, and transmittal, of the statistics. In contrast to prior art systems, the present invention utilises blocks of tiles of a fixed size and allows for non-adjacent, spatially separate, tiles to be grouped together.

Figure 24:
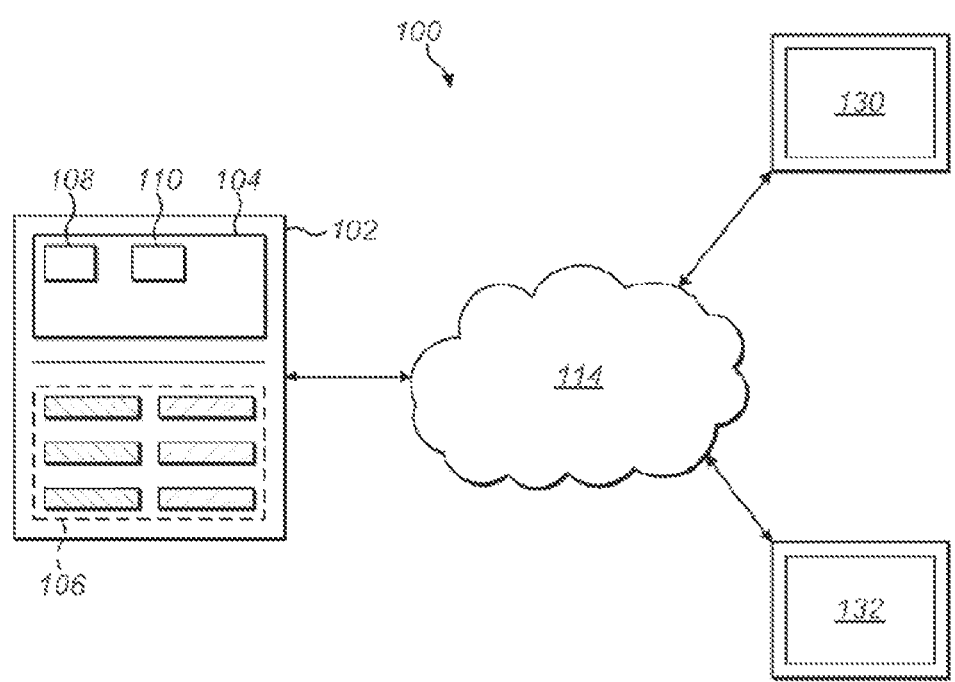
FIG. 24 illustrates a system.

FIG. 24 is a block diagram of a system for performing the statistical coding methodology according to an aspect of the invention.

In FIG. 24, there is shown the system 100, the system 100 comprising a streaming server 102 connected via a network 114 to a plurality of client devices 130, 132. The streaming server 102 comprising an encoder 104, the encoder configured to receive and encode a first video stream utilising the methodology described herein. The streaming server 104 is configured to deliver an encoded video stream 106 to a plurality of client devices such as set-top boxes smart TVs, smartphones, tablet computers, laptop computers etc., 130 and 132. Each client device 130 and 132 is configured to decode and render the encoded video stream 106. The client devices and streaming server 104 are connected via a network 114.

For ease of understanding the system 100 of FIG. 24 is shown with reference to a single streaming server 102 and two recipient client devices 130, 132 though in further embodiments the system 100 may comprise multiple servers (not shown) and several tens of thousands of client devices.

The streaming server 102 can be any suitable data storage and delivery server which is able to deliver encoded data to the client devices over the network. Streaming servers are known in the art, and use unicast and/or multicast protocols. The streaming server is arranged to encode and store the encoded data stream, and provide the encoded video data in one or more encoded data streams 106 to the client devices 130 and 132. The encoded video stream 106 is generated by the encoder 104. The encoder 104 in FIG. 24 is located on the streaming server 102, though in further embodiments the encoder 104 is located elsewhere in the system 100. The encoder 104 generates the encoded video stream utilising the techniques described herein.

The encoder further comprises a statistical module 108 configured to determine and calculate statistical properties of the video data.

The client devices 130 and 132 are devices known in the art and comprise the known elements required to receive and decode a video stream such as a processor, communications port and decoder.

An aspect of the invention is take into account the fact that areas of an image may be identified by virtue of the fact that they have similar, or identical, statistics. Regions which have the same statistics can, by using Shannon encoding (or any other form of entropy encoding), be described in a low data manner. As the entire region is defined in the same manner, this only needs to be defined once. It is known in the art to group regions spatially, on the assumption that pixels which are proximate to each will often show similar or identical properties. However, such spatial grouping will not be particularly effective where strong discontinuities are present (for example in the form of a feature or edge). Furthermore, the inventors have beneficially realised that whilst spatial proximate areas will have similar statistics, often areas which are spatially distinct will also have similar or identical statistics.

The present invention is based on the concept of identifying areas within the image which have similar statistics, and grouping these regions in order to reduce the amount data required to define such areas by encoding the groups using entropy encoding.

Figure 25:
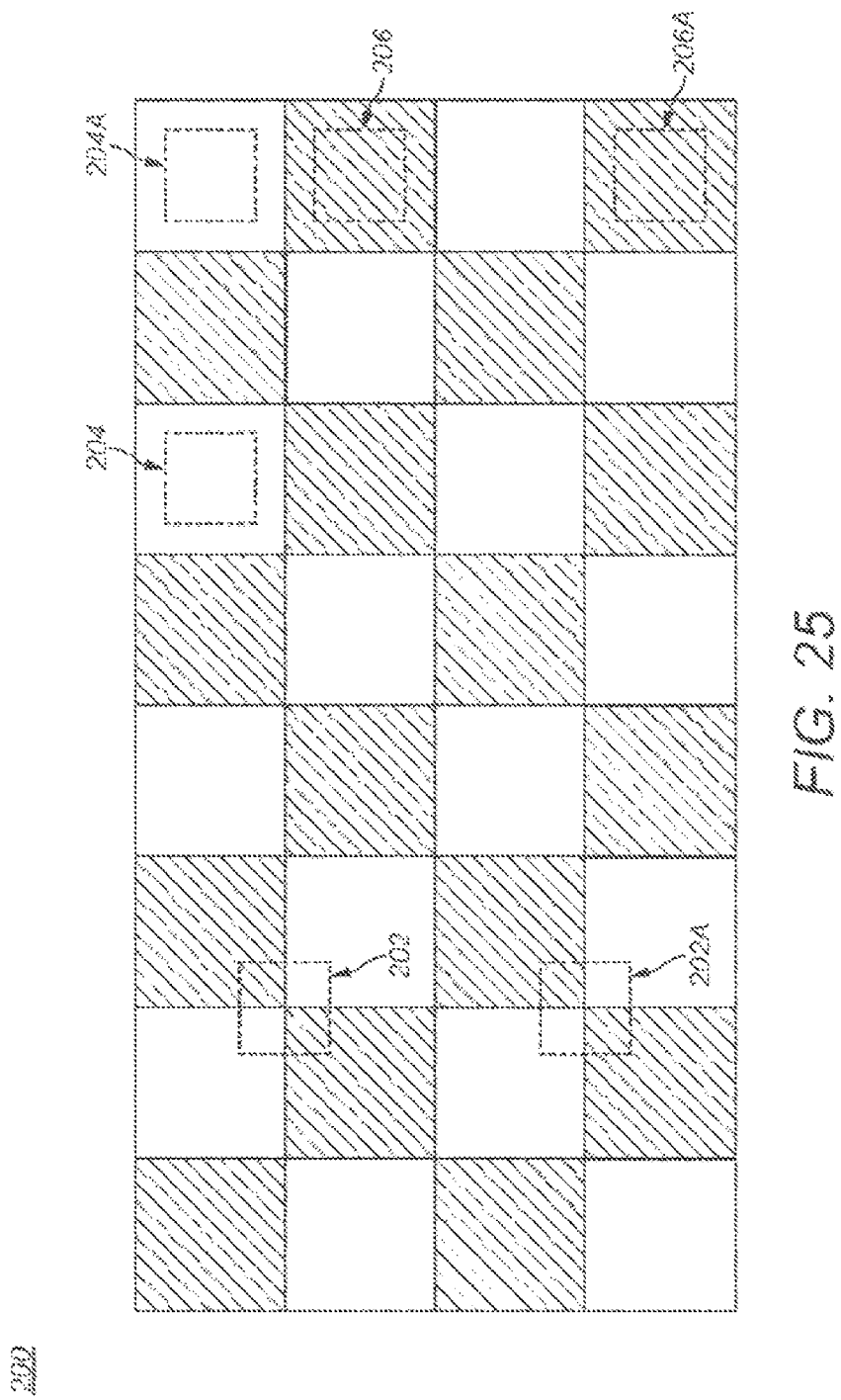
FIG. 25 illustrates an example of an image to be encoded.

FIG. 25 is an example of an image to be encoded using the method of the invention. An aspect of the invention is the ability to group tiles based on statistical properties, wherein the decision regarding the grouping is independent of the location of the tile within the image. Accordingly, such grouping allows for tiles to be grouped which would not otherwise be grouped based on spatial properties.

In FIG. 25, the image to be encoded is that of a chessboard 200. As is known with such boards, the board is defined by a set of alternating black and white squares. Three separate and equal sized regions have been identified on the board 202, 204 and 206. Whilst the image of the chessboard has been used for ease of understanding, the skilled person would realise that the described concepts are applicable to any form of image.

In FIG. 25, the first region 202 defines a region which comprises both a portion of a black and a white square. As can be seen, whilst the pixels in the first region 202 are spatially proximate, they will have different properties. In particular, the statistical properties of the pixels (for example luma, chroma, number of bits required to define the pixel, etc.) will be different for the black and white pixels within the first region 202. There is also shown region 202A, which is spatially separate from the first region 202, but has identical content. As such, region 202A would have identical statistical attributes to 202.

Similarly, the second 204 and third 206 regions consist of solely black and white pixels respectively. The second 204 and third 206 regions also have further regions 204A and 206A which are identical, and therefore will respectively have identical statistical attributes.

The example shown in FIG. 25 is an example where the properties of spatially distinct regions will be the same, or substantially similar. However, it is found that such clustering is found in many scenes, and thus can be used for the basis for entropy encoding.

Whilst it is possible to encode based on grouping of statistics, the amount of metadata required will also increase when more groups are introduced. As metadata is generally incompressible, the cost of the metadata must also be considered in order to ensure that the cost of the metadata does not exceed the benefit of the entropy based encoding.

Figure 26:
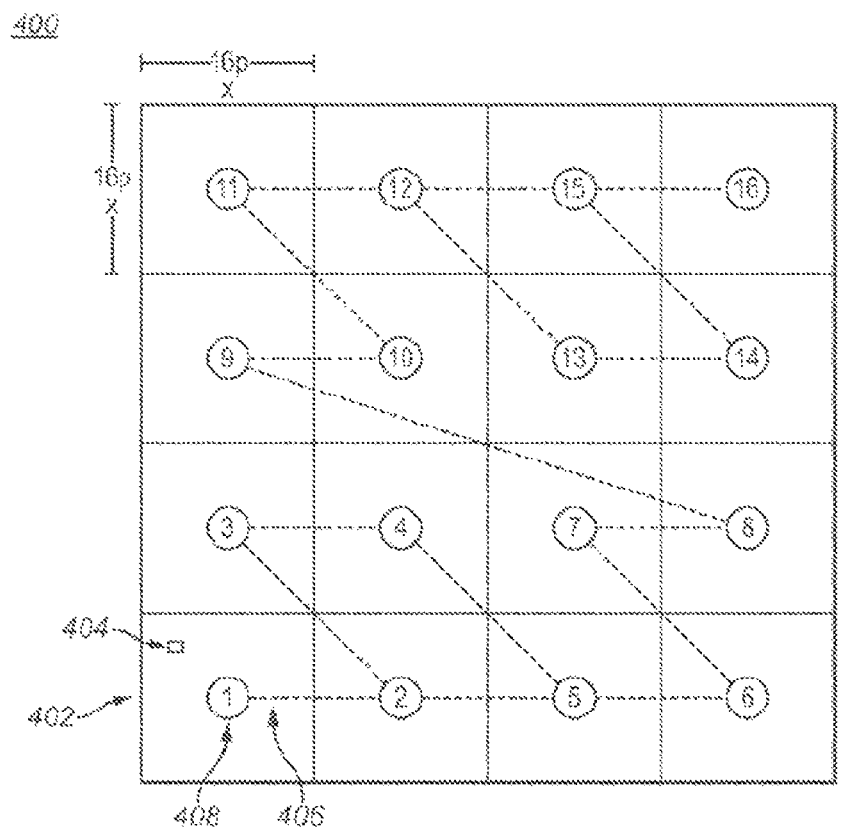
FIG. 26 illustrates a z-order traversal of tiles.

A process of clustering the data according to an aspect of the invention is now described. At step S102, a first frame of video data to be encoded is received. The video data may be stored locally, or received from an external source such as a server. At step S104, the frame is subdivided into a plurality of tiles. The tiles may be of any suitable size such as 8×8, 16×16, 32×32 etc. pixels. The size and number of tiles for the frame may vary according to available processing power, and the need to obtain a suitable size of tile in order to obtain meaningful statistics. Preferably, the number and size of tiles is fixed for the frame and all other frames of video data. The step of portioning an image in such a manner is known in the art. Each tile is preferably assigned an index which is indicative of the position of the tile within the image. Preferably the tiles are ordered within the image in a set-order. In a preferred embodiment, the order is set according to a z-order traversal of the tiles, as exemplified in FIG. 26. In FIG. 26 there is shown an image 400 which is subdivided into a plurality of tiles 402, each tile containing a number of pixels 404. Each tile 402 is assigned an index 408 found according to the z-order traversal 406 which preserves the spatial proximity of the tiles. Efficiently computing the z-order traversal 406 is known in the art. Thus, there is defined a set of indices which define the tiles. As the order is set, and the size of the tiles consistent, the individual pixels which define a tile can be readily determined. At step S106, for each of the tiles identified at step S104, the statistical attributes for the tile are calculated. In an embodiment, the tile is of dimension 16×16 pixels and therefore contains 256 total pixels. This allows for meaningful statistics to be calculated. The statistical attributes of the tile define one or more properties of the tile such as luma, chroma, number of bits required to define the tile, etc. An aspect is that the statistical attributes are objectively measurable, thus allowing for an objective comparison of the statistics between tiles to be made. The measurement of statistics for a tile is known in the art, and occurs via known means. Therefore at step S106 for each tile one or more properties/statistical attributes for each of the tiles are identified.

However, in an embodiment whilst such properties or statistics are calculated, they are not stored with the source data stream as metadata. They are stored separately from the data stream; for example, in memory associated with a processor performing the encoding. At step S108, instances of tiles defining the same or similar instances of a statistical attribute are identified. The identified tiles are grouped together so as to define a tileset. A tileset is therefore a group of tiles (which may, or may not, be spatial connected) that are grouped on the basis of having similar statistical attributes. As the tiles within a tileset have similar, or identical attributes, they will be near identical (or identical).

Figure 27:
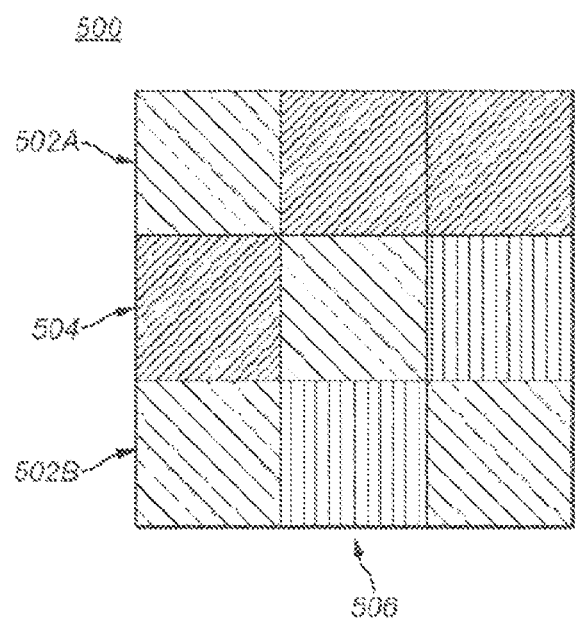
FIG. 27 illustrates an example image that has been subdivided into 9 tiles.

By grouping similar tiles into tilesets, the amount of metadata needed can be reduced. FIG. 27 is an example image 500 that has been subdivided into 9 tiles. Without the use of tilesets, metadata corresponding to 9 separate tiles would need to be used. However, some tiles share similar statistic properties with other tiles, such as 502A and 502B. Therefore, similar tiles are grouped together to form tilesets, exemplar tiles for each tileset being 502A, 504, and 506. As such, metadata corresponding to three tilesets would need to be used leading to a more compact metadata representation of the image 500. Thus, an important aspect is the clustering of tiles into tilesets according to their statistical attributes or properties, S108.

In an embodiment, tilesets are formed according to the cumulative probability distribution function of a particular statistic or set of statistics computed over the tiles. An example of a cumulative probability distribution function is shown in FIG. 28.

Figure 28:
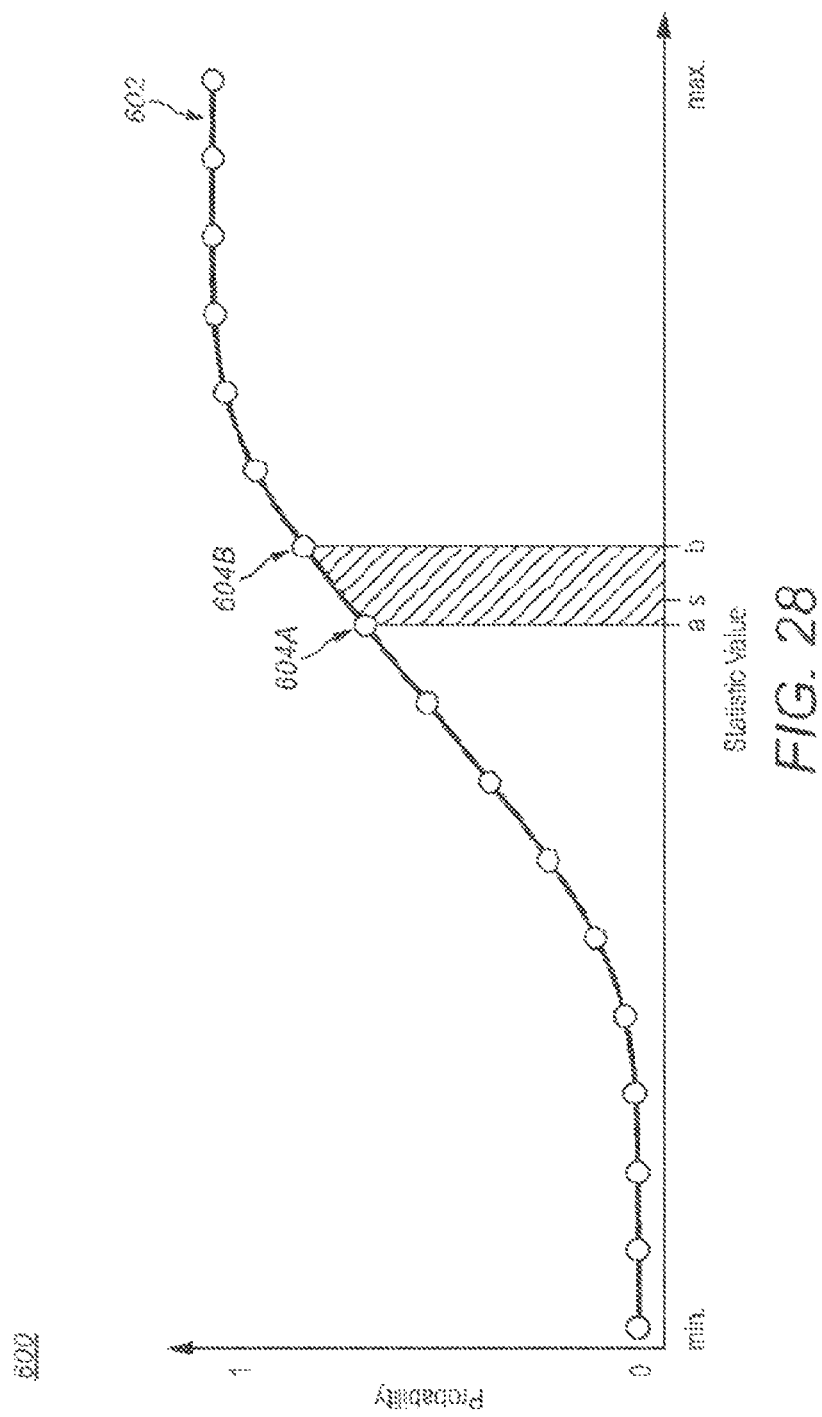
FIG. 28 illustrates a representative example of a statistic plotted against its cumulative probability to form a cumulative probability distribution.

FIG. 28 is a representative example of a statistic plotted against its cumulative probability to form a cumulative probability distribution 602. Whilst the general shape (the elongated s-shape) of the distribution function 602 will be the same across different frames, the specific form of the distribution will be dependent on the values for the frame. As the values for each frame change, the specific shape of the distribution function 602 will change. Thus, having tilesets defined on the distribution function provides a more effective measure across a frame. The use of a distribution function furthermore allows for tiles with similar statistics to be easily identified. In a preferred embodiment, sixteen groups of tiles (i.e. tilesets) are identified. The tilesets are identified in this instance by sampling 17 points across the cumulative probability distribution function 602. These points then form the boundaries for each tileset. 604A and 604B define the boundaries for one such tileset whereby any tile that has a statistic value, s, in the range, a<s≤b, is assigned to that tileset. As the statistics and their distribution will change for each frame, the boundary values will also change between frames. Whilst sixteen tilesets is preferred, in further embodiments other numbers of tilesets may be used.

In further embodiments, other forms of ordering of statistics, and clustering of tiles based on the similarity of statistics, are used. As each group has similar or identical statistical attributes, the group can be defined by their statistical attributes and are identified as tile sets.

A key aspect is that the identification of the individual tiles which form the tile set is independent of the spatial distribution of the tiles. Therefore tiles which are spatially distinct may form part of the same group. Thus at step S108 the identity of the titles forming each tileset is recorded.

At step S110 metadata for each identified tileset is calculated. The metadata describes the properties of the tiles which form the tileset, preferably comprising the data to describe one or more statistical attributes of the tileset, and the identification of the tiles which form the tileset. In one embodiment, the statistics for the entire tileset are recalculated using all tiles within the tileset. In further embodiments, the statistics for the tileset are taken from a single tile (for example the median tile of the tileset) and applied across the whole tileset. Thus, the metadata defines one or more statistical attributes for the tiles, as well as the individual tiles which form the tileset.

The process at step S110 is repeated for each of the tilesets. Thus, as well as the identity of the tiles forming the tileset (as determined at step S108) the properties of the tiles—which are identical or similar—are also determined. Such data is stored in the form of metadata associated with the image and tileset.

As the tiles are encoded in a sequential manner, the video data or image metadata is in the form of a set of indices which define the statistical attributes by which the tilesets are defined. These indices may be costly in terms of overhead. The inventors have beneficially realised that by clustering the tiles into tilesets, via their statistics, a measure of the likelihood of the data having a particular value (i.e. the value of the statistics by which the tileset is defined) can be made. Thus at step S110, in an embodiment, entropy encoding is used to reduce the cost associated with encoding. As the tilesets are defined by multiple tiles, the overhead associated with the metadata for entropy encoding is less than the cost of entropy encoding thereby producing a reduction in data size.

At step S112 for each of the tilesets, the tileset and metadata describing the tileset are encoded.

As the tilesets are identified by their similar, or identical, statistical attributes, the metadata to describe the statistical properties of the tiles in the tileset is constant for all tiles within the tileset. Thus, as the tiles within the tileset share the same properties, data requirement in order to encode the frame is greatly reduced as the metadata required to describe each tile in the frame in an embodiment is entropy encoded.

Whilst the above process allows for reductions in the dataset to be made based on the statistical similarity of the tiles in the dataset, further gains may be made by taking advantage of the similarity of tiles which are neighbouring each other. As is known, tiles which are adjacent to each other often show little or no variation. Therefore, in order to reduce the amount of data required to encode the tiles, the tiles are preferably encoded in a set order, such as a z-order traversal as shown in FIG. 26. Preferably, the value encoded is the difference between the value for the tile and the preceding value. Thus if the two tiles are identical in value then the encoded value is zero, or if they are similar then the value is small. Both of which have a low bit cost associated with their encoding. As stated above, tiles which are spatially similar (i.e. near to each other) will also typically have similar statistics. Therefore, whilst the invention will beneficially group the tiles in the tileset without any consideration to the spatial similarity, by ordering the encoding of the tiles in a z-order traversal, the encoding process can beneficially use the advantages associated with both the spatial and statistical similarities during the encoding process.

A further advantage associated with the use of tilesets is that they allow for decisions to be made at statistical level across the entire image. It is known in video encoding to encode different frames at different levels of encoding as part of an adaptive encoding methodology.

The decision is made based on the frame level statistics which have been determined. A further advantage of the present invention is that the use of tilesets, and the metadata associated with the tilesets (which is applicable to all the tiles that form the tileset) allows for decisions regarding adaptive encoding to be made on a frame-by-frame basis, with the variation in the encoding occurring within the individual frames.

An adaptive encoding process within a frame is also described here. As is known in video encoding, the bandwidth available is a limiting factor to the amount of data that can be sent and ultimately the level of quantisation used when encoding. There are a number of objective quality of frame metrics which are used to provide an objective measure to the encoded picture quality when compared to the original source data. Such measures are made across the entire frame. There are also a number of subjective measures, which define how well the end user will perceive the image. As the above described methodology allows for the local statistics to be obtained, it is possible to use such information in order to identify areas within a frame which are likely to be seen as visually more important to the end user. Such areas can be selectively encoded at a higher level of quantisation in order to provide a higher quality image for those areas. However, due to the finite amount of bandwidth, a trade-off must be made and the level of quantisation in other areas of the image must be lowered. As such the objective image quality metric for the entire image remains constant, but the areas which are deemed to be visually more important are quantised at a higher level. This therefore helps to provide a subjectively improved image.

At step S202, the process begins with the receipt of the metadata for each tileset as determined at step S110. At step S204, the metadata is used to determine tilesets which are likely to contain edges, or feature information, in the image. Features, such as edges, are known in video encoding to be a source of compression artifacts. Such features may be identified by the statistics of the frame, with certain statistics being associated with encoding errors. As compression artifacts are visible to the user, tiles which have compression artifacts will have, on a user subjective level, a lower level of quality. In an embodiment, the tilesets are ranked by a statistical value to define an order of visual "importance". In an embodiment, the statistics relate to the error associated with the encoding process and the tilesets are ranked from smallest to largest error. Tilesets which are identified as having the largest error are typically those associated with edges, or feature information, and will be perceived by the end user as having the lowest level of quality. In further embodiments, other suitable methods of ranking the tilesets are used. At step S206, the metadata is used to determine tilesets which are likely to be featureless, containing a uniform colour with little or no variation. Such tiles may be associated with a uniform background feature, or a consistent feature. Such tiles are also identified by the statistics as they show no variation in values across the tile. As such features are constant that are associated with having no compression artifacts or the like. At step S208, an adaptive quantisation decision is made in order to determine what level of quantisation is used to encode the individual tilesets. As a default, all tiles are encoded at the same level of quantisation. This is the standard encoding behaviour where the entire image is encoded at the same level of quantisation.

It has been beneficially realised that the level of quantisation across tilesets, with certain tilesets being encoded at a higher level of quantisation than others. Such decisions can be made as statistics are provided at an individual tileset level, thereby providing the information required to make the decision. Beneficially, by encoding tilesets, and therefore the tiles, identified at step S204 (i.e. those which are likely to be associated with compression artifacts), such tiles will show fewer compression artifacts and therefore will be perceived by the end user/viewer of the video to be of a higher quality. However, as the bandwidth cannot be increased, a corresponding decrease in the level of quantisation is made for some or all of the tilesets identified at step S206. As the level of quantisation for these tilesets has decreased, fewer bits are required in order to encode such frames. Thus, the overall amount of data required to encode the frame remains the same, but the level of quantisation is varied across the frame in order to provide enhanced regions (and corresponding regions with lower quantisation) within the image. Therefore, whilst the overall objective measure quality of the frame will remain unchanged, the subjective measure for the image may increase as the regions which are likely to show compression artifacts are quantised at a higher level, whereas areas which are uniform can be encoded at a lower level of quantisation without adversely affecting the end user experience. In an embodiment at step S208, a first tileset is selected to be encoded at a higher level of quantisation. Preferably the tileset to be encoded at the higher level of quantisation is the tileset which is ranked as the visually most important tileset. Subsequently, the increase in the size of the encoded frame as a result of encoding the tileset at the higher level of quantisation is determined. In order to ensure that the encoded dataset does not exceed the available bandwidth, one or more further tilesets are identified to be encoded at a lower level of quantisation. Preferably, the identified tilesets are those which are deemed to be visually the least important. When the tilesets are encoded at the lower level of quantisation, the decrease in the size of the encoded frame is determined and compared with the increase as a result of the quantisation of the tilesets at the higher level of quantisation. This process is repeated until such time that the overall size of the frame is the same, thus ensuring that the bandwidth requirement is not increased. Accordingly, the process provides an improved encoding process.

The process of creating tilesets can be repeated for an individual frame multiple times, with each set of tilesets determined based on a particular statistical attribute. By having multiple sets, further information regarding the underlying frame of video data is recorded and can be beneficially used in the encoding and decoding process. However, as there is an overhead associated with the creation of the set, in practice it is not desirable to have multiple sets.

A further aspect of the invention is the ability to group tiles into tilesets based on multiple statistical attributes. A process of defining a set of tilesets based on multiple statistical attributes is also described.

Steps S302 and S304 are identical to steps S102 and S104 respectively. Whilst it is possible to define and record the data for each statistical attribute separately this is costly in terms of the size of data required. Beneficially, the above methodology can be used to group tiles to form a tileset using several statistics. In order to group the statistics, at step S306 each statistic is defined in terms of a vector and a single vector score is determined for the statistics. It is found that clustering of up to three different statistics is preferred though in further embodiments a different number of statistics are grouped. Therefore, following the same principles described above with respect to step S108 of FIG. 25, at step S308 the tiles are clustered in groups of tiles having the same or similar vector (and thus same or similar statistics). As described with reference to FIG. 25, such clustering of the tiles allows for the tilesets to be encoded and further allowing for entropy encoding.

In further embodiments the value of each statistic is stored in a single matrix and the clustering is based on instances of the same of similar statistics.

STATEMENTS OF INVENTION

In the following, a number of statements of invention is provided.

1. A method of processing metadata associated with a stream of video data, the method comprising the steps of, for a first frame of video data:
   subdividing the first frame of video data into a plurality of tiles;
   calculating a first statistical attribute for each of a plurality of tiles;
   identifying tiles having a first instance of identical, or similar statistical, attributes, and grouping said identified tiles together as a tile set;
   for each tile set defining metadata for the tile set, said metadata indicative of the statistical attribute of the tiles defining the tile set; and
   encoding data indicative of the metadata for the tiles of the first frame of video data based on the metadata defined for each of the tile set to which said tile belongs.
2. The method of statement 1 wherein the encoding occurs using an entropy encoding based technique.
3. The method of any preceding statement wherein the metadata for a tile set further defines a location of each of the tiles forming the tile set.
4. The method of any preceding statement wherein the size of the tiles is fixed.
5. The method of any preceding statement wherein the step of identifying the tiles that form a tile set further comprises ordering the tiles, based on their statistical attributes.
6. The method of statement 5 wherein the ordering of the tiles defines a probability distribution function of the statistical attributes.
7. The method of any preceding statement wherein tiles are encoded in a set order.
8. The method of statement 7 wherein the method further comprises determining the difference between the metadata of a tile and its preceding tile, and encoding the metadata as the difference.
9. The method of statement 7 or 8 wherein in the set order is a z-order traverse.
10. The method of any preceding statement wherein the method further comprise the step of encoding the tiles.
11. The method of statement 10 wherein the step of encoding the tiles comprises determining a level of quantisation and encoding tiles at said level of quantisation
12. The method of statement 11 wherein tiles belonging to a first a first tile set are quantised at a first level of quantisation and tiles belonging to a second tile set are quantised at a second, different, level of quantisation.
13. The method of any preceding statement wherein the statistical attributes of the tile are selected from one or more of the group of: luma, chroma, and number of bits required to encode one or more pixels, within a frame of video data.
14. The method of any preceding statement wherein the first frame of video data is a residual frame, said residual frame being indicative of the differences between a first frame of data and a reference frame.
15. The method of any preceding statement wherein the method further comprises identifying one or more further statistical attributes of the tiles and identifying tiles having a plurality of instances of identical, or similar statistical, attributes, and grouping said identified tiles together as the tile set.
16. A system for encoding metadata associated with a stream of video data, the system comprising a processor, the processor configured to, for a first frame of video data:
    subdivide the first frame of video data into a plurality of tiles;
    for each of a plurality of tiles calculate a first statistical attributes of the tile;
    identify tiles having a first instance of identical, or similar statistical, attributes, and group said identified tiles together as a tile set;
    for each tile set define metadata for the tile set, said metadata indicative of the statistical attribute of the tiles defining the tile set; and
    encode data indicative of the metadata for the tiles of the first frame of video data based on the metadata defined for each of the tile set to which said tile belongs.
17. A method of decoding metadata associated with a stream of video data, the method comprising the steps of, for a first frame of video data, at a decoder:
    obtaining information to enable the decoder to subdivide the first frame of video data into a plurality of tiles;
    receiving an encoded stream of metadata, said encoded stream of metadata comprising information identifying tiles having a first instance of identical, or similar statistical, attributes, and information grouping said identified tiles together as a tile set;
    obtaining information regarding the identical, or similar statistical, attributes; and
    decoding the metadata for each of the tiles forming the tile set with the obtained information regarding the identical, or similar statistical, attributes.
18. The method of statement 17 wherein the encoded data stream is decoded using an entropy encoding based technique.
19. The method of statement 16 or 17 wherein the decoded metadata for a tile set further defines a location of each of the tiles forming the tile set.
20. The method of any of statements 16 to 19 wherein the size of the tiles is fixed.
21. The method of any of statements 16 to 20 comprising the step of obtaining information regarding the order in which the tiles were encoded and decoding the encoded stream based on said order.
22. The method of statement 22 wherein the method further comprises determining the difference between the metadata of a tile and its preceding tile, and decoding the metadata as the difference.
23. The method of statement 21 or 22 wherein in the set order is a z-order traverse.
24. The method of any of statements 16 to 23 further comprising obtaining information regarding a level of quantisation and decoding the data stream at said level of quantisation
25. The method of statement 24 wherein tiles belonging to a first a first tile set are decoded at a first level of quantisation and tiles belonging to a second tile set are decoded at a second, different, level of quantisation.

A-1. A method of decoding metadata associated with a stream of video data, the method comprising the steps of, for a first frame of video data, at a decoder.

obtaining information to enable the decoder to subdivide the first frame of video data into a plurality of tiles;

receiving an encoded stream of metadata, said encoded stream of metadata comprising information identifying tiles having a first instance of identical, or similar statistical, attributes, and information grouping said identified tiles together as a tile set;

obtaining information regarding the identical, or similar statistical, attributes; and decoding the metadata for each of the tiles forming the tile set with the obtained information regarding the identical, or similar statistical, attributes.

A-2. The method of statement A-1 wherein the encoded data stream is decoded using an entropy encoding based technique.

A-3. The method of statement A-1 or A-2 wherein the decoded metadata for a tile set further defines a location of each of the tiles forming the tile set.

A-4. The method of any preceding statement wherein the size of the tiles is fixed.

A-5. The method of any preceding statement comprising the step of obtaining information regarding the order in which the tiles were encoded and decoding the encoded stream based on said order.

A-6. The method of statement A-5 wherein the method further comprises determining the difference between the metadata of a tile and its preceding tile, and decoding the metadata as the difference.

A-7. The method of statement A-5 or A-6 wherein in the set order is a z-order traverse.

A-8. The method of any preceding statement further comprising obtaining information regarding a level of quantisation and decoding the data stream at said level of quantisation A-9. The method of statement A-8 wherein tiles belonging to a first a first tile set are decoded at a first level of quantisation and tiles belonging to a second tile set are decoded at a second, different, level of quantisation.

A-10 A decoder for decoding an encoded stream of video data, the decoder configured to perform the method of any of statements A-1 to A-9.

A-11. A method of processing metadata associated with a stream of video data, the method comprising the steps of, for a first frame of video data:

subdividing the first frame of video data into a plurality of tiles;

calculating a first statistical attribute for each of a plurality of tiles;

identifying tiles having a first instance of identical, or similar statistical, attributes, and grouping said identified tiles together as a tile set;

for each tile set defining metadata for the tile set, said metadata indicative of the statistical attribute of the tiles defining the tile set; and encoding data indicative of the metadata for the tiles of the first frame of video data based on the metadata defined for each of the tile set to which said tile belongs.

A-12. The method of statement A-11 wherein the encoding occurs using an entropy encoding based technique.

A-13. The method of any of statements A-11 or A-12 wherein the metadata for a tile set further defines a location of each of the tiles forming the tile set.

A-14. The method of statements A-11 to A-13 wherein the size of the tiles is fixed.

A-15. The method of statements A-11 to A-14 wherein the step of identifying the tiles that form a tile set further comprises ordering the tiles, based on their statistical attributes.

B-1. A method of decoding a stream of encoded data, the method comprising:

receiving an encoded dataset;

identifying from the dataset an ordered set of node symbols and data symbols, wherein a node symbol is a predetermined number of elements where each element indicates if a subsequent node symbol or data symbol is to be expected in the dataset and a data symbol is a predetermined number of bits which represent an encoded value;

constructing an ordered tree having a predetermined number of layers from the identified node symbols and data symbols by:

retrieving a first node symbol from the set;

associating the first node symbol with a root of the tree and associating each element of the first node symbol with a branch node of the root; and, traversing the tree, wherein if the associated element for a branch node indicates a subsequent node symbol exists in the set, traversing the tree comprises:

retrieving a subsequent node symbol from the ordered set;

associating the subsequent node symbol with the node; and, associating each element of the node symbol with a respective branch node for the node;

wherein if the associated bit for a branch node indicates no subsequent node symbol exists in the set, terminating the traversal for that subtree; and, wherein if the node is a leaf in a layer furthest from the root, retrieving a data symbol from the set.

B-2. A method according to statement B.1, further comprising:

simulating the tree after terminating the traversal, where each leaf in the subtree represents a predetermined value.

B-3. A method according to statement B.1 or B.2, wherein the element is a bit.

B.4. A method according to any one of statements B.1 to B.3, further comprising: mapping the ordered tree to a two-dimensional array.

C.1. A method of reconstructing a received set of encoded data, wherein the set of encoded data comprises first and second component sets, the first component set corresponding to a lower image resolution than the second component set, the method comprising:

for each of the first and second component sets:

decoding the component set so as to obtain a decoded set, the method further comprising:

upscaling the decoded first component set so as to increase the corresponding image resolution of the decoded first component set to be equal to the corresponding image resolution of the decoded second component set, and combining the decoded first and second component sets together so as to produce a reconstructed set.

C.2 A method according to statement C.1, wherein the set of encoded data comprises one or more further component sets, wherein each of the one or more further component sets corresponds to a higher image resolution than the second component set, and wherein each of the one or more further component sets corresponds to a progressively higher image resolution,
the method comprising, for each of the one or more further component sets, decoding the component set so as to obtain a decoded set,
the method further comprising, for each of the one or more further component sets, in ascending order of corresponding image resolution:
upscaling the reconstructed set having the highest corresponding image resolution so as to increase the corresponding image resolution of the reconstructed set to be equal to the corresponding image resolution of the further component set, and
combining the reconstructed set and the further component set together so as to produce a further reconstructed set.

C.3 A method according to statement C.1 or statement C.2, wherein each of the component sets corresponds to a progressively higher image resolution, wherein each progressively higher image resolution corresponds to a factor-of-four increase in the number of pixels in a corresponding image.

C.4 A method according to any of statements C.1 to C.3, wherein the number of further component sets is two.

C.5 A method according to any of statements C.1 to C.4, wherein the first component set corresponds to image data, and the second and any further component sets correspond to residual image data.

C.6 A method of decoding a data set, the method comprising:
de-sparsifying the set, comprising recreating sparse data in one or more parts of the set at which no sparse data was received, and maintaining the locations of received data within the set; and
applying an entropy decoding operation to the de-sparsified set;
wherein the step of de-sparsifying the set is performed in accordance with the entropy decoding operation.

C.7 A method of decoding a received data set so as to obtain a decoded set, the method comprising:
decoding the set according to the method of statement C.6;
de-quantizing the entropy-decoded set; and
applying a directional composition transform to the de-quantized set so as to obtain a decoded set.

C.8 A method of reconstructing a set of encoded data according to any of statements C.1 to C.5, wherein the decoding of each of the first and second component sets is performed according to the method of statement C.7.

C.9 A method of decoding a set of sparse data, the method comprising:
obtaining a set of encoded data, said encoded data containing information which, when decoded, would enable reconstruction of the set of sparse data;
decoding a first portion of said set of encoded data to obtain a first set of decoded data; and
based on the first set of decoded data, determining how to reconstruct a first portion of the set of sparse data.

C.10 The method of statement C.9, wherein the first set of decoded data corresponds to one or more metadata symbols indicating whether to reconstruct a first portion of the set of sparse data based on a second set of decoded data or based on simulating the first portion of the set of sparse data.

C.11 The method of statement C.10, wherein if the one or more metadata symbols indicates that reconstruction of the first portion of the set of sparse data should be based on a second set of decoded data, the method further comprises:
decoding a second portion of said set of encoded data to obtain the second set of decoded data; and
reconstructing the first portion of the set of sparse data by extracting from the second set of decoded data a first type of data symbols.

C.12 The method of statement C.9 or C.10, wherein if the one or more metadata symbols indicates that reconstruction of the first portion of the set of sparse data should be based on simulating the first portion of the set of sparse data, the method further comprises:
simulating first portion of the set of sparse data by generating a second type of data symbols.

C.13 The method of any one of statement C.11 or C.12, wherein the steps of decoding and reconstructing comprise:
decoding a first sub-portion of said second portion to obtain a first sub-set of decoded data;
based on the information associated with the first set of decoded data, determining whether the first sub-set of decoded data contains one or more metadata symbols or a first type of data symbols.

C.14 The method of statement C.13, wherein if it is determined that the first sub-set of decoded data contains one or more metadata symbols, the method further comprises:
decoding a second sub-portion of said second portion to obtain a second sub-set of decoded data; and
based at least on information associated with the first sub-set of decoded data, determining whether the second sub-set of decoded data contains one or more metadata symbols or a first type of data symbols.

C.15 The method of statement C.14, wherein if it is determined that the second sub-set of decoded data contains one or more metadata symbols, the method further comprises:
decoding a third sub-portion of said second portion to obtain a third sub-set of decoded data; and
reconstructing the first portion of the set of sparse data by extracting from the third sub-set of decoded data a first type of data symbols.

C.16 The method of statement C.13, wherein if it is determined that the second sub-set of decoded data contains a first type of data symbols, the method further comprises:
decoding a second sub-portion of said second portion to obtain a second sub-set of decoded data; and
reconstructing the first portion of the set of sparse data by extracting from the second sub-set of decoded data a first type of data symbols.

C.17 The method of statement C.13, wherein if it is determined that the first sub-set of decoded data contains a first type of data symbols, the method further comprises:
reconstructing the first portion of the set of sparse data by extracting from the first sub-set of decoded data a first type of data symbols.

C.18 The method of statement C.10, wherein if the one or more metadata symbols indicates that reconstruction of the first portion of the set of sparse data should be based on a second set of decoded data, the method further comprises:
decoding a second portion of said set of encoded data to obtain the second set of decoded data, wherein the second set of decoded data corresponds to one or more metadata symbols indicating whether to reconstruct a first portion of the set of sparse data based on a third set of decoded data or based on simulating the first portion of the set of sparse data.

C.19 The method of statement C.18, wherein if the one or more metadata symbols in the second set of decoded data indicates that reconstruction of the first portion of the set of sparse data should be based on simulating the first portion of the set of sparse data, the method further comprises:
simulating first portion of the set of sparse data by generating a second type of data symbols.

C.20 The method of statement C.19, wherein if the one or more metadata symbols indicates that reconstruction of the first portion of the set of sparse data should be based on a third set of decoded data, the method further comprises:
decoding a third portion of said set of encoded data to obtain the third set of decoded data, wherein the third set of decoded data corresponds to one or more metadata symbols indicating whether to reconstruct a first portion of the set of sparse data based on a fourth set of decoded data or based on simulating the first portion of the set of sparse data.

C.21 The method of statement C.20, wherein if the one or more metadata symbols in the third set of decoded data indicates that reconstruction of the first portion of the set of sparse data should be based on simulating the first portion of the set of sparse data, the method further comprises:
simulating first portion of the set of sparse data by generating a second type of data symbols.

C.22 The method of statement C.20, wherein if the one or more metadata symbols in the third set of decoded data indicates that reconstruction of the first portion of the set of sparse data should be based on a fourth set of decoded data, the method further comprises:
decoding a fourth portion of said set of encoded data to obtain the fourth set of decoded data;
reconstructing the first portion of the set of sparse data by extracting from the fourth set of decoded data a first type of data symbols.

C.23 The method of any one of statements C.11 to C.22, wherein the first type is a non-zero value and the second type is a zero value.

C.24 The method of any one of statements C.11 to C.22, wherein the first type is a value above a threshold and the second type is a value below the threshold, and wherein a value equal to the threshold can belong either to the first type or to the second type depending on a chosen implementation.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention.

The invention claimed is:

1. A method of decoding a set of sparse data, the method comprising:
obtaining a set of encoded data comprising information that, when decoded, would enable reconstruction of the set of sparse data;
decoding a first portion of said set of encoded data to obtain a first set of decoded data; and
based on the first set of decoded data, determining how to reconstruct a first portion of the set of sparse data,
wherein the first set of decoded data corresponds to one or more metadata symbols indicating whether to reconstruct the first portion of the set of sparse data based on (i) a second set of decoded data or (ii) a simulation of the first portion of the set of sparse data, and
wherein, if the one or more metadata symbols indicates that reconstruction of the first portion of the set of sparse data should be based on the second set of decoded data, the method further comprises:
decoding a second portion of said set of encoded data to obtain the second set of decoded data; and
reconstructing the first portion of the set of sparse data by extracting, from the second set of decoded data, a first type of data symbols.

2. The method of claim 1, wherein, if the one or more metadata symbols indicates that reconstruction of the first portion of the set of sparse data should be based on the simulation of the first portion of the set of sparse data, the method further comprises:
simulating the first portion of the set of sparse data by generating a second type of data symbols.

3. A non-transitory computer readable storage medium having stored thereon computer executable instructions that are executable by one or more processors of a decoder to cause the decoder to:
obtain a set of encoded data comprising information that, when decoded, would enable reconstruction of a set of sparse data;
decode a first portion of said set of encoded data to obtain a first set of decoded data; and
based on the first set of decoded data, determine how to reconstruct a first portion of the set of sparse data,
wherein the first set of decoded data corresponds to one or more metadata symbols indicating whether to reconstruct the first portion of the set of sparse data based on (i) a second set of decoded data or (ii) a simulation of the first portion of the set of sparse data, and
wherein, if the one or more metadata symbols indicates that reconstruction of the first portion of the set of sparse data should be based on the simulation of the first portion of the set of sparse data, the computer executable instructions further cause the decoder to:
simulate the first portion of the set of sparse data by generating a type of data symbols.

4. The computer readable storage medium of claim 3, wherein if the one or more metadata symbols indicates that reconstruction of the first portion of the set of sparse data should be based on the second set of decoded data, the method further comprises:
decoding a second portion of said set of encoded data to obtain the second set of decoded data; and
reconstructing the first portion of the set of sparse data by extracting, from the second set of decoded data, a different type of data symbols.

5. A decoder comprising:
a processor;
a computer readable storage medium having stored thereon computer executable instructions that are executable by the processor to cause the decoder to:
obtain a set of encoded data comprising information that, when decoded, would enable reconstruction of a set of sparse data;
decode a first portion of said set of encoded data to obtain a first set of decoded data; and based on the first set of decoded data, determine how to reconstruct a first portion of the set of sparse data, wherein the first set of decoded data corresponds to one or more metadata symbols indicating whether to reconstruct the first portion of the set of sparse data based on (i) a second set of decoded data or (ii) a simulation of the first portion of the set of sparse data, and wherein, if the one or more metadata symbols indicates that reconstruction of the first portion of the set of sparse data should be based on the second set of decoded data, the computer executable instruction further cause the decoder to:

decode a second portion of said set of encoded data to obtain the second set of decoded data; and reconstruct the first portion of the set of sparse data by extracting, from the second set of decoded data, a first type of data symbols.

6. The decoder of claim 5, wherein, if the one or more metadata symbols indicates that reconstruction of the first portion of the set of sparse data should be based on the simulation of the first portion of the set of sparse data, the computer executable instructions further cause the decoder to:

simulate the first portion of the set of sparse data by generating a second type of data symbols.

7. The method of claim 1, wherein the set of sparse data is describable as an array of data.

8. The method of claim 7, wherein a majority of the array has a value of 0.

9. The method of claim 7, wherein a majority of the array has values that are below a predefined threshold.

10. The method of claim 7, wherein the array is organized as a grid.

11. The method of claim 1, wherein the first type of data symbols includes up to four data symbols.

12. The non-transitory computer readable storage medium of claim 3, wherein the set of sparse data is describable as an array of data.

13. The non-transitory computer readable storage medium of claim 12, wherein a majority of the array has a value of 0.

14. The non-transitory computer readable storage medium of claim 12, wherein a majority of the array has values that are below a predefined threshold.

15. The non-transitory computer readable storage medium of claim 12, wherein the array is organized as a grid.

16. The non-transitory computer readable storage medium of claim 3, wherein the first type of data symbols includes up to four data symbols.

17. The decoder of claim 5, wherein the set of sparse data is describable as an array of data.

18. The decoder of claim 17, wherein a majority of the array has a value of 0.

19. The decoder of claim 17, wherein a majority of the array has values that are below a predefined threshold.

20. The decoder of claim 17, wherein the array is organized as a grid.

\* \* \* \* \*